(12) United States Patent
Eroz et al.

(10) Patent No.: US 8,782,489 B2
(45) Date of Patent: *Jul. 15, 2014

(54) METHOD AND SYSTEM FOR PROVIDING LOW DENSITY PARITY CHECK (LDPC) ENCODING AND DECODING

(71) Applicant: Hughes Network Systems, LLC, Germantown, MD (US)

(72) Inventors: Mustafa Eroz, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/786,632

(22) Filed: Mar. 6, 2013

(65) Prior Publication Data

US 2014/0101520 A1 Apr. 10, 2014

Related U.S. Application Data

(63) Continuation-in-part of application No. 12/707,766, filed on Feb. 18, 2010, now Pat. No. 8,402,341.

(51) Int. Cl.
*H03M 13/00* (2006.01)

(52) U.S. Cl.
USPC .......................................................... 714/758

(58) Field of Classification Search
CPC combination set(s) only.
See application file for complete search history.

(56) References Cited

U.S. PATENT DOCUMENTS

| | | |
|---|---|---|
| 5,805,642 A | 9/1998 | Wei et al. |
| 5,838,728 A | 11/1998 | Alamouti et al. |
| 5,844,943 A | 12/1998 | Kazecki et al. |
| 5,903,609 A | 5/1999 | Kool et al. |
| 6,023,783 A | 2/2000 | Divsalar et al. |
| 6,097,764 A | 8/2000 | McCallister et al. |
| 6,104,761 A | 8/2000 | McCallister et al. |

(Continued)

FOREIGN PATENT DOCUMENTS

| | | |
|---|---|---|
| EP | 1387496 A2 | 2/2004 |
| EP | 2365639 A2 | 9/2011 |
| WO | WO 2004/006442 A1 | 1/2004 |

OTHER PUBLICATIONS

Eroz, Mustafa et al., "An Innovative Low-Density Parity-Check Code Design With Near-Shannon-Limit Performance and Simple Implementation", IEEE Transactions on Communications, vol. 54, No. 1, Jan. 1, 2006, XPOQ7902266, Jan. 1, 2006, 13-17.

(Continued)

*Primary Examiner* — Guerrier Merant
(74) *Attorney, Agent, or Firm* — Potomac Technology Law, LLC

(57) ABSTRACT

An approach is provided for encoding a source signal based on a structured parity check matrix of a Low Density Parity Check (LDPC) code. The LDPC code is represented by stored information reflecting a tabular format of rows and columns, wherein each row represents occurrences of one values within a respective column of the parity check matrix, and wherein the columns of the parity check matrix are derived according to an operation based on the respective rows of the stored information. Blocks of information bits of the source signal are encoded based on the LDPC code to generate an encoded signal. Row indices of 1's in a column index of the parity check matrix are given at a respective row according to the stored information. The LDPC code is of a structure that facilitates use of a plurality of parallel engines for decoding the encoded signal.

32 Claims, 13 Drawing Sheets

(56) References Cited

U.S. PATENT DOCUMENTS

| | | |
|---|---|---|
| 6,430,722 B1 | 8/2002 | Eroz et al. |
| 6,529,495 B1 | 3/2003 | Aazhang et al. |
| 6,674,811 B1 | 1/2004 | Desrosiers et al. |
| 6,724,813 B1 | 4/2004 | Jamal et al. |
| 6,829,308 B2 | 12/2004 | Eroz et al. |
| 6,940,827 B2 | 9/2005 | Li et al. |
| 6,963,622 B2 | 11/2005 | Eroz et al. |
| 7,020,829 B2 | 3/2006 | Eroz et al. |
| 7,039,126 B2 | 5/2006 | Galins |
| 7,173,978 B2 | 2/2007 | Zhang et al. |
| 7,187,728 B2 | 3/2007 | Seier et al. |
| 7,191,378 B2 | 3/2007 | Eroz et al. |
| 7,203,887 B2 | 4/2007 | Eroz et al. |
| 7,234,098 B2 | 6/2007 | Eroz et al. |
| 7,237,174 B2 | 6/2007 | Eroz et al. |
| 7,296,208 B2 | 11/2007 | Sun et al. |
| 7,324,613 B2 | 1/2008 | Fang et al. |
| 7,334,181 B2 | 2/2008 | Eroz et al. |
| 7,376,883 B2 | 5/2008 | Eroz et al. |
| 7,398,455 B2 | 7/2008 | Eroz et al. |
| 7,424,662 B2 | 9/2008 | Eroz et al. |
| 7,430,396 B2 | 9/2008 | Sun et al. |
| 7,447,984 B2 | 11/2008 | Cameron et al. |
| 7,461,325 B2 | 12/2008 | Eroz et al. |
| 7,483,496 B2 | 1/2009 | Eroz et al. |
| 7,577,207 B2 | 8/2009 | Eroz et al. |
| 7,673,226 B2 | 3/2010 | Eroz et al. |
| 7,725,802 B2 | 5/2010 | Eroz et al. |
| 7,746,758 B2 | 6/2010 | Stolpman |
| 7,770,089 B2 | 8/2010 | Eroz et al. |
| 7,856,586 B2 | 12/2010 | Eroz et al. |
| 7,864,869 B2 | 1/2011 | Eroz et al. |
| 7,954,036 B2 | 5/2011 | Eroz et al. |
| 7,962,830 B2 | 6/2011 | Eroz et al. |
| 8,028,224 B2 | 9/2011 | Eroz et al. |
| 8,069,393 B2 | 11/2011 | Eroz et al. |
| 8,095,854 B2 | 1/2012 | Eroz et al. |
| 8,102,947 B2 | 1/2012 | Eroz et al. |
| 8,126,076 B2 | 2/2012 | Sartori et al. |
| 8,140,931 B2 | 3/2012 | Eroz et al. |
| 8,144,801 B2 | 3/2012 | Eroz et al. |
| 8,145,980 B2 | 3/2012 | Eroz et al. |
| 8,181,085 B2 | 5/2012 | Eroz et al. |
| 8,291,293 B2 | 10/2012 | Eroz et al. |
| 8,369,448 B2 | 2/2013 | Zhang et al. |
| 8,402,341 B2 * | 3/2013 | Eroz et al. ............ 714/758 |
| 2003/0021358 A1 | 1/2003 | Galins |
| 2003/0037298 A1 | 2/2003 | Eleftheriou et al. |
| 2004/0019845 A1 | 1/2004 | Eroz et al. |
| 2004/0054960 A1 | 3/2004 | Eroz et al. |
| 2004/0258177 A1 | 12/2004 | Shen et al. |
| 2006/0218459 A1 | 9/2006 | Hedberg |
| 2006/0224935 A1 | 10/2006 | Cameron et al. |
| 2008/0019263 A1 | 1/2008 | Stolpman |
| 2008/0313523 A1 | 12/2008 | Sun et al. |
| 2009/0158129 A1 | 6/2009 | Myung et al. |
| 2009/0187804 A1 | 7/2009 | Shen et al. |
| 2010/0100789 A1 | 4/2010 | Yu et al. |
| 2010/0122143 A1 | 5/2010 | Lee et al. |
| 2010/0211841 A1 | 8/2010 | Cao et al. |
| 2011/0051825 A1 | 3/2011 | Tao et al. |
| 2011/0202820 A1 | 8/2011 | Eroz et al. |
| 2011/0239086 A1 | 9/2011 | Eroz et al. |
| 2013/0198581 A1 * | 8/2013 | Lee et al. ............ 714/752 |
| 2013/0283131 A1 | 10/2013 | Tsatsaragkos et al. |
| 2014/0068375 A1 | 3/2014 | Eroz et al. |

OTHER PUBLICATIONS

Eroz, Mustafa et al., "Structured Low-Density Parity-Check Code Design for Next Generation Digital Video Broadcast", Military Communications Conference, 2005, Oct. 17, 2005, XP010901536, Oct. 17, 2005, 1-6.

ESR P1064EP00, , "European Search Report", EP 2365639 A3, Aug. 1, 2012.

ETSI EN 302 307 V1.2.1 (DVB), , "ETSI EN 302 307 V1.2.1 Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, Aug. 1, 2009, XP002678089, Aug. 1, 2009, 22-28, 37-49.

* cited by examiner

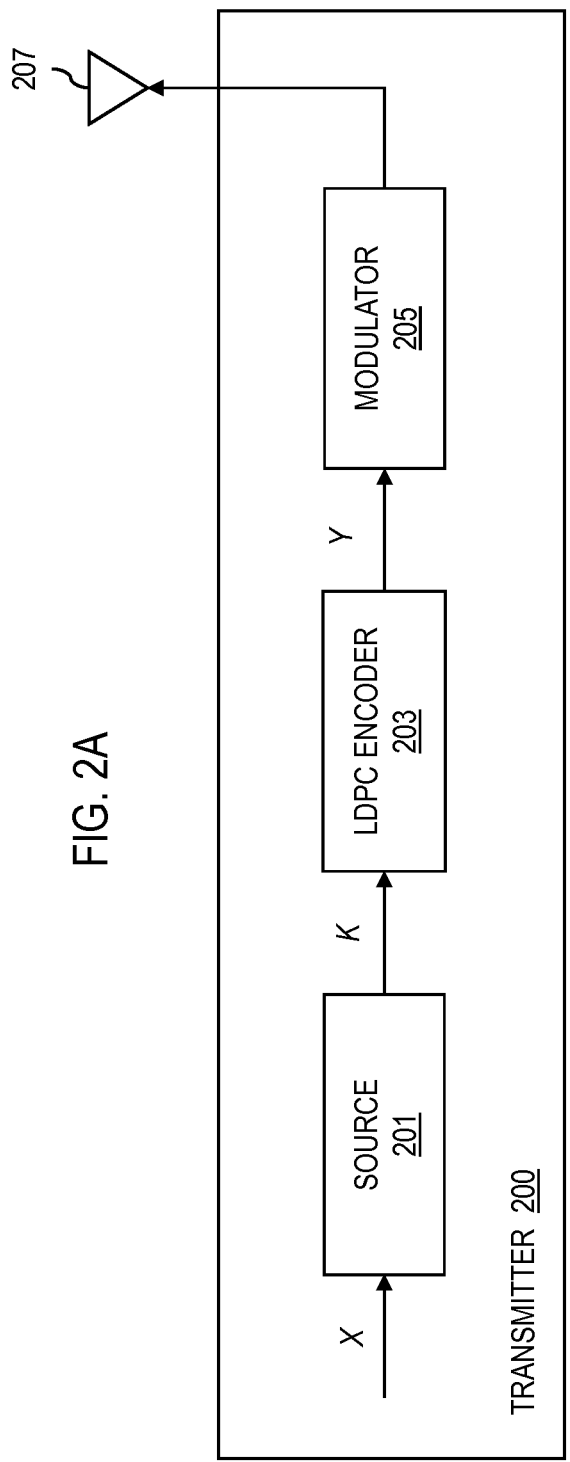
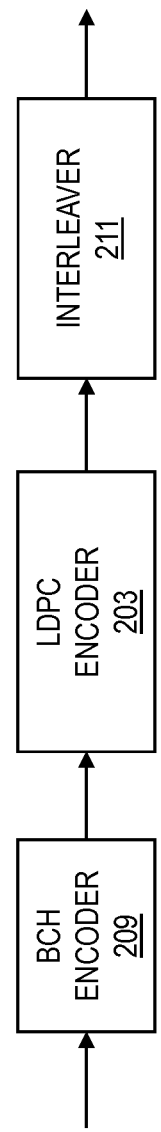

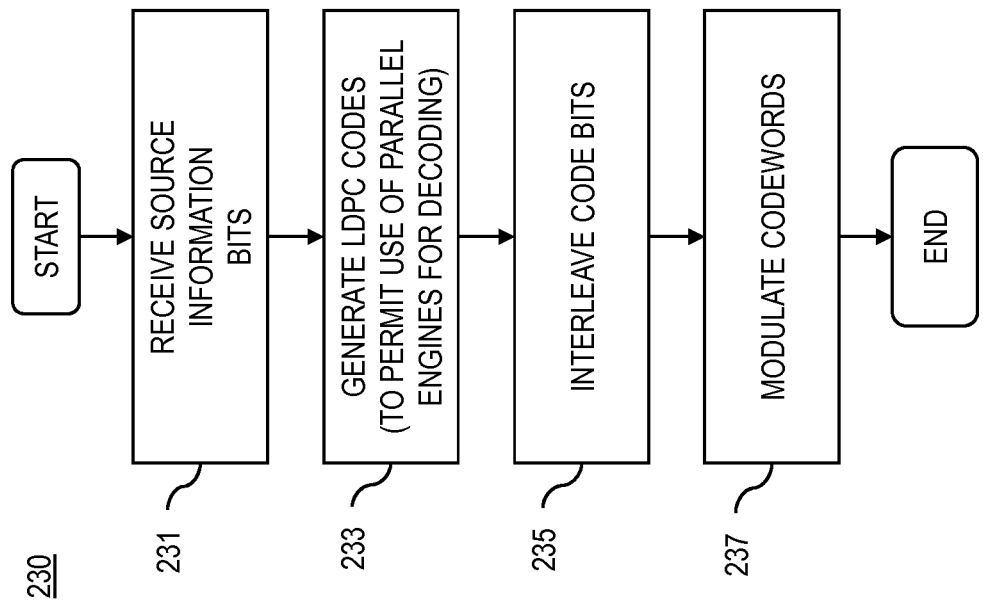
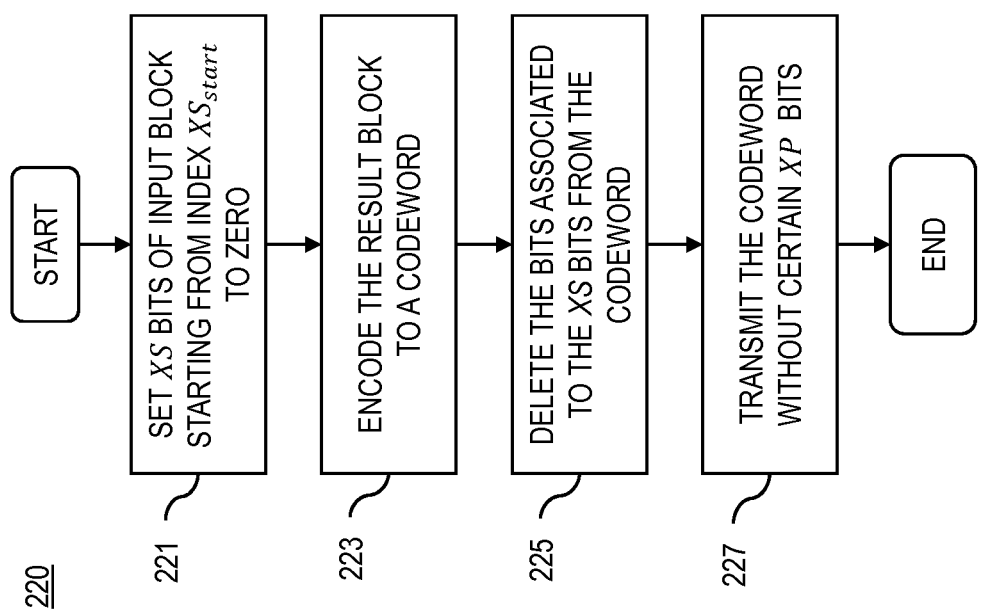

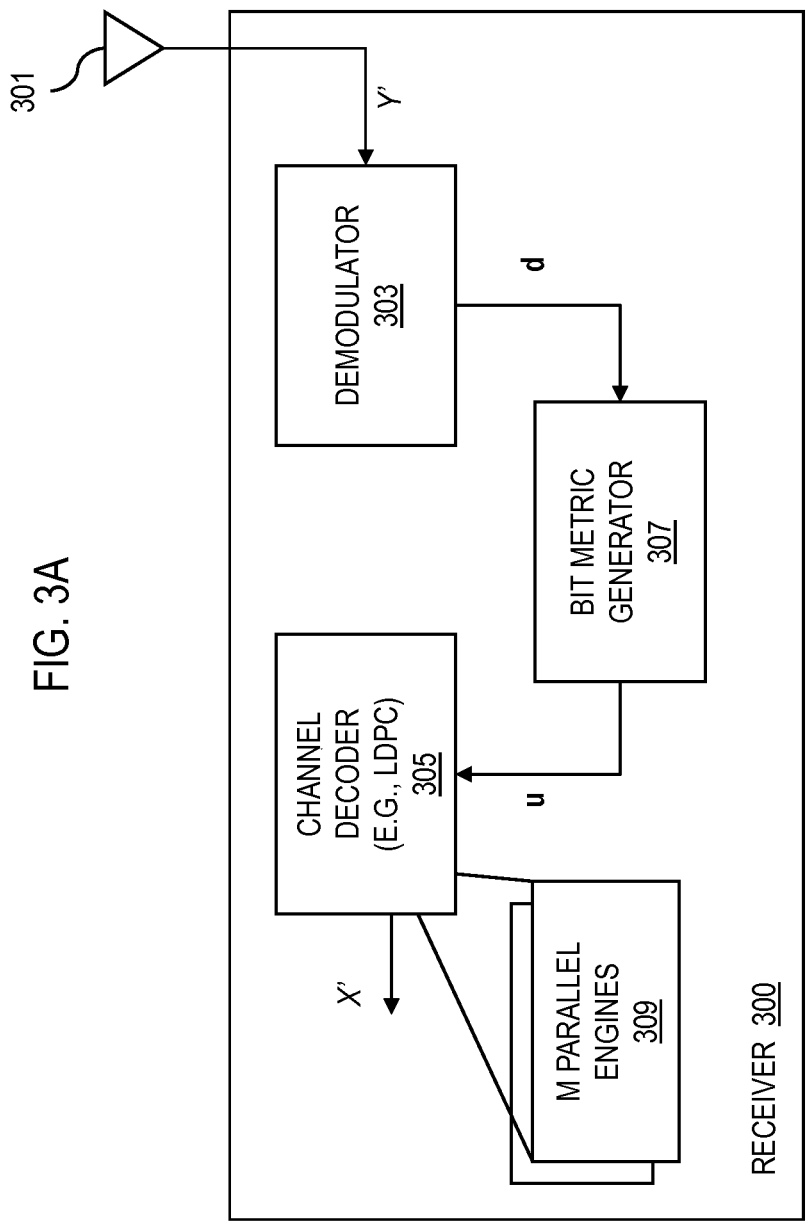

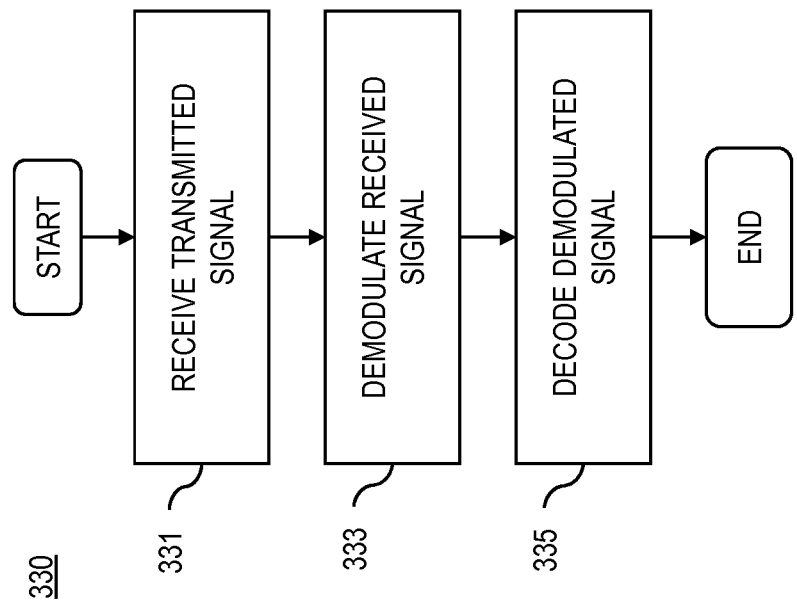

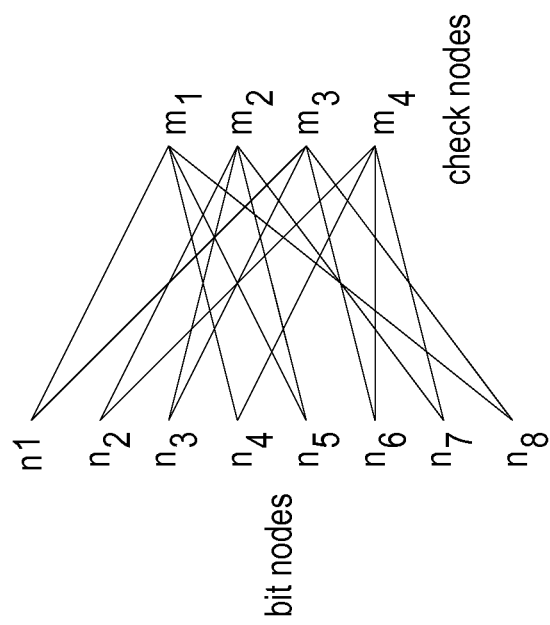

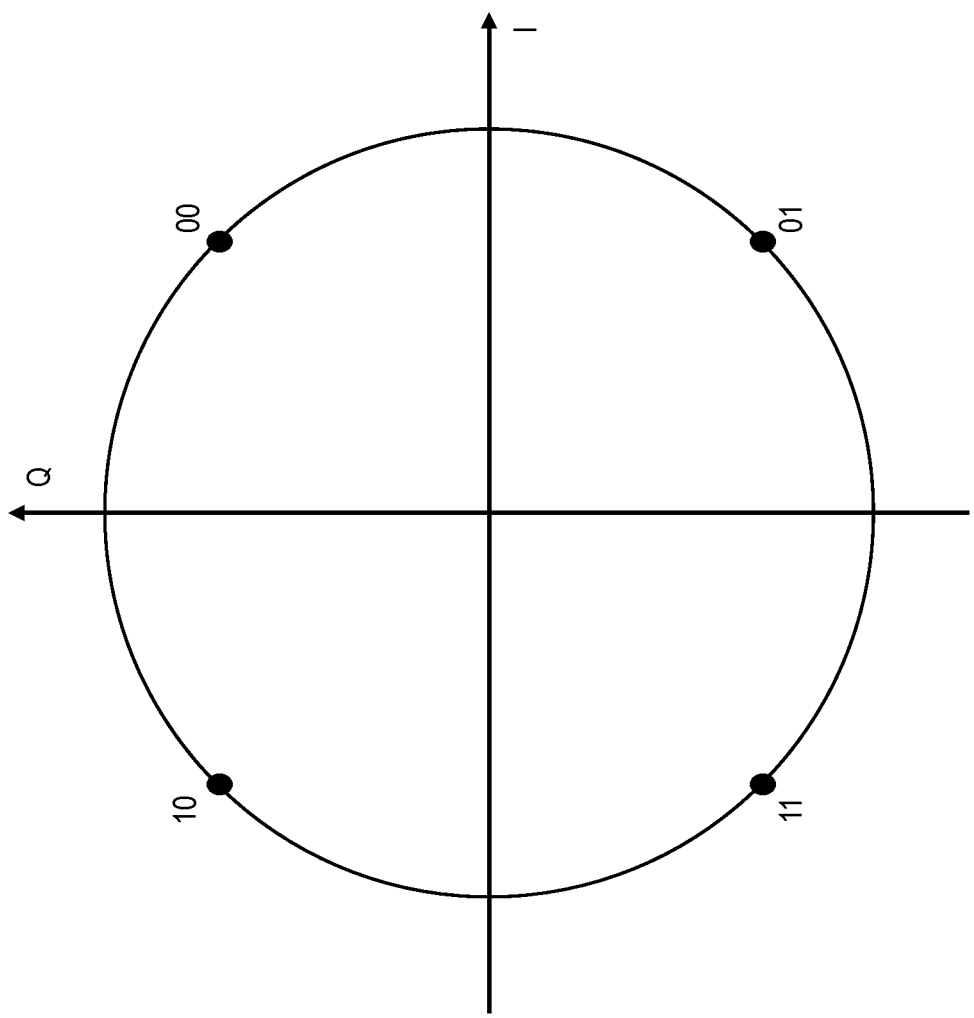

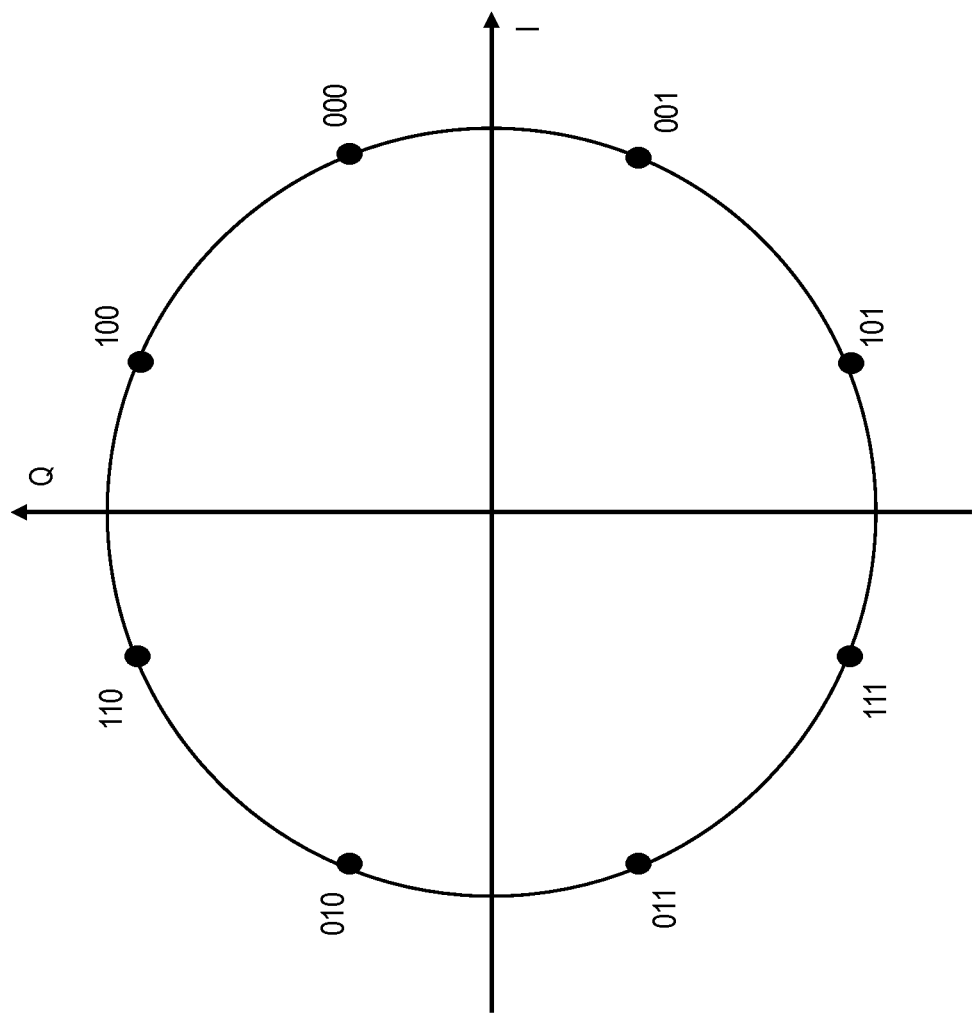

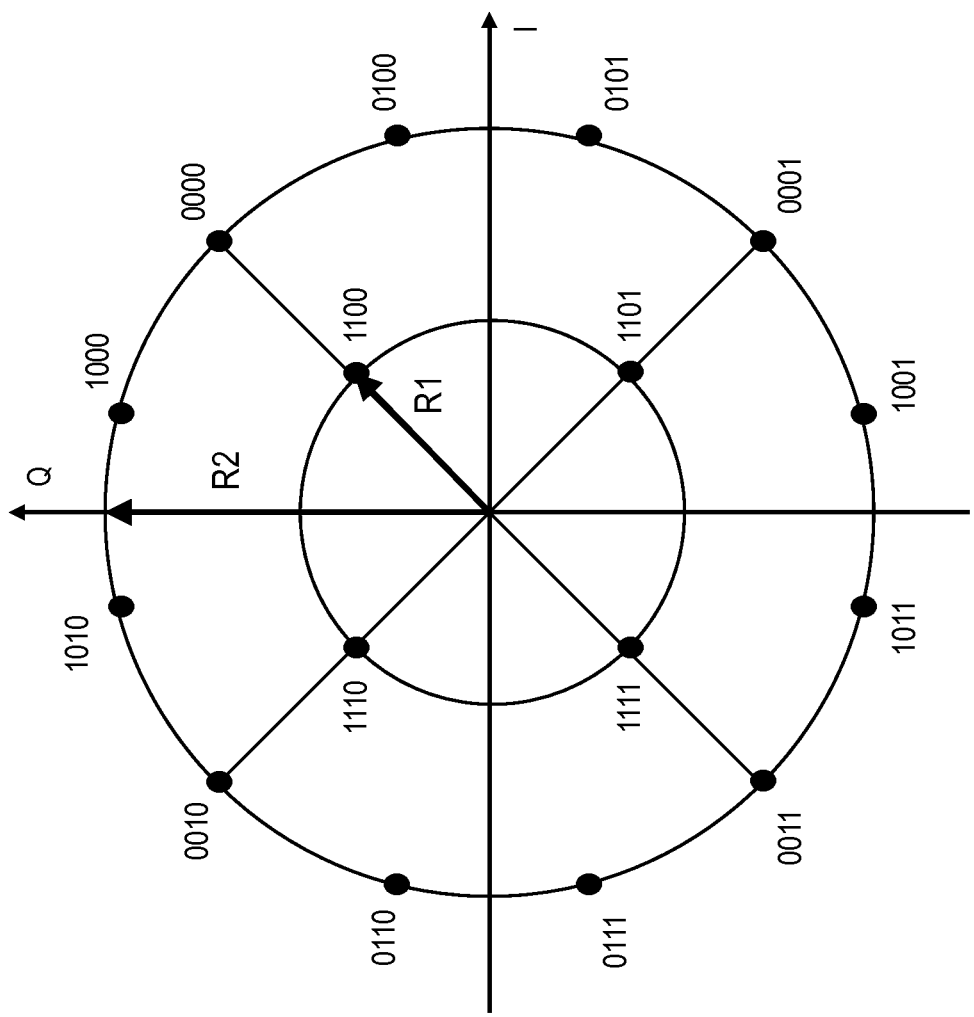

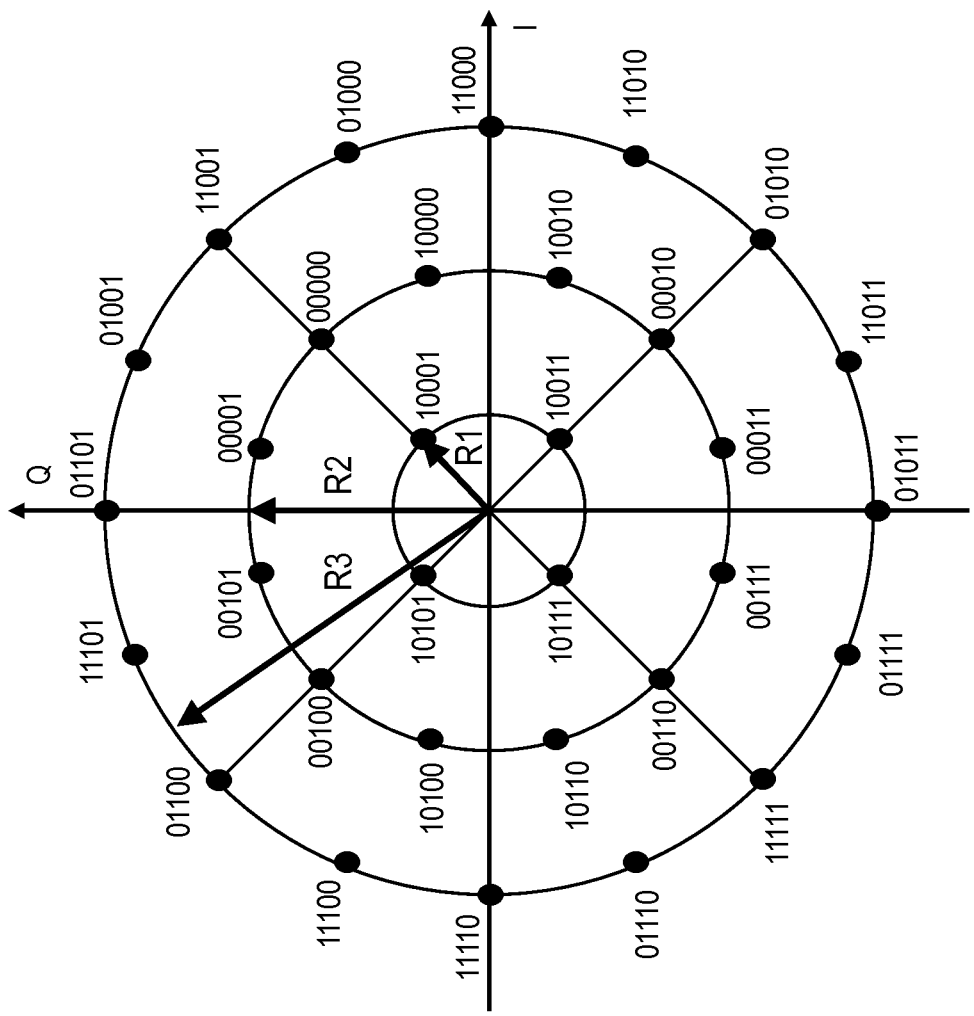

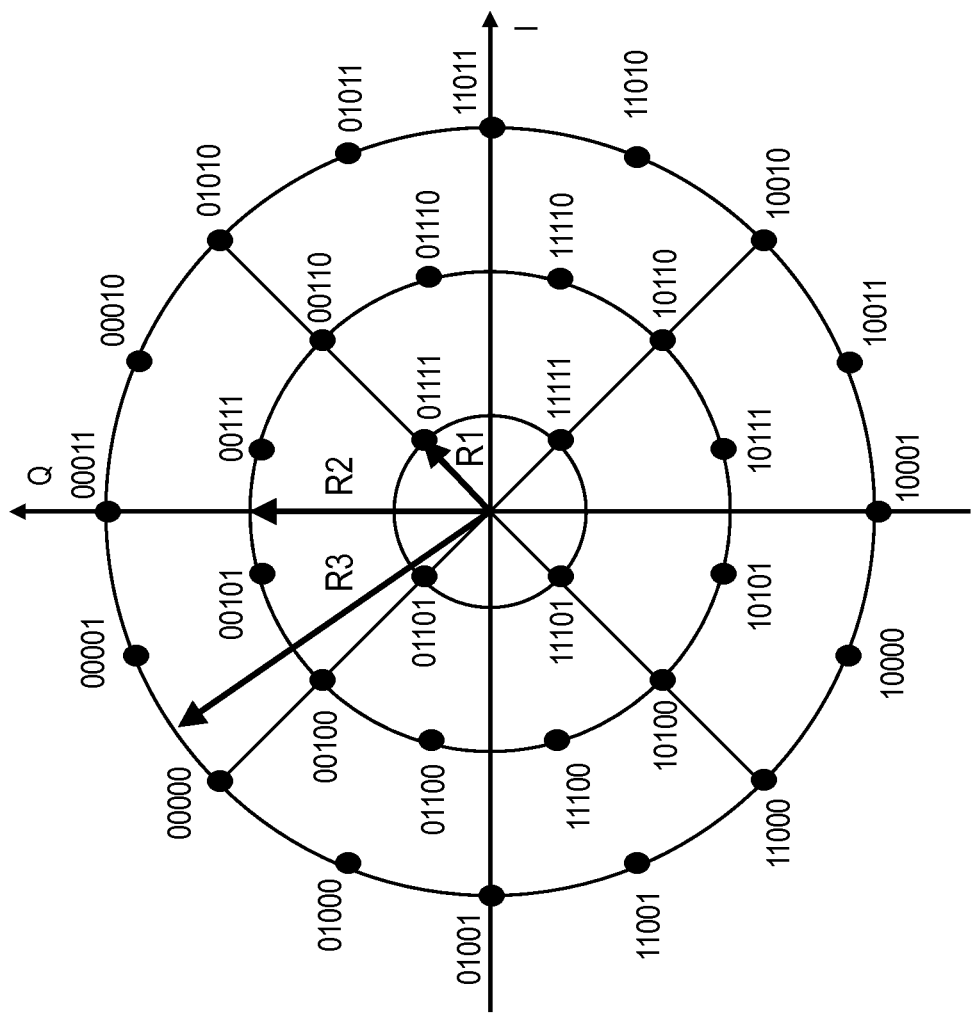

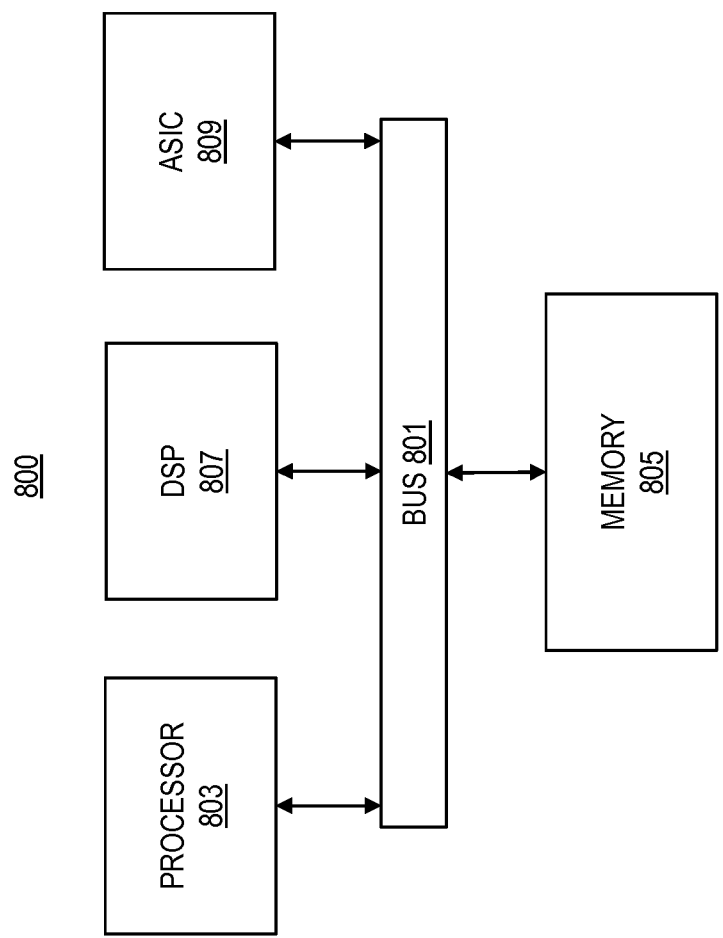

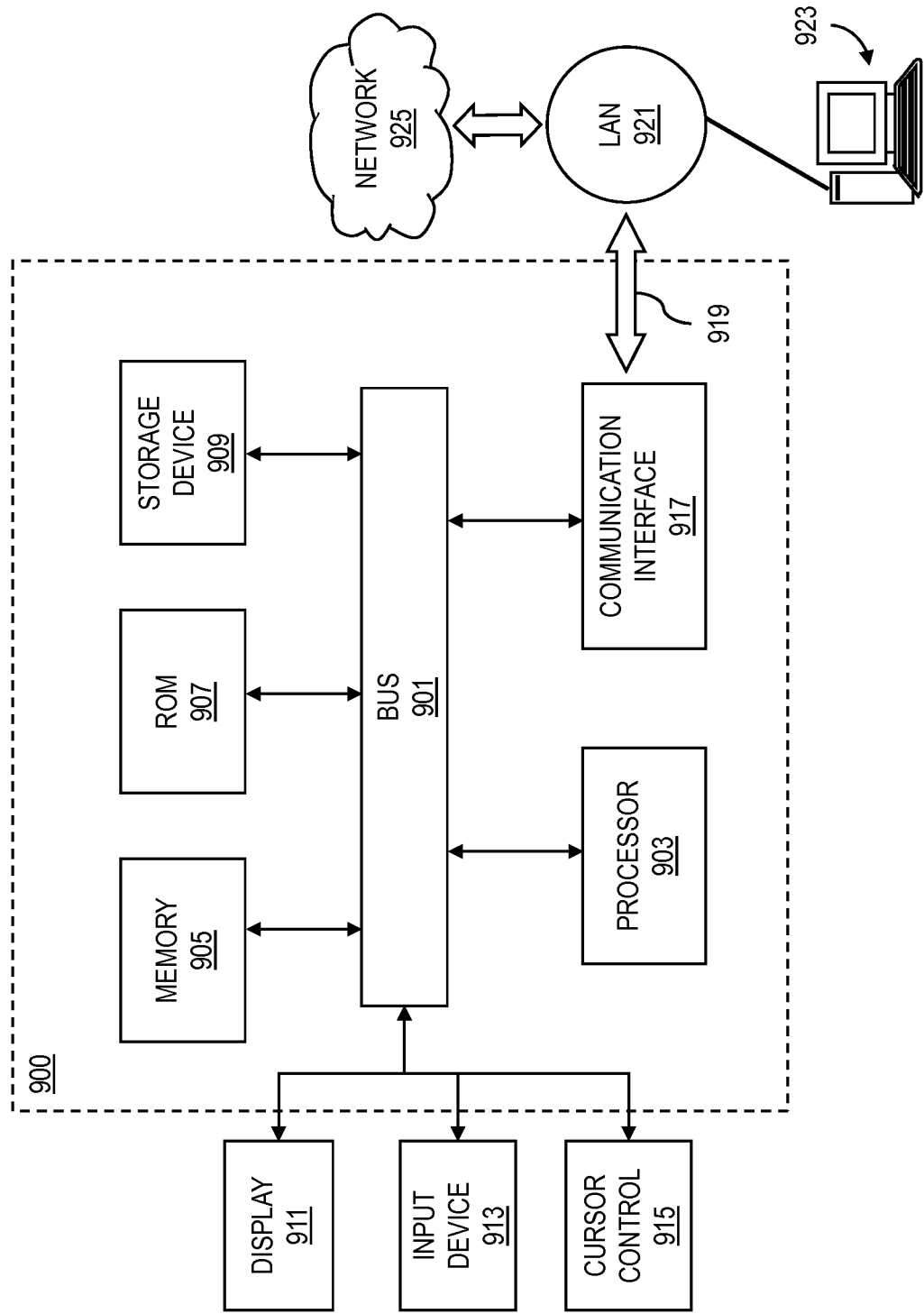

METHOD AND SYSTEM FOR PROVIDING LOW DENSITY PARITY CHECK (LDPC) ENCODING AND DECODING

This application is a Continuation-In-Part (CIP) of co-pending U.S. patent application Ser. No. 12/707,766, filed Feb. 18, 2010, titled Method and System for Providing Low Density Parity Check (LDPC) Encoding and Decoding, which is incorporated herein by reference in its entirety.

BACKGROUND OF THE INVENTION

Communication systems employ coding to ensure reliable communication across noisy communication channels. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Also, a key challenge in LDPC code implementation has been how to achieve the connection network between several processing engines (nodes) in the decoder. Further, the computational load in the decoding process, specifically the check node operations, poses a problem.

Therefore, there is a need for an LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding. There is a further need for a scheme that simplifies the communication between processing nodes in the LDPC decoder.

Some Exemplary Embodiments

These and other needs are addressed by the present invention, wherein various approaches are provided for encoding and decoding information bits of a source signal based on structured Low Density Parity Check (LDPC) codes.

According to exemplary embodiments of the present invention, a method comprises encoding information bits of a source signal based on a structured parity check matrix of a Low Density Parity Check (LDPC) code. The LDPC code is represented by stored information reflecting a tabular format of rows and columns, wherein each row represents occurrences of one values within a respective column of the parity check matrix, and wherein the columns of the parity check matrix are derived according to a predetermined operation based on the respective rows of the stored information. One or more blocks of information bits of the source signal are encoded based on the LDPC code to generate an encoded signal. The encoding of the blocks of information bits is performed based on blocks, where each block is of a size of $k_{ldpc}$ information bits, and the resulting encoded block is of a size of $n_{ldpc}$ code bits including parity bits $p_i$, $i=0, 1, 2, \ldots, n_{ldpc}-k_{ldpc}-1$. Parity bit accumulators $a_i$ are initialized such that $a_0=a_1= \ldots =a_{n_{ldpc}-k_{ldpc}-1}=0$. For a one of the blocks of information bits, the block is divided into j sequential groups (each of a size of M information bits), and for $j=1, 2, 3, \ldots k_{ldpc}/M$: (1) a first information bit of a $j^{th}$ group is accumulated in certain of the parity bit accumulators reflected by accumulator addresses based on a $j^{th}$ row of the stored information; and (2) the remaining (M−1) information bits of the $j^{th}$ group are accumulated in certain of the parity bit accumulators reflected by accumulator addresses according to $\{x+m \bmod M*q\} \bmod(n_{ldpc}-k_{ldpc})$, wherein x denotes an address of the parity bit accumulator corresponding to the first bit of the group, and $q=(n_{ldpc}-k_{ldpc})/M$. After all of the information bits of the one block are accumulated, certain operations (e.g., reflecting a single belief algorithm) are sequentially performed (with respect to the parity bit accumulators) according to $a_i=a_i \oplus a_{i-1}$, $i=1, 2, \ldots (n_{ldpc}-k_{ldpc}-1)$, where the additions are in Galois Field (GF) 2. The parity bits $p_i$, $i=0, 1, \ldots (n_{ldpc}-k_{ldpc}-1)$ are respectively reflected by the resulting parity bit accumulators $a_i$, $i=0, 1, \ldots (n_{ldpc}-k_{ldpc}-1)$. Further, the LDPC code may be structured to facilitate use of a plurality of parallel engines for decoding the encoded signal.

According to further exemplary embodiments of the present invention, a method comprises encoding information bits of a source signal based on a structured parity check matrix of a Low Density Parity Check (LDPC) code. The LDPC code is represented by stored information reflecting a tabular format of rows and columns, wherein each row represents occurrences of one values within a respective column of the parity check matrix, and wherein the columns of the parity check matrix are derived according to a predetermined operation based on the respective rows of the stored information. One or more blocks of information bits of the source signal are encoded based on the LDPC code to generate an encoded signal. The encoding of the blocks of information bits is performed based on blocks, where each block is of a size of $k_{ldpc}$ information bits, and the resulting encoded block is of a size of $n_{ldpc}$ code bits including parity bits $p_i$, $i=0, 1, 2, \ldots, n_{ldpc}-k_{ldpc}-1$. Parity bit accumulators $a_i$ are initialized such that $a_0=a_1= \ldots =a_{n_{ldpc}-k_{ldpc}-1}=0$. For a one of the blocks of information bits, the block is divided into j sequential groups (each of a size of M information bits), and for $j=1, 2, 3, \ldots k_{ldpc}/M$: (1) a first information bit of a $j^{th}$ group is accumulated in certain of the parity bit accumulators reflected by accumulator addresses based on a $j^{th}$ row of the stored information; and (2) the remaining (M−1) information bits of the $j^{th}$ group are accumulated in certain of the parity bit accumulators reflected by accumulator addresses according to $$\{x+m \bmod M\} - \left\{ \frac{x+m \bmod M}{M} - \frac{x}{M} \right\} * M,$$

wherein x denotes an address of the parity bit accumulator corresponding to the first bit of the group. Further, within the brackets { } of the second term of the foregoing formula for determining the accumulator addresses, the division for each term $$\left( \text{that is } \frac{x+m \bmod M}{M} \text{ and } \frac{x}{M} \right)$$

reflects integer division, whereby the result of the division equals the integer quotient and the numbers to the right of the decimal point are ignored). For example, a quotient of 5.952 would be converted to 5 and not rounded up to 6. As such, the result within the brackets { } should be either 0 or 1. After all of the information bits of the one block are accumulated, certain operations (e.g., reflecting a layered belief algorithm) are sequentially performed (with respect to the parity bit accumulators). The parity bits $p_i$, i=0, 1, . . . ($n_{ldpc}$–$k_{ldpc}$–1) are respectively reflected by the resulting parity bit accumulators $a_i$, i=0, 1, . . . ($n_{ldpc}$–$k_{ldpc}$–1). Further, the LDPC code may be structured to facilitate use of a plurality of parallel engines for decoding the encoded signal.

Additionally, according to other aspects of exemplary embodiments of the present invention, the encoded signal may be modulated according to a signal constellation comprising a one of the following: (1) a QPSK (Quadrature Phase Shift Keying) constellation having bit labeling and x-y bit positioning according to a certain predetermined structure; (2) an 8-PSK (Phase Shift Keying) constellation having bit labeling and x-y bit positioning according to a certain predetermined structure; (3) a 16-APSK (Amplitude Phase Shift Keying) constellation, of a 4+12 bit/ring format, having bit labeling and x-y bit positioning according to a certain predetermined structure; (4) a 32-APSK constellation, of a 4+12+16 bit/ring format, having bit labeling and x-y bit positioning according to a certain predetermined structure; (5) a 32-APSK constellation, of a 4+12+16 bit/ring format, having bit labeling and x-y bit positioning according to a certain predetermined structure.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A illustrates a block diagram of a transmitter employing an LDPC encoder and a modulator, according to exemplary embodiments of the present invention;

FIG. 2B illustrates a block diagram of a BCH encoder, an LDPC encoder and an interleaver, according to exemplary embodiments of the present invention;

FIG. 2C illustrates a flow chart of a process for performing shortening and puncturing in an LDPC coding process, according to exemplary embodiments of the present invention;

FIG. 2D illustrates a flow chart of a process for performing encoding, interleaving and modulating source information bits, according to exemplary embodiments of the present invention;

FIG. 3A illustrates a block diagram of a receiver, according to exemplary embodiments of the present invention;

FIG. 3B illustrates a flow chart depicting a process for decoding an encoded signal, according to exemplary embodiments of the present invention;

FIG. 4 illustrates a sparse parity check matrix, according to an exemplary embodiment of the present invention;

FIG. 5 illustrates a bipartite graph of an LDPC code of the matrix of FIG. 4, according to an exemplary embodiment of the present invention;

FIG. 6 illustrates a sub-matrix of a sparse parity check matrix, according to an exemplary embodiment of the present invention;

FIGS. 7A-7E illustrate modulation signal constellations, according to exemplary embodiments of the present invention;

FIG. 8 illustrates a block diagram of a chip set that can be utilized in implementing exemplary embodiments of the present invention; and FIG. 9 illustrates a block diagram of a computer system that can be utilized in implementing exemplary embodiments of the present invention.

Figure 1:
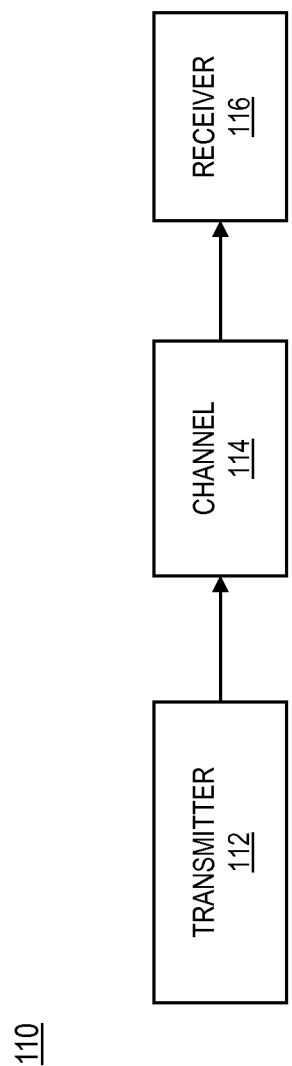
FIG. 1 illustrates a communications system capable of employing modulation and coding protocols, in accordance with exemplary embodiments of the present invention.

DESCRIPTION OF PREFERRED
EMBODIMENTS

A system, method, and software for efficiently encoding and decoding structured Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

FIG. 1 illustrates a communications system capable of employing modulation and coding protocols, in accordance with exemplary embodiments of the present invention. A digital communications system 110 includes a transmitter 112 that generates signal waveforms across a communication channel 114 to a receiver 116. In this discrete communications system 110, the transmitter 112 has a message source that produces a discrete set of possible messages; each of the possible messages has a corresponding signal waveform. These signal waveforms are attenuated, or otherwise altered, by communications channel 114. To combat the noise channel 114, LDPC codes are utilized.

The LDPC codes that are generated by the transmitter 112 enable high speed implementation without incurring any performance loss. These structured LDPC codes output from the transmitter 112 avoid assignment of a small number of check nodes to the bit nodes already vulnerable to channel errors by virtue of the modulation scheme (e.g., quadrature phase-shift keying (QPSK), offset quadrature phase-shift keying (OQPSK), 8-PSK, 16 amplitude phase-shift keying (16-APSK), 32-APSK, etc.).

Further, such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment, the transmitter 112 generates, using a relatively simple encoding technique, LDPC codes based on parity check matrices (which facilitate efficient memory access during decoding) to communicate with the receiver 116. The transmitter 112 employs LDPC codes that can outperform concatenated turbo+RS (Reed-Solomon) codes, provided the block length is sufficiently large.

FIG. 2A illustrates a block diagram of a transmitter employing an LDPC encoder and a modulator, according to exemplary embodiments of the present invention. As illustrated in FIG. 2A, a transmitter 200 can be equipped with an LDPC encoder 203 that accepts input from an information source 201 and outputs coded stream of higher redundancy suitable for error correction processing at the receiver 116. The information source 201 can generate K signals from a discrete alphabet, X. LDPC codes can be specified with parity check matrices. On the other hand, encoding LDPC codes may require, in general, specifying the generator matrices. Even though it is possible to obtain generator matrices from parity check matrices using Gaussian elimination, the resulting matrix is no longer sparse and storing a large generator matrix can be complex.

Encoder 203 generates signals from alphabet Y to a modulator 205 using a simple encoding technique that makes use of the parity check matrix by imposing structure onto the parity check matrix. According to certain embodiments, a restriction can be placed on the parity check matrix by constraining certain portion of the matrix to be triangular. The construction of such a parity check matrix is described more fully below in FIG. 6. FIG. 6 illustrates a sub-matrix of a sparse parity check matrix, according to an exemplary embodiment of the present invention. Such a restriction can result in negligible performance loss, and therefore, constitutes an attractive trade-off.

Modulator 205 maps the encoded messages from encoder 203 to signal waveforms that are transmitted to a transmit antenna 207, which emits these waveforms over the communication channel 114. Accordingly, the encoded messages are modulated and distributed to a transmit antenna 207. In certain exemplary embodiments, the modulation can include quadrature phase-shift keying (QPSK), offset quadrature phase-shift keying (OQPSK), 8-PSK, 16 amplitude phase-shift keying (16-APSK), and/or 32-APSK. According to further exemplary embodiments, further modulation schemes are envisioned. The transmissions from the transmit antenna 207 propagate to a receiver, as discussed below.

According to one embodiment, in the context of an OQPSK modulation scheme, for example, four different LDPC code rates are defined, as follows: 1/2, 2/3, 4/5, and 9/10, where, for each code rate, there are 22 different coded block sizes (coded bits), as follows: 720, 960, 1200, 1440, 1680, 1920, 2160, 2400, 2640, 2880, 3120, 3360, 3600, 3840, 4080, 4320, 4560, 4800, 5040, 5280, 5520 and 5760 coded bits, corresponding to from 3 up to 24 slots. Bursts longer than 24 slots may be obtained by coding multiple shorter LDPC codes of "almost equal" sizes. Of the 22 block sizes for each code rate, eight correspond to mother LDPC codes—which comprise the 720, 960, 1440, 2160, 2880, 3600, 4320, and 5760 bit blocks. The other 14 codes can be derived from another block size mother code by shortening and puncturing (as described further below).

According to a further embodiment, in the context of an 8-PSK modulation scheme, for example, three different LDPC code rates are defined, as follows: 2/3, 4/5, and 8/9, where, for each code rate, there are 15 different coded block sizes (coded bits), as follows: 720, 1080, 1440, 1800, 2160, 2520, 2880, 3240, 3600, 3960, 4320, 4680, 5040, 5400, and 5760, corresponding to from 2 up to 16 slots. Bursts longer than 16 slots may be obtained by coding multiple shorter LDPC codes of "almost equal" sizes. Of the 15 block sizes for each code rate, eight correspond to mother LDPC codes—which comprise the 720, 1080, 1440, 2160, 2880, 3600, 4320, and 5760 bit blocks. The other 7 codes can be derived from another block size mother code by shortening and puncturing (as described further below).

FIG. 2C illustrates a flow chart of a process for performing shortening and puncturing in an LDPC coding process, according to exemplary embodiments of the present invention. The number of shortened and punctured bits are denoted by XS and XP, respectively. With reference to FIG. 2C, for the shortening process, XS bits starting from index $XS_{start}$ in the input block are set to 0 before encoding (per step 221). After encoding, these bits are omitted from the resulting codeword before transmission (per steps 223 and 225).

According to one embodiment, at step 227, for example, for puncturing with rate 9/10 code (e.g., in the context of OQPSK modulation), the following XP systematic bits are not transmitted:

$$i_{k_{ldpc}-17XP+XP_{offset}}, i_{k_{ldpc}-17(XP-1)+XP_{offset}}, i_{k_{ldpc}-17(XP-2)+XP_{offset}}, \ldots, i_{k_{ldpc}-17\times3+XP_{offset}}, i_{k_{ldpc}-17\times2+XP_{offset}}, i_{k_{ldpc}-17+XP_{offset}};$$

and, as a further example, for puncturing with rate 1/2, 2/3 and 4/5 codes, the following XP parity bits are not transmitted:

$$p_{XP_{offset}}, p_{XP_{offset}+XP_{period}}, p_{XP_{offset}+2XP_{period}}, p_{XP_{offset}+2XP_{period}}, \ldots, p_{XP_{offset}+(XP-1)XP_{period}},$$

where $XP_{offset}$ and $XP_{period}$ are code dependent parameters (note that the first parity bit is denoted as $p_0$). For each block size that does not correspond to a mother code size, the parameters related to shortening and puncturing, as well as the mother codes, are given in Table 1κ below (where K and N denote the number of un-coded and coded bits, respectively). Moreover, if $K_{Mother}$ and $N_{Mother}$ denote the number of un-coded and coded bits of the mother code, respectively, then for the derived code: $K=K_{Mother}-XS$ and $N=N_{Mother}-XS-XP$.

TABLE 1a

| Rate/Block Size | XS | $XS_{start}$ | XP | $XP_{period}$ | $X_{offset}$ | Mother Code |
|---|---|---|---|---|---|---|
| 1/2 1200 | 120 | 0 | 120 | 6 | 0 | 1/2 1440 |
| 1/2 1680 | 240 | 0 | 240 | 4 | 0 | 1/2 2160 |
| 1/2 1920 | 120 | 0 | 120 | 9 | 0 | 1/2 2160 |
| 1/2 2400 | 240 | 0 | 240 | 4 | 0 | 1/2 2880 |
| 1/2 2640 | 120 | 0 | 120 | 12 | 0 | 1/2 2880 |
| 1/2 3120 | 240 | 0 | 240 | 7 | 6 | 1/2 3600 |
| 1/2 3360 | 120 | 0 | 120 | 15 | 0 | 1/2 3600 |
| 1/2 3840 | 240 | 0 | 240 | 9 | 0 | 1/2 4320 |
| 1/2 4080 | 120 | 0 | 120 | 18 | 0 | 1/2 4320 |
| 1/2 4560 | 600 | 0 | 600 | 3 | 0 | 1/2 5760 |
| 1/2 4800 | 480 | 0 | 480 | 3 | 0 | 1/2 5760 |
| 1/2 5040 | 360 | 0 | 360 | 8 | 0 | 1/2 5760 |
| 1/2 5280 | 240 | 0 | 240 | 12 | 0 | 1/2 5760 |
| 1/2 5520 | 120 | 0 | 120 | 24 | 0 | 1/2 5760 |
| 2/3 1200 | 160 | 480 | 80 | 6 | 0 | 2/3 1440 |
| 2/3 1680 | 320 | 720 | 160 | 3 | 0 | 2/3 2160 |
| 2/3 1920 | 160 | 720 | 80 | 9 | 0 | 2/3 2160 |
| 2/3 2400 | 320 | 960 | 160 | 6 | 0 | 2/3 2880 |
| 2/3 2640 | 160 | 960 | 80 | 12 | 0 | 2/3 2880 |
| 2/3 3120 | 320 | 1200 | 160 | 7 | 1 | 2/3 3600 |
| 2/3 3360 | 160 | 1200 | 80 | 15 | 0 | 2/3 3600 |
| 2/3 3840 | 320 | 1440 | 160 | 9 | 0 | 2/3 4320 |
| 2/3 4080 | 160 | 1440 | 80 | 18 | 0 | 2/3 4320 |
| 2/3 4560 | 800 | 1920 | 400 | 3 | 0 | 2/3 5760 |
| 2/3 4800 | 640 | 1920 | 320 | 3 | 0 | 2/3 5760 |
| 2/3 5040 | 480 | 1920 | 240 | 8 | 0 | 2/3 5760 |
| 2/3 5280 | 320 | 1920 | 160 | 7 | 3 | 2/3 5760 |
| 2/3 5520 | 160 | 1920 | 80 | 24 | 0 | 2/3 5760 |
| 4/5 1200 | 192 | 288 | 48 | 6 | 0 | 4/5 1440 |
| 4/5 1680 | 384 | 1104 | 96 | 4 | 0 | 4/5 2160 |
| 4/5 1920 | 192 | 432 | 48 | 9 | 0 | 4/5 2160 |
| 4/5 2400 | 384 | 576 | 96 | 6 | 0 | 4/5 2880 |
| 4/5 2640 | 192 | 576 | 48 | 12 | 0 | 4/5 2880 |

TABLE 1a-continued

| Rate/Block Size | XS | $XS_{start}$ | XP | $XP_{period}$ | $X_{offset}$ | Mother Code |
|---|---|---|---|---|---|---|
| 4/5 3120 | 384 | 720 | 96 | 7 | 4 | 4/5 3600 |
| 4/5 3360 | 192 | 720 | 48 | 15 | 0 | 4/5 3600 |
| 4/5 3840 | 384 | 864 | 96 | 9 | 0 | 4/5 4320 |
| 4/5 4080 | 192 | 864 | 48 | 18 | 0 | 4/5 4320 |
| 4/5 4560 | 960 | 1152 | 240 | 4 | 0 | 4/5 5760 |
| 4/5 4800 | 768 | 1152 | 192 | 6 | 0 | 4/5 5760 |
| 4/5 5040 | 576 | 1152 | 144 | 8 | 0 | 4/5 5760 |
| 4/5 5280 | 384 | 1152 | 96 | 12 | 0 | 4/5 5760 |
| 4/5 5520 | 192 | 1152 | 48 | 24 | 0 | 4/5 5760 |
| 9/10 1200 | 216 | 0 | 24 | N/A | 9 | 9/10 1440 |
| 9/10 1680 | 432 | 0 | 48 | N/A | 3 | 9/10 2160 |
| 9/10 1920 | 216 | 0 | 24 | N/A | 0 | 9/10 2160 |
| 9/10 2400 | 432 | 0 | 48 | N/A | 2 | 9/10 2880 |
| 9/10 2640 | 216 | 0 | 24 | N/A | 0 | 9/10 2880 |
| 9/10 3120 | 432 | 0 | 48 | N/A | 5 | 9/10 3600 |
| 9/10 3360 | 216 | 0 | 24 | N/A | 1 | 9/10 3600 |
| 9/10 3840 | 432 | 0 | 48 | N/A | 2 | 9/10 4320 |
| 9/10 4080 | 216 | 0 | 24 | N/A | 4 | 9/10 4320 |
| 9/10 4560 | 1080 | 0 | 120 | N/A | 0 | 9/10 5760 |
| 9/10 4800 | 864 | 0 | 96 | N/A | 0 | 9/10 5760 |
| 9/10 5040 | 648 | 0 | 72 | N/A | 4 | 9/10 5760 |
| 9/10 5280 | 432 | 0 | 48 | N/A | 2 | 9/10 5760 |
| 9/10 5520 | 216 | 0 | 24 | N/A | 4 | 9/10 5760 |

Further, for each mother LDPC code, the degree distribution of bit nodes is given in Table 1b below (where N denotes the total number of bit nodes—the coded block size). For each code, all of the check nodes except one have the same degree, namely $d_c=7$ for rate 1/2, $d_c=11$ for rate 2/3, $d_c=20$ for rate 4/5, and $d_c=34$ for rate 9/10. The remaining check node has degree one less.

TABLE 1b

| Rate | 8 | 7 | 6 | 5 | 4 | 3 | 2 | 1 |
|---|---|---|---|---|---|---|---|---|
| 1/2 | | | N/4 | | N/4 | | N/2-1 | 1 |
| 2/3 | N/6 | | | | N/6 | N/3 | N/3-1 | 1 |
| 4/5 | | | 2N/5 | | | 2N/5 | N/5-1 | 1 |
| 9/10 | | | | | N/2 | 2N/5 | N/10-1 | 1 |

According to a further embodiment, at step 227, for example, for puncturing with rate 8/9 code (e.g., in the context of 8-PSK modulation), the following XP systematic bits are not transmitted:

$$i_{k_{ldpc}-21XP+XP_{offset}}, i_{k_{ldpc}-21(XP-1)+XP_{offset}}, i_{k_{ldpc}-21(XP-2)+XP_{offset}}, \ldots, i_{k_{ldpc}-21\times3+XP_{offset}}, i_{k_{ldpc}-21\times2+XP_{offset}}, i_{k_{ldpc}-21+XP_{offset}},$$

and, as a further example, for puncturing with rate 2/3 and 4/5 codes, the following XP parity bits are not transmitted:

$$p_0, p_{XP_{period}}, p_{2XP_{period}}, \ldots, p_{(XP-1)_{period}},$$

where $XP_{offset}$ and $XP_{period}$ are code dependent parameters. For each block size that does not correspond to a mother code size, the parameters related to shortening and puncturing, as well as the mother codes, are given in Table 2a below (where K and N denote the number of un-coded and coded bits, respectively). Moreover, if $K_{Mother}$ and $N_{Mother}$ denote the number of un-coded and coded bits of the mother code, respectively, then for the derived code: $K=K_{Mother}-XS$ and $N=N_{Mother}-XS-XP$.

TABLE 2a

| Rate/Block Size | XS | $XS_{start}$ | XP | $XP_{period}$ | $XP_{offset}$ | Mother Code |
|---|---|---|---|---|---|---|
| 2/3 1800 | 240 | 720 | 120 | 6 | N/A | 2/3 2160 |
| 2/3 2520 | 240 | 960 | 120 | 8 | N/A | 2/3 2880 |
| 2/3 3240 | 240 | 1200 | 120 | 10 | N/A | 2/3 3600 |
| 2/3 3960 | 240 | 1440 | 120 | 12 | N/A | 2/3 4320 |
| 2/3 4680 | 720 | 1920 | 360 | 5 | N/A | 2/3 5760 |
| 2/3 5040 | 480 | 1920 | 240 | 8 | N/A | 2/3 5760 |
| 2/3 5400 | 240 | 1920 | 120 | 16 | N/A | 2/3 5760 |
| 4/5 1800 | 288 | 0 | 72 | 6 | N/A | 4/5 2160 |
| 4/5 2520 | 288 | 0 | 72 | 8 | N/A | 4/5 2880 |
| 4/5 3240 | 288 | 0 | 72 | 10 | N/A | 4/5 3600 |
| 4/5 3960 | 288 | 0 | 72 | 12 | N/A | 4/5 4320 |
| 4/5 4680 | 864 | 0 | 216 | 5 | N/A | 4/5 5760 |
| 4/5 5040 | 576 | 0 | 144 | 8 | N/A | 4/5 5760 |
| 4/5 5400 | 288 | 0 | 72 | 16 | N/A | 4/5 5760 |
| 8/9 1800 | 320 | 0 | 40 | N/A | 12 | 8/9 2160 |
| 8/9 2520 | 320 | 0 | 40 | N/A | 2 | 8/9 2880 |
| 8/9 3240 | 320 | 0 | 40 | N/A | 13 | 8/9 3600 |
| 8/9 3960 | 320 | 0 | 40 | N/A | 3 | 8/9 4320 |
| 8/9 4680 | 960 | 0 | 120 | N/A | 4 | 8/9 5760 |
| 8/9 5040 | 640 | 0 | 80 | N/A | 4 | 8/9 5760 |
| 8/9 5400 | 320 | 0 | 40 | N/A | 4 | 8/9 5760 |

Further, for each mother LDPC code, the degree distribution of bit nodes is given in Table 2b below (where N denotes the total number of bit nodes—the coded block size). For each code, all of the check nodes except one have the same degree, namely $d_c=11$ for rate 2/3, $d_c=20$ for rate 4/5, and $d_c=30$ for rate 8/9. The remaining check node has degree one less.

TABLE 2b

| Rate | 8 | 7 | 6 | 5 | 4 | 3 | 2 | 1 |
|---|---|---|---|---|---|---|---|---|
| 2/3 | N/6 | | | | N/6 | N/3 | N/3-1 | 1 |
| 4/5 | | | 2N/5 | | | 2N/5 | N/5-1 | 1 |
| 8/9 | | | 4N/9 | | 4N/9 | | N/9-1 | 1 |

With further respect to the LDPC coding, in accordance with exemplary embodiments, the LDPC encoder systematically encodes an information block of size $k_{ldpc}$, $i=(0, i_0, i_1, \ldots, i_{k_{ldpc}-1})$ into a codeword of size $n_{ldpc}$, $c=(i_0, i_1, \ldots i_{k_{ldpc}-1}, p_0, p_1, \ldots, p_{n_{ldpc}-k_{ldpc}-1})$. The transmission of the codeword starts in the given order from $i_0$ and ends with $p_{n_{ldpc}-k_{ldpc}-1}$. The task of the LDPC encoder is to determine $n_{ldpc}-k_{ldpc}$ parity bits $(p_0, p_1, \ldots, p_{n_{ldpc}-k_{ldpc}-1})$ for every block of $k_{ldpc}$ information bits $(i_0, i_1, \ldots, i_{k_{ldpc}-1})$. For example, the LDPC encoding process can be summarized as follows:

(1) Initialize the parity bit accumulators $a_0=a_1= \ldots = a_{n_{ldpc}-k_{ldpc}-1}=0$;

(2) For the first information bit $i_0$, accumulate $i_0$ at the respective parity bit accumulators according to the accumulator addresses specified in the first row of the table for the respective code rate and block size $(n_{ldpc})$—For example, Tables 5a through 5h and Tables 6a through 6j (below). In other words, each accumulator address specifies the reference number (i) for the respective accumulator $(a_i)$ at which the information bit is to be accumulated. For example, for rate 2/3 and block size 720 (Table 4, below), the following operations are performed:

$$a_{83}=a_{83} \oplus i_0$$

$$a_{117}=a_{117} \oplus i_0$$

$$a_{156}=a_{156} \oplus i_0$$

$$a_{169}=a_{169} \oplus i_0$$

$a_{231} = a_{231} \oplus i_0$ $a_{126} = a_{126} \oplus i_0$ $a_{112} = a_{112} \oplus i_0$ $a_{106} = a_{106} \oplus i_0$ (where all additions are in Galois Field (GF) 2 or modulo 2).

(3) For the next M−1 information bits $i_m$, (m=1, 2, . . . , M−1), accumulate the information bits at the respective parity bit accumulators according to the accumulator addresses {x+m mod M*q} mod($n_{ldpc}-k_{ldpc}$), where x denotes the address of the parity bit accumulator corresponding to the first bit $i_0$, M is the number of columns of a respective edge RAM (per Tables 3a and 3b, below), and $$q = \frac{n_{ldpc} - k_{ldpc}}{M}.$$

Continuing with the rate 2/3 and block size 720 example (Table 4), with M=30 and q=8, for information bit $i_1$, the following operations are performed:

$a_{91} = a_{91} \oplus i_1$ $a_{125} = a_{125} \oplus i_1$ $a_{164} = a_{164} \oplus i_1$ $a_{177} = a_{177} \oplus i_1$ $a_{239} = a_{239} \oplus i_1$ $a_{134} = a_{134} \oplus i_1$ $a_{120} = a_{120} \oplus i_1$ $a_{114} = a_{114} \oplus i_1$ (where all additions are in GF (2)).

(4) For the $(M+1)^{st}$ information bit $i_M$, accumulate $i_M$ at the respective parity bit accumulators according to the accumulator addresses specified in the second row of the respective parity bit accumulator address table. Then, in a similar manner as in (3), for the next M−1 information bits $i_m$, (m=M+1, M+2, . . . , 2M−1), accumulate the information bits at the respective parity bit accumulators according to the addresses {x+m mod M*q} mod($n_{ldpc}-k_{ldpc}$), where x denotes the address of the parity bit accumulator corresponding to the information bit $i_M$ (e.g., based on the entries in the second row of the respective parity bit accumulator address table).

(5) In a similar manner, for every group of M new information bits, accumulate the information bits at the respective parity accumulators based on accumulator addresses obtained from a new row of the respective parity bit accumulator address table and the formula {x+m mod M*q} mod ($n_{ldpc}-k_{ldpc}$).

(6) After all of the information bits are exhausted, the final parity bits of the codeword are obtained as follows: (a) starting with i=1, sequentially perform the following operations (e.g., single belief operations or a single belief algorithm for a single belief decoding mode) with respect to the parity bit accumulators $a_i$, $a_i = a_i \oplus a_{i-1}$, for i=1, 2, . . . , $n_{ldpc}-k_{ldpc}-1$; and (b) the final content of the parity bits $p_i$ of the codeword c=($i_0$, $i_1$, . . . $i_{k_{ldpc}-1}$, $p_0$, $p_1$, . . . $p_{n_{ldpc}-k_{ldpc}-1}$) are reflected by the resulting parity bit accumulators $a_i$, (i=0, 1, . . . , $n_{ldpc}-k_{ldpc}-1$).

TABLE 3a

| Code Rate - Block Size | M |
|---|---|
| ½ - 720 | 60 |
| ½ - 960 | 60 |
| ½ - 1440 | 60 |
| ½ - 2160 | 60 |
| ½ - 2880 | 60 |
| ½ - 3600 | 60 |
| ½ - 4320 | 60 |
| ½ - 5760 | 60 |
| ⅔ - 720 | 30 |
| ⅔ - 960 | 40 |
| ⅔ - 1440 | 60 |
| ⅔ - 2160 | 60 |
| ⅔ - 2880 | 60 |
| ⅔ - 3600 | 60 |
| ⅔ - 4320 | 60 |
| ⅔ - 5760 | 64 |
| ⅘ - 720 | 48 |
| ⅘ - 960 | 32 |
| ⅘ - 1440 | 48 |
| ⅘ - 2160 | 54 |
| ⅘ - 2880 | 64 |
| ⅘ - 3600 | 60 |
| ⅘ - 4320 | 54 |
| ⅘ - 5760 | 64 |
| 9/10 - 720 | 36 |
| 9/10 - 960 | 48 |
| 9/10 - 1440 | 36 |
| 9/10 - 2160 | 54 |
| 9/10 - 2880 | 48 |
| 9/10 - 3600 | 60 |
| 9/10 - 4320 | 54 |
| 9/10 - 5760 | 64 |

TABLE 3b

| Code Rate - Block Size | M |
|---|---|
| ⅔ - 720 | 30 |
| ⅔ - 1080 | 45 |
| ⅔ - 1440 | 60 |
| ⅔ - 2160 | 60 |
| ⅔ - 2880 | 60 |
| ⅔ - 3600 | 60 |
| ⅔ - 4320 | 60 |
| ⅔ - 5760 | 64 |
| ⅘ - 720 | 48 |
| ⅘ - 1080 | 36 |
| ⅘ - 1440 | 48 |
| ⅘ - 2160 | 54 |
| ⅘ - 2880 | 64 |
| ⅘ - 3600 | 60 |
| ⅘ - 4320 | 54 |
| ⅘ - 5760 | 64 |
| 8/9 - 720 | 40 |
| 8/9 - 1080 | 30 |
| 8/9 - 1440 | 40 |
| 8/9 - 2160 | 60 |
| 8/9 - 2880 | 64 |
| 8/9 - 3600 | 50 |
| 8/9 - 4320 | 60 |
| 8/9 - 5760 | 64 |

TABLE 4

Address of Parity Bit Accumulators (Rate ⅔ - Coded Block Size 720)

```
83 117 156 169 231 126 112 106
120 169 106 27 188 213 22 159
160 121 106 203 196 141 174 135
64 137 226 91 180 85 166 7
82 7 198 148
134 24 9 83
149 160 1 151
```

TABLE 4-continued

Address of Parity Bit Accumulators (Rate ⅔ - Coded Block Size 720)

74 203 116 13
206 12 101
200 45 98
16 235 165
167 25 171
2 83 33
8 174 207
36 170 207
73 172 86

TABLE 5a

Address of Parity Bit Accumulators (Rate 9/10 - Coded Block Size 720)

10 62 53 15
54 56 5 3
8 34 23 45
10 60 23 27
6 70 51 65
26 38 23 67
18 22 25 1
12 28 5 61
36 44 7 49
20 46 29 69
6 22 31
46 37 51
54 18 65
32 11 17
46 32 15
0 3 45
44 24 63
64 45 23

TABLE 5b

Address of Parity Bit Accumulators (Rate 9/10 - Coded Block Size 960)

88 70 81 43
6 64 29 13
18 82 1 35
10 6 47 53
38 22 57 1
78 6 87 15
78 48 73 37
26 82 13 17
52 62 19 29
58 14 79 27
86 16 19
2 7 95
44 30 5
42 81 13
22 66 17
8 93 19
82 50 41
16 93 57

TABLE 5c

Address of Parity Bit Accumulators (Rate 9/10 - Coded Block Size 1440)

132 109 122 67
12 97 46 19
120 129 70 31
28 125 2 55
108 81 134 59
136 49 30 139
40 69 38 123
100 141 46 75
64 109 134 47
120 29 26 67
112 37 10 55

TABLE 5c-continued

Address of Parity Bit Accumulators (Rate 9/10 - Coded Block Size 1440)

136 53 122 103
80 17 34 115
40 61 46 71
132 81 18 7
12 113 6 143
108 113 122 11
108 69 110 63
124 141 2 115
100 133 18 15
133 0 51
106 40 115
101 62 67
136 17 50
80 10 75
37 126 19
40 25 122
40 129 143
12 66 83
17 7 74
52 17 23
8 21 94
117 119 80
70 104 25
66 43 73
88 98 111

TABLE 5d

Address of Parity Bit Accumulators (Rate 9/10 - Coded Block Size 2160)

36 153 142 127
136 157 182 151
108 197 106 63
108 49 182 35
8 89 134 43
56 105 30 175
104 181 66 115
96 5 78 211
52 57 194 119
128 97 2 23
196 37 2 171
184 177 10 15
56 17 2 43
84 121 142 35
8 21 62 107
184 193 46 7
160 205 42 107
120 181 122 103
196 153 46 163
72 105 202 11
31 86 157
176 186 129
0 27 201
140 154 191
155 6 105
124 118 55
44 197 87
60 189 206
121 8 215
206 93 43
136 94 65
28 178 51
110 59 144
149 98 12
149 107 184
61 122 99

TABLE 5e

Address of Parity Bit Accumulators (Rate 9/10 - Coded Block Size 2880)

92 133 95 39
78 91 251 284

TABLE 5e-continued

Address of Parity Bit Accumulators (Rate 9/10 - Coded Block Size 2880)

262 92 89 204
15 226 74 150
73 39 28 47
258 175 57 160
171 286 97 12
208 69 108 59
164 4 171 217
50 245 171 139
18 122 35 97
30 26 160 53
81 72 286 20
236 259 66 105
11 0 146 7
196 95 168 194
1 129 64 29
241 177 250 47
151 53 184 192
59 52 21 84
248 87 264 280
103 278 137 154
175 56 273 192
43 80 183 95
134 245 142 33
229 18 196 200
186 188 251 33
43 33 250 74
6 55 77 261
282 139 286 227
135 163 89
252 151 250
138 286 205
32 137 4
44 87 137
192 158 189
138 50 173
236 15 94
82 285 281
133 249 191
114 1 128
96 193 76
1 242 153
284 156 53
42 92 160
113 247 81
196 275 103
168 117 262
116 166 137
177 8 125
115 9 6
199 219 18
208 138 73
14 154 101

TABLE 5f

Address of Parity Bit Accumulators (Rate 9/10 - Coded Block Size 3600)

212 271 274 5
122 345 127 59
138 71 189 157
60 256 26 143
234 105 190 224
240 217 129 58
135 2 349 221
227 336 171 194
358 169 77 330
34 235 174 269
74 261 28 235
126 50 345 130
302 42 31 15
214 47 79 339
89 180 178 9
38 192 89 49
332 256 222 183
187 140 88 137

TABLE 5f-continued

Address of Parity Bit Accumulators (Rate 9/10 - Coded Block Size 3600)

213 307 190 137
225 258 289 233
188 336 85 93
98 352 333 17
324 62 244 149
108 19 242 292
340 303 65 150
166 95 282 169
278 61 113 234
122 207 52 107
37 296 135 178
330 271 200 339
176 243 203
284 202 249
210 350 9
61 126 16
253 317 108
91 298 287
160 237 31
72 247 124
38 347 169
113 346 24
266 21 108
188 267 269
298 117 275
332 216 163
317 130 146
272 82 193
30 129 77
282 7 327
292 319 5
99 276 305
125 169 303
80 225 60
92 304 7
36 86 46

TABLE 5g

Address of Parity Bit Accumulators (Rate 9/10- Coded Block Size 4320)

273 190 207 371
331 258 135 416
306 12 291 293
262 215 396 74
14 193 91 207
384 341 260 81
128 365 170 9
336 396 413 238
16 407 130 4
42 323 54 85
6 103 349 176
216 286 426 277
425 416 419 322
289 164 379 189
1 292 319 363
345 132 134 423
366 146 381 235
88 111 206 4
121 426 307 254
203 244 406 216
7 275 53 76
329 418 416 84
233 293 351 368
153 410 101 183
196 400 170 65
192 357 31 43
46 245 428 304
51 1 144 351
319 321 413 298
350 213 244 210
387 166 367 228
297 178 83 238
97 428 266 165
197 423 115 265

TABLE 5g-continued

Address of Parity Bit Accumulators (Rate 9/10- Coded Block Size 4320)

43 104 172 122
144 227 407 65
166 210 73 311
94 351 154 357
64 172 30 13
320 243 412 318
392 346 252
286 13 207
208 277 178
67 161 394
351 45 17
295 196 251
326 356 145
168 411 262
54 51 177
398 148 355
330 168 399
161 312 50
419 65 327
61 374 232
28 69 303
298 116 221
52 270 165
103 398 283
243 184 364
348 7 209
362 221 187
343 184 190
265 306 277
56 25 34
325 345 60
198 344 113
68 41 171
253 56 188
431 27 256
106 421 22
274 279 67
298 294 79

TABLE 5h

Address of Parity Bit Accumulators (Rate 9/10 - Coded Block Size 5760)

35 247 105 399
280 268 513 68
161 104 460 466
156 253 305 393
72 489 178 202
398 199 151 383
92 527 54 224
200 409 42 147
459 569 553 312
242 180 155 10
216 458 361 318
104 489 206 52
22 56 123 538
264 295 130 29
263 28 274 239
276 124 449 21
360 482 519 253
225 202 212 312
268 338 558 200
43 291 436 27
84 231 40 521
95 142 558 361
475 462 319 419
84 74 522 573
451 188 526 263
226 159 440 491
415 434 60 215
553 250 72 209
18 436 311 210
327 524 536 18
15 211 11 453
22 452 289 305

TABLE 5h-continued

Address of Parity Bit Accumulators (Rate 9/10 - Coded Block Size 5760)

351 187 343 240
98 33 493 147
100 176 188 384
379 347 349 332
532 518 483 445
496 203 269 304
459 344 311 574
128 429 538 527
479 125 43 508
228 315 416 231
417 558 501 190
498 526 341 505
270 381 517 260
12 481 91
44 540 104
339 295 172
467 569 121
137 474 221
567 444 506
104 526 327
547 134 519
522 262 547
37 375 377
455 400 327
325 213 390
6 167 11
363 160 541
337 185 61
225 7 233
450 407 323
288 38 463
95 274 279
377 423 411
227 558 156
114 497 471
22 73 296
508 393 182
304 239 183
415 322 332
28 500 106
470 358 505
461 302 342
68 255 90
416 368 487
177 531 161
84 314 391
310 392 367
177 19 102
130 366 25

TABLE 6a

Address of Parity Bit Accumulators (Rate 2/3 - Coded Block Size 1080)

78 323 226 335 169 288 12 213
328 321 122 163 12 37 310 223
344 97 346 195 180 325 22 311
56 121 26 187 148 109 302 119
332 251 289 166
197 24 303 313
258 228 239 181
232 154 323 182
6 282 77
162 3 199
295 112 251
33 50 61
139 208 95
228 121 216
356 302 349
201 324 14

TABLE 6b

Address of Parity Bit Accumulators (Rate ⅘ - Coded Block Size 1080)

90 67 188 117 28 125
186 1 146 99 22 197
60 85 44 147 118 41
42 133 8 75 142 17
30 97 158 93 46 71
30 109 182 195 16 143
60 10 105
33 166 185
142 85 168
86 133 159
104 137 91
24 110 167
31 36 46
142 186 63
89 139 116
99 5 88
176 195 193
12 44 185
168 37 146 141 166 101
66 37 200 45 136 89
90 19 152 111 94 179
84 211 26 183 64 113
60 1 80 129 190 179
6 121 20 159 88 131

TABLE 6c

Address of Parity Bit Accumulators (Rate ⅘ - Coded Block Size 720)

34 78 37 17
72 76 43 35
2 4 79 37
40 60 51 17
4 70 59 49
50 22 63 31
46 20 69 73
40 70 57 55
38 22 43
46 40 71
14 17 61
26 21 45
4 36 1
60 26 33
46 55 21
36 27 13

TABLE 6d

Address of Parity Bit Accumulators (Rate ⅚ - Coded Block Size 1080)

20 77 70 31
96 45 86 3
24 65 34 3
0 21 74 67
28 5 106 71
16 41 18 95
72 17 6 59
40 69 22 71
64 101 86 83
96 85 46 119
96 37 70 99
0 89 46 59
80 65 74 63
44 57 102 79
76 5 54 115
8 109 74 119
32 105 118
48 57 62
44 89 30
80 97 114
60 65 115
40 5 111
52 9 27

TABLE 6d-continued

Address of Parity Bit Accumulators (Rate ⅚ - Coded Block Size 1080)

108 105 79
116 38 47
32 38 79
36 34 51
56 94 119
49 114 119
21 78 51
1 22 87
37 66 15

TABLE 6e

Address of Parity Bit Accumulators (Rate ⅚ - Coded Block Size 1440)

68 49 138 87
16 89 62 39
140 1 106 75
12 141 46 67
100 9 26 87
12 41 94 83
128 73 106 35
20 113 10 55
16 81 122 135
136 97 38 111
140 77 102 143
60 105 86 71
88 61 130 39
136 121 134 75
92 145 98 151
12 5 50 7
64 125 94
152 9 6
56 9 130
96 93 114
60 93 103
48 157 139
132 157 115
72 61 79
64 14 31
80 130 95
140 46 131
92 74 139
5 122 75
145 14 19
121 22 143
121 86 119

TABLE 6f

Address of Parity Bit Accumulators (Rate ⅚ - Coded Block Size 2160)

116 121 22 107
120 113 90 115
168 225 70 199
208 137 190 99
220 113 34 207
52 177 94 235
204 229 66 171
100 85 218 123
16 113 2 23
96 73 26 159
120 169 138 199
104 65 130 139
96 161 194 143
104 209 226 39
236 125 182 79
140 13 50 79
28 193 118
188 89 34
224 61 50
128 81 46
156 9 111
156 37 175

TABLE 6f-continued

Address of Parity Bit Accumulators (Rate 8/9 - Coded Block Size 2160)

72 105 239
64 137 131
176 182 135
148 18 95
100 54 215
224 174 103
165 238 87
145 214 207
89 182 55
53 38 159

TABLE 6g

Address of Parity Bit Accumulators (Rate 8/9 - Coded Block Size 2880)

33 174 30 142
266 282 240 78
291 229 80 43
156 132 134 303
50 31 287 239
68 186 92 75
59 203 255 37
171 139 287 45
101 23 89 52
20 271 38 109
84 32 111 225
183 314 101 110
142 163 44 25
206 302 173 5
86 272 18 39
237 199 140 86
248 159 56 167
215 283 76 254
190 187 148 291
310 57 53 99
90 134 151
199 111 30
227 148 51
167 33 294
190 147 173
84 175 108
35 317 138
111 300 73
306 292 224
106 307 274
202 153 79
58 195 131
10 249 242
51 9 28
275 6 287
54 246 313
106 88 49
315 42 218
265 212 239
85 306 147

TABLE 6h

Address of Parity Bit Accumulators (Rate 8/9 - Coded Block Size 3600)

267 282 5 84
96 78 167 18
276 240 117 303
136 175 169 324
117 73 360 4
379 398 265 253
146 11 62 89
114 227 342 31
26 284 295 49
239 137 124 350
118 266 191 155
213 310 20 73
384 231 396 323

TABLE 6h-continued

Address of Parity Bit Accumulators (Rate 8/9 - Coded Block Size 3600)

216 317 150 129
232 58 27 245
272 18 59 253
62 376 44 337
293 392 42 396
87 270 91 25
284 2 22 157
8 169 355 174
71 330 336 156
11 325 343 265
226 395 101 263
163 60 152 303
250 245 206 289
382 354 57 368
212 201 271 214
120 237 11 68
362 174 180 269
315 7 233 112
290 11 157 183
351 284 9
95 240 233
335 261 152
78 267 348
253 42 75
78 75 29
98 64 84
385 378 54
39 152 132
298 41 3
396 171 183
397 328 47
336 197 218
214 19 266
57 166 285
265 284 214
75 5 239
74 46 244
313 317 127
8 3 65
50 60 177
310 119 325
136 36 134
152 154 59
103 323 245
369 120 148
328 387 21
20 355 13
238 384 193
154 351 121
322 390 44
66 326 39

TABLE 6i

Address of Parity Bit Accumulators (Rate 8/9 - Coded Block Size 4320)

30 196 79 344
162 460 169 79
210 252 30 83
389 334 100 47
199 11 210 305
344 333 474 454
400 137 475 29
328 137 67 453
228 258 371 16
8 268 197 38
174 403 56 41
25 52 309 303
239 152 81 379
106 452 443 31
474 149 238 119
465 314 349 366
406 458 395 152
229 38 432 457
421 360 113 247

TABLE 6i-continued

Address of Parity Bit Accumulators (Rate 8/9 - Coded Block Size 4320)

244 144 178 315
189 97 212 62
375 166 356 397
2 307 79 436
385 314 411 287
159 389 392 190
77 115 316 118
50 284 59 53
329 67 277 42
177 466 331 380
144 335 402 52
48 449 126 151
160 273 70 143
53 440 436
321 262 469
271 379 374
55 394 181
279 57 168
176 225 134
322 267 220
418 203 308
270 332 257
398 82 379
104 167 117
141 82 168
119 332 470
370 165 96
361 51 463
225 363 460
468 151 461
103 444 357
359 357 203
188 1 350
379 385 256
274 393 123
408 434 142
96 426 414
343 22 106
277 434 108
363 110 257
407 85 353
204 45 307
424 39 230
376 41 346
416 259 124

TABLE 6j

Address of Parity Bit Accumulators (Rate 8/9 - Coded Block Size 5760)

353 507 64 261
477 315 226 338
72 128 203 524
180 202 549 634
189 460 321 307
339 402 117 164
461 342 193 78
145 236 119 63
100 365 496 418
210 341 285 136
376 482 304 510
468 31 274 75
587 550 182 409
30 365 461 19
184 599 351 66
28 627 2 475
143 352 175 161
163 637 166 159
33 138 486 307
580 583 384 8
573 524 380 465
510 366 451 154
93 258 525 304
358 286 434 410
458 26 442 565

TABLE 6j-continued

Address of Parity Bit Accumulators (Rate 8/9 - Coded Block Size 5760)

530 385 548 99
207 142 119 321
177 529 372 111
213 517 492 276
71 473 407 479
325 351 298 62
219 368 361 476
56 304 558 543
554 515 527 621
379 447 56 482
560 469 205 637
453 334 18 500
469 244 395 102
230 593 92 547
160 491 103 266
541 50 233
156 77 72
397 39 464
305 68 284
519 307 35
281 349 44
191 275 460
296 232 348
543 332 626
40 23 28
31 205 512
476 107 519
60 458 224
9 406 148
341 346 442
270 544 283
259 571 503
363 157 472
425 170 107
384 425 288
467 86 199
323 564 536
513 10 167
352 500 48
104 432 347
311 392 118
571 396 145
584 609 328
145 50 403
181 625 159
73 169 271
265 626 552
327 564 439
132 55 384
221 57 75
477 292 598
16 273 148
90 209 266
160 451 98
20 143 274

In accordance with further exemplary embodiments, with further respect to the LDPC coding, the LDPC encoder systematically encodes an information block of size $k_{ldpc}$, $i=(0, i_0, i_1, \ldots, i_{k_{ldpc}-1}$ into a codeword of size $n_{ldpc}$, $c=(i_0, i_1, \ldots i_{k_{ldpc}-1}, p_0, p_1, \ldots, p_{n_{ldpc}-k_{ldpc}-1})$. The transmission of the codeword starts in the given order from $i_0$ and ends with $p_{n_{ldpc}-k_{ldpc}-1}$. By way of example, the LDPC code parameters $(n_{ldpc}, k_{ldpc})$ are denoted as follows (Table 7):

TABLE 7

| Code Rate | LDPC Uncoded Block Length $k_{ldpc}$ | LDPC Coded Block Length $n_{ldpc}$ |
|---|---|---|
| 1/4 | 16200 | 64800 |
| 1/3 | 21600 | 64800 |
| 2/5 | 25920 | 64800 |

TABLE 7-continued

| Code Rate | LDPC Uncoded Block Length $k_{ldpc}$ | LDPC Coded Block Length $n_{ldpc}$ |
|---|---|---|
| 1/2 | 32400 | 64800 |
| 3/5 | 38880 | 64800 |
| 2/3 | 43200 | 64800 |
| 3/4 | 48600 | 64800 |
| 4/5 | 51840 | 64800 |
| 5/6 | 54000 | 64800 |
| 8/9 | 57600 | 64800 |
| 9/10 | 58320 | 64800 |

The task of the LDPC encoder is to determine $n_{ldpc} - k_{ldpc}$ parity bits $(p_0, p_1, \ldots, p_{n_{ldpc}-k_{ldpc}-1})$ for every block of $k_{ldpc}$ information bits $(i_0, i_1, \ldots, i_{k_{ldpc}-1})$. For example, the LDPC encoding process can be summarized as follows:

(1) Initialize the parity bit accumulators $a_0 = a_1 = \ldots = a_{n_{ldpc}-k_{ldpc}-1} = 0$;

(2) For the first information bit $i_0$, accumulate $i_0$ at the respective parity bit accumulators according to the accumulator addresses specified in the first row of the table for the respective code rate and block size ($n_{ldpc}$)—For example, Tables 8a through 8k (below). For example, for rate 9/10 (Table 8a, below), the following operations are performed:

$a_{405} = a_{405} \oplus i_0$ $a_{3342} = a_{3342} \oplus i_0$ $a_{3664} = a_{3664} \oplus i_0$ $a_{6278} = a_{6278} \oplus i_0$ (where all additions are in GF (2)).

(3) For the next M−1 information bits $i_m$, (m=1, 2, ..., M−1), accumulate the information bits at the respective parity bit accumulators according to the accumulator addresses $$\{x + m \bmod M\} - \left\{\frac{x + m \bmod M}{M} - \frac{x}{M}\right\} * M,$$

where (a) x denotes the address of the parity bit accumulator corresponding to the first bit $i_0$, (b) M is the number of columns of a respective edge RAM (e.g., 360), and $$q = \frac{n_{ldpc} - k_{ldpc}}{M}.$$

Here also, within the brackets { } of the second term of the foregoing formula for determining the accumulator addresses, the division for each term $$\left(\text{that is } \frac{x + m \bmod M}{M} \text{ and } \frac{x}{M}\right)$$

reflects integer division. Continuing with the rate 9/10 example (Table 8a), with M=360, for information bit $i_1$, the following operations are performed:

$a_{406} = a_{406} \oplus i_1$ $a_{3343} = a_{3343} \oplus i_1$ $a_{3665} = a_{3665} \oplus i_1$ $a_{6279} = a_{6279} \oplus i_1$ (where all additions are in GF(2)).

(4) For the (M+1)$^{st}$ information bit $i_M$, accumulate $i_M$ at the respective parity bit accumulators according to the accumulator addresses specified in the second row of the respective parity bit accumulator address table. Then, in a similar manner as in (3), for the next M−1 information bits $i_m$, (m=M+1, M+2, ..., 2M−1), accumulate the information bits at the respective parity bit accumulators according to the addresses $$\{x + m \bmod M\} - \left\{\frac{x + m \bmod M}{M} - \frac{x}{M}\right\} * M,$$

where x denotes the address of the parity bit accumulator corresponding to the information bit $i_M$ (e.g., based on the entries in the second row of the respective parity bit accumulator address table). Here also, within the brackets { } of the second term of the foregoing formula for determining the accumulator addresses, the division for each term $$\left(\text{that is } \frac{x + m \bmod M}{M} \text{ and } \frac{x}{M}\right)$$

reflects integer division.

(5) In a similar manner, for every group of M new information bits, accumulate the information bits at the respective parity accumulators based on accumulator addresses obtained from a new row of the respective Parity bit accumulator address table and the formula $$\{x + m \bmod M\} - \left\{\frac{x + m \bmod M}{M} - \frac{x}{M}\right\} * M.$$

(6) After all of the information (input) bits are exhausted, starting with M=1, sequentially perform the following operations (e.g., layered belief operations or a layered belief algorithm for a layered belief decoding mode) with respect to the parity bit accumulators $a_i$:

$a_M = a_M \oplus p_0$ $a_{2M} = a_{2M} \oplus a_M$ $a_{3M} = a_{3M} \oplus a_{2M}$ $\vdots \quad \vdots \quad \vdots$ $a_{n_{ldpc}-k_{ldpc}-M} = a_{n_{ldpc}-k_{ldpc}-M} \oplus a_{n_{ldpc}-k_{ldpc}-2M}$ $\vdots \quad \vdots \quad \vdots$ $a_1 = a_1 \oplus a_{n_{ldpc}-k_{ldpc}-M}$ $a_{M+1} = a_{M+1} \oplus a_1$ $a_{2M+1} = a_{2M+1} \oplus a_{M+1}$ $\vdots \quad \vdots \quad \vdots$ $a_{n_{ldpc}-k_{ldpc}-M+1} = a_{n_{ldpc}-k_{ldpc}-M+1} \oplus a_{n_{ldpc}-k_{ldpc}-2M+1}$ $\vdots \quad \vdots \quad \vdots$ $a_2 = a_2 \oplus a_{n_{ldpc}-k_{ldpc}-M+1}$ -continued $a_{M+2} = a_{M+2} \oplus a_2$ $a_{2M+2} = a_{2M+2} \oplus a_{M+2}$ $\vdots \qquad \vdots \qquad \vdots$ $a_{n_{ldpc}-k_{ldpc}-M+2} = a_{n_{ldpc}-k_{ldpc}-M+2} \oplus a_{n_{ldpc}-k_{ldpc}-2M+2}$ $\vdots \qquad \qquad \vdots$ $a_3 = a_3 \oplus a_{n_{ldpc}-k_{ldpc}-M+2}$ $a_{M+3} = a_{M+3} \oplus a_3$ $a_{2M+3} = a_{2M+3} \oplus a_{M+3}$ $\vdots \qquad \vdots \qquad \vdots$ $a_{n_{ldpc}-k_{ldpc}-M+3} = a_{n_{ldpc}-k_{ldpc}-M+3} \oplus a_{n_{ldpc}-k_{ldpc}-2M+3}$ $\vdots \qquad \qquad \vdots$ $a_{M-1} = a_{M-1} \oplus a_{n_{ldpc}-k_{ldpc}-2}$ $a_{2M-1} = a_{2M-2} \oplus a_{M-1}$ $a_{3M-1} = a_{3M-1} \oplus a_{2M-1}$ $\vdots \qquad \vdots \qquad \vdots$ $a_{n_{ldpc}-k_{ldpc}-1} = a_{n_{ldpc}-k_{ldpc}-1} \oplus a_{n_{ldpc}-k_{ldpc}-M-1}$ (7) The final content of the parity bits $p_i$ of the codeword $c=(i_0, i_1, \ldots i_{k_{ldpc}-1}, p_0, p_1, \ldots p_{n_{ldpc}-k_{ldpc}-1})$ are reflected by the resulting parity bit accumulators $a_i$, $(i=0, 1, \ldots, n_{ldpc}-k_{ldpc}-1)$.

TABLE 8a

Address of Parity Bit Accumulators (Rate 9/10)

405 3342 3664 6278
121 538 4579 4801
776 3102 3279 5298
135 1119 4225 6307
440 902 3893 5464
139 3289 5101 5543
1016 1893 3076 5942
2253 2759 5611 6055
335 1122 3260 5610
436 2337 2781 4648
2027 2451 5009 5137
1165 2440 4331 6125
1704 1858 3986 5327
938 2077 3080 5007
1239 1668 4309 4524
1464 2825 3640 4979
1682 3716 4081 5851
2709 2976 5931 6213
3811 5917 6342
1558 3818 4076
2290 5606 5807
2080 2467 4655
465 2866 4971
873 1881 4624
1301 2270 5161
1637 2567 4787
1380 4475 5563
258 2769 3845
240 1228 3387
46 5258 6393
583 1652 4139
2983 4137 5095
601 3064 3299
1821 6025 6123
775 3243 5674
822 3142 4768
3068 3255 6474
1006 2795 4896
2791 2997 5909
2583 3167 6427

TABLE 8a-continued

Address of Parity Bit Accumulators (Rate 9/10)

1395 4398 5579
608 2248 3277
2491 5104 5580
2437 4228 4444
246 568 3849
253 3723 4093
242 3968 6360
700 964 4904
1470 4714 5146
866 1382 3801
1107 3368 4559
1679 1981 6041
1868 5706 6063
1602 1894 5142
289 2726 4941
1943 3179 6347
2186 4446 5537
1055 3361 5448
531 2627 4448
1467 3414 5117
1738 4095 4628
1254 4214 5078
2218 5681 5936
272 5085 6284
139 1218 6269
576 3127 4258
1122 3584 3844
1795 4712 6092
1071 3754 4913
728 1868 3004
586 2425 2573
1986 3826 5894
217 1148 4123
1136 3201 3286
1138 4906 5344
548 3705 6148
2510 3974 4654
1846 2949 5959
2374 4890 6009
1495 2556 4359
582 4226 4406
233 3425 3922
1017 3734 5431
2358 5105 6251
260 418 2567
1627 2737 5360
788 3492 5646
1561 2057 4812
2147 5844 6217
952 2938 5458
1468 1837 4577
234 5186 6359
372 2505 2680
112 461 3311
1294 3488 6350
1377 2441 6280
841 2776 5751
295 2591 5086
1628 4822 5080
3920 5608 5788
641 3885 4916
1482 3689 5845
2930 3257 5936
750 4659 4733
1864 2899 4301
1068 1963 5753
2214 4295 4650
1367 3170 4306
1519 4107 5104
289 4410 4959
1252 5166 6162
389 1624 4422
1420 1543 4360
669 3321 3631
125 1396 3536
2955 5317 6367
561 2194 4127
2206 4179 6352

TABLE 8a-continued

Address of Parity Bit Accumulators (Rate 9/10)

794 3549 5771
2570 3692 4924
2001 3095 4990
2380 5638 6039
733 2805 3687
2704 3062 6013
187 2154 5745
861 1833 5750
1197 2312 4677
941 2008 4171
994 4565 5542
2058 3148 5976
789 1130 5079
448 4531 4763
1082 3375 5742
3455 5065 5744
621 1691 4313
90 4103 5953
1592 3266 3800
3144 5789 6418
270 2561 3650
668 2477 6348
2011 3060 4880
1490 3886 4777
122 2583 6348
2484 2643 5308
714 3867 4171
192 2798 3938
2420 4733 6067
647 1656 3776
85 6080 6232
1058 3109 4875
3035 3305 5118
1711 4216 6044
918 2044 4085
458 2522 4675
1113 2240 6268
1686 2087 5113
2385 2773 6280
1405 3216 5737
2016 4555 4733
853 3414 4395
3344 5214 5751
306 1153 5579

TABLE 8b

Address of Parity Bit Accumulators (Rate 8/9)

185 1982 5090 6885
2051 2208 6645 7139
463 930 3108 5287
267 4014 6164 6820
1118 1629 3252 5478
1939 2411 4705 6527
3131 3252 5283 6315
1376 4003 5928 6875
1744 2522 4828 5888
775 1312 4686 6012
1147 2917 5313 5516
1657 2852 3653 6751
2580 3234 5634 5767
2344 2721 4417 6418
179 3305 3726 7140
265 3322 4581 6309
443 2495 4394 4866
437 1796 3762 4139
768 1957 3793 3966
647 892 4421 5589
990 2583 2887 4756
1066 1924 3116 6195
1993 3020 5375 5699
2781 4456 6173 6700
1280 1782 3254 5823
1102 1476 3325 5079

TABLE 8b-continued

Address of Parity Bit Accumulators (Rate 8/9)

717 1636 5021 5053
718 1445 2691 5432
1965 3073 5711 6010
1941 2496 4802 6018
2517 3299 5556 6486
825 3944 5793 6425
666 2499 2522 4531
287 619 3347 3816
964 1328 4743 5169
1157 2369 4523 7043
127 4266 4568 6180
307 3640 4260 6893
292 4052 6794 7117
3713 4114 6485 7015
916 1840 4808 5220
139 438 3527 4645
654 1723 3612 4033
47 4410 4716 7198
1432 3782 4126 6347
41 1835 4267 5105
228 4313 5213 6963
894 3161 4884 5093
1561 2814 3746 6634
1393 1792 5407 5863
685 1078 2679 3088
1529 1937 5427 5781
1056 3146 4779 6602
649 2204 2568 6951
2768 3151 5521 6676
2074 2484 5833 6967
2398 3331 4515 5561
1280 3728 5934 6182
2485 3373 6190 6815
1141 3276 4393 6389
104 3339 7107
656 3450 5083
1912 3649 7037
273 2119 6733
916 4161 4570
2206 4605 6266
2610 3601 5771
723 1363 3961
2300 2790 6200
4199 4441 6771
1495 2820 5471
936 1329 5098
1475 5488 6486
1185 3676 4992
2330 5321 6307
2004 2901 5853
3133 3465 5656
120 4787 5879
384 1757 4790
701 2989 6954
193 3359 3727
1352 3685 4958
1982 2227 5529
1841 3055 6728
225 498 6919
2731 4716 6809
1503 2052 5524
1234 3886 5007
1341 4384 7124
434 868 6365
2928 5292 5711
2569 4525 7013
2659 3072 6131
541 995 5083
202 4311 5089
2258 6221 6630
1715 4295 6096
2435 4296 4435
900 3540 5913
1671 3425 5981
1627 2049 5389
1946 3883 4259
1194 3432 6018
1903 6028 7168

TABLE 8b-continued

Address of Parity Bit Accumulators (Rate 8/9)

67 3683 6193
2604 3891 5706
216 4278 4516
908 2717 5497
2309 4658 6455
1338 4593 6133
2279 5039 6588
334 4056 5129
3244 5460 6040
685 5104 6933
1369 2978 5006
2318 4819 7028
639 809 3032
585 1547 2797
966 3231 6705
1573 3363 6546
2085 6713 7136
1171 3970 5141
249 2769 4607
1519 4336 4827
377 1688 5622
3204 4717 6716
576 1078 3713
4697 5765 7128
1933 5226 6382
708 1625 2782
3166 5564 6505
808 2529 5679
64 1107 3749
1971 3071 4053
2298 4369 6479
1255 3962 5119
2359 5902 6978
169 3333 3750
739 3475 6479
2380 3302 6020
1153 2982 6933
108 3675 4989
1684 3397 4607
2468 3309 5749
1567 3494 5287
2695 5500 6779
1650 3987 5381
952 3655 5634
931 4061 5859
1862 3208 5942
114 1175 4355
59 3906 6452
1337 4180 7050
1052 2851 5200
2014 3149 6787
662 2573 4810
2249 6025 6192
1868 2250 6544
702 5004 6942
488 4582 6161

TABLE 8c

Address of Parity Bit Accumulators (Rate 5/6)

798 1195 3207 3556 5147 5412 7636 8021
181 3530 5203 5661 7617 8048 10135 10609
1462 1898 3635 3961 6209 6648 8552 9391
761 2127 2918 5450 7539 7636 9676 9809
1878 2332 5152 5494 7238 7765 9607 9727
181 3351 5105 5496 7409 7702 9598 10763
433 2788 3838 5588 5828 7800 8720 9731
488 2907 3472 6327 6569 8352 8930 10689
89 2842 5508 6026 7669 8121 10349 10699
1925 2231 4325 5010 6583 7643 8721 9846
1073 1231 3228 4187 5319 6420 7491 8521
154 2531 4592 5601 7458 7695 10201 10581
479 881 2553 5231 5431 7847 8862 9787
391 818 3787 4243 5817 7830 8104 10055

TABLE 8c-continued

Address of Parity Bit Accumulators (Rate 5/6)

97 588 2769 3729 5973 6278 8902 9993
2045 2185 4299 6169 6816 8287 8827 10767
507 1663 2729 3810 4901 5789 7930 9212
2496 2802 4651 5027 6717 7163 9596 10444
159 2056 4328 4854 6630 8590 9452 10469
105 1425 3252 3895 5416 6726 9204 9691
518 2749 3784 4758 5853 6843 8190 10706
331 2785 4978 5396 7162 8264 9814 10120
418 2240 2800 4818 6481 7079 8751 10595
1066 2927 4130 5387 6921 8198 9866 10247
25 3567 3892 5833 6308 7967 8287 10482
54 679 2617 4622 4734 6949 8644 9208
214 525 4266 4365 6258 6756 8899 9914
2030 2273 4200 4413 6808 6929 9081 10322
810 1196 3735 4282 6022 6390 8811 9881
869 3411 3871 5997 7129 8067 9328 10212
833 7114 8123
432 2458 4108
1764 7069 9592
4174 5900 7187
2292 5716 8280
2941 4153 5310
3285 3918 6052
794 3044 8493
1528 2043 4966
2117 9315 10277
1191 2175 6178
1469 5270 7449
1107 1504 6235
2293 4650 6746
839 4508 9493
1715 5088 8931
3454 4487 9120
2059 7336 9626
3162 4847 8433
3098 9173 9491
3195 6317 10336
1402 2396 7200
1190 4378 7312
3132 3499 10186
1505 1947 10088
1356 3312 9270
4853 7227 8577
1760 7218 9050
1124 1500 9030
1133 1501 8484
1277 2932 10769
369 6143 7263
2624 4740 8068
2270 5183 10587
1490 5278 5741
2996 5955 10051
2646 5143 7804
3515 5866 9203
2007 4063 7813
2784 6381 6663
1535 4845 8402
2345 6141 9480
7229 9659 10068
5821 8323 8658
388 5608 7239
4440 5599 8039
3254 3863 10116
145 4960 9463
4161 6533 6951
854 7196 8816
4022 7710 10676
1111 2194 8266
627 3218 3319
1884 4623 8735
1904 6509 9830
898 1433 3632
788 3712 8292
1668 7197 9130
330 4454 10156
244 9082 10160
2683 3844 4759
1266 1752 5956

TABLE 8c-continued

Address of Parity Bit Accumulators (Rate 5/6)

781 5063 10334
1256 1626 4876
1758 7765 8001
980 3659 7851
4149 8190 10202
92 3468 5352
825 5942 7041
3015 7100 10738
3478 5859 8168
3629 9571 9750
5503 6818 8354
3328 7496 10540
169 4810 9788
4408 5712 6625
1988 5507 9347
461 5210 8677
263 4203 8549
4588 7551 9631
2122 2239 8785
6645 9519 10624
2312 4343 8735
2199 4041 7078
1817 7474 8339
2908 6305 9881
3070 9077 10184
1137 6336 9262
437 2562 7750
671 2647 6444
3094 5542 5834
2498 4042 7138
3933 8184 8378
769 2671 9268
425 3579 5432
4120 4369 8476
546 3291 5723
2273 2530 7559
425 1494 5071
275 1890 9065
4492 5010 10023
147 1404 5990
4047 9339 10134
5177 7388 9568
2151 7534 10210
191 2601 6367
1124 3094 9452
1405 7140 9375
3908 9782 10082
1902 4924 8442
1706 4323 6831
1786 3732 6867
7563 8939 10016
5784 8885 10703
6173 8155 10542
3011 4950 7607
3283 8830 10655
895 5348 8081
2444 6732 7821
750 6367 6530

TABLE 8d

Address of Parity Bit Accumulators (Rate 4/5)

498 2356 3399 4631 5536 7415 9550 9825 11986
499 722 3381 4400 7825 8864 9980 10902 12000
923 1278 3976 5353 6383 7233 9807 11841 12067
1027 1141 3080 3450 6270 6615 8936 10053 12197
241 641 2589 3938 5948 7939 8405 10918 12913
1140 1748 3891 3977 5929 6450 8852 11141 11465
389 720 2956 3508 5292 6390 7424 9013 11890
913 2029 3157 6116 6139 8615 9640 10504 12410
1169 2356 3348 5141 5417 8732 9775 10888 11893
2068 2926 4223 6046 7006 9224 9651 12316 12691
1872 2497 4581 6490 8352 8820 10713 10983 12827
883 1338 2907 3415 6435 7383 9426 9937 11822

TABLE 8d-continued

Address of Parity Bit Accumulators (Rate 4/5)

2638 2906 5312 5413 8136 9226 10117 12244 12602
223 2800 4527 5538 6773 9346 9604 11204 12275
277 2712 3892 5465 5996 7851 10705 11551 12726
2053 2383 4042 4524 6654 7155 9091 9381 11287
1645 2733 3773 4901 5829 8913 9297 11284 12363
596 1703 2826 4657 4790 7024 7407 10286 10768
1260 7640 10440
413 1758 7516
6709 6900 11071
1638 11242 12568
247 4966 8252
2125 3685 7002
252 10234 11279
17 1921 5116
2515 4974 7892
2470 8033 12635
8169 10285 10536
7131 7997 11731
1646 4100 6581
5489 8335 10367
4315 5206 7834
3661 8534 10114
4825 8537 11665
4735 7855 11729
3636 7050 12359
5855 11577 12216
3709 4041 11974
1302 4819 9598
3726 5951 12780
439 6839 12862
6107 6862 10014
329 3400 9601
4365 4963 6828
2659 10871 12147
2956 5165 12608
1292 3562 8246
1694 9213 10369
558 1639 7845
5331 8084 10216
4385 4729 6706
5253 5424 11744
718 1662 8953
8672 9013 10984
3992 4522 9006
1971 3055 6477
6282 7542 9563
3542 10674 12427
2869 8558 8790
2382 7955 11422
2227 5687 10917
7260 10148 11466
866 2025 6459
807 8584 11291
3185 5589 8581
724 4213 10711
6951 7549 12599
2034 2386 10704
306 2866 11776
1115 7630 9974
226 7681 10061
1262 8047 11342
2579 11466 11672
5616 5900 9675
214 525 10189
2502 4013 9398
4192 8827 11901
749 8020 11632
2689 10394 12856
45 3331 12206
1852 3988 10681
1080 8893 11333
2708 11688 12168
144 4672 10289
6772 7703 8784
562 733 7714
768 5510 9791
519 9482 10071
1462 5139 9118

TABLE 8d-continued

Address of Parity Bit Accumulators (Rate 4/5)

1443 2000 4859
1636 3443 6279
2989 3370 5667
5155 6176 7256
2052 5261 7773
2950 8290 11050
5767 6931 7984
4358 6356 10596
2486 10860 12919
1421 3168 9846
5989 8551 10654
4504 4762 12565
4925 6522 10829
7308 8503 12839
2383 7034 7547
3957 9245 12567
3857 9346 12337
3692 6689 6950
3084 4828 7816
977 3692 6597
1538 7007 9577
623 8432 10784
6408 7355 10231
946 9879 12496
7515 8521 10900
4040 8421 10792
3361 5178 6908
2236 8735 10552
3647 6779 9745
5516 6702 12914
272 11360 11827
1847 4653 12103
25 7344 9583
2454 11437 12443
2047 4203 6137
6285 10091 11506
3281 4656 9090
4289 8798 12488
1220 9341 10946
73 3759 7981
6859 8176 10167
1755 4703 5322
1434 10905 12144
2380 3454 8174
1259 11673 12041
408 4852 12932
3116 5666 7879
2986 8641 10037
1022 6055 11595
1604 5858 7579
1860 5406 12830
2547 5839 9415
454 2602 4342
2697 5238 9006

TABLE 8e

Address of Parity Bit Accumulators (Rate 3/4)

755 3136 3253 5541 8180 13010 14277 15226
464 989 2773 3063 5246 5711 7829 10703
687 2174 5068 6955 8933 9180 12238 12247
620 868 3613 7063 7491 9977 11659 12231
1121 3221 3985 7303 8598 9677 11994 15459
239 3514 3734 5618 7483 9443 13290 14309
624 1641 4395 4791 8232 8520 11653 13714
1764 3468 3630 6883 8179 10354 10666 12589
5441 6021 9211 10116 11365 12476 15587 16031
1191 3709 4945 5821 9932 13549 13712 15675
4312 4559 6892 9729 11121 12847 14493 15725
2522 4963 7683 8080 10332 10545 13579 15279
2324 2660 4650 10336 12099 12402 14149 14535
6217 6529 9102 11077 11401 13051 14247 16145
1900 4014 6973 9765 10139 13297 15029 15931
356 3856 4735 8197 10020 13408 13819 16041

TABLE 8e-continued

Address of Parity Bit Accumulators (Rate 3/4)

589 3148 4079 5870 6141 9278 11221 11732
3162 5352 6442 7233 8287 11507 13756 15666
1600 8280 14758
8404 8921 13248
1796 8643 13329
3470 5959 10511
1771 2651 10918
5690 14326 14698
4969 7444 13930
3426 9264 13439
6079 7897 12750
731 5131 12199
4567 9453 15026
804 12393 12657
1363 2349 15827
2393 5056 11552
183 11487 15154
33 1989 15052
352 2157 14479
2459 2678 11725
7572 8993 11156
4590 10501 10934
3970 6836 16007
6430 6525 9597
2015 12757 14985
1842 6677 7692
12934 14875 15425
1165 6320 9437
1205 6831 8927
3986 8773 15795
7310 8501 14143
5813 10378 10472
3293 12137 15600
750 6051 8898
7955 13595 16006
947 6895 16179
1474 5536 11069
214 1979 5872
1373 1461 13091
8116 12210 15540
188 2677 6413
2785 6824 14251
2798 8431 12629
470 1655 3872
4471 6408 8522
8263 11449 16194
9329 9687 11535
21 6478 13326
2904 7141 11399
701 7076 11584
3166 5197 15397
5328 5731 7774
875 12344 15421
9177 13008 14984
3884 7246 14544
3334 6747 10089
4492 10028 13128
2463 12431 14331
2429 11404 14714
4661 11689 15261
6515 12787 14813
3354 9539 9857
9146 12412 12863
585 4001 7578
2300 7776 13341
3839 4001 14733
7541 9827 15058
5177 10853 12062
4861 10697 11004
1976 4984 9453
1118 10773 13950
1800 2888 4942
5525 10278 13858
1141 8799 14032
5552 8722 11930
3755 10366 15563
3879 6873 9914
1236 10327 13474

TABLE 8e-continued

Address of Parity Bit Accumulators (Rate ¾)

10007 12774 15695
2178 9047 16151
6256 7420 11075
7780 12124 14020
5611 7207 15439
2529 4322 15087
2714 5217 9884
81 10799 11594
1845 7854 12328
2480 4360 8883
1107 6991 10377
3479 5761 14289
5639 8855 9053
1460 3703 11295
7710 12577 14375
4720 12673 14956
1176 12155 13882
2187 6857 12985
1622 5874 9437
942 2765 14378
3492 5768 12701
6432 14722 14794
11046 13036 15948
2904 4211 7521
229 592 4897
1616 8035 11683
10569 13395 14431
4474 6712 15158
13340 13920 15592
5030 13245 15131
1061 6169 6794
328 6771 12242
8398 10475 10827
535 5368 9184
1903 5121 11454
745 2003 14697
503 3281 11435
3200 8219 8491
8299 9504 11601
4128 8160 16124
2994 4032 9680

TABLE 8f

Address of Parity Bit Accumulators (Rate ⅔)

1615 2039 8200 11116 12879 13266 14888
1056 2837 5958 7722 10531 13028 16131
321 4196 6772 8327 18370 21171 21440
2720 4996 7486 11437 15927 16234 21032
250 4778 5126 9839 16614 18590 21299
36 10862 13201 15758 17702 20512 21310
4548 8263 11202 12249 14424 17146 20605
521 2272 5846 7080 11967 15642 17973
1858 5497 5858 7892 13057 15657 19262
65 1964 3694 6305 7236 12924 14509
648 3736 6461 10779 13755 17583 19163
4991 6081 9123 11807 12144 18877 20967
667 1787 6412 8270 13080 15684 19871
7185 7366 14404 17011 17561 19430 21050
2701 4406 9153 9479 15365 19423 21462
3942 7315 10933 14239 17054 17558 19977
1427 5839 8022 10208 16873 16924 21529
60 6459 7405 9609 11824 16053 19264
1956 4737 6790 9007 12579 16313 19839
6949 8003 10138 12354 14675 17960 20107
3267 6813 10410 12761 14996 15151 17838
975 1375 3246 6456 9683 9895 14572
496 4250 9354 10365 14249 16724 19585
4187 5342 7802 10016 10840 13690 14811
954 9023 12299 15481 17308 19923 20256
1554 2755 4407 4842 10638 16587 17877
1953 3616 8712 12206 14211 16877 21233
1295 4174 4522 9604 12613 14892 17298
500 3106 5334 12580 12669 15443 18409

TABLE 8f-continued

Address of Parity Bit Accumulators (Rate ⅔)

2283 8824 9896 13581 13889 20424 20765
13321 16111 18888
6938 17206 19746
1784 4153 15066
9407 14334 18336
5350 6942 10093
3170 8370 11789
905 1308 8307
3052 5479 14093
1269 16063 19442
2686 4519 8777
1756 3659 11721
3002 11645 18023
8978 10622 20164
8846 11139 13721
3066 10762 13957
3464 11167 13550
16215 18615 18961
7676 15415 18065
5396 10017 18358
7850 16492 18269
3531 16286 18989
5739 11192 13524
1009 18408 18920
6625 13662 15264
3505 12215 20200
8426 12029 20522
8496 19529 20705
2218 6541 11495
2253 5667 20631
2320 5739 19782
2335 8137 9814
1688 9285 15288
1393 8162 12727
3355 11661 14163
142 10231 20568
9158 12878 13257
14324 17954 19658
2483 4417 18250
661 10219 14001
6896 10200 14537
8802 17982 20021
2787 9042 14255
3101 13180 18975
1164 8420 16306
6500 9735 12804
11842 14862 19904
7598 8199 17910
4273 17028 20983
544 9997 17358
3136 19586 20591
1785 5171 9714
8388 14782 18328
32 6240 10995
865 5080 8797
624 11476 14648
2163 7348 13686
101 3574 18935
7330 13508 14000
5743 7379 9514
1592 11437 17432
4893 6775 20933
762 2691 7070
3030 19170 20360
4299 7845 19138
1978 6589 12314
2757 11178 14780
4956 5881 21471
3392 7590 9773
15990 19435 20227
1888 5932 16298
4085 5882 12449
4813 16665 20934
5522 9375 18435
10466 12470 16771
11805 16606 21277
856 5550 18431
1094 12130 15534

TABLE 8f-continued

Address of Parity Bit Accumulators (Rate 2/3)

14549 17123 19074
5076 13100 17343
10615 16455 20767
13544 15381 16991
3829 18367 21333
15456 15532 19920
6866 15766 18286
6461 8677 12234
2026 12038 20327
3839 8318 10649
4613 11022 15972
3757 13434 15910
4519 6461 11133

TABLE 8g

Address of Parity Bit Accumulators (Rate 3/5)

487 2424 5103 6294 14728 16989 22394 22707
1634 5235 7897 8219 10473 10926 15226 17159
7836 8222 10026 12421 17812 20194 21551 25762
178 4183 5238 8916 11565 13513 17234 23622
2619 3761 6539 10279 11943 16294 19745 22819
1097 3310 5297 10950 12939 13749 18284 19985
5062 8675 11402 13351 14655 16741 20553 22461
5862 7897 12406 13503 16929 17631 20389 22142
1160 8004 9813 13540 14666 18003 22246 24879
157 6179 13015 16673 17089 19482 23223 24324
1568 3396 5983 13072 13336 18349 18521 21010
3632 5935 7011 12522 15857 17935 18950 23596
7555 8375 10646 12391 15071 20478 22501 23402
2000 2378 7387 11854 13513 21598 24971 25503
476 2578 7339 8402 13753 16147 19513 22512
1646 7593 8714 9846 12535 14403 21897 22723
913 3205 5384 6134 13821 16335 23236 24236
502 1494 5665 8092 9094 13273 18152 23856
3571 5849 7970 10318 16538 19009 19186 24775
1768 5020 10749 15104 18446 21191 21392 25505
279 7272 9982 10336 13151 15451 18316 22103
2005 4026 4677 7991 9235 13384 14754 23731
1319 3499 6567 7679 11063 15094 15267 17449
6162 6797 10759 11683 12866 13911 17226 22718
2382 9187 11808 16423 18162 19122 21873 22911
216 1114 7075 14485 16966 19607 22914 24691
721 2693 6387 8821 17550 19330 22719 24673
972 2842 8828 9933 12899 15009 15268 23746
1947 4539 10078 12725 13876 18387 20589 24783
1755 4300 6903 8799 14179 14485 20595 24429
3854 4896 7018 10751 14016 14346 16861 19163
3859 4085 5919 7733 15182 16468 19409 21431
1371 6763 10705 10999 14233 17684 21160 22018
2356 5185 5651 12200 12308 16384 18868 21030
6600 8655 9801 11712 13854 16725 20795 25380
1692 3627 6962 7462 10218 21056 21314 24003
16314 19603 22678
1179 19957 21941
14163 19047 24512
10474 20933 24258
461 8308 11535
7361 11441 12375
40 6417 10855
6001 22526 23757
1071 3964 9467
2756 6525 23536
449 3246 11782
12053 19545 21812
2670 3701 10363
7809 17817 20062
2900 6138 24663
7042 9061 22324
7149 12133 15790
7464 15848 22261
4406 15275 21965
2305 8240 15658
844 3405 18366

TABLE 8g-continued

Address of Parity Bit Accumulators (Rate 3/5)

1893 2451 17338
5810 17934 20992
2244 4845 24158
17878 18964 23878
5429 22314 24712
303 14398 24478
15836 18743 21826
4587 17442 23891
9067 19984 25568
12659 20803 25727
5409 6673 23824
9692 15061 18694
861 1169 16870
12226 14993 20284
13054 14784 20185
160 15501 23163
614 18992 23847
4719 15363 20481
19129 23171 24212
5465 21650 25118
3669 15823 17361
12767 13112 21339
4658 14270 17975
503 11296 14239
16728 20243 25123
1952 12991 19964
11201 17284 18410
2840 12877 24940
4989 21344 23127
3268 15681 23795
2050 16692 25423
4144 9210 10293
896 8604 15852
9235 23106 25062
4425 5548 25280
4343 10845 11308
3224 9603 25270
1859 10301 21895
4944 11025 23373
5530 9419 25244
8525 15896 18435
8591 19838 24964
18261 19436 25885
4301 15776 15875
9532 16158 20694
9674 11995 20018
8382 9360 12086
2974 19579 25776
2968 4956 20785
3009 11349 25614
2975 11230 25789

TABLE 8h

Address of Parity Bit Accumulators (Rate 1/2)

1690 4392 7243 10123 12751 19068 23261 25882 25950
4295 8310 13735 14903 18216 18521 20457 22873 26999
2900 6292 14253 16327 19561 21463 23348 26738 31108
1201 2187 4037 6084 7112 17403 20499 23973 29486
1913 5146 8684 10762 11063 15735 19611 22881 27218
1569 1918 5946 8361 9717 12102 16573 19187 28309
925 7530 10304 16459 18002 20820 22693 24097 30913
4336 14315 16734 16940 19494 19977 21895 25121 31768
3367 3872 10516 11797 16080 18647 21646 24129 31143
1557 4179 6997 9985 19179 23292 24350 26834 28821
2605 4611 6484 13227 16750 22762 26200 28877 31731
3139 6378 7943 9983 10171 14917 17887 19560 25630
5706 5916 8409 10080 13664 13753 20142 22989 29228
4479 7229 10272 12943 17716 21870 24521 29638 32330
818 2084 5177 9571 10713 14061 27997 28946 31914
4223 8466 15465 16241 18591 20686 25672 28312 31533
3049 3335 8311 11572 17578 22419 23724 27334 27454
607 4010 11542 13746 16393 19392 21126 28048 28409
1687 2090 4816 6641 7824 8909 10871 25465 30399

TABLE 8h-continued

Address of Parity Bit Accumulators (Rate ½)

1282 3011 6333 8010 10952 16958 24124 26242 32302
2156 4900 6829 9255 15769 16823 25927 30541 30839
3133 5074 7609 10078 13090 15951 22294 27409 28021
588 1624 7313 9206 12908 15670 21180 22034 30955
3342 7385 7790 11060 13010 17437 21755 28052 28308
3431 5338 15158 18950 23091 24334 26495 28510 30791
515 3366 11860 15866 18097 19816 20516 23868 32139
219 6739 12840 20551 23331 23530 25670 28997 32168
152 1161 11055 18106 18657 20617 25241 26437 30692
4846 9453 14029 14862 20321 22192 26263 26518 29656
3613 6463 12229 15428 17644 19554 20150 27965 31614
110 6876 9265
14936 18681 31853
3661 16313 30499
271 6718 20110
21531 29984 30553
1164 17609 23628
8154 13382 24492
3653 10000 31610
2337 21448 28080
11999 15213 25875
12821 31286 31518
6097 17194 24909
9702 24304 28525
5883 18252 26861
16032 17834 20825
8986 16741 21021
568 27281 27400
13853 15558 19265
1005 5259 12243
10050 23589 27597
758 7779 12074
2783 12248 14536
810 1354 27229
6362 20993 27191
10553 18772 30110
2402 2835 21129
12261 15601 22445
11442 15365 22496
9669 16977 21706
5711 13362 23591
17344 21970 29298
240 13300 29750
12151 27394 32351
2346 25180 25427
2473 16162 20178
3772 7888 29067
4813 22325 26724
5566 11255 14096
11274 26442 28451
5733 14961 21477
9204 11769 32017
4994 8043 9090
5419 10606 24702
7182 11243 14543
13457 24507 29332
7082 21960 26549
13422 17659 31308
4351 30026 30998
11180 13085 17157
18933 21543 23781
14066 18961 22375
8255 12388 19309
2529 12598 29636
8811 28673 31573
8938 24504 30413
14629 24906 30234
14478 24007 30182
2559 14678 29540
25088 25451 28782
553 25507 29461

TABLE 8i

Address of Parity Bit Accumulators (Rate ⅔)

4173 6386 6813 15139 16380 22095
22454 24964 26820 27326 30289 32188
826 1264 3864 7778 9667 17876 20474
21361 24378 24599 28142 33137
229 1256 4395 6290 6664 15376 17436
19340 19463 28818 33008 36039
3801 8483 10585 12292 13418 14753
17085 18901 21746 22945 35570 37330
1056 7871 8934 9916 12131 17573
20277 23395 30197 33313 35985 37827
367 6393 7261 12313 16956 18789
19865 22650 23639 24535 31056 36744
4276 10788 13433 16512 17384 20031
26177 27799 29564 30931 33354 37567
1446 3707 5576 7649 9769 11723 15461
19981 23591 30056 34358 36599
4336 4879 6768 8836 11153 16163 18737
26233 28194 29209 32440 36228
4993 6006 9212 11740 14173 16526 24459
25254 29745 33408 36055 36434
664 2361 9581 15385 18970 20683 22481
25313 25573 28771 29109 38646
60 4096 7203 9634 13663 17240 22069
22446 25032 35038 36150 37117
531 2834 6551 13051 17419 18553 21464
23928 26936 29707 32040 37070
1518 2753 6081 6875 9167 10435 12956
20117 23116 24850 32134 38490
3408 7120 7440 10653 12980 16264 21753
28010 29934 31090 32798 37138
1625 2003 12165 12307 18588 19634 22220
24047 24332 32481 32815 36389
43 5869 9888 13215 14897 16193 17231
19751 28403 34240 37503 37977
995 8360 11257 11794 14564 20565
24887 27011 29372 31511 36783 37169
1807 2320 5317 5423 14505 18577 20893
27636 30865 33909 37026 38577
2917 3575 8016 11563 15569 17766 20889
24069 24341 35063 38343 38694
127 2839 6382 9940 11027 12217 14285
27540 27894 31199 31358 34474
1933 4300 6891 13497 16865 20989 22027
28776 29073 32248 33905 38280
1378 3266 8115 10258 14509 21738 25522
25610 28824 29362 31876 33896
849 7607 10285 10474 12436 16182 19495
21673 29264 32706 35784 38261
18317 32445 34841
3016 3492 27531
11220 27356 31589
14213 19144 37905
17819 20378 21592
25822 27680 28748
11051 18497 31183
8759 22683 30156
8604 15941 32844
19298 23156 30575
21482 28103 37945
2142 5436 35950
2977 10390 20959
1436 7104 12063
14316 22841 36453
4795 15107 25769
4674 5422 31791
3026 11082 34646
13803 18011 35474
22733 33617 34598
2430 11376 17648
19089 27031 33569
3748 31787 38672
1716 28541 30394
18278 33786 34836
8313 26157 32033
2619 34491 37580
31387 33834 35739
5034 11365 26172
24580 30460 33982

TABLE 8i-continued

Address of Parity Bit Accumulators (Rate ⅔)

4375 14974 34935
6085 8159 25482
12728 23556 35511
2361 35221 35496
7948 15663 37449
12946 13026 23162
9367 13954 16799
15553 18209 29641
9304 24815 26869
5095 26639 30677
14012 20605 23633
12915 13984 30821
9349 16778 23849
16874 26541 26754
15642 20257 28066
7505 14992 20745
547 5328 26296
5178 8851 26552

TABLE 8j

Address of Parity Bit Accumulators (Rate ⅓)

7127 12217 14903 17792 19690 23709 26904
31847 32174 37971 39934 43192
631 3892 3961 7110 9168 14664 20881
33763 34077 38290 38589 40587
1561 4952 12735 17050 17363 23114
23432 26431 30725 34201 38679 41775
3120 6362 9346 10202 19293 21581 26158
28110 28791 30854 37723 39609
937 3213 3271 8272 9035 15349 18735
23617 27626 33046 35819 42715
42 5281 15192 15731 20687 23236 29529
31564 32442 35605 36703 42323
3415 5078 7595 8830 16298 16735 18395
18860 20659 21190 24417 39339
1247 3506 4592 7574 11799 14188 22214
27862 31190 33446 39010 39447
659 6732 8711 10845 14967 20932 21392
24561 27950 30282 34491 39662
1574 6084 6401 10616 15496 21480 22587
24801 28997 34755 40468 40765
1816 5243 8287 9380 12795 13208 22838
23280 31453 35837 36957 38620
2526 5720 11010 12022 15200 19448 27202
27673 29334 32919 36071 42350
542 3767 8589 14736 17599 18679 20408
29296 37332 38338 40657 42203
1274 6050 11401 13088 14271 17551 31621
32620 36895 37191 39291 43194
312 4625 6259 6839 10672 16695 21781
27493 27928 31056 33505 41398
167 1811 6813 10155 10651 15544 16043
23824 28470 32607 35112 37845
2477 2675 8067 19670 22707 27069 29018
30917 33456 37625 40865 42750
2232 8590 13476 14000 16942 23026 23964
26975 29689 33460 36770 41758
2199 4775 7747 8795 17270 18866 21982
24102 29704 34123 34954 41148
2130 4709 11954 12300 19938 25299 25579
28797 30414 36228 36617 42694
1336 22318 25169
18630 24904 26071
19828 24680 29215
33916 41065 41539
14761 30074 40827
10013 20112 25932
14530 21735 41427
12985 26680 37635
7003 9909 14113
16556 18312 20606
18051 19132 21794
4506 10959 16641

TABLE 8j-continued

Address of Parity Bit Accumulators (Rate ⅓)

13543 16372 29889
9717 22665 37324
30086 36117 40152
19395 33829 38170
3120 17782 40104
1599 30981 35293
5514 10349 25365
5646 10000 25213
5839 12560 41786
20495 31791 34710
4251 31730 33042
1029 12241 28921
4009 32368 35306
7216 13773 36495
12623 22397 34316
20441 24199 41893
15962 17883 25624
13355 13717 35667
24883 27266 28103
24291 28357 34576
964 35256 39973
11315 18036 39120
2832 16014 25615
3789 7400 11418
9383 32137 37908
11721 30386 39012
7963 26523 43088
7442 11584 26585

TABLE 8k

Address of Parity Bit Accumulators (Rate ¼)

4154 7271 18608 26981 29145 30753 34895
36931 37422 42768 47366 47722
3011 5069 6156 9587 12589 20148 33306
36809 37089 44032 45205 48468
39 1332 8129 19650 21273 25443 26292
28737 31676 33999 34500 38260
2180 2761 8052 10750 16919 18907 23210
24269 26621 34815 39889 43751
1473 1960 13924 21410 23195 27618 32955
36079 38702 41888 44387 44654
4943 6550 9829 14893 15444 19815 24320
29734 33955 36141 42602 45015
1132 3914 6903 12154 12305 16298 20487
25855 29304 32150 39228 47188
880 8771 13199 15965 21881 22783 25410
28163 31814 34217 38887 40142
2890 7245 11208 18761 21093 26680 31955
38349 40180 43274 43710 46286
296 571 2760 9305 13529 14589 17815
28360 30693 33015 35716 39781
3678 9475 12627 13894 16267 19135 22641
24756 28788 33357 35290 46414
2066 9907 11657 15142 15516 21000
22945 27012 29663 40795 44925 47884
713 4869 6526 10360 14920 21797 31226
35575 41795 42905 45382 45984
1015 4061 6411 8415 11494 13574 23760
24879 27137 37539 42259 45488
8455 11853 14155 16832 19318 19778 27886
28893 36425 41079 43947 48266
5393 17152 43557
17300 25044 48036
25767 28037 31468
4322 42152 44324
27676 46770 47870
23456 24791 30363
7899 10123 45744
7716 12923 33714
18718 30285 40475
1794 18035 32276
26277 33598 38109
8757 21965 40705

TABLE 8k-continued

Address of Parity Bit Accumulators (Rate ¼)

7007 12090 17815
17010 22010 37440
3493 13085 32557
10988 18098 20180
2166 11137 23546
15518 20550 35071
26272 41471 46610
4430 14274 35788
23839 29219 43155
17336 20770 32566
10570 16186 35139
5836 22534 38783
5863 36391 41378
5580 30971 41722
5558 30075 39521
14465 39539 40407
3369 30151 46801
9211 37880 46862

FIG. 2B illustrates a block diagram of a Bose Chaudhuri Hocquenghem (BCH) encoder 209, utilized with an LDPC encoder 203 and an interleaver 211, according to exemplary embodiments of the present invention. Under this scenario, the codes generated by the LDPC encoder 203 and the BCH encoder 209, can have a concatenated outer BCH code. Further, the output of the LDPC encoder can be bit interleaved using the interleaver 211. In one exemplary embodiment, the interleaver 211 can be a block interleaver. Alternatively, the interleaver 211 can be an optional element in the transmitter and instead an interleaver in a receiver (such as receiver 116) can be used to interleave decoder input. Additionally, a cyclic redundancy check (CRC) encoder (not shown) can be connected to the BCH encoder 209 such that error detection can be achieved using cyclic redundancy check (CRC) codes. In one embodiment, the outer BCH code can be a 12 bit error correcting, with $n_{bch}=k_{bch}+192$, noting that $n_{bch}=k_{ldpc}$.

By way of example, the BCH coding parameters are specified in the following table (Table 9a):

TABLE 9a

Coding Parameters (normal FEC Frame – LDPC Coded Block $n_{ldpc} = 64800$)

| LDPC Code Rate | BCH Uncoded Block $K_{bch}$ | BCH Coded Block $N_{bch}$ LDPC Uncoded Block $k_{ldpc}$ | BCH t-Error Correction (bits) |
| --- | --- | --- | --- |
| ¼ | 16008 | 16200 | 12 |
| ⅓ | 21408 | 21600 | 12 |
| ⅖ | 25728 | 25920 | 12 |
| ½ | 32208 | 32400 | 12 |
| ⅗ | 36688 | 38880 | 12 |
| ⅔ | 43040 | 43200 | 10 |
| ¾ | 48408 | 48600 | 12 |
| ⅘ | 51648 | 51840 | 12 |
| ⅚ | 53840 | 54000 | 10 |
| 8/9 | 57472 | 57600 | 8 |
| 9/10 | 58192 | 58320 | 8 |

By way of further example, the generator polynomial of the t error correcting BCH encoder 209 is obtained by multiplying the first t polynomials specified in the following table (Table 9b):

TABLE 9b

BCH Polynomials (normal FEC Frame – LDPC Coded Block $n_{ldpc} = 64800$)

$g_1(x)$   $1 + x^2 + x^3 + x^5 + x^{16}$
$g_2(x)$   $1 + x + x^4 + x^5 + x^6 + x^8 + x^{16}$
$g_3(x)$   $1 + x^2 + x^3 + x^4 + x^5 + x^7 + x^8 + x^9 + x^{10} + x^{11} + x^{16}$
$g_4(x)$   $1 + x^2 + x^4 + x^6 + x^9 + x^{11} + x^{12} + x^{14} + x^{16}$
$g_5(x)$   $1 + x + x^2 + x^3 + x^5 + x^8 + x^9 + x^{10} + x^{11} + x^{12} + x^{16}$
$g_6(x)$   $1 + x^2 + x^4 + x^5 + x^7 + x^8 + x^9 + x^{10} + x^{12} + x^{13} + x^{14} + x^{15} + x^{16}$
$g_7(x)$   $1 + x^2 + x^5 + x^6 + x^8 + x^9 + x^{10} + x^{11} + x^{13} + x^{15} + x^{16}$
$g_8(x)$   $1 + x + x^2 + x^5 + x^6 + x^8 + x^9 + x^{12} + x^{13} + x^{14} + x^{16}$
$g_9(x)$   $1 + x^5 + x^7 + x^9 + x^{10} + x^{11} + x^{16}$
$g_{10}(x)$   $1 + x + x^2 + x^5 + x^7 + x^8 + x^{10} + x^{12} + x^{13} + x^{14} + x^{16}$
$g_{11}(x)$   $1 + x^2 + x^3 + x^5 + x^9 + x^{11} + x^{12} + x^{13} + x^{16}$
$g_{12}(x)$   $1 + x + x^5 + x^6 + x^7 + x^9 + x^{11} + x^{12} + x^{16}$

The BCH encoding of information bits $m=(m_{k_{bch}-1}, m_{k_{bch}-2}, \ldots m_1, m_0)$ into a codeword $c=(m_{k_{bch}-1}, m_{k_{bch}-2}, \ldots m_1, m_0, d_{n_{bch}-k_{bch}-1}, d_{n_{bch}-k_{bch}-2}, \ldots d_1, d_0)$ is achieved as follows: (1) multiply the message polynomial $m(x)=(m_{k_{bch}-1}x^{k_{bch}-1} + m_{k_{bch}-2}x^{k_{bch}-1} + \ldots + m_1x+m_0)$ by $x^{n_{bch}-k_{bch}}$; (2) divide $x^{n_{bch}-k_{bch}}(x)$ by the generator polynomial $g(x)$, where $d(x)=(d_{n_{bch}-k_{bch}-1}x^{n_{bch}-k_{bch}-1} + \ldots +d_1x+d_0)$ is the remainder; and (3) set the codeword polynomial $c(x)=x^{n_{bch}-k_{bch}}m+d(x)$.

In accordance with further exemplary embodiments, for 8-PSK, 16-APSK and 32-APSK modulation formats, for example, the output of the LDPC encoder 203 can be bit interleaved using the interleaver 211. Data is serially written into the interleaver 211 column-wise (from top to bottom), and serially read out row-wise (from left to right, except for the rate 3/5 8-PSK case, where data is read out from right to left). The configuration of the block interleaver 211 for each modulation format is illustrated in Table 10.

TABLE 10

| Modulation | Rows ($n_{ldpc}$ = 64800) | Rows ($n_{ldpc}$ = 16200) | Columns |
| --- | --- | --- | --- |
| 8-PSK | 21600 | 5400 | 3 |
| 16-APSK | 16200 | 4050 | 4 |
| 32-APSK | 12960 | 3240 | 5 |

FIG. 2D illustrates a flow chart of a process for performing encoding, interleaving and modulating source information bits, according to exemplary embodiments of the present invention. At step 231 the information bits are received and LDPC codes are generated at step 233. It is noted that the structure of the LDPC codes (stemming from the design of the parity check matrix) permits an efficient decoding process, whereby parallel computation engines can be utilized. According to certain embodiment, the LDPC code can be generated without BCH codes and codes also can contain a CRC code. At step 235, the coded bits are altered by the interleaver 211, as described above. Next the codes are modulated per step 237 and are transmitted on the communication channel.

FIG. 3A illustrates a block diagram of a receiver, and FIG. 3B illustrates a flow chart depicting a process for decoding an encoded signal, according to exemplary embodiments of the present invention. At the receiving side, a receiver 300 includes an antenna 301 that receives the waveforms emitted over the channel 114, which is depicted by step 331 where the receiver 300 receives the transmitted signal. The receiver provides a demodulator 303 that demodulates the received signal (Step 333). By way of example, the signal may reflect a source signal received at the receiver 200, encoded and modulated based on the exemplary encoding and modulation schemes described herein, and transmitted over the channel 114. After demodulation, the received signals are forwarded to a decoder 305 for decoding the demodulated signal (Step 335). The decoder attempts to reconstruct the original source messages by generating messages, X', in conjunction with a bit metric generator 307. According to certain embodiments, the decoder 305 can employ M parallel engines 309 to efficiently decode the received signals. By way of example, according to this parallel approach, M may correspond to the groupings of M bit nodes for processing. In one exemplary embodiment, the demodulator 303 in accordance with the bit metric generator 307 can provide a priori probabilities of log likelihood ratios of coded bits. It is contemplated that the above transmitter 200 and receiver 300 can be deployed within a single wireless terminal, in which case a common antenna system can be shared. The wireless terminal can for example be configured to operate within a satellite communication, a cellular system, wireless local area network (WLAN), etc. The LDPC codes, according to exemplary embodiments, can be used to variety of digital video applications, such as MPEG (Motion Pictures Expert Group) packet transmission.

To appreciate the advantages offered by the present embodiments, it is instructive to examine how LDPC codes are generated, as discussed in FIG. 4. FIG. 4 illustrates a sparse parity check matrix, according to an exemplary embodiment of the present invention. LDPC codes are long, linear block codes with sparse parity check matrix $H_{(n-k)\times n}$. Typically the block length n ranges from thousands to tens of thousands of bits. For example, a parity check matrix for an LDPC code of length n=8 and rate 1/2 is shown in FIG. 4. FIG. 5 illustrates a bipartite graph of an LDPC code of the matrix of FIG. 4, according to an exemplary embodiment of the present invention. Parity check equations imply that for each check node, the sum (over Galois Field (GF) 2) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning to the receiver 300, the LDPC decoder 305 is considered a message passing decoder, whereby the decoder 305 aims to find the values of bit nodes. To accomplish this task, bit nodes and check nodes iteratively communicate with each other. The nature of this communication is described below. From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ would indicate to $n_1$ that the value of $n_1$ is believed to be 1. Additionally, for soft decision decoding, a reliability measure is added. From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of the value of $n_1$ is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an exemplary embodiment. As described previously, the encoder 203 (of FIG. 2) can employ a simple encoding technique by restricting the values of the lower triangular area of the parity check matrix. According to an exemplary embodiment, the restriction imposed on the parity check matrix is of the form:

$$H_{(n-k)\times n}=[A_{(n-k)\times k} B_{(n-k)\times (n-k)}], \text{ where } B \text{ is the lower triangular.}$$

Any information block $i=(i_0, i_1, \ldots, i_{k-1})$ can be encoded to a codeword $c=(i_0, i_1, \ldots, i_{k-1}, p_0, p_1, \ldots, p_{n-k-1})$ using $Hc^T=0$, and recursively solving for parity bits, for example:

$$a_{00}i_0+a_{01}i_1+\ldots+a_{0,k-1}i_{k-1}+p_0=0 \Rightarrow \text{Solve } p_0$$

$$a_{10}i_0+a_{11}i_1+\ldots+a_{1,k-1}i_{k-1}+b_{10}p_1=0 \Rightarrow \text{Solve } p_1$$

and similarly for $p_2, p_3, \ldots, p_{1-k-1}$.

FIGS. 7A-7E illustrate modulation signal constellations, according to exemplary embodiments of the present invention.

FIG. 7A illustrates a QPSK constellation, including the associated bit labeling, in accordance with an exemplary embodiment. In the context of QPSK, bits $2i$, $2i+1$ Determine the $i^{th}$ QPSK symbol, where $i=0, 1, 2, \ldots, (N/2)-1$ and N is the coded LDPC block size. Alternatively, the bit positioning for the signal constellation of FIG. 7A can be expressed as specified below in Table 11 a (where $\epsilon_x$ represents average energy per symbol):

TABLE 11a

| Bit Label | [x, y] Coordinates |
|---|---|
| 00 | $[\sqrt{\epsilon_x} * \cos(\pi/4.0), \sqrt{\epsilon_x} * \sin(\pi/4.0)]$ |
| 01 | $[\sqrt{\epsilon_x} * \cos(7.0 * \pi/4.0), \sqrt{\epsilon_x} * \sin(7.0 * \pi/4.0)]$ |
| 10 | $[\sqrt{\epsilon_x} * \cos(3.0 * \pi/4.0), \sqrt{\epsilon_x} * \sin(3.0 * \pi/4.0)]$ |
| 11 | $[\sqrt{\epsilon_x} * \cos(5.0 * \pi/4.0), \sqrt{\epsilon_x} * \sin(5.0 * \pi/4.0)]$ |

FIG. 7B illustrates an 8-PSK constellation, including the associated bit labeling, in accordance with an exemplary embodiment. In the context of 8-PSK, bits $3i$, $3i+1$, $3i+2$ of the interleaver output determine the $i^{th}$ 8-PSK symbol where $i=0, 1, 2, \ldots, (N/3)-1$ and N is the coded LDPC block size—except rate 3/5, where bits $3i+2$, $3i+1$, $3i$ of the interleaver output determine the $i^{th}$ 8-PSK symbol. Alternatively, the bit positioning for the signal constellation of FIG. 7B can be expressed as specified below in Table 11b (where $\epsilon_x$ represents average energy per symbol):

TABLE 11b

| Bit Label | [x, y] Coordinates |
|---|---|
| 000 | $[\sqrt{\epsilon_x} * \cos(\pi/8.0), \sqrt{\epsilon_x} * \sin(\pi/8.0)]$ |
| 001 | $[\sqrt{\epsilon_x} * \cos(15.0 * \pi/8.0), \sqrt{\epsilon_x} * \sin(15.0 * \pi/8.0)]$ |
| 010 | $[\sqrt{\epsilon_x} * \cos(7.0 * \pi/8.0), \sqrt{\epsilon_x} * \sin(7.0 * \pi/8.0)]$ |
| 011 | $[\sqrt{\epsilon_x} * \cos(9.0 * \pi/8.0), \sqrt{\epsilon_x} * \sin(9.0 * \pi/8.0)]$ |
| 100 | $[\sqrt{\epsilon_x} * \cos(3.0 * \pi/8.0), \sqrt{\epsilon_x} * \sin(3.0 * \pi/8.0)]$ |
| 101 | $[\sqrt{\epsilon_x} * \cos(13.0 * \pi/8.0), \sqrt{\epsilon_x} * \sin(13.0 * \pi/8.0)]$ |
| 110 | $[\sqrt{\epsilon_x} * \cos(5.0 * \pi/8.0), \sqrt{\epsilon_x} * \sin(5.0 * \pi/8.0)]$ |
| 111 | $[\sqrt{\epsilon_x} * \cos(11.0 * \pi/8.0), \sqrt{\epsilon_x} * \sin(11.0 * \pi/8.0)]$ |

FIG. 7C illustrates a 16-APSK (4+12) constellation, including the associated bit labeling, in accordance with an exemplary embodiment. In the context of 16-APSK, bits $4i$, $4i+1$, $4i+2$, $4i+3$ of the interleaver output determine the $i^{th}$ 16-APSK symbol, where i=0, 1, 2, . . . , (N/4)−1 and N is the coded LDPC block size. Alternatively, the bit positioning for the signal constellation of FIG. 7C can be expressed as specified below in Table 11c (where $\epsilon_x$ represents average energy per symbol, $4*R1^2+12*R2^2=16$, and R1 represents the radius of the inner-most ring and R2 represents the radius of the outer ring):

TABLE 11c

| Bit Label | [x, y] Coordinates |
|---|---|
| 0000 | [R2 * $\sqrt{\epsilon_x}$ * cos(3.0 * π/12.0), R2 * $\sqrt{\epsilon_x}$ * sin(3.0 * π/12.0)] |
| 0001 | [R2 * $\sqrt{\epsilon_x}$ * cos(21.0 * π/12.0), R2 * $\sqrt{\epsilon_x}$ * sin(21 * π/12.0)] |
| 0010 | [R2 * $\sqrt{\epsilon_x}$ * cos(9.0 * π/12.0), R2 * $\sqrt{\epsilon_x}$ * sin(9 * π/12.0)] |
| 0011 | [R2 * $\sqrt{\epsilon_x}$ * cos(15.0 * π/12.0), R2 * $\sqrt{\epsilon_x}$ * sin(15 * π/12.0)] |
| 0100 | [R2 * $\sqrt{\epsilon_x}$ * cos(π/12.0), R2 * $\sqrt{\epsilon_x}$ * sin(π/12.0)] |
| 0101 | [R2 * $\sqrt{\epsilon_x}$ * cos(23.0 * π/12.0), R2 * $\sqrt{\epsilon_x}$ * sin(23 * π/12.0)] |
| 0110 | [R2 * $\sqrt{\epsilon_x}$ * cos(11.0 * π/12.0), R2 * $\sqrt{\epsilon_x}$ * sin(11 * π/12.0)] |
| 0111 | [R2 * $\sqrt{\epsilon_x}$ * cos(13.0 * π/12.0), R2 * $\sqrt{\epsilon_x}$ * sin(13 * π/12.0)] |
| 1000 | [R2 * $\sqrt{\epsilon_x}$ * cos(5.0 * π/12.0), R2 * $\sqrt{\epsilon_x}$ * sin(5 * π/12.0)] |
| 1001 | [R2 * $\sqrt{\epsilon_x}$ * cos(19.0 * π/12.0), R2 * $\sqrt{\epsilon_x}$ * sin(19 * π/12.0)] |
| 1010 | [R2 * $\sqrt{\epsilon_x}$ * cos(7.0 * π/12.0), R2 * $\sqrt{\epsilon_x}$ * sin(7 * π/12.0)] |
| 1011 | [R2 * $\sqrt{\epsilon_x}$ * cos(17.0 * π/12.0), R2 * $\sqrt{\epsilon_x}$ * sin(17 * π/12.0)] |
| 1100 | [R1 * $\sqrt{\epsilon_x}$ * cos(π/4.0), R1 * $\sqrt{\epsilon_x}$ * sin(π/4.0)] |
| 1101 | [R1 * $\sqrt{\epsilon_x}$ * cos(7.0 * π/4.0), R1 * $\sqrt{\epsilon_x}$ * sin(7.0 * π/4.0)] |
| 1110 | [R1 * $\sqrt{\epsilon_x}$ * cos(3.0 * π/4.0), R1 * $\sqrt{\epsilon_x}$ * sin(3.0 * π/4.0)] |
| 1111 | [R1 * $\sqrt{\epsilon_x}$ * cos(5.0 * π/4.0), R1 * $\sqrt{\epsilon_x}$ * sin(5.0 * π/4.0)] |

FIG. 7D illustrates a 32-APSK (4+12+16) constellation, including the associated bit labeling, in accordance with an exemplary embodiment. In the context of 32-APSK (single belief decoding mode), bits $5i$, $5i+1$, $5i+2$, $5i+3$, $5i+4$ of the interleaver output determine the $i^{th}$ 32-APSK symbol, where i=0, 1, 2, . . . , (N/5)−1 and N is the coded LDPC block size. Alternatively, the bit positioning for the signal constellation of FIG. 7D can be expressed as specified below in Table 11d (where $\epsilon_x$ represents average energy per symbol, $4*R1^2+12*R2^2+16*R3^2=32$, and R1 represents the radius of the inner-most ring, R2 represents the radius of the middle ring and R3 represents the radius of the outer ring):

TABLE 11d

| Bit Label | [x, y] Coordinates |
|---|---|
| 00000 | [R2 * $\sqrt{\epsilon_x}$ * sin(π/4.0), R2 * $\sqrt{\epsilon_x}$ * sin(π/4.0)] |
| 00001 | [R2 * $\sqrt{\epsilon_x}$ * sin(π/12.0), R2 * $\sqrt{\epsilon_x}$ * sin(5.0 * π/12.0)] |
| 00010 | [R2 * $\sqrt{\epsilon_x}$ * sin(π/4.0), −R2 * $\sqrt{\epsilon_x}$ * sin(π/4.0)] |
| 00011 | [R2 * $\sqrt{\epsilon_x}$ * sin(π/12.0), −R2 * $\sqrt{\epsilon_x}$ * sin(5.0 * π/12.0)] |
| 00100 | [−R2 * $\sqrt{\epsilon_x}$ * sin(π/4.0), R2 * $\sqrt{\epsilon_x}$ * sin(π/4.0)] |
| 00101 | [−R2 * $\sqrt{\epsilon_x}$ * sin(π/12.0), R2 * $\sqrt{\epsilon_x}$ * sin(5.0 * π/12.0)] |
| 00110 | [−R2 * $\sqrt{\epsilon_x}$ * sin(π/4.0), −R2 * $\sqrt{\epsilon_x}$ * sin(π/4.0)] |
| 00111 | [−R2 * $\sqrt{\epsilon_x}$ * sin(π/12.0), −R2 * $\sqrt{\epsilon_x}$ * sin(5.0 * π/12.0)] |
| 01000 | [R3 * $\sqrt{\epsilon_x}$ * cos(π/8.0), R3 * $\sqrt{\epsilon_x}$ * sin(π/8.0)] |
| 01001 | [R3 * $\sqrt{\epsilon_x}$ * sin(π/8.0), R3 * $\sqrt{\epsilon_x}$ * cos(π/8.0)] |
| 01010 | [R3 * $\sqrt{\epsilon_x}$ * sin(π/4.0), −R3 * $\sqrt{\epsilon_x}$ * sin(π/4.0)] |
| 01011 | [0, −R3 * $\sqrt{\epsilon_x}$] |
| 01100 | [−R3 * $\sqrt{\epsilon_x}$ * sin(π/4.0), R3 * $\sqrt{\epsilon_x}$ * sin(π/4.0)] |
| 01101 | [0, R3 * $\sqrt{\epsilon_x}$] |
| 01110 | [−R3 * $\sqrt{\epsilon_x}$ * cos(π/8.0), −R3 * $\sqrt{\epsilon_x}$ * sin(π/8.0)] |
| 01111 | [−R3 * $\sqrt{\epsilon_x}$ * sin(π/8.0), −R3 * $\sqrt{\epsilon_x}$ * cos(π/8.0)] |
| 10000 | [R2 * $\sqrt{\epsilon_x}$ * sin(5.0 * π/12.0), R2 * $\sqrt{\epsilon_x}$ * sin(π/12.0)] |
| 10001 | [R1 * $\sqrt{\epsilon_x}$ * sin(π/4.0), R1 * $\sqrt{\epsilon_x}$ * sin(π/4.0)] |
| 10010 | [R2 * $\sqrt{\epsilon_x}$ * sin(5.0 * π/12.0), −R2 * $\sqrt{\epsilon_x}$ * sin(π/12.0)] |
| 10011 | [R1 * $\sqrt{\epsilon_x}$ * sin(π/4.0), −R1 * $\sqrt{\epsilon_x}$ * sin(π/4.0)] |
| 10100 | [−R2 * $\sqrt{\epsilon_x}$ * sin(5.0 * π/12.0), R2 * $\sqrt{\epsilon_x}$ * sin(π/12.0)] |
| 10101 | [−R1 * $\sqrt{\epsilon_x}$ * sin(π/4.0), R1 * $\sqrt{\epsilon_x}$ * sin(π/4.0)] |
| 10110 | [−R2 * $\sqrt{\epsilon_x}$ * sin(5.0 * π/12.0), −R2 * $\sqrt{\epsilon_x}$ * sin(π/12.0)] |
| 10111 | [−R1 * $\sqrt{\epsilon_x}$ * sin(π/4.0), −R1 * $\sqrt{\epsilon_x}$ * sin(π/4.0)] |
| 11000 | [R3 * $\sqrt{\epsilon_x}$, 0] |
| 11001 | [R3 * $\sqrt{\epsilon_x}$ * sin(π/4.0), R3 * $\sqrt{\epsilon_x}$ * sin(π/4.0)] |
| 11010 | [R3 * $\sqrt{\epsilon_x}$ * cos(π/8.0), −R3 * $\sqrt{\epsilon_x}$ * sin(π/8.0)] |

TABLE 11d-continued

| Bit Label | [x, y] Coordinates |
|---|---|
| 11011 | [R3 * $\sqrt{\epsilon_x}$ * sin(π/8.0), −R3 * $\sqrt{\epsilon_x}$ * cos(π/8.0)] |
| 11100 | [−R3 * $\sqrt{\epsilon_x}$ * cos(π/8.0), R3 * $\sqrt{\epsilon_x}$ * sin(π/8.0)] |
| 11101 | [−R3 * $\sqrt{\epsilon_x}$ * sin(π/8.0), R3 * $\sqrt{\epsilon_x}$ * cos(π/8.0)] |
| 11110 | [−R3 * $\sqrt{\epsilon_x}$, 0] |
| 11111 | [−R3 * $\sqrt{\epsilon_x}$ * sin(π/4.0), −R3 * $\sqrt{\epsilon_x}$ * sin(π/4.0)] |

FIG. 7E illustrates a 32-APSK (4+12+16) constellation, including the associated bit labeling, in accordance with an exemplary embodiment. In the context of 32-APSK (layered belief decoding mode): (1) for rate 3/4, bits $5i+3$, $5i+4$, $5i+2$, $5i+1$, $5i$ of the interleaver output determine the $i^{th}$ 32-APSK symbol, where i=0, 1, 2, . . . , (N/5)−1 and N is the coded LDPC block size; (2) for rate 4/5, bits $5i+1$, $5i+4$, $5i+3$, $5i+2$, $5i$ of the interleaver output determine the $i^{th}$ 32-APSK symbol, where i=0, 1, 2, . . . , (N/5)−1 and N is the coded LDPC block size; (3) for rates 5/6 and 8/9, bits $5i+1$, $5i$, $5i+2$, $5i+3$, $5i+4$ of the interleaver output determine the $i^{th}$ 32-APSK symbol, where i=0, 1, 2, . . . , (N/5)−1 and N is the coded LDPC block size; (4) for rate 9/10, bits $5i+2$, $5i+3$, $5i+4$, $5i+1$, $5i$ of the interleaver output determine the $i^{th}$ 32-APSK symbol, where i=0, 1, 2, . . . , (N/5)−1 and N is the coded LDPC block size. Alternatively, the bit positioning for the signal constellation of FIG. 7E can be expressed as specified below in Table 11e (where $\epsilon_x$ represents average energy per symbol, $4*R1^2+12*R2^2+16*R3^2=32$, and R1 represents the radius of the inner-most ring, R2 represents the radius of the middle ring and R3 represents the radius of the outer ring):

TABLE 11e

| Bit Label | [x, y] Coordinates |
|---|---|
| 00000 | [−R3 * $\sqrt{\epsilon_x}$ * sin(π/4.0), R3 * $\sqrt{\epsilon_x}$ * sin(π/4.0)] |
| 00001 | [−R3 * $\sqrt{\epsilon_x}$ * sin(π/8.0), R3 * $\sqrt{\epsilon_x}$ * cos(π/8.0)] |
| 00010 | [R3 * $\sqrt{\epsilon_x}$ * sin(π/8.0), R3 * $\sqrt{\epsilon_x}$ * cos(π/8.0)] |
| 00011 | [0, R3 * $\sqrt{\epsilon_x}$] |
| 00100 | [−R2 * $\sqrt{\epsilon_x}$ * sin (π/4.0), R2 * $\sqrt{\epsilon_x}$ * sin(π/4.0)] |
| 00101 | [−R2 * $\sqrt{\epsilon_x}$ * sin(π/12.0), R2 * $\sqrt{\epsilon_x}$ * sin(5.0 * π/12.0)] |
| 00110 | [R2 * $\sqrt{\epsilon_x}$ * sin(π/4.0), R2 * $\sqrt{\epsilon_x}$ * sin(π/4.0)] |
| 00111 | [R2 * $\sqrt{\epsilon_x}$ * sin(π/12.0), R2 * $\sqrt{\epsilon_x}$ * sin(5.0 * π/12.0)] |
| 01000 | [−R3 * $\sqrt{\epsilon_x}$ * cos(π/8.0), R3 * $\sqrt{\epsilon_x}$ * sin(π/8.0)] |
| 01001 | [−R3 * $\sqrt{\epsilon_x}$, 0] |
| 01010 | [R3 * $\sqrt{\epsilon_x}$ * sin(π/4.0), R3 * $\sqrt{\epsilon_x}$ * sin(π/4.0)] |
| 01011 | [R3 * $\sqrt{\epsilon_x}$ * cos(π/8.0), R3 * $\sqrt{\epsilon_x}$ * sin(π/8.0)] |
| 01100 | [−R2 * $\sqrt{\epsilon_x}$ * sin(5.0 * π/12.0), R2 * $\sqrt{\epsilon_x}$ * sin(π/12.0)] |
| 01101 | [−R1 * $\sqrt{\epsilon_x}$ * sin(π/4.0), R1 * $\sqrt{\epsilon_x}$ * sin(π/4.0)] |
| 01110 | [R2 * $\sqrt{\epsilon_x}$ * sin(5.0 * π/12.0), R2 * $\sqrt{\epsilon_x}$ * sin(π/12.0)] |
| 01111 | [R1 * $\sqrt{\epsilon_x}$ * sin(π/4.0), R1 * $\sqrt{\epsilon_x}$ * sin(π/4.0)] |
| 10000 | [−R3 * $\sqrt{\epsilon_x}$ * sin(π/8.0), −R3 * $\sqrt{\epsilon_x}$ * cos(π/8.0)] |
| 10001 | [0, −R3 * $\sqrt{\epsilon_x}$] |
| 10010 | [R3 * $\sqrt{\epsilon_x}$ * sin(π/4.0), −R3 * $\sqrt{\epsilon_x}$ * sin(π/4.0)] |
| 10011 | [R3 * $\sqrt{\epsilon_x}$ * sin(π/8.0), −R3 * $\sqrt{\epsilon_x}$ * cos(π/8.0)] |
| 10100 | [−R2 * $\sqrt{\epsilon_x}$ * sin(π/4.0), −R2 * $\sqrt{\epsilon_x}$ * sin(π/4.0)] |
| 10101 | [−R2 * $\sqrt{\epsilon_x}$ * sin(π/12.0), −R2 * $\sqrt{\epsilon_x}$ * sin(5.0 * π/12.0)] |
| 10110 | [R2 * $\sqrt{\epsilon_x}$ * sin(π/4.0), −R2 * $\sqrt{\epsilon_x}$ * sin(π/4.0)] |
| 10111 | [R2 * $\sqrt{\epsilon_x}$ * sin(π/12.0), −R2 * $\sqrt{\epsilon_x}$ * sin(5.0 * π/12.0)] |
| 11000 | [−R3 * $\sqrt{\epsilon_x}$ * sin(π/4.0), −R3 * $\sqrt{\epsilon_x}$ * sin(π/4.0)] |
| 11001 | [−R3 * $\sqrt{\epsilon_x}$ * cos(π/8.0), −R3 * $\sqrt{\epsilon_x}$ * sin(π/8.0)] |
| 11010 | [R3 * $\sqrt{\epsilon_x}$ * cos(π/8.0), −R3 * $\sqrt{\epsilon_x}$ * sin(π/8.0)] |
| 11011 | [R3 * $\sqrt{\epsilon_x}$, 0] |
| 11100 | [−R2 * $\sqrt{\epsilon_x}$ * sin(5.0 * π/12.0), −R2 * $\sqrt{\epsilon_x}$ * sin(π/12.0)] |
| 11101 | [−R1 * $\sqrt{\epsilon_x}$ * sin(π/4.0), −R1 * $\sqrt{\epsilon_x}$ * sin(π/4.0)] |
| 11110 | [R2 * $\sqrt{\epsilon_x}$ * sin(5.0 * π/12.0), −R2 * $\sqrt{\epsilon_x}$ * sin(π/12.0)] |
| 11111 | [R1 * $\sqrt{\epsilon_x}$ * sin(π/4.0), −R1 * $\sqrt{\epsilon_x}$ * sin(π/4.0)] |

FIG. 8 illustrates a block diagram of a chip set that can be utilized in implementing exemplary embodiments of the present invention. With reference to FIG. 8, chip set 800 includes, for instance, processor and memory components described with respect to FIG. 5 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 800 includes a communication mechanism such as a bus 801 for passing information among the components of the chip set. A processor 803 has connectivity to the bus 801 to execute instructions and process information stored in, for example, a memory 805. The processor 803 includes one or more processing cores with each core configured to perform independently. A multi-core processor enables multiprocessing within a single physical package. Examples of a multi-core processor include two, four, eight, or greater numbers of processing cores. Alternatively or in addition, the processor 503 includes one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, and/or one or more application-specific integrated circuits (ASIC) 1309. A DSP 807 typically is configured to process real-world signals (e.g., sound) in real time independently of the processor 803. Similarly, an ASIC 1309 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 may comprise various forms of computer-readable media, e.g., including both dynamic memory (e.g., RAM) and static memory (e.g., ROM) for storing executable instructions that, when executed by the processor 803 and/or the DSP 807 and/or the ASIC 1309, perform the process of exemplary embodiments as described herein. The memory 805 also stores the data associated with or generated by the execution of the process.

The term "computer-readable medium" or "computer-readable media," as used herein, refers to any medium that participates in providing instructions for execution by the processor 803, and/or one or more of the specialized components, such as the one or more digital signal processors (DSP) 807, and/or one or more application-specific integrated circuits (ASIC) 809. Such a medium may take many forms, including but not limited to non-volatile media, volatile media, and transmission media. Non-volatile media include, for example, read only memory (ROM), included within memory 805. Volatile media, for example, may include dynamic random access memory (RAM), included within memory 805. Transmission media may include copper or other conductive wiring, fiber optics, or other physical transmission media, including the wires and/or optical fiber that comprise bus 801. Transmission media can also take the form of wireless data signals, such as those generated during radio frequency (RF) and infrared (IR) data communications. Common forms of computer-readable media include, for example, magnetic storage media (e.g., magnetic hard disks or any other magnetic storage medium), solid state or semiconductor storage media (e.g., RAM, PROM, EPROM, FLASH EPROM, a data storage device that uses integrated circuit assemblies as memory to store data persistently, or any other storage memory chip or module), optical storage media (e.g., CD ROM, CDRW, DVD, or any other optical storage medium), a or any other medium for storing data from which a computer or processor can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Moreover, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various exemplary embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

FIG. 9 illustrates a block diagram of a computer system that can be utilized in implementing exemplary embodiments of the present invention. The computer system 900 includes a bus 901 or other communications mechanism for communicating information, and a processor 903 coupled to the bus 901 for processing information. The processor may comprise one or more of various types of general processors, and/or one or more specialized components (not shown), such as the one or more digital signal processors (DSPs) and/or one or more application-specific integrated circuits (ASICs). The computer system 900 also includes main memory 905, such as a random access memory (RAM) or other dynamic storage device, coupled to the bus 901 for storing information and instructions to be executed by the processor 903. Memory 905 can also be used for storing temporary variables or other intermediate information during execution of instructions to be executed by the processor 903. The computer system 900 further includes a read only memory (ROM) 907 or other static storage device coupled to the bus 901 for storing static information and instructions for the processor 903. A storage device 909, such as a magnetic disk or optical disk, is additionally coupled to the bus 901 for storing information and instructions.

The computer system 900 can be coupled via the bus 901 to a display 911, such as a cathode ray tube (CRT), liquid crystal display, active matrix display, or plasma display, for displaying information to a computer user. An input device 913, such as a keyboard including alphanumeric and other keys, is coupled to the bus 901 for communicating information and command selections to the processor 903. Another type of user input device is cursor control 915, such as a mouse, a trackball, or cursor direction keys for communicating direction information and command selections to the processor 903 and for controlling cursor movement on the display 911.

According to aspects of exemplary embodiments of the invention, dynamic and flexible architectures, apparatus and methods for implementing load balancing for traffic loads for multiple priorities, in accordance with exemplary embodiments, are provided by the computer system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement can also be employed to execute the instructions contained in main memory 905. In alternative embodiments, hard-wired circuitry can be used in place of or in combination with software instructions to implement embodiments and aspects of the invention. Thus, embodiments of the present invention are not limited to any specific combination of hardware circuitry and software.

The computer system 900 also includes a communications interface 917 coupled to bus 901. The communications interface 917 provides a two-way data communications, such as coupling to a network link 919 connected to a local network 921 or to or from remote terminals or controllers of communications systems. For example, the communications interface 917 can be a digital subscriber line (DSL) card or modem, an integrated services digital network (ISDN) card, a cable modem, or a telephone modem to provide a data communications connection to a corresponding type of telephone line. As another example, communications interface 917 can be a local area network (LAN) card (e.g., for Ethernet or an Asynchronous Transfer Model (ATM) network) to provide a data communications connection to a compatible LAN. Wireless links, such as for satellite communications systems, can also be implemented. In any such implementation, communications interface 917 sends and receives electrical, electromagnetic, or optical signals that carry digital data streams representing various types of information. Further, the communications interface 917 can include peripheral interface devices, such as a Universal Serial Bus (USB) interface, a PCMCIA (Personal Computer Memory Card International Association) interface, etc.

The network link 919 typically provides data communications through one or more networks to other data devices. For example, the network link 919 can provide a connection through local network 921 to a host computer 923, which has connectivity to a network 925 (e.g., a wide area network (WAN) or the global packet data communications network now commonly referred to as the "Internet") or to data equipment operated by service provider. The local network 921 and network 925 both use electrical, electromagnetic, or optical signals to convey information and instructions. The signals through the various networks and the signals on network link 919 and through communications interface 917, which communicate digital data with computer system 900, are exemplary forms of carrier waves bearing the information and instructions.

The computer system 900 can send messages and receive data, including program code, through the network(s), network link 919, and communications interface 917. In the Internet example, a server (not shown) can transmit requested code belonging to an application program for implementing an embodiment of the present invention through the network 925, local network 921 and communications interface 917. The processor 903 can execute the transmitted code while being received and/or store the code in storage device 909, or other non-volatile storage for later execution. In this manner, computer system 900 can obtain application code in the form of a carrier wave.

While exemplary embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
accessing, by a processor of a device, stored information representing a predetermined structured parity check matrix of a Low Density Parity Check (LDPC) code, wherein the stored information reflects a tabular format of rows and columns, wherein each row represents occurrences of one values within a respective column of the parity check matrix, and wherein the columns of the parity check matrix are derived according to a predetermined operation based on the respective rows of the stored tabular information; and
encoding one or more blocks of information bits of a source signal based on the LDPC code to generate an LDPC encoded signal;
wherein the LDPC encoding of the blocks of information bits (each block being of a size of $k_{ldpc}$ information bits, and each resulting encoded block being of a size of $n_{ldpc}$ code bits including parity bits $p_i$, i=0, 1, 2, . . . , $n_{ldpc}-k_{ldpc}-1$), comprises:
initializing parity bit accumulators $a_0=a_1= \ldots =a_{n_{ldpc}-k_{ldpc}-1}=0$;
for a one of the blocks of information bits, divided into j sequential groups (each of a size of M information bits), and for j=1, 2, 3, . . . $k_{ldpc}/M$: (1) accumulating a first information bit of a $j^{th}$ group in certain of the parity bit accumulators reflected by accumulator addresses based on a $j^{th}$ row of the stored tabular information; and (2) accumulating the remaining (M−1) information bits of the $j^{th}$ group in certain of the parity bit accumulators reflected by accumulator addresses according to {x+m mod M*q} mod($n_{ldpc}-k_{ldpc}$), wherein x denotes an address of the parity bit accumulator corresponding to the first bit of the group, and q=($n_{ldpc}-k_{ldpc}$)/M; and after all of the information bits of the one block are accumulated, sequentially performing operations (with respect to the parity bit accumulators) according to $a_i = a_i \oplus a_{i-1}$, $i=1, 2, \ldots (n_{ldpc}-k_{ldpc}-1)$, where the additions are in Galois Field (GF) 2; and wherein the parity bits $p_i$, $i=0, 1, \ldots (n_{ldpc}-k_{ldpc}-1)$ are respectively reflected by the resulting parity bit accumulators $a_i$, $i=0, 1, \ldots (n_{ldpc}-k_{ldpc}-1)$; and wherein the stored information representing the structured parity check matrix comprises a one of the following Tables 1a through 1r, TABLE 1a Address of Parity Bit Accumulators (Rate 9/10 - Coded Block Size 720)

10 62 53 15
54 56 5 3
8 34 23 45
10 60 23 27
6 70 51 65
26 38 23 67
18 22 25 1
12 28 5 61
36 44 7 49
20 46 29 69
6 22 31
46 37 51
54 18 65
32 11 17
46 32 15
0 3 45
44 24 63
64 45 23

TABLE 1b

Address of Parity Bit Accumulators (Rate 9/10 - Coded Block Size 960)

88 70 81 43
6 64 29 13
18 82 1 35
10 6 47 53
38 22 57 1
78 6 87 15
78 48 73 37
26 82 13 17
52 62 19 29
58 14 79 27
86 16 19
2 7 95
44 30 5
42 81 13
22 66 17
8 93 19
82 50 41
16 93 57

TABLE 1c

Address of Parity Bit Accumulators (Rate 9/10 - Coded Block Size 1440)

132 109 122 67
12 97 46 19
120 129 70 31
28 125 2 55
108 81 134 59
136 49 30 139
40 69 38 123
100 141 46 75
64 109 134 47
120 29 26 67
112 37 10 55
136 53 122 103

TABLE 1c-continued

Address of Parity Bit Accumulators (Rate 9/10 - Coded Block Size 1440)

80 17 34 115
40 61 46 71
132 81 18 7
12 113 6 143
108 113 122 11
108 69 110 63
124 141 2 115
100 133 18 15
133 0 51
106 40 115
101 62 67
136 17 50
80 10 75
37 126 19
40 25 122
40 129 143
12 66 83
17 7 74
52 17 23
8 21 94
117 119 80
70 104 25
66 43 73
88 98 111

TABLE 1d

Address of Parity Bit Accumulators (Rate 9/10 - Coded Block Size 2160)

36 153 142 127
136 157 182 151
108 197 106 63
108 49 182 35
8 89 134 43
56 105 30 175
104 181 66 115
96 5 78 211
52 57 194 119
128 97 2 23
196 37 2 171
184 177 10 15
56 17 2 43
84 121 142 35
8 21 62 107
184 193 46 7
160 205 42 107
120 181 122 103
196 153 46 163
72 105 202 11
31 86 157
176 186 129
0 27 201
140 154 191
155 6 105
124 118 55
44 197 87
60 189 206
121 8 215
206 93 43
136 94 65
28 178 51
110 59 144
149 98 12
149 107 184
61 122 99

TABLE 1e

Address of Parity Bit Accumulators (Rate 9/10 - Coded Block Size 2880)

92 133 95 39
78 91 251 284
262 92 89 204

TABLE 1e-continued

Address of Parity Bit Accumulators (Rate 9/10 - Coded Block Size 2880)

15 226 74 150
73 39 28 47
258 175 57 160
171 286 97 12
208 69 108 59
164 4 171 217
50 245 171 139
18 122 35 97
30 26 160 53
81 72 286 20
236 259 66 105
11 0 146 7
196 95 168 194
1 129 64 29
241 177 250 47
151 53 184 192
59 52 21 84
248 87 264 280
103 278 137 154
175 56 273 192
43 80 183 95
134 245 142 33
229 18 196 200
186 188 251 33
43 33 250 74
6 55 77 261
282 139 286 227
135 163 89
252 151 250
138 286 205
32 137 4
44 87 137
192 158 189
138 50 173
236 15 94
82 285 281
133 249 191
114 1 128
96 193 76
1 242 153
284 156 53
42 92 160
113 247 81
196 275 103
168 117 262
116 166 137
177 8 125
115 9 6
199 219 18
208 138 73
14 154 101

TABLE 1f

Address of Parity Bit Accumulators (Rate 9/10 - Coded Block Size 3600)

212 271 274 5
122 345 127 59
138 71 189 157
60 256 26 143
234 105 190 224
240 217 129 58
135 2 349 221
227 336 171 194
358 169 77 330
34 235 174 269
74 261 28 235
126 50 345 130
302 42 31 15
214 47 79 339
89 180 178 9
38 192 89 49
332 256 222 183
187 140 88 137
213 307 190 137

TABLE 1f-continued

Address of Parity Bit Accumulators (Rate 9/10 - Coded Block Size 3600)

225 258 289 233
188 336 85 93
98 352 333 17
324 62 244 149
108 19 242 292
340 303 65 150
166 95 282 169
278 61 113 234
122 207 52 107
37 296 135 178
330 271 200 339
176 243 203
284 202 249
210 350 9
61 126 16
253 317 108
91 298 287
160 237 31
72 247 124
38 347 169
113 346 24
266 21 108
188 267 269
298 117 275
332 216 163
317 130 146
272 82 193
30 129 77
282 7 327
292 319 5
99 276 305
125 169 303
80 225 60
92 304 7
36 86 46

TABLE 1g

Address of Parity Bit Accumulators (Rate 9/10 - Coded Block Size 4320)

273 190 207 371
331 258 135 416
306 12 291 293
262 215 396 74
14 193 91 207
384 341 260 81
128 365 170 9
336 396 413 238
16 407 130 4
42 323 54 85
6 103 349 176
216 286 426 277
425 416 419 322
289 164 379 189
1 292 319 363
345 132 134 423
366 146 381 235
88 111 206 4
121 426 307 254
203 244 406 216
7 275 53 76
329 418 416 84
233 293 351 368
153 410 101 183
196 400 170 65
192 357 31 43
46 245 428 304
51 1 144 351
319 321 413 298
350 213 244 210
387 166 367 228
297 178 83 238
97 428 266 165
197 423 115 265
43 104 172 122

TABLE 1g-continued

Address of Parity Bit Accumulators (Rate 9/10 - Coded Block Size 4320)

144 227 407 65
166 210 73 311
94 351 154 357
64 172 30 13
320 243 412 318
392 346 252
286 13 207
208 277 178
67 161 394
351 45 17
295 196 251
326 356 145
168 411 262
54 51 177
398 148 355
330 168 399
161 312 50
419 65 327
61 374 232
28 69 303
298 116 221
52 270 165
103 398 283
243 184 364
348 7 209
362 221 187
343 184 190
265 306 277
56 25 34
325 345 60
198 344 113
68 41 171
253 56 188
431 27 256
106 421 22
274 279 67
298 294 79

TABLE 1h

Address of Parity Bit Accumulators (Rate 9/10 - Coded Block Size 5760)

35 247 105 399
280 268 513 68
161 104 460 466
156 253 305 393
72 489 178 202
398 199 151 383
92 527 54 224
200 409 42 147
459 569 553 312
242 180 155 10
216 458 361 318
104 489 206 52
22 56 123 538
264 295 130 29
263 28 274 239
276 124 449 21
360 482 519 253
225 202 212 312
268 338 558 200
43 291 436 27
84 231 40 521
95 142 558 361
475 462 319 419
84 74 522 573
451 188 526 263
226 159 440 491
415 434 60 215
553 250 72 209
18 436 311 210
327 524 536 18
15 211 11 453
22 452 289 305
351 187 343 240

TABLE 1h-continued

Address of Parity Bit Accumulators (Rate 9/10 - Coded Block Size 5760)

98 33 493 147
100 176 188 384
379 347 349 332
532 518 483 445
496 203 269 304
459 344 311 574
128 429 538 527
479 125 43 508
228 315 416 231
417 558 501 190
498 526 341 505
270 381 517 260
12 481 91
44 540 104
339 295 172
467 569 121
137 474 221
567 444 506
104 526 327
547 134 519
522 262 547
37 375 377
455 400 327
325 213 390
6 167 11
363 160 541
337 185 61
225 7 233
450 407 323
288 38 463
95 274 279
377 423 411
227 558 156
114 497 471
22 73 296
508 393 182
304 239 183
415 322 332
28 500 106
470 358 505
461 302 342
68 255 90
416 368 487
177 531 161
84 314 391
310 392 367
177 19 102
130 366 25

TABLE 1i

Address of Parity Bit Accumulators (Rate 2/3 - Coded Block Size 1080)

78 323 226 335 169 288 12 213
328 321 122 163 12 37 310 223
344 97 346 195 180 325 22 311
56 121 26 187 148 109 302 119
332 251 289 166
197 24 303 313
258 228 239 181
232 154 323 182
6 282 77
162 3 199
295 112 251
33 50 61
139 208 95
228 121 216
356 302 349
201 324 14

TABLE 1j

Address of Parity Bit Accumulators (Rate 4/5 - Coded Block Size 1080)

90 67 188 117 28 125
186 1 146 99 22 197
60 85 44 147 118 41
42 133 8 75 142 17
30 97 158 93 46 71
30 109 182 195 16 143
60 10 105
33 166 185
142 85 168
86 133 159
104 137 91
24 110 167
31 36 46
142 186 63
89 139 116
99 5 88
176 195 193
12 44 185
168 37 146 141 166 101
66 37 200 45 136 89
90 19 152 111 94 179
84 211 26 183 64 113
60 1 80 129 190 179
6 121 20 159 88 131

TABLE 1k

Address of Parity Bit Accumulators (Rate 8/9 - Coded Block Size 720)

34 78 37 17
72 76 43 35
2 4 79 37
40 60 51 17
4 70 59 49
50 22 63 31
46 20 69 73
40 70 57 55
38 22 43
46 40 71
14 17 61
26 21 45
4 36 1
60 26 33
46 55 21
36 27 13

TABLE 1l

Address of Parity Bit Accumulators (Rate 8/9 - Coded Block Size 1080)

20 77 70 31
96 45 86 3
24 65 34 3
0 21 74 67
28 5 106 71
16 41 18 95
72 17 6 59
40 69 22 71
64 101 86 83
96 85 46 119
96 37 70 99
0 89 46 59
80 65 74 63
44 57 102 79
76 5 54 115
8 109 74 119
32 105 118
48 57 62
44 89 30
80 97 114
60 65 115
40 5 111
52 9 27

TABLE 1l-continued

Address of Parity Bit Accumulators (Rate 8/9 - Coded Block Size 1080)

108 105 79
116 38 47
32 38 79
36 34 51
56 94 119
49 114 119
21 78 51
1 22 87
37 66 15

TABLE 1m

Address of Parity Bit Accumulators (Rate 8/9 - Coded Block Size 1440)

68 49 138 87
16 89 62 39
140 1 106 75
12 141 46 67
100 9 26 87
12 41 94 83
128 73 106 35
20 113 10 55
16 81 122 135
136 97 38 111
140 77 102 143
60 105 86 71
88 61 130 39
136 121 134 75
92 145 98 151
12 5 50 7
64 125 94
152 9 6
56 9 130
96 93 114
60 93 103
48 157 139
132 157 115
72 61 79
64 14 31
80 130 95
140 46 131
92 74 139
5 122 75
145 14 19
121 22 143
121 86 119

TABLE 1n

Address of Parity Bit Accumulators (Rate 8/9 - Coded Block Size 2160)

116 121 22 107
120 113 90 115
168 225 70 199
208 137 190 99
220 113 34 207
52 177 94 235
204 229 66 171
100 85 218 123
16 113 2 23
96 73 26 159
120 169 138 199
104 65 130 139
96 161 194 143
104 209 226 39
236 125 182 79
140 13 50 79
28 193 118
188 89 34
224 61 50
128 81 46
156 9 111
156 37 175

TABLE 1n-continued

Address of Parity Bit Accumulators (Rate 8/9 - Coded Block Size 2160)

72 105 239
64 137 131
176 182 135
148 18 95
100 54 215
224 174 103
165 238 87
145 214 207
89 182 55
53 38 159

TABLE 1o

Address of Parity Bit Accumulators (Rate 8/9 - Coded Block Size 2880)

33 174 30 142
266 282 240 78
291 229 80 43
156 132 134 303
50 31 287 239
68 186 92 75
59 203 255 37
171 139 287 45
101 23 89 52
20 271 38 109
84 32 111 225
183 314 101 110
142 163 44 25
206 302 173 5
86 272 18 39
237 199 140 86
248 159 56 167
215 283 76 254
190 187 148 291
310 57 53 99
90 134 151
199 111 30
227 148 51
167 33 294
190 147 173
84 175 108
35 317 138
111 300 73
306 292 224
106 307 274
202 153 79
58 195 131
10 249 242
51 9 28
275 6 287
54 246 313
106 88 49
315 42 218
265 212 239
85 306 147

TABLE 1p

Address of Parity Bit Accumulators (Rate 8/9 - Coded Block Size 3600)

267 282 5 84
96 78 167 18
276 240 117 303
136 175 169 324
117 73 360 4
379 398 265 253
146 11 62 89
114 227 342 31
26 284 295 49
239 137 124 350
118 266 191 155
213 310 20 73
384 231 396 323

TABLE 1p-continued

Address of Parity Bit Accumulators (Rate 8/9 - Coded Block Size 3600)

216 317 150 129
232 58 27 245
272 18 59 253
62 376 44 337
293 392 42 396
87 270 91 25
284 2 22 157
8 169 355 174
71 330 336 156
11 325 343 265
226 395 101 263
163 60 152 303
250 245 206 289
382 354 57 368
212 201 271 214
120 237 11 68
362 174 180 269
315 7 233 112
290 11 157 183
351 284 9
95 240 233
335 261 152
78 267 348
253 42 75
78 75 29
98 64 84
385 378 54
39 152 132
298 41 3
396 171 183
397 328 47
336 197 218
214 19 266
57 166 285
265 284 214
75 5 239
74 46 244
313 317 127
8 3 65
50 60 177
310 119 325
136 36 134
152 154 59
103 323 245
369 120 148
328 387 21
20 355 13
238 384 193
154 351 121
322 390 44
66 326 39

TABLE 1q

Address of Parity Bit Accumulators (Rate 8/9 - Coded Block Size 4320)

30 196 79 344
162 460 169 79
210 252 30 83
389 334 100 47
199 11 210 305
344 333 474 454
400 137 475 29
328 137 67 453
228 258 371 16
8 268 197 38
174 403 56 41
25 52 309 303
239 152 81 379
106 452 443 31
474 149 238 119
465 314 349 366
406 458 395 152
229 38 432 457
421 360 113 247

TABLE 1q-continued

Address of Parity Bit Accumulators (Rate 8/9 - Coded Block Size 4320)

244 144 178 315
189 97 212 62
375 166 356 397
2 307 79 436
385 314 411 287
159 389 392 190
77 115 316 118
50 284 59 53
329 67 277 42
177 466 331 380
144 335 402 52
48 449 126 151
160 273 70 143
53 440 436
321 262 469
271 379 374
55 394 181
279 57 168
176 225 134
322 267 220
418 203 308
270 332 257
398 82 379
104 167 117
141 82 168
119 332 470
370 165 96
361 51 463
225 363 460
468 151 461
103 444 357
359 357 203
188 1 350
379 385 256
274 393 123
408 434 142
96 426 414
343 22 106
277 434 108
363 110 257
407 85 353
204 45 307
424 39 230
376 41 346
416 259 124

TABLE 1r

Address of Parity Bit Accumulators (Rate 8/9 - Coded Block Size 5760)

353 507 64 261
477 315 226 338
72 128 203 524
180 202 549 634
189 460 321 307
339 402 117 164
461 342 193 78
145 236 119 63
100 365 496 418
210 341 285 136
376 482 304 510
468 31 274 75
587 550 182 409
30 365 461 19
184 599 351 66
28 627 2 475
143 352 175 161
163 637 166 159
33 138 486 307
580 583 384 8
573 524 380 465
510 366 451 154
93 258 525 304
358 286 434 410
458 26 442 565

TABLE 1r-continued

Address of Parity Bit Accumulators (Rate 8/9 - Coded Block Size 5760)

530 385 548 99
207 142 119 321
177 529 372 111
213 517 492 276
71 473 407 479
325 351 298 62
219 368 361 476
56 304 558 543
554 515 527 621
379 447 56 482
560 469 205 637
453 334 18 500
469 244 395 102
230 593 92 547
160 491 103 266
541 50 233
156 77 72
397 39 464
305 68 284
519 307 35
281 349 44
191 275 460
296 232 348
543 332 626
40 23 28
31 205 512
476 107 519
60 458 224
9 406 148
341 346 442
270 544 283
259 571 503
363 157 472
425 170 107
384 425 288
467 86 199
323 564 536
513 10 167
352 500 48
104 432 347
311 392 118
571 396 145
584 609 328
145 50 403
181 625 159
73 169 271
265 626 552
327 564 439
132 55 384
221 57 75
477 292 598
16 273 148
90 209 266
160 451 98
20 143 274.

2. A method according to claim 1, wherein row indices of 1's in a column index j*M (j=0, 1, 2, 3, ..., $k_{ldpc}$/M−1) of the parity check matrix are given at the $j^{th}$ row according to the one Table.

3. A method according to claim 1, wherein the LDPC code is of a structure that facilitates use of a plurality of parallel engines for decoding the encoded signal.

4. A method according to claim 1, further comprising:
modulating the LDPC encoded signal according to a signal constellation reflecting one of QPSK (Quadrature Phase Shift Keying), OQPSK (Offset QPSK), PSK (Phase Shift Keying), 8-PSK, 16-APSK (Amplitude PSK), and 32-APSK.

5. A method according to claim 1, further comprising:
modulating the LDPC encoded signal according to a signal constellation that comprises a one of the following formats (where $\epsilon_x$ represents average energy per symbol), a QPSK (Quadrature Phase Shift Keying) constellation having bit labeling and x-y bit positioning according to the following table:

| Bit Label | [x, y] Coordinates |
|---|---|
| 00 | $[\sqrt{\epsilon_x} * \cos(\pi/4.0), \sqrt{\epsilon_x} * \sin(\pi/4.0)]$ |
| 01 | $[\sqrt{\epsilon_x} * \cos(7.0 * \pi/4.0), \sqrt{\epsilon_x} * \sin(7.0 * \pi/4.0)]$ |
| 10 | $[\sqrt{\epsilon_x} * \cos(3.0 * \pi/4.0), \sqrt{\epsilon_x} * \sin(3.0 * \pi/4.0)]$ |
| 11 | $[\sqrt{\epsilon_x} * \cos(5.0 * \pi/4.0), \sqrt{\epsilon_x} * \sin(5.0 * \pi/4.0)]$ | an 8-PSK (Phase Shift Keying) constellation having bit labeling and x-y bit positioning according to the following table:

| Bit Label | [x, y] Coordinates |
|---|---|
| 000 | $[\sqrt{\epsilon_x} * \cos(\pi/8.0), \sqrt{\epsilon_x} * \sin(\pi/8.0)]$ |
| 001 | $[\sqrt{\epsilon_x} * \cos(15.0 * \pi/8.0), \sqrt{\epsilon_x} * \sin(15.0 * \pi/8.0)]$ |
| 010 | $[\sqrt{\epsilon_x} * \cos(7.0 * \pi/8.0), \sqrt{\epsilon_x} * \sin(7.0 * \pi/8.0)]$ |
| 011 | $[\sqrt{\epsilon_x} * \cos(9.0 * \pi/8.0), \sqrt{\epsilon_x} * \sin(9.0 * \pi/8.0)]$ |
| 100 | $[\sqrt{\epsilon_x} * \cos(3.0 * \pi/8.0), \sqrt{\epsilon_x} * \sin(3.0 * \pi/8.0)]$ |
| 101 | $[\sqrt{\epsilon_x} * \cos(13.0 * \pi/8.0), \sqrt{\epsilon_x} * \sin(13.0 * \pi/8.0)]$ |
| 110 | $[\sqrt{\epsilon_x} * \cos(5.0 * \pi/8.0), \sqrt{\epsilon_x} * \sin(5.0 * \pi/8.0)]$ |
| 111 | $[\sqrt{\epsilon_x} * \cos(11.0 * \pi/8.0), \sqrt{\epsilon_x} * \sin(11.0 * \pi/8.0)]$ | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and $4*R1^2+12*R2^2=16$):

| Bit Label | [x, y] Coordinates |
|---|---|
| 0000 | $[R2 * \sqrt{\epsilon_x} * \cos(3.0 * \pi/12.0), R2 * \sqrt{\epsilon_x} * \sin(3.0 * \pi/12.0)]$ |
| 0001 | $[R2 * \sqrt{\epsilon_x} * \cos(21.0 * \pi/12.0), R2 * \sqrt{\epsilon_x} * \sin(21 * \pi/12.0)]$ |
| 0010 | $[R2 * \sqrt{\epsilon_x} * \cos(9.0 * \pi/12.0), R2 * \sqrt{\epsilon_x} * \sin(9 * \pi/12.0)]$ |
| 0011 | $[R2 * \sqrt{\epsilon_x} * \cos(15.0 * \pi/12.0), R2 * \sqrt{\epsilon_x} * \sin(15 * \pi/12.0)]$ |
| 0100 | $[R2 * \sqrt{\epsilon_x} * \cos(\pi/12.0), R2 * \sqrt{\epsilon_x} * \sin(\pi/12.0)]$ |
| 0101 | $[R2 * \sqrt{\epsilon_x} * \cos(23.0 * \pi/12.0), R2 * \sqrt{\epsilon_x} * \sin(23 * \pi/12.0)]$ |
| 0110 | $[R2 * \sqrt{\epsilon_x} * \cos(11.0 * \pi/12.0), R2 * \sqrt{\epsilon_x} * \sin(11 * \pi/12.0)]$ |
| 0111 | $[R2 * \sqrt{\epsilon_x} * \cos(13.0 * \pi/12.0), R2 * \sqrt{\epsilon_x} * \sin(13 * \pi/12.0)]$ |
| 1000 | $[R2 * \sqrt{\epsilon_x} * \cos(5.0 * \pi/12.0), R2 * \sqrt{\epsilon_x} * \sin(5 * \pi/12.0)]$ |
| 1001 | $[R2 * \sqrt{\epsilon_x} * \cos(19.0 * \pi/12.0), R2 * \sqrt{\epsilon_x} * \sin(19 * \pi/12.0)]$ |
| 1010 | $[R2 * \sqrt{\epsilon_x} * \cos(7.0 * \pi/12.0), R2 * \sqrt{\epsilon_x} * \sin(7 * \pi/12.0)]$ |
| 1011 | $[R2 * \sqrt{\epsilon_x} * \cos(17.0 * \pi/12.0), R2 * \sqrt{\epsilon_x} * \sin(17 * \pi/12.0)]$ |
| 1100 | $[R1 * \sqrt{\epsilon_x} * \cos(\pi/4.0), R1 * \sqrt{\epsilon_x} * \sin(\pi/4.0)]$ |
| 1101 | $[R1 * \sqrt{\epsilon_x} * \cos(7.0 * \pi/4.0), R1 * \sqrt{\epsilon_x} * \sin(7.0 * \pi/4.0)]$ |
| 1110 | $[R1 * \sqrt{\epsilon_x} * \cos(3.0 * \pi/4.0), R1 * \sqrt{\epsilon_x} * \sin(3.0 * \pi/4.0)]$ |
| 1111 | $[R1 * \sqrt{\epsilon_x} * \cos(5.0 * \pi/4.0), R1 * \sqrt{\epsilon_x} * \sin(5.0 * \pi/4.0)]$ | a 32-APSK constellation, of a 4+12+16 bit/ring format, having a bit labeling and x-y bit positioning according to the following table (where R1 represents the radius of an inner ring, R2 represents the radius of a middle ring and R3 represents the radius of an outer ring, and $4*R1^2+12*R2^2=16*R3^2=32$):

| Bit Label | [x, y] Coordinates |
|---|---|
| 00000 | $[R2 * \sqrt{\epsilon_x} * \sin(\pi/4.0), R2 * \sqrt{\epsilon_x} * \sin(\pi/4.0)]$ |
| 00001 | $[R2 * \sqrt{\epsilon_x} * \sin(\pi/12.0), R2 * \sqrt{\epsilon_x} * \sin(5.0 * \pi/12.0)]$ |
| 00010 | $[R2 * \sqrt{\epsilon_x} * \sin(\pi/4.0), -R2 * \sqrt{\epsilon_x} * \sin(\pi/4.0)]$ |
| 00011 | $[R2 * \sqrt{\epsilon_x} * \sin(\pi/12.0), -R2 * \sqrt{\epsilon_x} * \sin(5.0 * \pi/12.0)]$ |
| 00100 | $[-R2 * \sqrt{\epsilon_x} * \sin(\pi/4.0), R2 * \sqrt{\epsilon_x} * \sin(\pi/4.0)]$ |
| 00101 | $[-R2 * \sqrt{\epsilon_x} * \sin(\pi/12.0), R2 * \sqrt{\epsilon_x} * \sin(5.0 * \pi/12.0)]$ |
| 00110 | $[-R2 * \sqrt{\epsilon_x} * \sin(\pi/4.0), -R2 * \sqrt{\epsilon_x} * \sin(\pi/4.0)]$ |
| 00111 | $[-R2 * \sqrt{\epsilon_x} * \sin(\pi/12.0), -R2 * \sqrt{\epsilon_x} * \sin(5.0 * \pi/12.0)]$ |
| 01000 | $[R3 * \sqrt{\epsilon_x} * \cos(\pi/8.0), R3 * \sqrt{\epsilon_x} * \sin(\pi/8.0)]$ |
| 01001 | $[R3 * \sqrt{\epsilon_x} * \sin(\pi/8.0), R3 * \sqrt{\epsilon_x} * \cos(\pi/8.0)]$ |
| 01010 | $[R3 * \sqrt{\epsilon_x} * \sin(\pi/4.0), -R3 * \sqrt{\epsilon_x} * \sin(\pi/4.0)]$ |
| 01011 | $[0, -R3 * \sqrt{\epsilon_x}]$ |
| 01100 | $[-R3 * \sqrt{\epsilon_x} * \sin(\pi/4.0), R3 * \sqrt{\epsilon_x} * \sin(\pi/4.0)]$ |
| 01101 | $[0, R3 * \sqrt{\epsilon_x}]$ |
| 01110 | $[-R3 * \sqrt{\epsilon_x} * \cos(\pi/8.0), -R3 * \sqrt{\epsilon_x} * \sin(\pi/8.0)]$ |
| 01111 | $[-R3 * \sqrt{\epsilon_x} * \sin(\pi/8.0), -R3 * \sqrt{\epsilon_x} * \cos(\pi/8.0)]$ |
| 10000 | $[R2 * \sqrt{\epsilon_x} * \sin(5.0 * \pi/12.0), R2 * \sqrt{\epsilon_x} * \sin(\pi/12.0)]$ |
| 10001 | $[R1 * \sqrt{\epsilon_x} * \sin(\pi/4.0), R1 * \sqrt{\epsilon_x} * \sin(\pi/4.0)]$ |
| 10010 | $[R2 * \sqrt{\epsilon_x} * \sin(5.0 * \pi/12.0), -R2 * \sqrt{\epsilon_x} * \sin(\pi/12.0)]$ |
| 10011 | $[R1 * \sqrt{\epsilon_x} * \sin(\pi/4.0), -R1 * \sqrt{\epsilon_x} * \sin(\pi/4.0)]$ |
| 10100 | $[-R2 * \sqrt{\epsilon_x} * \sin(5.0 * \pi/12.0), R2 * \sqrt{\epsilon_x} * \sin(\pi/12.0)]$ |
| 10101 | $[-R1 * \sqrt{\epsilon_x} * \sin(\pi/4.0), R1 * \sqrt{\epsilon_x} * \sin(\pi/4.0)]$ |
| 10110 | $[-R2 * \sqrt{\epsilon_x} * \sin(5.0 * \pi/12.0), -R2 * \sqrt{\epsilon_x} * \sin(\pi/12.0)]$ |
| 10111 | $[-R1 * \sqrt{\epsilon_x} * \sin(\pi/4.0), -R1 * \sqrt{\epsilon_x} * \sin(\pi/4.0)]$ |
| 11000 | $[R3 * \sqrt{\epsilon_x}, 0]$ |
| 11001 | $[R3 * \sqrt{\epsilon_x} * \sin(\pi/4.0), R3 * \sqrt{\epsilon_x} * \sin(\pi/4.0)]$ |
| 11010 | $[R3 * \sqrt{\epsilon_x} * \cos(\pi/8.0), -R3 * \sqrt{\epsilon_x} * \sin(\pi/8.0)]$ |
| 11011 | $[R3 * \sqrt{\epsilon_x} * \sin(\pi/8.0), -R3 * \sqrt{\epsilon_x} * \cos(\pi/8.0)]$ |
| 11100 | $[-R3 * \sqrt{\epsilon_x} * \cos(\pi/8.0), R3 * \sqrt{\epsilon_x} * \sin(\pi/8.0)]$ |
| 11101 | $[-R3 * \sqrt{\epsilon_x} * \sin(\pi/8.0), R3 * \sqrt{\epsilon_x} * \cos(\pi/8.0)]$ |
| 11110 | $[-R3 * \sqrt{\epsilon_x}, 0]$ |
| 11111 | $[-R3 * \sqrt{\epsilon_x} * \sin(\pi/4.0), -R3 * \sqrt{\epsilon_x} * \sin(\pi/4.0)]$ | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | $[-R3 * \sqrt{\epsilon_x} * \sin(\pi/4.0), R3 * \sqrt{\epsilon_x} * \sin(\pi/4.0)]$ |
| 00001 | $[-R3 * \sqrt{\epsilon_x} * \sin(\pi/8.0), R3 * \sqrt{\epsilon_x} * \cos(\pi/8.0)]$ |
| 00010 | $[R3 * \sqrt{\epsilon_x} * \sin(\pi/8.0), R3 * \sqrt{\epsilon_x} * \cos(\pi/8.0)]$ |
| 00011 | $[0, R3 * \sqrt{\epsilon_x}]$ |
| 00100 | $[-R2 * \sqrt{\epsilon_x} * \sin(\pi/4.0), R2 * \sqrt{\epsilon_x} * \sin(\pi/4.0)]$ |
| 00101 | $[-R2 * \sqrt{\epsilon_x} * \sin(\pi/12.0), R2 * \sqrt{\epsilon_x} * \sin(5.0 * \pi/12.0)]$ |
| 00110 | $[R2 * \sqrt{\epsilon_x} * \sin(\pi/4.0), R2 * \sqrt{\epsilon_x} * \sin(\pi/4.0)]$ |
| 00111 | $[R2 * \sqrt{\epsilon_x} * \sin(\pi/12.0), R2 * \sqrt{\epsilon_x} * \sin(5.0 * \pi/12.0)]$ |
| 01000 | $[-R3 * \sqrt{\epsilon_x} * \cos(\pi/8.0), R3 * \sqrt{\epsilon_x} * \sin(\pi/8.0)]$ |
| 01001 | $[-R3 * \sqrt{\epsilon_x}, 0]$ |
| 01010 | $[R3 * \sqrt{\epsilon_x} * \sin(\pi/4.0), R3 * \sqrt{\epsilon_x} * \sin(\pi/4.0)]$ |
| 01011 | $[R3 * \sqrt{\epsilon_x} * \cos(\pi/8.0), R3 * \sqrt{\epsilon_x} * \sin(\pi/8.0)]$ |
| 01100 | $[-R2 * \sqrt{\epsilon_x} * \sin(5.0 * \pi/12.0), R2 * \sqrt{\epsilon_x} * \sin(\pi/12.0)]$ |
| 01101 | $[-R1 * \sqrt{\epsilon_x} * \sin(\pi/4.0), R1 * \sqrt{\epsilon_x} * \sin(\pi/4.0)]$ |
| 01110 | $[R2 * \sqrt{\epsilon_x} * \sin(5.0 \pi/12.0), R2 * \sqrt{\epsilon_x} * \sin(\pi/12.0)]$ |
| 01111 | $[R1 * \sqrt{\epsilon_x} * \sin(\pi/4.0), R1 * \sqrt{\epsilon_x} * \sin(\pi/4.0)]$ |
| 10000 | $[-R3 * \sqrt{\epsilon_x} * \sin(\pi/8.0), -R3 * \sqrt{\epsilon_x} * \cos(\pi/8.0)]$ |
| 10001 | $[0, -R3 * \sqrt{\epsilon_x}]$ |
| 10010 | $[R3 * \sqrt{\epsilon_x} * \sin(\pi/4.0), -R3 * \sqrt{\epsilon_x} * \sin(\pi/4.0)]$ |
| 10011 | $[R3 * \sqrt{\epsilon_x} * \sin(\pi/8.0), -R3 * \sqrt{\epsilon_x} * \cos(\pi/8.0)]$ |
| 10100 | $[-R2 * \sqrt{\epsilon_x} * \sin(\pi/4.0), -R2 * \sqrt{\epsilon_x} * \sin(\pi/4.0)]$ |
| 10101 | $[-R2 * \sqrt{\epsilon_x} * \sin(\pi/12.0), -R2 * \sqrt{\epsilon_x} * \sin(5.0 * \pi/12.0)]$ |
| 10110 | $[R2 * \sqrt{\epsilon_x} * \sin(\pi/4.0), -R2 * \sqrt{\epsilon_x} * \sin(\pi/4.0)]$ |
| 10111 | $[R2 * \sqrt{\epsilon_x} * \sin(\pi/12.0), -R2 * \sqrt{\epsilon_x} * \sin(5.0 * \pi/12.0)]$ |
| 11000 | $[-R3 * \sqrt{\epsilon_x} * \sin(\pi/4.0), -R3 * \sqrt{\epsilon_x} * \sin(\pi/4.0)]$ |
| 11001 | $[-R3 * \sqrt{\epsilon_x} * \cos(\pi/8.0), -R3 * \sqrt{\epsilon_x} * \sin(\pi/8.0)]$ |
| 11010 | $[R3 * \sqrt{\epsilon_x} * \cos(\pi/8.0), -R3 * \sqrt{\epsilon_x} * \sin(\pi/8.0)]$ |
| 11011 | $[R3 * \sqrt{\epsilon_x}, 0]$ |
| 11100 | $[-R2 * \sqrt{\epsilon_x} * \sin(5.0 * \pi/12.0), -R2 * \sqrt{\epsilon_x} * \sin(\pi/12.0)]$ |
| 11101 | $[-R1 * \sqrt{\epsilon_x} * \sin(\pi/4.0), -R1 * \sqrt{\epsilon_x} * \sin(\pi/4.0)]$ |
| 11110 | $[R2 * \sqrt{\epsilon_x} * \sin(5.0 * \pi/12.0), -R2 * \sqrt{\epsilon_x} * \sin(\pi/12.0)]$ |
| 11111 | $[R1 * \sqrt{\epsilon_x} * \sin(\pi/4.0), -R1 * \sqrt{\epsilon_x} * \sin(\pi/4.0)]$. |

6. A method according to claim 1, further comprising:

encoding, prior to the LDPC encoding, the one or more blocks of information bits of the source signal based on a t-error Bose Chaudhuri Hocquenghem (BCH) code.

7. A method according to claim 6, further comprising:

interleaving the LDPC encoded signal.

8. A method according to claim 7, further comprising:
modulating the interleaved signal according to a signal constellation that comprises a one of the following formats (where $\epsilon_x$ represents average energy per symbol),
a QPSK (Quadrature Phase Shift Keying) constellation having bit labeling and x-y bit positioning according to the following table:

| Bit Label | [x, y] Coordinates |
|---|---|
| 00 | $[\sqrt{\epsilon_x} * \cos(\pi/4.0), \sqrt{\epsilon_x} * \sin(\pi/4.0)]$ |
| 01 | $[\sqrt{\epsilon_x} * \cos(7.0 * \pi/4.0), \sqrt{\epsilon_x} * \sin(7.0 * \pi/4.0)]$ |
| 10 | $[\sqrt{\epsilon_x} * \cos(3.0 * \pi/4.0), \sqrt{\epsilon_x} * \sin(3.0 * \pi/4.0)]$ |
| 11 | $[\sqrt{\epsilon_x} * \cos(5.0 * \pi/4.0), \sqrt{\epsilon_x} * \sin(5.0 * \pi/4.0)]$ | an 8-PSK (Phase Shift Keying) constellation having bit labeling and x-y bit positioning according to the following table:

| Bit Label | [x, y] Coordinates |
|---|---|
| 000 | $[\sqrt{\epsilon_x} * \cos(\pi/8.0), \sqrt{\epsilon_x} * \sin(\pi/8.0)]$ |
| 001 | $[\sqrt{\epsilon_x} * \cos(15.0 * \pi/8.0), \sqrt{\epsilon_x} * \sin(15.0 * \pi/8.0)]$ |
| 010 | $[\sqrt{\epsilon_x} * \cos(7.0 * \pi/8.0), \sqrt{\epsilon_x} * \sin(7.0 * \pi/8.0)]$ |
| 011 | $[\sqrt{\epsilon_x} * \cos(9.0 * \pi/8.0), \sqrt{\epsilon_x} * \sin(9.0 * \pi/8.0)]$ |
| 100 | $[\sqrt{\epsilon_x} * \cos(3.0 * \pi/8.0), \sqrt{\epsilon_x} * \sin(3.0 * \pi/8.0)]$ |
| 101 | $[\sqrt{\epsilon_x} * \cos(13.0 * \pi/8.0), \sqrt{\epsilon_x} * \sin(13.0 * \pi/8.0)]$ |
| 110 | $[\sqrt{\epsilon_x} * \cos(5.0 * \pi/8.0), \sqrt{\epsilon_x} * \sin(5.0 * \pi/8.0)]$ |
| 111 | $[\sqrt{\epsilon_x} * \cos(11.0 * \pi/8.0), \sqrt{\epsilon_x} * \sin(11.0 * \pi/8.0)]$ | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and $4*R1^2+12*R2^2=16$):

| Bit Label | [x, y] Coordinates |
|---|---|
| 0000 | $[R2 * \sqrt{\epsilon_x} * \cos(3.0 * \pi/12.0), R2 * \sqrt{\epsilon_x} * \sin(3.0 * \pi/12.0)]$ |
| 0001 | $[R2 * \sqrt{\epsilon_x} * \cos(21.0 * \pi/12.0), R2 * \sqrt{\epsilon_x} * \sin(21 * \pi/12.0)]$ |
| 0010 | $[R2 * \sqrt{\epsilon_x} * \cos(9.0 * \pi/12.0), R2 * \sqrt{\epsilon_x} * \sin(9 * \pi/12.0)]$ |
| 0011 | $[R2 * \sqrt{\epsilon_x} * \cos(15.0 * \pi/12.0), R2 * \sqrt{\epsilon_x} * \sin(15 * \pi/12.0)]$ |
| 0100 | $[R2 * \sqrt{\epsilon_x} * \cos(\pi/12.0), R2 * \sqrt{\epsilon_x} * \sin(\pi/12.0)]$ |
| 0101 | $[R2 * \sqrt{\epsilon_x} * \cos(23.0 * \pi/12.0), R2 * \sqrt{\epsilon_x} * \sin(23 * \pi/12.0)]$ |
| 0110 | $[R2 * \sqrt{\epsilon_x} * \cos(11.0 * \pi/12.0), R2 * \sqrt{\epsilon_x} * \sin(11 * \pi/12.0)]$ |
| 0111 | $[R2 * \sqrt{\epsilon_x} * \cos(13.0 * \pi/12.0), R2 * \sqrt{\epsilon_x} * \sin(13 * \pi/12.0)]$ |
| 1000 | $[R2 * \sqrt{\epsilon_x} * \cos(5.0 * \pi/12.0), R2 * \sqrt{\epsilon_x} * \sin(5 * \pi/12.0)]$ |
| 1001 | $[R2 * \sqrt{\epsilon_x} * \cos(19.0 * \pi/12.0), R2 * \sqrt{\epsilon_x} * \sin(19 * \pi/12.0)]$ |
| 1010 | $[R2 * \sqrt{\epsilon_x} * \cos(7.0 * \pi/12.0), R2 * \sqrt{\epsilon_x} * \sin(7 * \pi/12.0)]$ |
| 1011 | $[R2 * \sqrt{\epsilon_x} * \cos(17.0 * \pi/12.0), R2 * \sqrt{\epsilon_x} * \sin(17 * \pi/12.0)]$ |
| 1100 | $[R1 * \sqrt{\epsilon_x} * \cos(\pi/4.0), R1 * \sqrt{\epsilon_x} * \sin(\pi/4.0)]$ |
| 1101 | $[R1 * \sqrt{\epsilon_x} * \cos(7.0 * \pi/4.0), R1 * \sqrt{\epsilon_x} * \sin(7.0 * \pi/4.0)]$ |
| 1110 | $[R1 * \sqrt{\epsilon_x} * \cos(3.0 * \pi/4.0), R1 * \sqrt{\epsilon_x} * \sin(3.0 * \pi/4.0)]$ |
| 1111 | $[R1 * \sqrt{\epsilon_x} * \cos(5.0 * \pi/4.0), R1 * \sqrt{\epsilon_x} * \sin(5.0 * \pi/4.0)]$ | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | $[R2 * \sqrt{\epsilon_x} * \sin(\pi/4.0), R2 * \sqrt{\epsilon_x} * \sin(\pi/4.0)]$ |
| 00001 | $[R2 * \sqrt{\epsilon_x} * \sin(\pi/12.0), R2 * \sqrt{\epsilon_x} * \sin(5.0 * \pi/12.0)]$ |
| 00010 | $[R2 * \sqrt{\epsilon_x} * \sin(\pi/4.0), -R2 * \sqrt{\epsilon_x} * \sin(\pi/4.0)]$ |
| 00011 | $[R2 * \sqrt{\epsilon_x} * \sin(\pi/12.0), -R2 * \sqrt{\epsilon_x} * \sin(5.0 * \pi/12.0)]$ |
| 00100 | $[-R2 * \sqrt{\epsilon_x} * \sin(\pi/4.0), R2 * \sqrt{\epsilon_x} * \sin(\pi/4.0)]$ |
| 00101 | $[-R2 * \sqrt{\epsilon_x} * \sin(\pi/12.0), R2 * \sqrt{\epsilon_x} * \sin(5.0 * \pi/12.0)]$ |
| 00110 | $[-R2 * \sqrt{\epsilon_x} * \sin(\pi/4.0), -R2 * \sqrt{\epsilon_x} * \sin(\pi/4.0)]$ |
| 00111 | $[-R2 * \sqrt{\epsilon_x} * \sin(\pi/12.0), -R2 * \sqrt{\epsilon_x} * \sin(5.0 * \pi/12.0)]$ |
| 01000 | $[R3 * \sqrt{\epsilon_x} * \cos(\pi/8.0), R3 * \sqrt{\epsilon_x} * \sin(\pi/8.0)]$ |
| 01001 | $[R3 * \sqrt{\epsilon_x} * \sin(\pi/8.0), R3 * \sqrt{\epsilon_x} * \cos(\pi/8.0)]$ |
| 01010 | $[R3 * \sqrt{\epsilon_x} * \sin(\pi/4.0), -R3 * \sqrt{\epsilon_x} * \sin(\pi/4.0)]$ |
| 01011 | $[0, -R3 * \sqrt{\epsilon_x}]$ |
| 01100 | $[-R3 * \sqrt{\epsilon_x} * \sin(\pi/4.0), R3 * \sqrt{\epsilon_x} * \sin(\pi/4.0)]$ |
| 01101 | $[0, R3 * \sqrt{\epsilon_x}]$ |
| 01110 | $[-R3 * \sqrt{\epsilon_x} * \cos(\pi/8.0), -R3 * \sqrt{\epsilon_x} * \sin(\pi/8.0)]$ |
| 01111 | $[-R3 * \sqrt{\epsilon_x} * \sin(\pi/8.0), -R3 * \sqrt{\epsilon_x} * \cos(\pi/8.0)]$ |
| 10000 | $[R2 * \sqrt{\epsilon_x} * \sin(5.0 * \pi/12.0), R2 * \sqrt{\epsilon_x} * \sin(\pi/12.0)]$ |
| 10001 | $[R1 * \sqrt{\epsilon_x} * \sin(\pi/4.0), R1 * \sqrt{\epsilon_x} * \sin(\pi/4.0)]$ |
| 10010 | $[R2 * \sqrt{\epsilon_x} * \sin(5.0 * \pi/12.0), -R2 * \sqrt{\epsilon_x} * \sin(\pi/12.0)]$ |
| 10011 | $[R1 * \sqrt{\epsilon_x} * \sin(\pi/4.0), -R1 * \sqrt{\epsilon_x} * \sin(\pi/4.0)]$ |
| 10100 | $[-R2 * \sqrt{\epsilon_x} * \sin(5.0 * \pi/12.0), R2 * \sqrt{\epsilon_x} * \sin(\pi/12.0)]$ |
| 10101 | $[-R1 * \sqrt{\epsilon_x} * \sin(\pi/4.0), R1 * \sqrt{\epsilon_x} * \sin(\pi/4.0)]$ |
| 10110 | $[-R2 * \sqrt{\epsilon_x} * \sin(5.0 * \pi/12.0), -R2 * \sqrt{\epsilon_x} * \sin(\pi/12.0)]$ |
| 10111 | $[-R1 * \sqrt{\epsilon_x} * \sin(\pi/4.0), -R1 * \sqrt{\epsilon_x} * \sin(\pi/4.0)]$ |
| 11000 | $[R3 * \sqrt{\epsilon_x}, 0]$ |
| 11001 | $[R3 * \sqrt{\epsilon_x} * \sin(\pi/4.0), R3 * \sqrt{\epsilon_x} * \sin(\pi/4.0)]$ |
| 11010 | $[R3 * \sqrt{\epsilon_x} * \cos(\pi/8.0), -R3 * \sqrt{\epsilon_x} * \sin(\pi/8.0)]$ |
| 11011 | $[R3 * \sqrt{\epsilon_x} * \sin(\pi/8.0), -R3 * \sqrt{\epsilon_x} * \cos(\pi/8.0)]$ |
| 11100 | $[-R3 * \sqrt{\epsilon_x} * \cos(\pi/8.0), R3 * \sqrt{\epsilon_x} * \sin(\pi/8.0)]$ |
| 11101 | $[-R3 * \sqrt{\epsilon_x} * \sin(\pi/8.0), R3 * \sqrt{\epsilon_x} * \cos(\pi/8.0)]$ |
| 11110 | $[-R3 * \sqrt{\epsilon_x}, 0]$ |
| 11111 | $[-R3 * \sqrt{\epsilon_x} * \sin(\pi/4.0), -R3 * \sqrt{\epsilon_x} * \sin(\pi/4.0)]$ | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | $[-R3 * \sqrt{\epsilon_x} * \sin(\pi/4.0), R3 * \sqrt{\epsilon_x} * \sin(\pi/4.0)]$ |
| 00001 | $[-R3 * \sqrt{\epsilon_x} * \sin(\pi/8.0), R3 * \sqrt{\epsilon_x} * \cos(\pi/8.0)]$ |
| 00010 | $[R3 * \sqrt{\epsilon_x} * \sin(\pi/8.0), R3 * \sqrt{\epsilon_x} * \cos(\pi/8.0)]$ |
| 00011 | $[0, R3 * \sqrt{\epsilon_x}]$ |
| 00100 | $[-R2 * \sqrt{\epsilon_x} * \sin(\pi/4.0), R2 * \sqrt{\epsilon_x} * \sin(\pi/4.0)]$ |
| 00101 | $[-R2 * \sqrt{\epsilon_x} * \sin(\pi/12.0), R2 * \sqrt{\epsilon_x} * \sin(5.0 * \pi/12.0)]$ |
| 00110 | $[R2 * \sqrt{\epsilon_x} * \sin(\pi/4.0), R2 * \sqrt{\epsilon_x} * \sin(\pi/4.0)]$ |
| 00111 | $[R2 * \sqrt{\epsilon_x} * \sin(\pi/12.0), R2 * \sqrt{\epsilon_x} * \sin(5.0 * \pi/12.0)]$ |
| 01000 | $[-R3 * \sqrt{\epsilon_x} * \cos(\pi/8.0), R3 * \sqrt{\epsilon_x} * \sin(\pi/8.0)]$ |
| 01001 | $[-R3 * \sqrt{\epsilon_x}, 0]$ |
| 01010 | $[R3 * \sqrt{\epsilon_x} * \sin(\pi/4.0), R3 * \sqrt{\epsilon_x} * \sin(\pi/4.0)]$ |
| 01011 | $[R3 * \sqrt{\epsilon_x} * \cos(\pi/8.0), R3 * \sqrt{\epsilon_x} * \sin(\pi/8.0)]$ |
| 01100 | $[-R2 * \sqrt{\epsilon_x} * \sin(5.0 * \pi/12.0), R2 * \sqrt{\epsilon_x} * \sin(\pi/12.0)]$ |
| 01101 | $[-R1 * \sqrt{\epsilon_x} * \sin(\pi/4.0), R1 * \sqrt{\epsilon_x} * \sin(\pi/4.0)]$ |
| 01110 | $[R2 * \sqrt{\epsilon_x} * \sin(5.0 * \pi/12.0), R2 * \sqrt{\epsilon_x} * \sin(\pi/12.0)]$ |
| 01111 | $[R1 * \sqrt{\epsilon_x} * \sin(\pi/4.0), R1 * \sqrt{\epsilon_x} * \sin(\pi/4.0)]$ |
| 10000 | $[-R3 * \sqrt{\epsilon_x} * \sin(\pi/8.0), -R3 * \sqrt{\epsilon_x} * \cos(\pi/8.0)]$ |
| 10001 | $[0, -R3 * \sqrt{\epsilon_x}]$ |
| 10010 | $[R3 * \sqrt{\epsilon_x} * \sin(\pi/4.0), -R3 * \sqrt{\epsilon_x} * \sin(\pi/4.0)]$ |
| 10011 | $[R3 * \sqrt{\epsilon_x} * \sin(\pi/8.0), -R3 * \sqrt{\epsilon_x} * \cos(\pi/8.0)]$ |
| 10100 | $[-R2 * \sqrt{\epsilon_x} * \sin(\pi/4.0), -R2 * \sqrt{\epsilon_x} * \sin(\pi/4.0)]$ |
| 10101 | $[-R2 * \sqrt{\epsilon_x} * \sin(\pi/12.0), -R2 * \sqrt{\epsilon_x} * \sin(5.0 * \pi/12.0)]$ |
| 10110 | $[R2 * \sqrt{\epsilon_x} * \sin(\pi/4.0), -R2 * \sqrt{\epsilon_x} * \sin(\pi/4.0)]$ |
| 10111 | $[R2 * \sqrt{\epsilon_x} * \sin(\pi/12.0), -R2 * \sqrt{\epsilon_x} * \sin(5.0 * \pi/12.0)]$ |
| 11000 | $[-R3 * \sqrt{\epsilon_x} * \sin(\pi/4.0), -R3 * \sqrt{\epsilon_x} * \sin(\pi/4.0)]$ |
| 11001 | $[-R3 * \sqrt{\epsilon_x} * \cos(\pi/8.0), -R3 * \sqrt{\epsilon_x} * \sin(\pi/8.0)]$ |
| 11010 | $[R3 * \sqrt{\epsilon_x} * \cos(\pi/8.0), -R3 * \sqrt{\epsilon_x} * \sin(\pi/8.0)]$ |
| 11011 | $[R3 * \sqrt{\epsilon_x}, 0]$ |
| 11100 | $[-R2 * \sqrt{\epsilon_x} * \sin(5.0 * \pi/12.0), -R2 * \sqrt{\epsilon_x} * \sin(\pi/12.0)]$ |
| 11101 | $[-R1 * \sqrt{\epsilon_x} * \sin(\pi/4.0), -R1 * \sqrt{\epsilon_x} * \sin(\pi/4.0)]$ |
| 11110 | $[R2 * \sqrt{\epsilon_x} * \sin(5.0 * \pi/12.0), -R2 * \sqrt{\epsilon_x} * \sin(\pi/12.0)]$ |
| 11111 | $[R1 * \sqrt{\epsilon_x} * \sin(\pi/4.0), -R1 * \sqrt{\epsilon_x} * \sin(\pi/4.0)]$. |

9. A method comprising:
accessing, by a processor of a device, stored information representing a predetermined structured parity check matrix of a Low Density Parity Check (LDPC) code, wherein the stored information reflects a tabular format of rows and columns, wherein each row represents occurrences of one values within a respective column of the parity check matrix, and wherein the columns of the parity check matrix are derived according to a predetermined operation based on the respective rows of the stored tabular information; and encoding one or more blocks of information bits of a source signal based on the LDPC code to generate an LDPC encoded signal;

wherein the LDPC encoding of the blocks of information bits (each block being of a size of $k_{ldpc}$ information bits, and each resulting encoded block being of a size of $n_{ldpc}$ code bits including parity bits $p_i$, i=0, 1, 2, ..., $n_{ldpc}-k_{ldpc}-1$), comprises:

initializing parity bit accumulators $a_0=a_1= \ldots =a_{n_{ldpc}-k_{ldpc}-1}=0$;

for a one of the blocks of information bits, divided into j sequential groups (each of a size of M information bits), and for j=1, 2, 3, ... $k_{ldpc}/M$: (1) accumulating a first information bit of a $j^{th}$ group in certain of the parity bit accumulators reflected by accumulator addresses based on a $j^{th}$ row of the stored tabular information; and (2) accumulating the remaining (M-1) information bits of the $j^{th}$ group in certain of the parity bit accumulators reflected by accumulator addresses according to $$\{x+m \bmod M\} - \left\{\frac{x+m \bmod M}{M} - \frac{x}{M}\right\} * M,$$

wherein the division within the second bracketed term reflects integer division, and x denotes an address of the parity bit accumulator corresponding to the first bit of the group; and after all of the information bits are accumulated, starting with M=1, sequentially performing operations (with respect to the parity bit accumulators) according to the following (where the additions are in Galois Field (GF) 2), $$a_M = a_M \oplus p_0$$
$$a_{2M} = a_{2M} \oplus a_M$$
$$a_{3M} = a_{3M} \oplus a_{2M}$$
$$\vdots \quad \vdots \quad \vdots$$
$$a_{n_{ldpc}-k_{ldpc}-M} = a_{n_{ldpc}-k_{ldpc}-M} \oplus a_{n_{ldpc}-k_{ldpc}-2M}$$
$$\vdots \quad \vdots \quad \vdots$$
$$a_1 = a_1 \oplus a_{n_{ldpc}-k_{ldpc}-M}$$
$$a_{M+1} = a_{M+1} \oplus a_1$$
$$a_{2M+1} = a_{2M+1} \oplus a_{M+1}$$
$$\vdots \quad \vdots \quad \vdots$$
$$a_{n_{ldpc}-k_{ldpc}-M+1} = a_{n_{ldpc}-k_{ldpc}-M+1} \oplus a_{n_{ldpc}-k_{ldpc}-2M+1}$$
$$\vdots \quad \vdots \quad \vdots$$
$$a_2 = a_2 \oplus a_{n_{ldpc}-k_{ldpc}-M+1}$$
$$a_{M+2} = a_{M+2} \oplus a_2$$

-continued $$a_{2M+2} = a_{2M+2} \oplus a_{M+2}$$
$$\vdots \quad \vdots \quad \vdots$$
$$a_{n_{ldpc}-k_{ldpc}-M+2} = a_{n_{ldpc}-k_{ldpc}-M+2} \oplus a_{n_{ldpc}-k_{ldpc}-2M+2}$$
$$\vdots \quad \vdots \quad \vdots$$
$$a_3 = a_3 \oplus a_{n_{ldpc}-k_{ldpc}-M+2}$$
$$a_{M+3} = a_{M+3} \oplus a_3$$
$$a_{2M+3} = a_{2M+3} \oplus a_{M+3}$$
$$\vdots \quad \vdots \quad \vdots$$
$$a_{n_{ldpc}-k_{ldpc}-M+3} = a_{n_{ldpc}-k_{ldpc}-M+3} \oplus a_{n_{ldpc}-k_{ldpc}-2M+3}$$
$$\vdots \quad \vdots \quad \vdots$$
$$a_{M-1} = a_{M-1} \oplus a_{n_{ldpc}-k_{ldpc}-2}$$
$$a_{2M-1} = a_{2M-2} \oplus a_{M-1}$$
$$a_{3M-1} = a_{3M-1} \oplus a_{2M-1}$$
$$\vdots \quad \vdots \quad \vdots$$
$$a_{n_{ldpc}-k_{ldpc}-1} = a_{n_{ldpc}-k_{ldpc}-1} \oplus a_{n_{ldpc}-k_{ldpc}-M-1}$$

wherein the parity bits $p_i$, i=0, 1, ... ($n_{ldpc}-k_{ldpc}-1$) are respectively reflected by the resulting parity bit accumulators $a_i$, i=0, 1, ... ($n_{ldpc}-k_{ldpc}-1$); and wherein the stored information representing the structured parity check matrix comprises a one of the following Tables 9a through 9k, TABLE 9a

| Address of Parity Bit Accumulators (Rate 9/10) |
|---|
| 405 3342 3664 6278 |
| 121 538 4579 4801 |
| 776 3102 3279 5298 |
| 135 1119 4225 6307 |
| 440 902 3893 5464 |
| 139 3289 5101 5543 |
| 1016 1893 3076 5942 |
| 2253 2759 5611 6055 |
| 335 1122 3260 5610 |
| 436 2337 2781 4648 |
| 2027 2451 5009 5137 |
| 1165 2440 4331 6125 |
| 1704 1858 3986 5327 |
| 938 2077 3080 5007 |
| 1239 1668 4309 4524 |
| 1464 2825 3640 4979 |
| 1682 3716 4081 5851 |
| 2709 2976 5931 6213 |
| 3811 5917 6342 |
| 1558 3818 4076 |
| 2290 5606 5807 |
| 2080 2467 4655 |
| 465 2866 4971 |
| 873 1881 4624 |
| 1301 2270 5161 |
| 1637 2567 4787 |
| 1380 4475 5563 |
| 258 2769 3845 |
| 240 1228 3387 |
| 46 5258 6393 |
| 583 1652 4139 |
| 2983 4137 5095 |
| 601 3064 3299 |
| 1821 6025 6123 |
| 775 3243 5674 |
| 822 3142 4768 |
| 3068 3255 6474 |
| 1006 2795 4896 |
| 2791 2997 5909 |

TABLE 9a-continued

Address of Parity Bit Accumulators (Rate 9/10)

2583 3167 6427
1395 4398 5579
608 2248 3277
2491 5104 5580
2437 4228 4444
246 568 3849
253 3723 4093
242 3968 6360
700 964 4904
1470 4714 5146
866 1382 3801
1107 3368 4559
1679 1981 6041
1868 5706 6063
1602 1894 5142
289 2726 4941
1943 3179 6347
2186 4446 5537
1055 3361 5448
531 2627 4448
1467 3414 5117
1738 4095 4628
1254 4214 5078
2218 5681 5936
272 5085 6284
139 1218 6269
576 3127 4258
1122 3584 3844
1795 4712 6092
1071 3754 4913
728 1868 3004
586 2425 2573
1986 3826 5894
217 1148 4123
1136 3201 3286
1138 4906 5344
548 3705 6148
2510 3974 4654
1846 2949 5959
2374 4890 6009
1495 2556 4359
582 4226 4406
233 3425 3922
1017 3734 5431
2358 5105 6251
260 418 2567
1627 2737 5360
788 3492 5646
1561 2057 4812
2147 5844 6217
952 2938 5458
1468 1837 4577
234 5186 6359
372 2505 2680
112 461 3311
1294 3488 6350
1377 2441 6280
841 2776 5751
295 2591 5086
1628 4822 5080
3920 5608 5788
641 3885 4916
1482 3689 5845
2930 3257 5936
750 4659 4733
1864 2899 4301
1068 1963 5753
2214 4295 4650
1367 3170 4306
1519 4107 5104
289 4410 4959
1252 5166 6162
389 1624 4422
1420 1543 4360
669 3321 3631
125 1396 3536
2955 5317 6367
561 2194 4127

TABLE 9a-continued

Address of Parity Bit Accumulators (Rate 9/10)

2206 4179 6352
794 3549 5771
2570 3692 4924
2001 3095 4990
2380 5638 6039
733 2805 3687
2704 3062 6013
187 2154 5745
861 1833 5750
1197 2312 4677
941 2008 4171
994 4565 5542
2058 3148 5976
789 1130 5079
448 4531 4763
1082 3375 5742
3455 5065 5744
621 1691 4313
90 4103 5953
1592 3266 3800
3144 5789 6418
270 2561 3650
668 2477 6348
2011 3060 4880
1490 3886 4777
122 2583 6348
2484 2643 5308
714 3867 4171
192 2798 3938
2420 4733 6067
647 1656 3776
85 6080 6232
1058 3109 4875
3035 3305 5118
1711 4216 6044
918 2044 4085
458 2522 4675
1113 2240 6268
1686 2087 5113
2385 2773 6280
1405 3216 5737
2016 4555 4733
853 3414 4395
3344 5214 5751
306 1153 5579

TABLE 9b

Address of Parity Bit Accumulators (Rate 8/9)

185 1982 5090 6885
2051 2208 6645 7139
463 930 3108 5287
267 4014 6164 6820
1118 1629 3252 5478
1939 2411 4705 6527
3131 3252 5283 6315
1376 4003 5928 6875
1744 2522 4828 5888
775 1312 4686 6012
1147 2917 5313 5516
1657 2852 3653 6751
2580 3234 5634 5767
2344 2721 4417 6418
179 3305 3726 7140
265 3322 4581 6309
443 2495 4394 4866
437 1796 3762 4139
768 1957 3793 3966
647 892 4421 5589
990 2583 2887 4756
1066 1924 3116 6195
1993 3020 5375 5699
2781 4456 6173 6700
1280 1782 3254 5823

TABLE 9b-continued

Address of Parity Bit Accumulators (Rate 8/9)

1102 1476 3325 5079
717 1636 5021 5053
718 1445 2691 5432
1965 3073 5711 6010
1941 2496 4802 6018
2517 3299 5556 6486
825 3944 5793 6425
666 2499 2522 4531
287 619 3347 3816
964 1328 4743 5169
1157 2369 4523 7043
127 4266 4568 6180
307 3640 4260 6893
292 4052 6794 7117
3713 4114 6485 7015
916 1840 4808 5220
139 438 3527 4645
654 1723 3612 4033
47 4410 4716 7198
1432 3782 4126 6347
41 1835 4267 5105
228 4313 5213 6963
894 3161 4884 5093
1561 2814 3746 6634
1393 1792 5407 5863
685 1078 2679 3088
1529 1937 5427 5781
1056 3146 4779 6602
649 2204 2568 6951
2768 3151 5521 6676
2074 2484 5833 6967
2398 3331 4515 5561
1280 3728 5934 6182
2485 3373 6190 6815
1141 3276 4393 6389
104 3339 7107
656 3450 5083
1912 3649 7037
273 2119 6733
916 4161 4570
2206 4605 6266
2610 3601 5771
723 1363 3961
2300 2790 6200
4199 4441 6771
1495 2820 5471
936 1329 5098
1475 5488 6486
1185 3676 4992
2330 5321 6307
2004 2901 5853
3133 3465 5656
120 4787 5879
384 1757 4790
701 2989 6954
193 3359 3727
1352 3685 4958
1982 2227 5529
1841 3055 6728
225 498 6919
2731 4716 6809
1503 2052 5524
1234 3886 5007
1341 4384 7124
434 868 6365
2928 5292 5711
2569 4525 7013
2659 3072 6131
541 995 5083
202 4311 5089
2258 6221 6630
1715 4295 6096
2435 4296 4435
900 3540 5913
1671 3425 5981
1627 2049 5389
1946 3883 4259
1194 3432 6018

TABLE 9b-continued

Address of Parity Bit Accumulators (Rate 8/9)

1903 6028 7168
67 3683 6193
2604 3891 5706
216 4278 4516
908 2717 5497
2309 4658 6455
1338 4593 6133
2279 5039 6588
334 4056 5129
3244 5460 6040
685 5104 6933
1369 2978 5006
2318 4819 7028
639 809 3032
585 1547 2797
966 3231 6705
1573 3363 6546
2085 6713 7136
1171 3970 5141
249 2769 4607
1519 4336 4827
377 1688 5622
3204 4717 6716
576 1078 3713
4697 5765 7128
1933 5226 6382
708 1625 2782
3166 5564 6505
808 2529 5679
64 1107 3749
1971 3071 4053
2298 4369 6479
1255 3962 5119
2359 5902 6978
169 3333 3750
739 3475 6479
2380 3302 6020
1153 2982 6933
108 3675 4989
1684 3397 4607
2468 3309 5749
1567 3494 5287
2695 5500 6779
1650 3987 5381
952 3655 5634
931 4061 5859
1862 3208 5942
114 1175 4355
59 3906 6452
1337 4180 7050
1052 2851 5200
2014 3149 6787
662 2573 4810
2249 6025 6192
1868 2250 6544
702 5004 6942
488 4582 6161

TABLE 9c

Address of Parity Bit Accumulators (Rate 5/6)

798 1195 3207 3556 5147 5412 7636 8021
181 3530 5203 5661 7617 8048 10135 10609
1462 1898 3635 3961 6209 6648 8552 9391
761 2127 2918 5450 7539 7636 9676 9809
1878 2332 5152 5494 7238 7765 9607 9727
181 3351 5105 5496 7409 7702 9598 10763
433 2788 3838 5588 5828 7800 8720 9731
488 2907 3472 6327 6569 8352 8930 10689
89 2842 5508 6026 7669 8121 10349 10699
1925 2231 4325 5010 6583 7643 8721 9846
1073 1231 3228 4187 5319 6420 7491 8521
154 2531 4592 5601 7458 7695 10201 10581
479 881 2553 5231 5431 7847 8862 9787

TABLE 9c-continued

Address of Parity Bit Accumulators (Rate 5/6)

391 818 3787 4243 5817 7830 8104 10055
97 588 2769 3729 5973 6278 8902 9993
2045 2185 4299 6169 6816 8287 8827 10767
507 1663 2729 3810 4901 5789 7930 9212
2496 2802 4651 5027 6717 7163 9596 10444
159 2056 4328 4854 6630 8590 9452 10469
105 1425 3252 3895 5416 6726 9204 9691
518 2749 3784 4758 5853 6843 8190 10706
331 2785 4978 5396 7162 8264 9814 10120
418 2240 2800 4818 6481 7079 8751 10595
1066 2927 4130 5387 6921 8198 9866 10247
25 3567 3892 5833 6308 7967 8287 10482
54 679 2617 4622 4734 6949 8644 9208
214 525 4266 4365 6258 6756 8899 9914
2030 2273 4200 4413 6808 6929 9081 10322
810 1196 3735 4282 6022 6390 8811 9881
869 3411 3871 5997 7129 8067 9328 10212
833 7114 8123
432 2458 4108
1764 7069 9592
4174 5900 7187
2292 5716 8280
2941 4153 5310
3285 3918 6052
794 3044 8493
1528 2043 4966
2117 9315 10277
1191 2175 6178
1469 5270 7449
1107 1504 6235
2293 4650 6746
839 4508 9493
1715 5088 8931
3454 4487 9120
2059 7336 9626
3162 4847 8433
3098 9173 9491
3195 6317 10336
1402 2396 7200
1190 4378 7312
3132 3499 10186
1505 1947 10088
1356 3312 9270
4853 7227 8577
1760 7218 9050
1124 1500 9030
1133 1501 8484
1277 2932 10769
369 6143 7263
2624 4740 8068
2270 5183 10587
1490 5278 5741
2996 5955 10051
2646 5143 7804
3515 5866 9203
2007 4063 7813
2784 6381 6663
1535 4845 8402
2345 6141 9480
7229 9659 10068
5821 8323 8658
388 5608 7239
4440 5599 8039
3254 3863 10116
145 4960 9463
4161 6533 6951
854 7196 8816
4022 7710 10676
1111 2194 8266
627 3218 3319
1884 4623 8735
1904 6509 9830
898 1433 3632
788 3712 8292
1668 7197 9130
330 4454 10156
244 9082 10160
2683 3844 4759

TABLE 9c-continued

Address of Parity Bit Accumulators (Rate 5/6)

1266 1752 5956
781 5063 10334
1256 1626 4876
1758 7765 8001
980 3659 7851
4149 8190 10202
92 3468 5352
825 5942 7041
3015 7100 10738
3478 5859 8168
3629 9571 9750
5503 6818 8354
3328 7496 10540
169 4810 9788
4408 5712 6625
1988 5507 9347
461 5210 8677
263 4203 8549
4588 7551 9631
2122 2239 8785
6645 9519 10624
2312 4343 8735
2199 4041 7078
1817 7474 8339
2908 6305 9881
3070 9077 10184
1137 6336 9262
437 2562 7750
671 2647 6444
3094 5542 5834
2498 4042 7138
3933 8184 8378
769 2671 9268
425 3579 5432
4120 4369 8476
546 3291 5723
2273 2530 7559
425 1494 5071
275 1890 9065
4492 5010 10023
147 1404 5990
4047 9339 10134
5177 7388 9568
2151 7534 10210
191 2601 6367
1124 3094 9452
1405 7140 9375
3908 9782 10082
1902 4924 8442
1706 4323 6831
1786 3732 6867
7563 8939 10016
5784 8885 10703
6173 8155 10542
3011 4950 7607
3283 8830 10655
895 5348 8081
2444 6732 7821
750 6367 6530

TABLE 9d

Address of Parity Bit Accumulators (Rate 4/5)

498 2356 3399 4631 5536 7415 9550 9825 11986
499 722 3381 4400 7825 8864 9980 10902 12000
923 1278 3976 5353 6383 7233 9807 11841 12067
1027 1141 3080 3450 6270 6615 8936 10053 12197
241 641 2589 3938 5948 7939 8405 10918 12913
1140 1748 3891 3977 5929 6450 8852 11141 11465
389 720 2956 3508 5292 6390 7424 9013 11890
913 2029 3157 6116 6139 8615 9640 10504 12410
1169 2356 3348 5141 5417 8732 9775 10888 11893
2068 2926 4223 6046 7006 9224 9651 12316 12691
1872 2497 4581 6490 8352 8820 10713 10983 12827

TABLE 9d-continued

Address of Parity Bit Accumulators (Rate 4/5)

883 1338 2907 3415 6435 7383 9426 9937 11822
2638 2906 5312 5413 8136 9226 10117 12244 12602
223 2800 4527 5538 6773 9346 9604 11204 12275
277 2712 3892 5465 5996 7851 10705 11551 12726
2053 2383 4042 4524 6654 7155 9091 9381 11287
1645 2733 3773 4901 5829 8913 9297 11284 12363
596 1703 2826 4657 4790 7024 7407 10286 10768
1260 7640 10440
413 1758 7516
6709 6900 11071
1638 11242 12568
247 4966 8252
2125 3685 7002
252 10234 11279
17 1921 5116
2515 4974 7892
2470 8033 12635
8169 10285 10536
7131 7997 11731
1646 4100 6581
5489 8335 10367
4315 5206 7834
3661 8534 10114
4825 8537 11665
4735 7855 11729
3636 7050 12359
5855 11577 12216
3709 4041 11974
1302 4819 9598
3726 5951 12780
439 6839 12862
6107 6862 10014
329 3400 9601
4365 4963 6828
2659 10871 12147
2956 5165 12608
1292 3562 8246
1694 9213 10369
558 1639 7845
5331 8084 10216
4385 4729 6706
5253 5424 11744
718 1662 8953
8672 9013 10984
3992 4522 9006
1971 3055 6477
6282 7542 9563
3542 10674 12427
2869 8558 8790
2382 7955 11422
2227 5687 10917
7260 10148 11466
866 2025 6459
807 8584 11291
3185 5589 8581
724 4213 10711
6951 7549 12599
2034 2386 10704
306 2866 11776
1115 7630 9974
226 7681 10061
1262 8047 11342
2579 11466 11672
5616 5900 9675
214 525 10189
2502 4013 9398
4192 8827 11901
749 8020 11632
2689 10394 12856
45 3331 12206
1852 3988 10681
1080 8893 11333
2708 11688 12168
144 4672 10289
6772 7703 8784
562 733 7714
768 5510 9791
519 9482 10071

TABLE 9d-continued

Address of Parity Bit Accumulators (Rate 4/5)

1462 5139 9118
1443 2000 4859
1636 3443 6279
2989 3370 5667
5155 6176 7256
2052 5261 7773
2950 8290 11050
5767 6931 7984
4358 6356 10596
2486 10860 12919
1421 3168 9846
5989 8551 10654
4504 4762 12565
4925 6522 10829
7308 8503 12839
2383 7034 7547
3957 9245 12567
3857 9346 12337
3692 6689 6950
3084 4828 7816
977 3692 6597
1538 7007 9577
623 8432 10784
6408 7355 10231
946 9879 12496
7515 8521 10900
4040 8421 10792
3361 5178 6908
2236 8735 10552
3647 6779 9745
5516 6702 12914
272 11360 11827
1847 4653 12103
25 7344 9583
2454 11437 12443
2047 4203 6137
6285 10091 11506
3281 4656 9090
4289 8798 12488
1220 9341 10946
73 3759 7981
6859 8176 10167
1755 4703 5322
1434 10905 12144
2380 3454 8174
1259 11673 12041
408 4852 12932
3116 5666 7879
2986 8641 10037
1022 6055 11595
1604 5858 7579
1860 5406 12830
2547 5839 9415
454 2602 4342
2697 5238 9006

TABLE 9e

Address of Parity Bit Accumulators (Rate 3/4)

755 3136 3253 5541 8180 13010 14277 15226
464 989 2773 3063 5246 5711 7829 10703
687 2174 5068 6955 8933 9180 12238 12247
620 868 3613 7063 7491 9977 11659 12231
1121 3221 3985 7303 8598 9677 11994 15459
239 3514 3734 5618 7483 9443 13290 14309
624 1641 4395 4791 8232 8520 11653 13714
1764 3468 3630 6883 8179 10354 10666 12589
5441 6021 9211 10116 11365 12476 15587 16031
1191 3709 4945 5821 9932 13549 13712 15675
4312 4559 6892 9729 11121 12847 14493 15725
2522 4963 7683 8080 10332 10545 13579 15279
2324 2660 4650 10336 12099 12402 14149 14535
6217 6529 9102 11077 11401 13051 14247 16145
1900 4014 6973 9765 10139 13297 15029 15931

TABLE 9e-continued

Address of Parity Bit Accumulators (Rate ¾)

356 3856 4735 8197 10020 13408 13819 16041
589 3148 4079 5870 6141 9278 11221 11732
3162 5352 6442 7233 8287 11507 13756 15666
1600 8280 14758
8404 8921 13248
1796 8643 13329
3470 5959 10511
1771 2651 10918
5690 14326 14698
4969 7444 13930
3426 9264 13439
6079 7897 12750
731 5131 12199
4567 9453 15026
804 12393 12657
1363 2349 15827
2393 5056 11552
183 11487 15154
33 1989 15052
352 2157 14479
2459 2678 11725
7572 8993 11156
4590 10501 10934
3970 6836 16007
6430 6525 9597
2015 12757 14985
1842 6677 7692
12934 14875 15425
1165 6320 9437
1205 6831 8927
3986 8773 15795
7310 8501 14143
5813 10378 10472
3293 12137 15600
750 6051 8898
7955 13595 16006
947 6895 16179
1474 5536 11069
214 1979 5872
1373 1461 13091
8116 12210 15540
188 2677 6413
2785 6824 14251
2798 8431 12629
470 1655 3872
4471 6408 8522
8263 11449 16194
9329 9687 11535
21 6478 13326
2904 7141 11399
701 7076 11584
3166 5197 15397
5328 5731 7774
875 12344 15421
9177 13008 14984
3884 7246 14544
3334 6747 10089
4492 10028 13128
2463 12431 14331
2429 11404 14714
4661 11689 15261
6515 12787 14813
3354 9539 9857
9146 12412 12863
585 4001 7578
2300 7776 13341
3839 4001 14733
7541 9827 15058
5177 10853 12062
4861 10697 11004
1976 4984 9453
1118 10773 13950
1800 2888 4942
5525 10278 13858
1141 8799 14032
5552 8722 11930
3755 10366 15563
3879 6873 9914

TABLE 9e-continued

Address of Parity Bit Accumulators (Rate ¾)

1236 10327 13474
10007 12774 15695
2178 9047 16151
6256 7420 11075
7780 12124 14020
5611 7207 15439
2529 4322 15087
2714 5217 9884
81 10799 11594
1845 7854 12328
2480 4360 8883
1107 6991 10377
3479 5761 14289
5639 8855 9053
1460 3703 11295
7710 12577 14375
4720 12673 14956
1176 12155 13882
2187 6857 12985
1622 5874 9437
942 2765 14378
3492 5768 12701
6432 14722 14794
11046 13036 15948
2904 4211 7521
229 592 4897
1616 8035 11683
10569 13395 14431
4474 6712 15158
13340 13920 15592
5030 13245 15131
1061 6169 6794
328 6771 12242
8398 10475 10827
535 5368 9184
1903 5121 11454
745 2003 14697
503 3281 11435
3200 8219 8491
8299 9504 11601
4128 8160 16124
2994 4032 9680

TABLE 9f

Address of Parity Bit Accumulators (Rate ⅔)

1615 2039 8200 11116 12879 13266 14888
1056 2837 5958 7722 10531 13028 16131
321 4196 6772 8327 18370 21171 21440
2720 4996 7486 11437 15927 16234 21032
250 4778 5126 9839 16614 18590 21299
36 10862 13201 15758 17702 20512 21310
4548 8263 11202 12249 14424 17146 20605
521 2272 5846 7080 11967 15642 17973
1858 5497 5858 7892 13057 15657 19262
65 1964 3694 6305 7236 12924 14509
648 3736 6461 10779 13755 17583 19163
4991 6081 9123 11807 12144 18877 20967
667 1787 6412 8270 13080 15684 19871
7185 7366 14404 17011 17561 19430 21050
2701 4406 9153 9479 15365 19423 21462
3942 7315 10933 14239 17054 17558 19977
1427 5839 8022 10208 16873 16924 21529
60 6459 7405 9609 11824 16053 19264
1956 4737 6790 9007 12579 16313 19839
6949 8003 10138 12354 14675 17960 20107
3267 6813 10410 12761 14996 15151 17838
975 1375 3246 6456 9683 9895 14572
496 4250 9354 10365 14249 16724 19585
4187 5342 7802 10016 10840 13690 14811
954 9023 12299 15481 17308 19923 20256
1554 2755 4407 4842 10638 16587 17877
1953 3616 8712 12206 14211 16877 21233
1295 4174 4522 9604 12613 14892 17298

TABLE 9f-continued

Address of Parity Bit Accumulators (Rate ⅔)

500 3106 5334 12580 12669 15443 18409
2283 8824 9896 13581 13889 20424 20765
13321 16111 18888
6938 17206 19746
1784 4153 15066
9407 14334 18336
5350 6942 10093
3170 8370 11789
905 1308 8307
3052 5479 14093
1269 16063 19442
2686 4519 8777
1756 3659 11721
3002 11645 18023
8978 10622 20164
8846 11139 13721
3066 10762 13957
3464 11167 13550
16215 18615 18961
7676 15415 18065
5396 10017 18358
7850 16492 18269
3531 16286 18989
5739 11192 13524
1009 18408 18920
6625 13662 15264
3505 12215 20200
8426 12029 20522
8496 19529 20705
2218 6541 11495
2253 5667 20631
2320 5739 19782
2335 8137 9814
1688 9285 15288
1393 8162 12727
3355 11661 14163
142 10231 20568
9158 12878 13257
14324 17954 19658
2483 4417 18250
661 10219 14001
6896 10200 14537
8802 17982 20021
2787 9042 14255
3101 13180 18975
1164 8420 16306
6500 9735 12804
11842 14862 19904
7598 8199 17910
4273 17028 20983
544 9997 17358
3136 19586 20591
1785 5171 9714
8388 14782 18328
32 6240 10995
865 5080 8797
624 11476 14648
2163 7348 13686
101 3574 18935
7330 13508 14000
5743 7379 9514
1592 11437 17432
4893 6775 20933
762 2691 7070
3030 19170 20360
4299 7845 19138
1978 6589 12314
2757 11178 14780
4956 5881 21471
3392 7590 19773
15990 19435 20227
1888 5932 16298
4085 5882 12449
4813 16665 20934
5522 9375 18435
10466 12470 16771
11805 16606 21277
856 5550 18431

TABLE 9f-continued

Address of Parity Bit Accumulators (Rate ⅔)

1094 12130 15534
14549 17123 19074
5076 13100 17343
10615 16455 20767
13544 15381 16991
3829 18367 21333
15456 15532 19920
6866 15766 18286
6461 8677 12234
2026 12038 20327
3839 8318 10649
4613 11022 15972
3757 13434 15910
4519 6461 11133

TABLE 9g

Address of Parity Bit Accumulators (Rate ⅗)

487 2424 5103 6294 14728 16989 22394 22707
1634 5235 7897 8219 10473 10926 15226 17159
7836 8222 10026 12421 17812 20194 21551 25762
178 4183 5238 8916 11565 13513 17234 23622
2619 3761 6539 10279 11943 16294 19745 22819
1097 3310 5297 10950 12939 13749 18284 19985
5062 8675 11402 13351 14655 16741 20553 22461
5862 7897 12406 13503 16929 17631 20389 22142
1160 8004 9813 13540 14666 18003 22246 24879
157 6179 13015 16673 17089 19482 23223 24324
1568 3396 5983 13072 13336 18349 18521 21010
3632 5935 7011 12522 15857 17935 18950 23596
7555 8375 10646 12391 15071 20478 22501 23402
2000 2378 7387 11854 13513 21598 24971 25503
476 2578 7339 8402 13753 16147 19513 22512
1646 7593 8714 9846 12535 14403 21897 22723
913 3205 5384 6134 13821 16335 23236 24236
502 1494 5665 8092 9094 13273 18152 23856
3571 5849 7970 10318 16538 19009 19186 24775
1768 5020 10749 15104 18446 21191 21392 25505
279 7272 9982 10336 13151 15451 18316 22103
2005 4026 4677 7991 9235 13384 14754 23731
1319 3499 6567 7679 11063 15094 15267 17449
6162 6797 10759 11683 12866 13911 17226 22718
2382 9187 11808 16423 18162 19122 21873 22911
216 1114 7075 14485 16966 19607 22914 24691
721 2693 6387 8821 17550 19330 22719 24673
972 2842 8828 9933 12899 15009 15268 23746
1947 4539 10078 12725 13876 18387 20589 24783
1755 4300 6903 8799 14179 14485 20595 24429
3854 4896 7018 10751 14016 14346 16861 19163
3859 4085 5919 7733 15182 16468 19409 21431
1371 6763 10705 10999 14233 17684 21160 22018
2356 5185 5651 12200 12308 16384 18868 21030
6600 8655 9801 11712 13854 16725 20795 25380
1692 3627 6962 7462 10218 21056 21314 24003
16314 19603 22678
1179 19957 21941
14163 19047 24512
10474 20933 24258
461 8308 11535
7361 11441 12375
40 6417 10855
6001 22526 23757
1071 3964 9467
2756 6525 23536
449 3246 11782
12053 19545 21812
2670 3701 10363
7809 17817 20062
2900 6138 24663
7042 9061 22324
7149 12133 15790
7464 15848 22261
4406 15275 21965
2305 8240 15658

TABLE 9g-continued

Address of Parity Bit Accumulators (Rate 3/5)

844 3405 18366
1893 2451 17338
5810 17934 20992
2244 4845 24158
17878 18964 23878
5429 22314 24712
303 14398 24478
15836 18743 21826
4587 17442 23891
9067 19984 25568
12659 20803 25727
5409 6673 23824
9692 15061 18694
861 1169 16870
12226 14993 20284
13054 14784 20185
160 15501 23163
614 18992 23847
4719 15363 20481
19129 23171 24212
5465 21650 25118
3669 15823 17361
12767 13112 21339
4658 14270 17975
503 11296 14239
16728 20243 25123
1952 12991 19964
11201 17284 18410
2840 12877 24940
4989 21344 23127
3268 15681 23795
2050 16692 25423
4144 9210 10293
896 8604 15852
9235 23106 25062
4425 5548 25280
4343 10845 11308
3224 9603 25270
1859 10301 21895
4944 11025 23373
5530 9419 25244
8525 15896 18435
8591 19838 24964
18261 19436 25885
4301 15776 15875
9532 16158 20694
9674 11995 20018
8382 9360 12086
2974 19579 25776
2968 4956 20785
3009 11349 25614
2975 11230 25789

TABLE 9h

Address of Parity Bit Accumulators (Rate 1/2)

1690 4392 7243 10123 12751 19068 23261 25882 25950
4295 8310 13735 14903 18216 18521 20457 22873 26999
2900 6292 14253 16327 19561 21463 23348 26738 31108
1201 2187 4037 6084 7112 17403 20499 23973 29486
1913 5146 8684 10762 11063 15735 19611 22881 27218
1569 1918 5946 8361 9717 12102 16573 19187 28309
925 7530 10304 16459 18002 20820 22693 24097 30913
4336 14315 16734 16940 19494 19977 21895 25121 31768
3367 3872 10516 11797 16080 18647 21646 24129 31143
1557 4179 6997 9985 19179 23292 24350 26834 28821
2605 4611 6484 13227 16750 22762 26200 28877 31731
3139 6378 7943 9983 10171 14917 17887 19560 25630
5706 5916 8409 10080 13664 13753 20142 22989 29228
4479 7229 10272 12943 17716 21870 24521 29638 32330
818 2084 5177 9571 10713 14061 27997 28946 31914
4223 8466 15465 16241 18591 20686 25672 28312 31533
3049 3335 8311 11572 17578 22419 23724 27334 27454
607 4010 11542 13746 16393 19392 21126 28048 28409

TABLE 9h-continued

Address of Parity Bit Accumulators (Rate 1/2)

1687 2090 4816 6641 7824 8909 10871 25465 30399
1282 3011 6333 8010 10952 16958 24124 26242 32302
2156 4900 6829 9255 15769 16823 25927 30541 30839
3133 5074 7609 10078 13090 15951 22294 27409 28021
588 1624 7313 9206 12908 15670 21180 22034 30955
3342 7385 7790 11060 13010 17437 21755 28052 28308
3431 5338 15158 18950 23091 24334 26495 28510 30791
515 3366 11860 15866 18097 19816 20516 23868 32139
219 6739 12840 20551 23331 23530 25670 28997 32168
152 1161 11055 18106 18657 20617 25241 26437 30692
4846 9453 14029 14862 20321 22192 26263 26518 29656
3613 6463 12229 15428 17644 19554 20150 27965 31614
110 6876 9265
14936 18681 31853
3661 16313 30499
271 6718 20110
21531 29984 30553
1164 17609 23628
8154 13382 24492
3653 10000 31610
2337 21448 28080
11999 15213 25875
12821 31286 31518
6097 17194 24909
9702 24304 28525
5883 18252 26861
16032 17834 20825
8986 16741 21021
568 27281 27400
13853 15558 19265
1005 5259 12243
10050 23589 27597
758 7779 12074
2783 12248 14536
810 1354 27229
6362 20993 27191
10553 18772 30110
2402 2835 21129
12261 15601 22445
11442 15365 22496
9669 16977 21706
5711 13362 23591
17344 21970 29298
240 13300 29750
12151 27394 32351
2346 25180 25427
2473 16162 20178
3772 7888 29067
4813 22325 26724
5566 11255 14096
11274 26442 28451
5733 14961 21477
9204 11769 32017
4994 8043 9090
5419 10606 24702
7182 11243 14543
13457 24507 29332
7082 21960 26549
13422 17659 31308
4351 30026 30998
11180 13085 17157
18933 21543 23781
14066 18961 22375
8255 12388 19309
2529 12598 29636
8811 28673 31573
8938 24504 30413
14629 24906 30234
14478 24007 30182
2559 14678 29540
25088 25451 28782
553 25507 29461

TABLE 9i

Address of Parity Bit Accumulators (Rate 2/5)

4173 6386 6813 15139 16380 22095 22454 24964 26820 27326 30289 32188
826 1264 3864 7778 9667 17876 20474 21361 24378 24599 28142 33137
229 1256 4395 6290 6664 15376 17436 19340 19463 28818 33008 36039
3801 8483 10585 12292 13418 14753 17085 18901 21746 22945 35570 37330
1056 7871 8934 9916 12131 17573 20277 23395 30197 33313 35985 37827
367 6393 7261 12313 16956 18789 19865 22650 23639 24535 31056 36744
4276 10788 13433 16512 17384 20031 26177 27799 29564 30931 33354 37567
1446 3707 5576 7649 9769 11723 15461 19981 23591 30056 34358 36599
4336 4879 6768 8836 11153 16163 18737 26233 28194 29209 32440 36228
4993 6006 9212 11740 14173 16526 24459 25254 29745 33408 36055 36434
664 2361 9581 15385 18970 20683 22481 25313 25573 28771 29109 38646
60 4096 7203 9634 13663 17240 22069 22446 25032 35038 36150 37117
531 2834 6551 13051 17419 18553 21464 23928 26936 29707 32040 37070
1518 2753 6081 6875 9167 10435 12956 20117 23116 24850 32134 38490
3408 7120 7440 10653 12980 16264 21753 28010 29934 31090 32798 37138
1625 2003 12165 12307 18588 19634 22220 24047 24332 32481 32815 36389
43 5869 9888 13215 14897 16193 17231 19751 28403 34240 37503 37977
995 8360 11257 11794 14564 20565 24887 27011 29372 31511 36783 37169
1807 2320 5317 5423 14505 18577 20893 27636 30865 33909 37026 38577
2917 3575 8016 11563 15569 17766 20889 24069 24341 35063 38343 38694
127 2839 6382 9940 11027 12217 14285 27540 27894 31199 31358 34474
1933 4300 6891 13497 16865 20989 22027 28776 29073 32248 33905 38280
1378 3266 8115 10258 14509 21738 25522 25610 28824 29362 31876 33896
849 7607 10285 10474 12436 16182 19495 21673 29264 32706 35784 38261
18317 32445 34841
3016 3492 27531
11220 27356 31589
14213 19144 37905
17819 20378 21592
25822 27680 28748
11051 18497 31183
8759 22683 30156
8604 15941 32844
19298 23156 30575
21482 28103 37945
2142 5436 35950
2977 10390 20959
1436 7104 12063
14316 22841 36453
4795 15107 25769
4674 5422 31791
3026 11082 34646
13803 18011 35474
22733 33617 34598
2430 11376 17648
19089 27031 33569
3748 31787 38672
1716 28541 30394
18278 33786 34836
8313 26157 32033
2619 34491 37580
31387 33834 35739
5034 11365 26172
24580 30460 33982
4375 14974 34935
6085 8159 25482

TABLE 9i-continued

Address of Parity Bit Accumulators (Rate 2/5)

12728 23556 35511
2361 35221 35496
7948 15663 37449
12946 13026 23162
9367 13954 16799
15553 18209 29641
9304 24815 26869
5095 26639 30677
14012 20605 23633
12915 13984 30821
9349 16778 23849
16874 26541 26754
15642 20257 28066
7505 14992 20745
547 5328 26296
5178 8851 26552

TABLE 9j

Address of Parity Bit Accumulators (Rate 1/3)

7127 12217 14903 17792 19690 23709 26904 31847 32174 37971 39934 43192
631 3892 3961 7110 9168 14664 20881 33763 34077 38290 38589 40587
1561 4952 12735 17050 17363 23114 23432 26431 30725 34201 38679 41775
3120 6362 9346 10202 19293 21581 26158 28110 28791 30854 37723 39609
937 3213 3271 8272 9035 15349 18735 23617 27626 33046 35819 42715
42 5281 15192 15731 20687 23236 29529 31564 32442 35605 36703 42323
3415 5078 7595 8830 16298 16735 18395 18860 20659 21190 24417 39339
1247 3506 4592 7574 11799 14188 22214 27862 31190 33446 39010 39447
659 6732 8711 10845 14967 20932 21392 24561 27950 30282 34491 39662
1574 6084 6401 10616 15496 21480 22587 24801 28997 34755 40468 40765
1816 5243 8287 9380 12795 13208 22838 23280 31453 35837 36957 38620
2526 5720 11010 12022 15200 19448 27202 27673 29334 32919 36071 42350
542 3767 8589 14736 17599 18679 20408 29296 37332 38338 40657 42203
1274 6050 11401 13088 14271 17551 31621 32620 36895 37191 39291 43194
312 4625 6259 6839 10672 16695 21781 27493 27928 31056 33505 41398
167 1811 6813 10155 10651 15544 16043 23824 28470 32607 35112 37845
2477 2675 8067 19670 22707 27069 29018 30917 33456 37625 40865 42750
2232 8590 13476 14000 16942 23026 23964 26975 29689 33460 36770 41758
2199 4775 7747 8795 17270 18866 21982 24102 29704 34123 34954 41148
2130 4709 11954 12300 19938 25299 25579 28797 30414 36228 36617 42694
1336 22318 25169
18630 24904 26071
19828 24680 29215
33916 41065 41539
14761 30074 40827
10013 20112 25932
14530 21735 41427
12985 26680 37635
7003 9909 14113
16556 18312 20606
18051 19132 21794
4506 10959 16641
13543 16372 29889
9717 22665 37324
30086 36117 40152

TABLE 9j-continued

Address of Parity Bit Accumulators (Rate ⅓)

19395 33829 38170
3120 17782 40104
1599 30981 35293
5514 10349 25365
5646 10000 25213
5839 12560 41786
20495 31791 34710
4251 31730 33042
1029 12241 28921
4009 32368 35306
7216 13773 36495
12623 22397 34316
20441 24199 41893
15962 17883 25624
13355 13717 35667
24883 27266 28103
24291 28357 34576
964 35256 39973
11315 18036 39120
2832 16014 25615
3789 7400 11418
9383 32137 37908
11721 30386 39012
7963 26523 43088
7442 11584 26585

TABLE 9k

Address of Parity Bit Accumulators (Rate ¼)

4154 7271 18608 26981 29145 30753 34895 36931 37422 42768 47366 47722
3011 5069 6156 9587 12589 20148 33306 36809 37089 44032 45205 48468
39 1332 8129 19650 21273 25443 26292 28737 31676 33999 34500 38260
2180 2761 8052 10750 16919 18907 23210 24269 26621 34815 39889 43751
1473 1960 13924 21410 23195 27618 32955 36079 38702 41888 44387 44654
4943 6550 9829 14893 15444 19815 24320 29734 33955 36141 42602 45015
1132 3914 6903 12154 12305 16298 20487 25855 29304 32150 39228 47188
880 8771 13199 15965 21881 22783 25410 28163 31814 34217 38887 40142
2890 7245 11208 18761 21093 26680 31955 38349 40180 43274 43710 46286
296 571 2760 9305 13529 14589 17815 28360 30693 33015 35716 39781
3678 9475 12627 13894 16267 19135 22641 24756 28788 33357 35290 46414
2066 9907 11657 15142 15516 21000 22945 27012 29663 40795 44925 47884
713 4869 6526 10360 14920 21797 31226 35575 41795 42905 45382 45984
1015 4061 6411 8415 11494 13574 23760 24879 27137 37539 42259 45488
8455 11853 14155 16832 19318 19778 27886 28893 36425 41079 43947 48266
5393 17152 43557
17300 25044 48036
25767 28037 31468
4322 42152 44324
27676 46770 47870
23456 24791 30363
7899 10123 45744
7716 12923 33714
18718 30285 40475
1794 18035 32276
26277 33598 38109
8757 21965 40705
7007 12090 17815
17010 22010 37440
3493 13085 32557
10988 18098 20180

TABLE 9k-continued

Address of Parity Bit Accumulators (Rate ¼)

2166 11137 23546
15518 20550 35071
26272 41471 46610
4430 14274 35788
23839 29219 43155
17336 20770 32566
10570 16186 35139
5836 22534 38783
5863 36391 41378
5580 30971 41722
5558 30075 39521
14465 39539 40407
3369 30151 46801
9211 37880 46862.

10. A method according to claim 9, wherein row indices of 1's in a column index j*M (j=0, 1, 2, 3, . . . , $k_{ldpc}$/M−1) of the parity check matrix are given at the $j^{th}$ row according to the one Table.

11. A method according to claim 9, wherein the LDPC code is of a structure that facilitates use of a plurality of parallel engines for decoding the encoded signal.

12. A method according to claim 9, further comprising:

modulating the LDPC encoded signal according to a signal constellation reflecting one of QPSK (Quadrature Phase Shift Keying), OQPSK (Offset QPSK), PSK (Phase Shift Keying), 8-PSK, 16-APSK (Amplitude PSK), and 32-APSK.

13. A method according to claim 9, further comprising:

modulating the encoded LDPC signal according to a signal constellation that comprises a one of the following formats (where $\epsilon_x$ represents average energy per symbol), a QPSK (Quadrature Phase Shift Keying) constellation having bit labeling and x-y bit positioning according to the following table:

| Bit Label | [x, y] Coordinates |
|---|---|
| 00 | [$\sqrt{\epsilon_x}$ * cos(π/4.0), $\sqrt{\epsilon_x}$ * sin(π/4.0)] |
| 01 | [$\sqrt{\epsilon_x}$ * cos(7.0 * π/4.0), $\sqrt{\epsilon_x}$ * sin(7.0 * π/4.0)] |
| 10 | [$\sqrt{\epsilon_x}$ * cos(3.0 * π/4.0), $\sqrt{\epsilon_x}$ * sin(3.0 * π/4.0)] |
| 11 | [$\sqrt{\epsilon_x}$ * cos(5.0 * π/4.0), $\sqrt{\epsilon_x}$ * sin(5.0 * π/4.0)] | an 8-PSK (Phase Shift Keying) constellation having bit labeling and x-y bit positioning according to the following table:

| Bit Label | [x, y] Coordinates |
|---|---|
| 000 | [$\sqrt{\epsilon_x}$ * cos(π/8.0), $\sqrt{\epsilon_x}$ * sin(π/8.0)] |
| 001 | [$\sqrt{\epsilon_x}$ * cos(15.0 * π/8.0), $\sqrt{\epsilon_x}$ * sin(15.0 * π/8.0)] |
| 010 | [$\sqrt{\epsilon_x}$ * cos(7.0 * π/8.0), $\sqrt{\epsilon_x}$ * sin(7.0 * π/8.0)] |
| 011 | [$\sqrt{\epsilon_x}$ * cos(9.0 * π/8.0), $\sqrt{\epsilon_x}$ * sin(9.0 * π/8.0)] |
| 100 | [$\sqrt{\epsilon_x}$ * cos(3.0 * π/8.0), $\sqrt{\epsilon_x}$ * sin(3.0 * π/8.0)] |
| 101 | [$\sqrt{\epsilon_x}$ * cos(13.0 * π/8.0), $\sqrt{\epsilon_x}$ * sin(13.0 * π/8.0)] |
| 110 | [$\sqrt{\epsilon_x}$ * cos(5.0 * π/8.0), $\sqrt{\epsilon_x}$ * sin(5.0 * π/8.0)] |
| 111 | [$\sqrt{\epsilon_x}$ * cos(11.0 * π/8.0), $\sqrt{\epsilon_x}$ * sin(11.0 * π/8.0)] | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and $4*R1^2+12*R2^2=16$):

| Bit Label | [x, y] Coordinates |
|---|---|
| 0000 | [R2 * √ϵ_x * cos(3.0 * π/12.0), R2 * √ϵ_x * sin(3.0 * π/12.0)] |
| 0001 | [R2 * √ϵ_x * cos(21.0 * π/12.0), R2 * √ϵ_x * sin(21 * π/12.0)] |
| 0010 | [R2 * √ϵ_x * cos(9.0 * π/12.0), R2 * √ϵ_x * sin(9 * π/12.0)] |
| 0011 | [R2 * √ϵ_x * cos(15.0 * π/12.0), R2 * √ϵ_x * sin(15 * π/12.0)] |
| 0100 | [R2 * √ϵ_x * cos(π/12.0), R2 * √ϵ_x * sin(π/12.0)] |
| 0101 | [R2 * √ϵ_x * cos(23.0 * π/12.0), R2 * √ϵ_x * sin(23 * π/12.0)] |
| 0110 | [R2 * √ϵ_x * cos(11.0 * π/12.0), R2 * √ϵ_x * sin(11 * π/12.0)] |
| 0111 | [R2 * √ϵ_x * cos(13.0 * π/12.0), R2 * √ϵ_x * sin(13 * π/12.0)] |
| 1000 | [R2 * √ϵ_x * cos(5.0 * π/12.0), R2 * √ϵ_x * sin(5 * π/12.0)] |
| 1001 | [R2 * √ϵ_x * cos(19.0 * π/12.0), R2 * √ϵ_x * sin(19 * π/12.0)] |
| 1010 | [R2 * √ϵ_x * cos(7.0 * π/12.0), R2 * √ϵ_x * sin(7 * π/12.0)] |
| 1011 | [R2 * √ϵ_x * cos(17.0 * π/12.0), R2 * √ϵ_x * sin(17 * π/12.0)] |
| 1100 | [R1 * √ϵ_x * cos(π/4.0), R1 * √ϵ_x * sin(π/4.0)] |
| 1101 | [R1 * √ϵ_x * cos(7.0 * π/4.0), R1 * √ϵ_x * sin(7.0 * π/4.0)] |
| 1110 | [R1 * √ϵ_x * cos(3.0 * π/4.0), R1 * √ϵ_x * sin(3.0 * π/4.0)] |
| 1111 | [R1 * √ϵ_x * cos(5.0 * π/4.0), R1 * √ϵ_x * sin(5.0 * π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | [R2 * √ϵ_x * sin(π/4.0), R2 * √ϵ_x * sin(π/4.0)] |
| 00001 | [R2 * √ϵ_x * sin(π/12.0), R2 * √ϵ_x * sin(5.0 * π/12.0)] |
| 00010 | [R2 * √ϵ_x * sin(π/4.0), −R2 * √ϵ_x * sin(π/4.0)] |
| 00011 | [R2 * √ϵ_x * sin(π/12.0), −R2 * √ϵ_x * sin(5.0 * π/12.0)] |
| 00100 | [−R2 * √ϵ_x * sin(π/4.0), R2 * √ϵ_x * sin(π/4.0)] |
| 00101 | [−R2 * √ϵ_x * sin(π/12.0), R2 * √ϵ_x * sin(5.0 * π/12.0)] |
| 00110 | [−R2 * √ϵ_x * sin(π/4.0), −R2 * √ϵ_x * sin(π/4.0)] |
| 00111 | [−R2 * √ϵ_x * sin(π/12.0), −R2 * √ϵ_x * sin(5.0 * π/12.0)] |
| 01000 | [R3 * √ϵ_x * cos(π/8.0), R3 * √ϵ_x * sin(π/8.0)] |
| 01001 | [R3 * √ϵ_x * sin(π/8.0), R3 * √ϵ_x * cos(π/8.0)] |
| 01010 | [R3 * √ϵ_x * sin(π/4.0), −R3 * √ϵ_x * sin(π/4.0)] |
| 01011 | [0, −R3 * √ϵ_x] |
| 01100 | [−R3 * √ϵ_x * sin(π/4.0), R3 * √ϵ_x * sin(π/4.0)] |
| 01101 | [0, R3 * √ϵ_x] |
| 01110 | [−R3 * √ϵ_x * cos(π/8.0), −R3 * √ϵ_x * sin(π/8.0)] |
| 01111 | [−R3 * √ϵ_x * sin(π/8.0), −R3 * √ϵ_x * cos(π/8.0)] |
| 10000 | [R2 * √ϵ_x * sin(5.0 * π/12.0), R2 * √ϵ_x * sin(π/12.0)] |
| 10001 | [R1 * √ϵ_x * sin(π/4.0), R1 * √ϵ_x * sin(π/4.0)] |
| 10010 | [R2 * √ϵ_x * sin(5.0 * π/12.0), −R2 * √ϵ_x * sin(π/12.0)] |
| 10011 | [R1 * √ϵ_x * sin(π/4.0), −R1 * √ϵ_x * sin(π/4.0)] |
| 10100 | [−R2 * √ϵ_x * sin(5.0 * π/12.0), R2 * √ϵ_x * sin(π/12.0)] |
| 10101 | [−R1 * √ϵ_x * sin(π/4.0), R1 * √ϵ_x * sin(π/4.0)] |
| 10110 | [−R2 * √ϵ_x * sin(5.0 * π/12.0), −R2 * √ϵ_x * sin(π/12.0)] |
| 10111 | [−R1 * √ϵ_x * sin(π/4.0), −R1 * √ϵ_x * sin(π/4.0)] |
| 11000 | [R3 * √ϵ_x, 0] |
| 11001 | [R3 * √ϵ_x * sin(π/4.0), R3 * √ϵ_x * sin(π/4.0)] |
| 11010 | [R3 * √ϵ_x * cos(π/8.0), −R3 * √ϵ_x * sin(π/8.0)] |
| 11011 | [R3 * √ϵ_x * sin(π/8.0), −R3 * √ϵ_x * cos(π/8.0)] |
| 11100 | [−R3 * √ϵ_x * cos(π/8.0), R3 * √ϵ_x * sin(π/8.0)] |
| 11101 | [−R3 * √ϵ_x * sin(π/8.0), R3 * √ϵ_x * cos(π/8.0)] |
| 11110 | [−R3 * √ϵ_x, 0] |
| 11111 | [−R3 * √ϵ_x * sin(π/4.0), −R3 * √ϵ_x * sin(π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | [−R3 * √ϵ_x * sin(π/4.0), R3 * √ϵ_x * sin(π/4.0)] |
| 00001 | [−R3 * √ϵ_x * sin(π/8.0), R3 * √ϵ_x * cos(π/8.0)] |
| 00010 | [R3 * √ϵ_x * sin(π/8.0), R3 * √ϵ_x * cos(π/8.0)] |
| 00011 | [0, R3 * √ϵ_x] |
| 00100 | [−R2 * √ϵ_x * sin(π/4.0), R2 * √ϵ_x * sin(π/4.0)] |
| 00101 | [−R2 * √ϵ_x * sin(π/12.0), R2 * ϵ_x * sin(5.0 * π/12.0)] |
| 00110 | [R2 * √ϵ_x * sin(π/4.0), R2 * √ϵ_x * sin(π/4.0)] |
| 00111 | [R2 * √ϵ_x * sin(π/12.0), R2 * √ϵ_x * sin(5.0 * π/12.0)] |
| 01000 | [−R3 * √ϵ_x * cos(π/8.0), R3 * √ϵ_x * sin(π/8.0)] |
| 01001 | [−R3 * √ϵ_x, 0] |
| 01010 | [R3 * √ϵ_x * sin(π/4.0), R3 * √ϵ_x * sin(π/4.0)] |
| 01011 | [R3 * √ϵ_x * cos(π/8.0), R3 * √ϵ_x * sin(π/8.0)] |
| 01100 | [−R2 * √ϵ_x * sin(5.0 * π/12.0), R2 * √ϵ_x * sin(π/12.0)] |
| 01101 | [−R1 * √ϵ_x * sin(π/4.0), R1 * √ϵ_x * sin(π/4.0)] |
| 01110 | [R2 * √ϵ_x * sin(5.0 * π/12.0), R2 * √ϵ_x * sin(π/2.0)] |
| 01111 | [R1 * √ϵ_x * sin(π/4.0), R1 * √ϵ_x * sin(π/4.0)] |
| 10000 | [−R3 * √ϵ_x * sin(π/8.0), −R3 * √ϵ_x * cos(π/8.0)] |
| 10001 | [0, −R3 * √ϵ_x] |
| 10010 | [R3 * √ϵ_x * sin(π/4.0), −R3 * √ϵ_x * sin(π/4.0)] |
| 10011 | [R3 * √ϵ_x * sin(π/8.0), −R3 * √ϵ_x * cos(π/8.0)] |
| 10100 | [−R2 * √ϵ_x * sin(π/4.0), −R2 * √ϵ_x * sin(π/4.0)] |
| 10101 | [−R2 * √ϵ_x * sin(π/12.0), −R2 * √ϵ_x * sin(5.0 * π/12.0)] |
| 10110 | [R2 * √ϵ_x * sin(π/4.0), −R2 * √ϵ_x * sin(π/4.0)] |
| 10111 | [R2 * √ϵ_x * sin(π/12.0), −R2 * √ϵ_x * sin(5.0 * π/12.0)] |
| 11000 | [−R3 * √ϵ_x * sin(π/4.0), −R3 * √ϵ_x * sin(π/4.0)] |
| 11001 | [−R3 * √ϵ_x * cos(π/8.0), −R3 * √ϵ_x * sin(π/8.0)] |
| 11010 | [R3 * √ϵ_x * cos(π/8.0), −R3 * √ϵ_x * sin(π/8.0)] |
| 11011 | [R3 * √ϵ_x, 0] |
| 11100 | [−R2 * √ϵ_x * sin(5.0 * π/12.0), −R2 * √ϵ_x * sin(π/12.0)] |
| 11101 | [−R1 * √ϵ_x * sin(π/4.0), −R1 * √ϵ_x * sin(π/4.0)] |
| 11110 | [R2 * √ϵ_x * sin(5.0 * π/12.0), −R2 * √ϵ_x * sin(π/12.0)] |
| 11111 | [R1 * √ϵ_x * sin(π/4.0), −R1 * √ϵ_x * sin(π/4.0)]. |

14. A method according to claim 9, further comprising:
encoding, prior to the LDPC encoding, the one or more blocks of information bits of the source signal based on a t-error Bose Chaudhuri Hocquenghem (BCH) code.

15. A method according to claim 14, further comprising:
interleaving the LDPC encoded signal.

16. A method according to claim 15, further comprising:
modulating the interleaved signal according to a signal constellation that comprises a one of the following formats (where $\epsilon_x$ represents average energy per symbol),
a QPSK (Quadrature Phase Shift Keying) constellation having bit labeling and x-y bit positioning according to the following table:

| Bit Label | [x, y] Coordinates |
|---|---|
| 00 | [√ϵ_x * cos(π/4.0), √ϵ_x * sin(π/4.0)] |
| 01 | [√ϵ_x * cos(7.0 * π/4.0), √ϵ_x * sin(7.0 * π/4.0)] |
| 10 | [√ϵ_x * cos(3.0 * π/4.0), √ϵ_x * sin(3.0 * π/4.0)] |
| 11 | [√ϵ_x * cos(5.0 * π/4.0), √ϵ_x * sin(5.0 * π/4.0)] | an 8-PSK (Phase Shift Keying) constellation having bit labeling and x-y bit positioning according to the following table:

| Bit Label | [x, y] Coordinates |
|---|---|
| 000 | [√ϵ_x * cos(π/8.0), √ϵ_x * sin(π/8.0)] |
| 001 | [√ϵ_x * cos(15.0 * π/8.0), √ϵ_x * sin(15.0 * π/8.0)] |
| 010 | [√ϵ_x * cos(7.0 * π/8.0), √ϵ_x * sin(7.0 * π/8.0)] |
| 011 | [√ϵ_x * cos(9.0 * π/8.0), √ϵ_x * sin(9.0 * π/8.0)] |
| 100 | [√ϵ_x * cos(3.0 * π/8.0), √ϵ_x * sin(3.0 * π/8.0)] |
| 101 | [√ϵ_x * cos(13.0 * π/8.0), √ϵ_x * sin(13.0 * π/8.0)] |
| 110 | [√ϵ_x * cos(5.0 * π/8.0), √ϵ_x * sin(5.0 * π/8.0)] |
| 111 | [√ϵ_x * cos(11.0 * π/8.0), √ϵ_x * sin(11.0 * π/8.0)] | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and $4*R1^2+12*R2^2=16$):

| Bit Label | [x, y] Coordinates |
|---|---|
| 0000 | [R2 * $\sqrt{\epsilon_x}$ * cos(3.0 * π/12.0), R2 * $\sqrt{\epsilon_x}$ * sin(3.0 * π/12.0)] |
| 0001 | [R2 * $\sqrt{\epsilon_x}$ * cos(21.0 * π/12.0), R2 * $\sqrt{\epsilon_x}$ * sin(21 * π/12.0)] |
| 0010 | [R2 * $\sqrt{\epsilon_x}$ * cos(9.0 * π/12.0), R2 * $\sqrt{\epsilon_x}$ * sin(9 * π/12.0)] |
| 0011 | [R2 * $\sqrt{\epsilon_x}$ * cos(15.0 * π/12.0), R2 * $\sqrt{\epsilon_x}$ * sin(15 * π/12.0)] |
| 0100 | [R2 * $\sqrt{\epsilon_x}$ * cos(π/12.0), R2 * $\sqrt{\epsilon_x}$ * sin(π/12.0)] |
| 0101 | [R2 * $\sqrt{\epsilon_x}$ * cos(23.0 * π/12.0), R2 * $\sqrt{\epsilon_x}$ * sin(23 * π/12.0)] |
| 0110 | [R2 * $\sqrt{\epsilon_x}$ * cos(11.0 * π/12.0), R2 * $\sqrt{\epsilon_x}$ * sin(11 * π/12.0)] |
| 0111 | [R2 * $\sqrt{\epsilon_x}$ * cos(13.0 * π/12.0), R2 * $\sqrt{\epsilon_x}$ * sin(13 * π/12.0)] |
| 1000 | [R2 * $\sqrt{\epsilon_x}$ * cos(5.0 * π/12.0), R2 * $\sqrt{\epsilon_x}$ * sin(5 * π/12.0)] |
| 1001 | [R2 * $\sqrt{\epsilon_x}$ * cos(19.0 * π/12.0), R2 * $\sqrt{\epsilon_x}$ * sin(19 * π/12.0)] |
| 1010 | [R2 * $\sqrt{\epsilon_x}$ * cos(7.0 * π/12.0), R2 * $\sqrt{\epsilon_x}$ * sin(7 * π/12.0)] |
| 1011 | [R2 * $\sqrt{\epsilon_x}$ * cos(17.0 * π/12.0), R2 * $\sqrt{\epsilon_x}$ * sin(17 * π/12.0)] |
| 1100 | [R1 * $\sqrt{\epsilon_x}$ * cos(π/4.0), R1 * $\sqrt{\epsilon_x}$ * sin(π/4.0)] |
| 1101 | [R1 * $\sqrt{\epsilon_x}$ * cos(7.0 * π/4.0), R1 * $\sqrt{\epsilon_x}$ * sin(7.0 * π/4.0)] |
| 1110 | [R1 * $\sqrt{\epsilon_x}$ * cos(3.0 * π/4.0), R1 * $\sqrt{\epsilon_x}$ * sin(3.0 * π/4.0)] |
| 1111 | [R1 * $\sqrt{\epsilon_x}$ * cos(5.0 * π/4.0), R1 * $\sqrt{\epsilon_x}$ * sin(5.0 * π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | [R2 * $\sqrt{\epsilon_x}$ * sin(π/4.0), R2 * $\sqrt{\epsilon_x}$ * sin(π/4.0)] |
| 00001 | [R2 * $\sqrt{\epsilon_x}$ * sin(π/12.0), R2 * $\sqrt{\epsilon_x}$ * sin(5.0 * π/12.0)] |
| 00010 | [R2 * $\sqrt{\epsilon_x}$ * sin(π/4.0), -R2 * $\sqrt{\epsilon_x}$ * sin(π/4.0)] |
| 00011 | [R2 * $\sqrt{\epsilon_x}$ * sin(π/12.0), -R2 * $\sqrt{\epsilon_x}$ * sin(5.0 * π/12.0)] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [-R2 * $\sqrt{\epsilon_x}$ * sin(π/4.0), -R2 * $\sqrt{\epsilon_x}$ * sin(π/4.0)] |
| 00111 | [-R2 * $\sqrt{\epsilon_x}$ * sin(π/12.0), -R2 * $\sqrt{\epsilon_x}$ * sin(5.0 * π/12.0)] |
| 01000 | [R3 * $\sqrt{\epsilon_x}$ * cos(π/8.0), R3 * $\sqrt{\epsilon_x}$ * sin(π/8.0)] |
| 01001 | [R3 * $\sqrt{\epsilon_x}$ * sin(π/8.0), R3 * $\sqrt{\epsilon_x}$ * cos(π/8.0)] |
| 01010 | [R3 * $\sqrt{\epsilon_x}$ * sin(π/4.0), -R3 * $\sqrt{\epsilon_x}$ * sin(π/4.0)] |
| 01011 | [0, -R3 * $\sqrt{\epsilon_x}$] |
| 01100 | [-R3 * $\sqrt{\epsilon_x}$ * sin(π/4.0), R3 * $\sqrt{\epsilon_x}$ * sin(π/4.0)] |
| 01101 | [0, R3 * $\sqrt{\epsilon_x}$] |
| 01110 | [-R3 * $\sqrt{\epsilon_x}$ * cos(π/8.0), -R3 * $\sqrt{\epsilon_x}$ * sin(π/8.0)] |
| 01111 | [-R3 * $\sqrt{\epsilon_x}$ * sin(π/8.0), -R3 * $\sqrt{\epsilon_x}$ * cos(π/8.0)] |
| 10000 | [R2 * $\sqrt{\epsilon_x}$ * sin(5.0 * π/12.0), R2 * $\sqrt{\epsilon_x}$ * sin(π/12.0)] |
| 10001 | [R1 * $\sqrt{\epsilon_x}$ * sin(π/4.0), R1 * $\sqrt{\epsilon_x}$ * sin(π/4.0)] |
| 10010 | [R2 * $\sqrt{\epsilon_x}$ * sin(5.0 * π/12.0), -R2 * $\sqrt{\epsilon_x}$ * sin(π/12.0)] |
| 10011 | [R1 * $\sqrt{\epsilon_x}$ * sin(π/4.0), -R1 * $\sqrt{\epsilon_x}$ * sin(π/4.0)] |
| 10100 | [-R2 * $\sqrt{\epsilon_x}$ * sin(5.0 * π/12.0), R2 * $\sqrt{\epsilon_x}$ * sin(π/12.0)] |
| 10101 | [-R1 * $\sqrt{\epsilon_x}$ * sin(π/4.0), R1 * $\sqrt{\epsilon_x}$ * sin(π/4.0)] |
| 10110 | [-R2 * $\sqrt{\epsilon_x}$ * sin(5.0 * π/12.0), -R2 * $\sqrt{\epsilon_x}$ * sin(π/12.0)] |
| 10111 | [-R1 * $\sqrt{\epsilon_x}$ * sin(π/4.0), -R1 * $\sqrt{\epsilon_x}$ * sin(π/4.0)] |
| 11000 | [R3 * $\sqrt{\epsilon_x}$, 0] |
| 11001 | [R3 * $\sqrt{\epsilon_x}$ * sin(π/4.0), R3 * $\sqrt{\epsilon_x}$ * sin(π/4.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$ * sin(π/8.0), -R3 * $\sqrt{\epsilon_x}$ * cos(π/8.0)] |
| 11100 | [-R3 * $\sqrt{\epsilon_x}$ * cos(π/8.0), R3 * $\sqrt{\epsilon_x}$ * sin(π/8.0)] |
| 11101 | [-R3 * $\sqrt{\epsilon_x}$ * sin(π/8.0), R3 * $\sqrt{\epsilon_x}$ * cos(π/8.0)] |
| 11110 | [-R3 * $\sqrt{\epsilon_x}$, 0] |
| 11111 | [-R3 * $\sqrt{\epsilon_x}$ * sin(π/4.0), -R3 * $\sqrt{\epsilon_x}$ * sin(π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | [-R3 * $\sqrt{\epsilon_x}$ * sin(π/4.0), R3 * $\sqrt{\epsilon_x}$ * sin(π/4.0)] |
| 00001 | [-R3 * $\sqrt{\epsilon_x}$ * sin(π/8.0), R3 * $\sqrt{\epsilon_x}$ * cos(π/8.0)] |
| 00010 | [R3 * $\sqrt{\epsilon_x}$ * sin(π/8.0), R3 * $\sqrt{\epsilon_x}$ * cos(π/8.0)] |
| 00011 | [0, R3 * $\sqrt{\epsilon_x}$] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [R2 * $\sqrt{\epsilon_x}$ * sin(π/4.0), R2 * $\sqrt{\epsilon_x}$ * sin(π/4.0)] |
| 00111 | [R2 * $\sqrt{\epsilon_x}$ * sin(π/12.0), R2 * $\sqrt{\epsilon_x}$ * sin(5.0 * π/12.0)] |
| 01000 | [-R3 * $\sqrt{\epsilon_x}$ * cos(π/8.0), R3 * $\sqrt{\epsilon_x}$ * sin(π/8.0)] |
| 01001 | [-R3 * $\sqrt{\epsilon_x}$, 0] |
| 01010 | [R3 * $\sqrt{\epsilon_x}$ * sin(π/4.0), R3 * $\sqrt{\epsilon_x}$ * sin(π/4.0)] |
| 01011 | [R3 * $\sqrt{\epsilon_x}$ * cos(π/8.0), R3 * $\sqrt{\epsilon_x}$ * sin(π/8.0)] |
| 01100 | [-R2 * $\sqrt{\epsilon_x}$ * sin(5.0 * π/12.0), R2 * $\sqrt{\epsilon_x}$ * sin(π/12.0)] |
| 01101 | [-R1 * $\sqrt{\epsilon_x}$ * sin(π/4.0), R1 * $\sqrt{\epsilon_x}$ * sin(π/4.0)] |
| 01110 | [R2 * $\sqrt{\epsilon_x}$ * sin(5.0 * π/12.0), R2 * $\sqrt{\epsilon_x}$ * sin(π/12.0)] |
| 01111 | [R1 * $\sqrt{\epsilon_x}$ * sin(π/4.0), R1 * $\sqrt{\epsilon_x}$ * sin(π/4.0)] |
| 10000 | [-R3 * $\sqrt{\epsilon_x}$ * sin(π/8.0), -R3 * $\sqrt{\epsilon_x}$ * cos(π/8.0)] |
| 10001 | [0, -R3 * $\sqrt{\epsilon_x}$] |
| 10010 | [R3 * $\sqrt{\epsilon_x}$ * sin(π/4.0), -R3 * $\sqrt{\epsilon_x}$ * sin(π/4.0)] |
| 10011 | [R3 * $\sqrt{\epsilon_x}$ * sin(π/8.0), -R3 * $\sqrt{\epsilon_x}$ * cos(π/8.0)] |
| 10100 | [-R2 * $\sqrt{\epsilon_x}$ * sin(π/4.0), -R2 * $\sqrt{\epsilon_x}$ * sin(π/4.0)] |
| 10101 | [-R2 * $\sqrt{\epsilon_x}$ * sin(π/12.0), -R2 * $\sqrt{\epsilon_x}$ * sin(5.0 * π/12.0)] |
| 10110 | [R2 * $\sqrt{\epsilon_x}$ * sin(π/4.0), -R2 * $\sqrt{\epsilon_x}$ * sin(π/4.0)] |
| 10111 | [R2 * $\sqrt{\epsilon_x}$ * sin(π/12.0), -R2 * $\sqrt{\epsilon_x}$ * sin(5.0 * π/12.0)] |
| 11000 | [-R3 * $\sqrt{\epsilon_x}$ * sin(π/4.0), -R3 * $\sqrt{\epsilon_x}$ * sin(π/4.0)] |
| 11001 | [-R3 * $\sqrt{\epsilon_x}$ * cos(π/8.0), -R3 * $\sqrt{\epsilon_x}$ * sin(π/8.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$, 0] |
| 11100 | [-R2 * $\sqrt{\epsilon_x}$ * sin(5.0 * π/12.0), -R2 * $\sqrt{\epsilon_x}$ * sin(π/12.0)] |
| 11101 | [-R1 * $\sqrt{\epsilon_x}$ * sin(π/4.0), -R1 * $\sqrt{\epsilon_x}$ * sin(π/4.0)] |
| 11110 | [R2 * $\sqrt{\epsilon_x}$ * sin(5.0 * π/12.0), -R2 * $\sqrt{\epsilon_x}$ * sin(π/12.0)] |
| 11111 | [R1 * $\sqrt{\epsilon_x}$ * sin(π/4.0), -R1 * $\sqrt{\epsilon_x}$ * sin(π/4.0)]. |

17. An apparatus, comprising:
at least one processor; and
at least one memory including computer program code for one or more programs,
the at least one memory and the computer program code configured to, with the at least one processor, cause the apparatus to perform at least the following:
accessing stored information representing a predetermined structured parity check matrix of a Low Density Parity Check (LDPC) code, wherein the stored information reflects a tabular format of rows and columns, wherein each row represents occurrences of one values within a respective column of the parity check matrix, and wherein the columns of the parity check matrix are derived according to a predetermined operation based on the respective rows of the stored tabular information; and
encoding one or more blocks of information bits of a source signal based on the LDPC code to generate an LDPC encoded signal;
wherein the LDPC encoding of the blocks of information bits (each block being of a size of $k_{ldpc}$ information bits, and each resulting encoded block being of a size of $n_{ldpc}$ code bits including parity bits $p_i$, i=0, 1, 2, . . . , $n_{ldpc}-k_{ldpc}-1$), comprises:
initializing parity bit accumulators $a_0=a_1=\ldots=a_{n_{ldpc}-k_{ldpc}-1}=0$;
for a one of the blocks of information bits, divided into j sequential groups (each of a size of M information bits), and for j=1, 2, 3, . . . $k_{ldpc}/M$: (1) accumulating a first information bit of a $j^{th}$ group in certain of the parity bit accumulators reflected by accumulator addresses based on a $j^{th}$ row of the stored tabular information; and (2) accumulating the remaining (M-1) information bits of the $j^{th}$ group in certain of the parity bit accumulators reflected by accumulator addresses according to {x+m mod M*q} mod($n_{ldpc}-$ $k_{ldpc}$), wherein x denotes an address of the parity bit accumulator corresponding to the first bit of the group, and $q=(n_{ldpc}-k_{ldpc})/M$; and after all of the information bits of the one block are accumulated, sequentially performing operations (with respect to the parity bit accumulators) according to $a_i=a_i \oplus a_{i-1}$, i=1, 2, . . . ($n_{ldpc}-k_{ldpc}-1$), where the additions are in Galois Field (GF) 2; and wherein the parity bits $p_i$, i=0, 1, . . . ($n_{ldpc}-k_{ldpc}-1$) are respectively reflected by the resulting parity bit accumulators $a_i$, i=0, 1, . . . ($n_{ldpc}-k_{ldpc}-1$); and wherein the stored information representing the structured parity check matrix comprises a one of the following Tables 17a through 17r, TABLE 17a Address of Parity Bit Accumulators (Rate 9/10 - Coded Block Size 720)

10 62 53 15
54 56 5 3
8 34 23 45
10 60 23 27
6 70 51 65
26 38 23 67
18 22 25 1
12 28 5 61
36 44 7 49
20 46 29 69
6 22 31
46 37 51
54 18 65
32 11 17
46 32 15
0 3 45
44 24 63
64 45 23

TABLE 17b

Address of Parity Bit Accumulators (Rate 9/10 - Coded Block Size 960)

88 70 81 43
6 64 29 13
18 82 1 35
10 6 47 53
38 22 57 1
78 6 87 15
78 48 73 37
26 82 13 17
52 62 19 29
58 14 79 27
86 16 19
2 7 95
44 30 5
42 81 13
22 66 17
8 93 19
82 50 41
16 93 57

TABLE 17c

Address of Parity Bit Accumulators (Rate 9/10 - Coded Block Size 1440)

132 109 122 67
12 97 46 19
120 129 70 31
28 125 2 55
108 81 134 59
136 49 30 139
40 69 38 123
100 141 46 75
64 109 134 47

TABLE 17c-continued

Address of Parity Bit Accumulators (Rate 9/10 - Coded Block Size 1440)

120 29 26 67
112 37 10 55
136 53 122 103
80 17 34 115
40 61 46 71
132 81 18 7
12 113 6 143
108 113 122 11
108 69 110 63
124 141 2 115
100 133 18 15
133 0 51
106 40 115
101 62 67
136 17 50
80 10 75
37 126 19
40 25 122
40 129 143
12 66 83
17 7 74
52 17 23
8 21 94
117 119 80
70 104 25
66 43 73
88 98 111

TABLE 17d

Address of Parity Bit Accumulators (Rate 9/10 - Coded Block Size 2160)

36 153 142 127
136 157 182 151
108 197 106 63
108 49 182 35
8 89 134 43
56 105 30 175
104 181 66 115
96 5 78 211
52 57 194 119
128 97 2 23
196 37 2 171
184 177 10 15
56 17 2 43
84 121 142 35
8 21 62 107
184 193 46 7
160 205 42 107
120 181 122 103
196 153 46 163
72 105 202 11
31 86 157
176 186 129
0 27 201
140 154 191
155 6 105
124 118 55
44 197 87
60 189 206
121 8 215
206 93 43
136 94 65
28 178 51
110 59 144
149 98 12
149 107 184
61 122 99

TABLE 17e

Address of Parity Bit Accumulators (Rate 9/10 - Coded Block Size 2880)

92 133 95 39
78 91 251 284
262 92 89 204
15 226 74 150
73 39 28 47
258 175 57 160
171 286 97 12
208 69 108 59
164 4 171 217
50 245 171 139
18 122 35 97
30 26 160 53
81 72 286 20
236 259 66 105
11 0 146 7
196 95 168 194
1 129 64 29
241 177 250 47
151 53 184 192
59 52 21 84
248 87 264 280
103 278 137 154
175 56 273 192
43 80 183 95
134 245 142 33
229 18 196 200
186 188 251 33
43 33 250 74
6 55 77 261
282 139 286 227
135 163 89
252 151 250
138 286 205
32 137 4
44 87 137
192 158 189
138 50 173
236 15 94
82 285 281
133 249 191
114 1 128
96 193 76
1 242 153
284 156 53
42 92 160
113 247 81
196 275 103
168 117 262
116 166 137
177 8 125
115 9 6
199 219 18
208 138 73
14 154 101

TABLE 17f

Address of Parity Bit Accumulators (Rate 9/10 - Coded Block Size 3600)

212 271 274 5
122 345 127 59
138 71 189 157
60 256 26 143
234 105 190 224
240 217 129 58
135 2 349 221
227 336 171 194
358 169 77 330
34 235 174 269
74 261 28 235
126 50 345 130
302 42 31 15
214 47 79 339
89 180 178 9
38 192 89 49

TABLE 17f-continued

Address of Parity Bit Accumulators (Rate 9/10 - Coded Block Size 3600)

332 256 222 183
187 140 88 137
213 307 190 137
225 258 289 233
188 336 85 93
98 352 333 17
324 62 244 149
108 19 242 292
340 303 65 150
166 95 282 169
278 61 113 234
122 207 52 107
37 296 135 178
330 271 200 339
176 243 203
284 202 249
210 350 9
61 126 16
253 317 108
91 298 287
160 237 31
72 247 124
38 347 169
113 346 24
266 21 108
188 267 269
298 117 275
332 216 163
317 130 146
272 82 193
30 129 77
282 7 327
292 319 5
99 276 305
125 169 303
80 225 60
92 304 7
36 86 46

TABLE 17g

Address of Parity Bit Accumulators (Rate 9/10 - Coded Block Size 4320)

273 190 207 371
331 258 135 416
306 12 291 293
262 215 396 74
14 193 91 207
384 341 260 81
128 365 170 9
336 396 413 238
16 407 130 4
42 323 54 85
6 103 349 176
216 286 426 277
425 416 419 322
289 164 379 189
1 292 319 363
345 132 134 423
366 146 381 235
88 111 206 4
121 426 307 254
203 244 406 216
7 275 53 76
329 418 416 84
233 293 351 368
153 410 101 183
196 400 170 65
192 357 31 43
46 245 428 304
51 1 144 351
319 321 413 298
350 213 244 210
387 166 367 228
297 178 83 238

TABLE 17g-continued

Address of Parity Bit Accumulators (Rate 9/10 - Coded Block Size 4320)

97 428 266 165
197 423 115 265
43 104 172 122
144 227 407 65
166 210 73 311
94 351 154 357
64 172 30 13
320 243 412 318
392 346 252
286 13 207
208 277 178
67 161 394
351 45 17
295 196 251
326 356 145
168 411 262
54 51 177
398 148 355
330 168 399
161 312 50
419 65 327
61 374 232
28 69 303
298 116 221
52 270 165
103 398 283
243 184 364
348 7 209
362 221 187
343 184 190
265 306 277
56 25 34
325 345 60
198 344 113
68 41 171
253 56 188
431 27 256
106 421 22
274 279 67
298 294 79

TABLE 17h

Address of Parity Bit Accumulators (Rate 9/10 - Coded Block Size 5760)

35 247 105 399
280 268 513 68
161 104 460 466
156 253 305 393
72 489 178 202
398 199 151 383
92 527 54 224
200 409 42 147
459 569 553 312
242 180 155 10
216 458 361 318
104 489 206 52
22 56 123 538
264 295 130 29
263 28 274 239
276 124 449 21
360 482 519 253
225 202 212 312
268 338 558 200
43 291 436 27
84 231 40 521
95 142 558 361
475 462 319 419
84 74 522 573
451 188 526 263
226 159 440 491
415 434 60 215
553 250 72 209
18 436 311 210
327 524 536 18

TABLE 17h-continued

Address of Parity Bit Accumulators (Rate 9/10 - Coded Block Size 5760)

15 211 11 453
22 452 289 305
351 187 343 240
98 33 493 147
100 176 188 384
379 347 349 332
532 518 483 445
496 203 269 304
459 344 311 574
128 429 538 527
479 125 43 508
228 315 416 231
417 558 501 190
498 526 341 505
270 381 517 260
12 481 91
44 540 104
339 295 172
467 569 121
137 474 221
567 444 506
104 526 327
547 134 519
522 262 547
37 375 377
455 400 327
325 213 390
6 167 11
363 160 541
337 185 61
225 7 233
450 407 323
288 38 463
95 274 279
377 423 411
227 558 156
114 497 471
22 73 296
508 393 182
304 239 183
415 322 332
28 500 106
470 358 505
461 302 342
68 255 90
416 368 487
177 531 161
84 314 391
310 392 367
177 19 102
130 366 25

TABLE 17i

Address of Parity Bit Accumulators (Rate 2/3 - Coded Block Size 1080)

78 323 226 335 169 288 12 213
328 321 122 163 12 37 310 223
344 97 346 195 180 325 22 311
56 121 26 187 148 109 302 119
332 251 289 166
197 24 303 313
258 228 239 181
232 154 323 182
6 282 77
162 3 199
295 112 251
33 50 61
139 208 95
228 121 216
356 302 349
201 324 14

TABLE 17j

Address of Parity Bit Accumulators (Rate 4/5 - Coded Block Size 1080)

90 67 188 117 28 125
186 1 146 99 22 197
60 85 44 147 118 41
42 133 8 75 142 17
30 97 158 93 46 71
30 109 182 195 16 143
60 10 105
33 166 185
142 85 168
86 133 159
104 137 91
24 110 167
31 36 46
142 186 63
89 139 116
99 5 88
176 195 193
12 44 185
168 37 146 141 166 101
66 37 200 45 136 89
90 19 152 111 94 179
84 211 26 183 64 113
60 1 80 129 190 179
6 121 20 159 88 131

TABLE 17k

Address of Parity Bit Accumulators (Rate 8/9 - Coded Block Size 720)

34 78 37 17
72 76 43 35
2 4 79 37
40 60 51 17
4 70 59 49
50 22 63 31
46 20 69 73
40 70 57 55
38 22 43
46 40 71
14 17 61
26 21 45
4 36 1
60 26 33
46 55 21
36 27 13

TABLE 17l

Address of Parity Bit Accumulators (Rate 8/9 - Coded Block Size 1080)

20 77 70 31
96 45 86 3
24 65 34 3
0 21 74 67
28 5 106 71
16 41 18 95
72 17 6 59
40 69 22 71
64 101 86 83
96 85 46 119
96 37 70 99
0 89 46 59
80 65 74 63
44 57 102 79
76 5 54 115
8 109 74 119
32 105 118
48 57 62
44 89 30
80 97 114
60 65 115
40 5 111
52 9 27

TABLE 17l-continued

Address of Parity Bit Accumulators (Rate 8/9 - Coded Block Size 1080)

108 105 79
116 38 47
32 38 79
36 34 51
56 94 119
49 114 119
21 78 51
1 22 87
37 66 15

TABLE 17m

Address of Parity Bit Accumulators (Rate 8/9 - Coded Block Size 1440)

68 49 138 87
16 89 62 39
140 1 106 75
12 141 46 67
100 9 26 87
12 41 94 83
128 73 106 35
20 113 10 55
16 81 122 135
136 97 38 111
140 77 102 143
60 105 86 71
88 61 130 39
136 121 134 75
92 145 98 151
12 5 50 7
64 125 94
152 9 6
56 9 130
96 93 114
60 93 103
48 157 139
132 157 115
72 61 79
64 14 31
80 130 95
140 46 131
92 74 139
5 122 75
145 14 19
121 22 143
121 86 119

TABLE 17n

Address of Parity Bit Accumulators (Rate 8/9 - Coded Block Size 2160)

116 121 22 107
120 113 90 115
168 225 70 199
208 137 190 99
220 113 34 207
52 177 94 235
204 229 66 171
100 85 218 123
16 113 2 23
96 73 26 159
120 169 138 199
104 65 130 139
96 161 194 143
104 209 226 39
236 125 182 79
140 13 50 79
28 193 118
188 89 34
224 61 50
128 81 46
156 9 111
156 37 175

TABLE 17n-continued

Address of Parity Bit Accumulators (Rate 8/9 - Coded Block Size 2160)

72 105 239
64 137 131
176 182 135
148 18 95
100 54 215
224 174 103
165 238 87
145 214 207
89 182 55
53 38 159

TABLE 17o

Address of Parity Bit Accumulators (Rate 8/9 - Coded Block Size 2880)

33 174 30 142
266 282 240 78
291 229 80 43
156 132 134 303
50 31 287 239
68 186 92 75
59 203 255 37
171 139 287 45
101 23 89 52
20 271 38 109
84 32 111 225
183 314 101 110
142 163 44 25
206 302 173 5
86 272 18 39
237 199 140 86
248 159 56 167
215 283 76 254
190 187 148 291
310 57 53 99
90 134 151
199 111 30
227 148 51
167 33 294
190 147 173
84 175 108
35 317 138
111 300 73
306 292 224
106 307 274
202 153 79
58 195 131
10 249 242
51 9 28
275 6 287
54 246 313
106 88 49
315 42 218
265 212 239
85 306 147

TABLE 17p

Address of Parity Bit Accumulators (Rate 8/9 - Coded Block Size 3600)

267 282 5 84
96 78 167 18
276 240 117 303
136 175 169 324
117 73 360 4
379 398 265 253
146 11 62 89
114 227 342 31
26 284 295 49
239 137 124 350
118 266 191 155
213 310 20 73
384 231 396 323

TABLE 17p-continued

Address of Parity Bit Accumulators (Rate 8/9 - Coded Block Size 3600)

216 317 150 129
232 58 27 245
272 18 59 253
62 376 44 337
293 392 42 396
87 270 91 25
284 2 22 157
8 169 355 174
71 330 336 156
11 325 343 265
226 395 101 263
163 60 152 303
250 245 206 289
382 354 57 368
212 201 271 214
120 237 11 68
362 174 180 269
315 7 233 112
290 11 157 183
351 284 9
95 240 233
335 261 152
78 267 348
253 42 75
78 75 29
98 64 84
385 378 54
39 152 132
298 41 3
396 171 183
397 328 47
336 197 218
214 19 266
57 166 285
265 284 214
75 5 239
74 46 244
313 317 127
8 3 65
50 60 177
310 119 325
136 36 134
152 154 59
103 323 245
369 120 148
328 387 21
20 355 13
238 384 193
154 351 121
322 390 44
66 326 39

TABLE 17q

Address of Parity Bit Accumulators (Rate 8/9 - Coded Block Size 4320)

30 196 79 344
162 460 169 79
210 252 30 83
389 334 100 47
199 11 210 305
344 333 474 454
400 137 475 29
328 137 67 453
228 258 371 16
8 268 197 38
174 403 56 41
25 52 309 303
239 152 81 379
106 452 443 31
474 149 238 119
465 314 349 366
406 458 395 152
229 38 432 457
421 360 113 247

TABLE 17q-continued

Address of Parity Bit Accumulators (Rate 8/9 - Coded Block Size 4320)

244 144 178 315
189 97 212 62
375 166 356 397
2 307 79 436
385 314 411 287
159 389 392 190
77 115 316 118
50 284 59 53
329 67 277 42
177 466 331 380
144 335 402 52
48 449 126 151
160 273 70 143
53 440 436
321 262 469
271 379 374
55 394 181
279 57 168
176 225 134
322 267 220
418 203 308
270 332 257
398 82 379
104 167 117
141 82 168
119 332 470
370 165 96
361 51 463
225 363 460
468 151 461
103 444 357
359 357 203
188 1 350
379 385 256
274 393 123
408 434 142
96 426 414
343 22 106
277 434 108
363 110 257
407 85 353
204 45 307
424 39 230
376 41 346
416 259 124

TABLE 17r

Address of Parity Bit Accumulators (Rate 8/9 - Coded Block Size 5760)

353 507 64 261
477 315 226 338
72 128 203 524
180 202 549 634
189 460 321 307
339 402 117 164
461 342 193 78
145 236 119 63
100 365 496 418
210 341 285 136
376 482 304 510
468 31 274 75
587 550 182 409
30 365 461 19
184 599 351 66
28 627 2 475
143 352 175 161
163 637 166 159
33 138 486 307
580 583 384 8
573 524 380 465
510 366 451 154
93 258 525 304
358 286 434 410
458 26 442 565

TABLE 17r-continued

Address of Parity Bit Accumulators (Rate 8/9 - Coded Block Size 5760)

530 385 548 99
207 142 119 321
177 529 372 111
213 517 492 276
71 473 407 479
325 351 298 62
219 368 361 476
56 304 558 543
554 515 527 621
379 447 56 482
560 469 205 637
453 334 18 500
469 244 395 102
230 593 92 547
160 491 103 266
541 50 233
156 77 72
397 39 464
305 68 284
519 307 35
281 349 44
191 275 460
296 232 348
543 332 626
40 23 28
31 205 512
476 107 519
60 458 224
9 406 148
341 346 442
270 544 283
259 571 503
363 157 472
425 170 107
384 425 288
467 86 199
323 564 536
513 10 167
352 500 48
104 432 347
311 392 118
571 396 145
584 609 328
145 50 403
181 625 159
73 169 271
265 626 552
327 564 439
132 55 384
221 57 75
477 292 598
16 273 148
90 209 266
160 451 98
20 143 274.

18. An apparatus according to claim 17, wherein row indices of 1's in a column index j*M (j=0, 1, 2, 3, . . . , $k_{ldpc}$/M−1) of the parity check matrix are given at the $j^{th}$ row according to the one Table.

19. An apparatus according to claim 17, wherein the LDPC code is of a structure that facilitates use of a plurality of parallel engines for decoding the encoded signal.

20. An apparatus according to claim 17, wherein the apparatus is further caused to perform the following:
   modulating the LDPC encoded signal according to a signal constellation reflecting one of QPSK (Quadrature Phase Shift Keying), OQPSK (Offset QPSK), PSK (Phase Shift Keying), 8-PSK, 16-APSK (Amplitude PSK), and 32-APSK.

21. An apparatus according to claim 17, wherein the apparatus is further caused to perform the following:
   modulating the LDPC encoded signal according to a signal constellation that comprises a one of the following formats (where $\epsilon_x$ represents average energy per symbol), a QPSK (Quadrature Phase Shift Keying) constellation having bit labeling and x-y bit positioning according to the following table:

| Bit Label | [x, y] Coordinates |
|---|---|
| 00 | [$\sqrt{\epsilon_x}$ * cos(π/4.0), $\sqrt{\epsilon_x}$ * sin(π/4.0)] |
| 01 | [$\sqrt{\epsilon_x}$ * cos(7.0 * π/4.0), $\sqrt{\epsilon_x}$ * sin(7.0 * π/4.0)] |
| 10 | [$\sqrt{\epsilon_x}$ * cos(3.0 * π/4.0), $\sqrt{\epsilon_x}$ * sin(3.0 * π/4.0)] |
| 11 | [$\sqrt{\epsilon_x}$ * cos(5.0 * π/4.0), $\sqrt{\epsilon_x}$ * sin(5.0 * π/4.0)] | an 8-PSK (Phase Shift Keying) constellation having bit labeling and x-y bit positioning according to the following table:

| Bit Label | [x, y] Coordinates |
|---|---|
| 000 | [$\sqrt{\epsilon_x}$ * cos(π/8.0), $\sqrt{\epsilon_x}$ * sin(π/8.0)] |
| 001 | [$\sqrt{\epsilon_x}$ * cos(15.0 * π/8.0), $\sqrt{\epsilon_x}$ * sin(15.0 * π/8.0)] |
| 010 | [$\sqrt{\epsilon_x}$ * cos(7.0 * π/8.0), $\sqrt{\epsilon_x}$ * sin(7.0 * π/8.0)] |
| 011 | [$\sqrt{\epsilon_x}$ * cos(9.0 * π/8.0), $\sqrt{\epsilon_x}$ * sin(9.0 * π/8.0)] |
| 100 | [$\sqrt{\epsilon_x}$ * cos(3.0 * π/8.0), $\sqrt{\epsilon_x}$ * sin(3.0 * π/8.0)] |
| 101 | [$\sqrt{\epsilon_x}$ * cos(13.0 * π/8.0), $\sqrt{\epsilon_x}$ * sin(13.0 * π/8.0)] |
| 110 | [$\sqrt{\epsilon_x}$ * cos(5.0 * π/8.0), $\sqrt{\epsilon_x}$ * sin(5.0 * π/8.0)] |
| 111 | [$\sqrt{\epsilon_x}$ * cos(11.0 * π/8.0), $\sqrt{\epsilon_x}$ * sin(11.0 * π/8.0)] | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and 4*R1$^2$+12*R2$^2$=16):

| Bit Label | [x, y] Coordinates |
|---|---|
| 0000 | [R2 * $\sqrt{\epsilon_x}$ * cos(3.0 * π/12.0), R2 * $\sqrt{\epsilon_x}$ * sin(3.0 * π/12.0)] |
| 0001 | [R2 * $\sqrt{\epsilon_x}$ * cos(21.0 * π/12.0), R2 * $\sqrt{\epsilon_x}$ * sin(21 * π/12.0)] |
| 0010 | [R2 * $\sqrt{\epsilon_x}$ * cos(9.0 * π/12.0), R2 * $\sqrt{\epsilon_x}$ * sin(9 * π/12.0)] |
| 0011 | [R2 * $\sqrt{\epsilon_x}$ * cos(15.0 * π/12.0), R2 * $\sqrt{\epsilon_x}$ * sin(15 * π/12.0)] |
| 0100 | [R2 * $\sqrt{\epsilon_x}$ * cos(π/12.0), R2 * $\sqrt{\epsilon_x}$ * sin(π/12.0)] |
| 0101 | [R2 * $\sqrt{\epsilon_x}$ * cos(23.0 * π/12.0), R2 * $\sqrt{\epsilon_x}$ * sin(23 * π/12.0)] |
| 0110 | [R2 * $\sqrt{\epsilon_x}$ * cos(11.0 * π/12.0), R2 * $\sqrt{\epsilon_x}$ * sin(11 * π/12.0)] |
| 0111 | [R2 * $\sqrt{\epsilon_x}$ * cos(13.0 * π/12.0), R2 * $\sqrt{\epsilon_x}$ * sin(13 * π/12.0)] |
| 1000 | [R2 * $\sqrt{\epsilon_x}$ * cos(5.0 * π/12.0), R2 * $\sqrt{\epsilon_x}$ * sin(5 * π/12.0)] |
| 1001 | [R2 * $\sqrt{\epsilon_x}$ * cos(19.0 * π/12.0), R2 * $\sqrt{\epsilon_x}$ * sin(19 * π/12.0)] |
| 1010 | [R2 * $\sqrt{\epsilon_x}$ * cos(7.0 * π/12.0), R2 * $\sqrt{\epsilon_x}$ * sin(7 * π/12.0)] |
| 1011 | [R2 * $\sqrt{\epsilon_x}$ * cos(17.0 * π/12.0), R2 * $\sqrt{\epsilon_x}$ * sin(17 * π/12.0)] |
| 1100 | [R1 * $\sqrt{\epsilon_x}$ * cos(π/4.0), R1 * $\sqrt{\epsilon_x}$ * sin(π/4.0)] |
| 1101 | [R1 * $\sqrt{\epsilon_x}$ * cos(7.0 * π/4.0), R1 * $\sqrt{\epsilon_x}$ * sin(7.0 * π/4.0)] |
| 1110 | [R1 * $\sqrt{\epsilon_x}$ * cos(3.0 * π/4.0), R1 * $\sqrt{\epsilon_x}$ * sin(3.0 * π/4.0)] |
| 1111 | [R1 * $\sqrt{\epsilon_x}$ * cos(5.0 * π/4.0), R1 * $\sqrt{\epsilon_x}$ * sin(5.0 * π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and 4*R1$^2$+12*R2$^2$+16*R3$^2$=32):

| Bit Label | [x, y] Coordinates |
|---|---|
| 00000 | [R2 * $\sqrt{\epsilon_x}$ * sin(π/4.0), R2 * $\sqrt{\epsilon_x}$ * sin(π/4.0)] |
| 00001 | [R2 * $\sqrt{\epsilon_x}$ * sin(π/12.0), R2 * $\sqrt{\epsilon_x}$ * sin(5.0 * π/12.0)] |
| 00010 | [R2 * $\sqrt{\epsilon_x}$ * sin(π/4.0), -R2 * $\sqrt{\epsilon_x}$ * sin(π/4.0)] |
| 00011 | [R2 * $\sqrt{\epsilon_x}$ * sin(π/12.0), -R2 * $\sqrt{\epsilon_x}$ * sin(5.0 * π/12.0)] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [-R2 * $\sqrt{\epsilon_x}$ * sin(π/4.0), -R2 * $\sqrt{\epsilon_x}$ * sin(π/4.0)] |
| 00111 | [-R2 * $\sqrt{\epsilon_x}$ * sin(π/12.0), -R2 * $\sqrt{\epsilon_x}$ * sin(5.0 * π/12.0)] |
| 01000 | [R3 * $\sqrt{\epsilon_x}$ * cos(π/8.0), R3 * $\sqrt{\epsilon_x}$ * sin(π/8.0)] |
| 01001 | [R3 * $\sqrt{\epsilon_x}$ * sin(π/8.0), R3 * $\sqrt{\epsilon_x}$ * cos(π/8.0)] |
| 01010 | [R3 * $\sqrt{\epsilon_x}$ * sin(π/4.0), -R3 * $\sqrt{\epsilon_x}$ * cos(π/4.0)] |
| 01011 | [0, -R3 * $\sqrt{\epsilon_x}$ ] |
| 01100 | [-R3 * $\sqrt{\epsilon_x}$ * sin(π/4.0), R3 * $\sqrt{\epsilon_x}$ * sin(π/4.0)] |
| 01101 | [0, R3 * $\sqrt{\epsilon_x}$ ] |
| 01110 | [-R3 * $\sqrt{\epsilon_x}$ * cos(π/8.0), -R3 * $\sqrt{\epsilon_x}$ * sin(π/8.0)] |
| 01111 | [-R3 * $\sqrt{\epsilon_x}$ * sin(π/8.0), -R3 * $\sqrt{\epsilon_x}$ * sin(π/8.0)] |
| 10000 | [R2 * $\sqrt{\epsilon_x}$ * sin(5.0 * π/12.0), R2 * $\sqrt{\epsilon_x}$ * sin(π/12.0)] |
| 10001 | [R1 * $\sqrt{\epsilon_x}$ * sin(π/4.0), R1 * $\sqrt{\epsilon_x}$ * sin(π/4.0)] |
| 10010 | [R2 * $\sqrt{\epsilon_x}$ * sin(5.0 * π/12.0), -R2 * $\sqrt{\epsilon_x}$ * sin(π/12.0)] |
| 10011 | [R1 * $\sqrt{\epsilon_x}$ * sin(π/4.0), -R1 * $\sqrt{\epsilon_x}$ * sin(π/4.0)] |
| 10100 | [-R2 * $\sqrt{\epsilon_x}$ * sin(5.0 * π/12.0), R2 * $\sqrt{\epsilon_x}$ * sin(π/12.0)] |
| 10101 | [-R1 * $\sqrt{\epsilon_x}$ * sin(π/4.0), R1 * $\sqrt{\epsilon_x}$ * sin(π/4.0)] |
| 10110 | [-R2 * $\sqrt{\epsilon_x}$ * sin(5.0 * π/12.0), -R2 * $\sqrt{\epsilon_x}$ * sin(π/12.0)] |
| 10111 | [-R1 * $\sqrt{\epsilon_x}$ * sin(π/4.0), -R1 * $\sqrt{\epsilon_x}$ * sin(π/4.0)] |
| 11000 | [R3 * $\sqrt{\epsilon_x}$, 0] |
| 11001 | [R3 * $\sqrt{\epsilon_x}$ * sin(π/4.0), R3 * $\sqrt{\epsilon_x}$ * sin(π/4.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$ * sin(π/8.0), -R3 * $\sqrt{\epsilon_x}$ * cos(π/8.0)] |
| 11100 | [-R3 * $\sqrt{\epsilon_x}$ * cos(π/8.0), R3 * $\sqrt{\epsilon_x}$ * sin(π/8.0)] |
| 11101 | [-R3 * $\sqrt{\epsilon_x}$ * sin(π/8.0), R3 * $\sqrt{\epsilon_x}$ * cos(π/8.0)] |
| 11110 | [-R3 * $\sqrt{\epsilon_x}$, 0] |
| 11111 | [-R3 * $\sqrt{\epsilon_x}$ * sin(π/4.0), -R3 * $\sqrt{\epsilon_x}$ * sin(π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and 4*R1$^2$+12*R2$^2$+16*R3$^2$=32):

| Bit Label | [x, y] Coordinates |
|---|---|
| 00000 | [-R3 * $\sqrt{\epsilon_x}$ * sin(π/4.0), R3 * $\sqrt{\epsilon_x}$ * sin(π/4.0)] |
| 00001 | [-R3 * $\sqrt{\epsilon_x}$ * sin(π/8.0), R3 * $\sqrt{\epsilon_x}$ * cos(π/8.0)] |
| 00010 | [R3 * $\sqrt{\epsilon_x}$ * sin(π/8.0), R3 * $\sqrt{\epsilon_x}$ * cos(π/8.0)] |
| 00011 | [0, R3 * $\sqrt{\epsilon_x}$ ] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [R2 * $\sqrt{\epsilon_x}$ * sin(π/4.0), R2 * $\sqrt{\epsilon_x}$ * sin(π/4.0)] |
| 00111 | [R2 * $\sqrt{\epsilon_x}$ * sin(π/12.0), R2 * $\sqrt{\epsilon_x}$ * sin(5.0 * π/12.0)] |
| 01000 | [-R3 * $\sqrt{\epsilon_x}$ * cos(π/8.0), R3 * $\sqrt{\epsilon_x}$ * sin(π/8.0)] |
| 01001 | [-R3 * $\sqrt{\epsilon_x}$, 0] |
| 01010 | [R3 * $\sqrt{\epsilon_x}$ * sin(π/4.0), R3 * $\sqrt{\epsilon_x}$ * sin(π/4.0)] |
| 01011 | [R3 * $\sqrt{\epsilon_x}$ * cos(π/8.0), R3 * $\sqrt{\epsilon_x}$ * sin(π/8.0)] |
| 01100 | [-R2 * $\sqrt{\epsilon_x}$ * sin(5.0 * π/12.0), R2 * $\sqrt{\epsilon_x}$ * sin(π/12.0)] |
| 01101 | [-R1 * $\sqrt{\epsilon_x}$ * sin(π/4.0), R1 * $\sqrt{\epsilon_x}$ * sin(π/4.0)] |
| 01110 | [R2 * $\sqrt{\epsilon_x}$ * sin(5.0 * π/12.0), R2 * $\sqrt{\epsilon_x}$ * sin(π/12.0)] |
| 01111 | [R1 * $\sqrt{\epsilon_x}$ * sin(π/4.0), R1 * $\sqrt{\epsilon_x}$ * sin(π/4.0)] |
| 10000 | [-R3 * $\sqrt{\epsilon_x}$ * sin(π/8.0), -R3 * $\sqrt{\epsilon_x}$ * cos(π/8.0)] |
| 10001 | [0, -R3 * $\sqrt{\epsilon_x}$ ] |
| 10010 | [R3 * $\sqrt{\epsilon_x}$ * sin(π/4.0), -R3 * $\sqrt{\epsilon_x}$ * sin(π/4.0)] |
| 10011 | [R3 * $\sqrt{\epsilon_x}$ * sin(π/8.0), -R3 * $\sqrt{\epsilon_x}$ * cos(π/8.0)] |
| 10100 | [-R2 * $\sqrt{\epsilon_x}$ * sin(π/4.0), -R2 * $\sqrt{\epsilon_x}$ * sin(π/4.0)] |
| 10101 | [-R2 * $\sqrt{\epsilon_x}$ * sin(π/12.0), -R2 * $\sqrt{\epsilon_x}$ * sin(5.0 * π/12.0)] |
| 10110 | [R2 * $\sqrt{\epsilon_x}$ * sin(π/4.0), -R2 * $\sqrt{\epsilon_x}$ * sin(π/4.0)] |
| 10111 | [R2 * $\sqrt{\epsilon_x}$ * sin(π/12.0), -R2 * $\sqrt{\epsilon_x}$ * sin(5.0 * π/12.0)] |
| 11000 | [-R3 * $\sqrt{\epsilon_x}$ * sin(π/4.0), -R3 * $\sqrt{\epsilon_x}$ * sin(π/4.0)] |
| 11001 | [-R3 * $\sqrt{\epsilon_x}$ * cos(π/8.0), -R3 * $\sqrt{\epsilon_x}$ * sin(π/8.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$, 0] |
| 11100 | [-R2 * $\sqrt{\epsilon_x}$ * sin(5.0 * π/12.0), -R2 * $\sqrt{\epsilon_x}$ * sin(π/12.0)] |
| 11101 | [-R1 * $\sqrt{\epsilon_x}$ * sin(π/4.0), -R1 * $\sqrt{\epsilon_x}$ * sin(π/4.0)] |
| 11110 | [R2 * $\sqrt{\epsilon_x}$ * sin(5.0 * π/12.0), -R2 * $\sqrt{\epsilon_x}$ * sin(π/12.0)] |
| 11111 | [R1 * $\sqrt{\epsilon_x}$ * sin(π/4.0), -R1 * $\sqrt{\epsilon_x}$ * sin(π/4.0)]. |

22. An apparatus according to claim 17, wherein the apparatus is further caused to perform the following:
encoding, prior to the LDPC encoding, the one or more blocks of information bits of the source signal based on a t-error Bose Chaudhuri Hocquenghem (BCH) code.

23. An apparatus according to claim 22, wherein the apparatus is further caused to perform the following:
interleaving the LDPC encoded signal.

24. An apparatus according to claim 23, wherein the apparatus is further caused to perform the following:
modulating the interleaved signal according to a signal constellation that comprises a one of the following formats (where $\epsilon_x$ represents average energy per symbol),
a QPSK (Quadrature Phase Shift Keying) constellation having bit labeling and x-y bit positioning according to the following table:

| Bit Label | [x, y] Coordinates |
|---|---|
| 00 | [$\sqrt{\epsilon_x}$ * cos(π/4.0), $\sqrt{\epsilon_x}$ * sin(π/4.0)] |
| 01 | [$\sqrt{\epsilon_x}$ * cos(7.0 * π/4.0), $\sqrt{\epsilon_x}$ * sin(7.0 * π/4.0)] |
| 10 | [$\sqrt{\epsilon_x}$ * cos(3.0 * π/4.0), $\sqrt{\epsilon_x}$ * sin(3.0 * π/4.0)] |
| 11 | [$\sqrt{\epsilon_x}$ * cos(5.0 * π/4.0), $\sqrt{\epsilon_x}$ * sin(5.0 * π/4.0)] | an 8-PSK (Phase Shift Keying) constellation having bit labeling and x-y bit positioning according to the following table:

| Bit Label | [x, y] Coordinates |
|---|---|
| 000 | [$\sqrt{\epsilon_x}$ * cos(π/8.0), $\sqrt{\epsilon_x}$ * sin(π/8.0)] |
| 001 | [$\sqrt{\epsilon_x}$ * cos(15.0 * π/8.0), $\sqrt{\epsilon_x}$ * sin(15.0 * π/8.0)] |
| 010 | [$\sqrt{\epsilon_x}$ * cos(7.0 * π/8.0), $\sqrt{\epsilon_x}$ * sin(7.0 * π/8.0)] |
| 011 | [$\sqrt{\epsilon_x}$ * cos(9.0 * π/8.0), $\sqrt{\epsilon_x}$ * sin(9.0 * π/8.0)] |
| 100 | [$\sqrt{\epsilon_x}$ * cos(3.0 * π/8.0), $\sqrt{\epsilon_x}$ * sin(3.0 * π/8.0)] |
| 101 | [$\sqrt{\epsilon_x}$ * cos(13.0 * π/8.0), $\sqrt{\epsilon_x}$ * sin(13.0 * π/8.0)] |
| 110 | [$\sqrt{\epsilon_x}$ * cos(5.0 * π/8.0), $\sqrt{\epsilon_x}$ * sin(5.0 * π/8.0)] |
| 111 | [$\sqrt{\epsilon_x}$ * cos(11.0 * π/8.0), $\sqrt{\epsilon_x}$ * sin(11.0 * π/8.0)] | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and 4*R1²+12*R2²=16):

| Bit Label | [x, y] Coordinates |
|---|---|
| 0000 | [R2 * $\sqrt{\epsilon_x}$ * cos(3.0 * π/12.0), R2 * $\sqrt{\epsilon_x}$ * sin(3.0 * π/12.0)] |
| 0001 | [R2 * $\sqrt{\epsilon_x}$ * cos(21.0 * π/12.0), R2 * $\sqrt{\epsilon_x}$ * sin(21 * π/12.0)] |
| 0010 | [R2 * $\sqrt{\epsilon_x}$ * cos(9.0 * π/12.0), R2 * $\sqrt{\epsilon_x}$ * sin(9 * π/12.0)] |
| 0011 | [R2 * $\sqrt{\epsilon_x}$ * cos(15.0 * π/12.0), R2 * $\sqrt{\epsilon_x}$ * sin(15 * π/12.0)] |
| 0100 | [R2 * $\sqrt{\epsilon_x}$ * cos(π/12.0), R2 * $\sqrt{\epsilon_x}$ * sin(π/12.0)] |
| 0101 | [R2 * $\sqrt{\epsilon_x}$ * cos(23.0 * π/12.0), R2 * $\sqrt{\epsilon_x}$ * sin(23 * π/12.0)] |
| 0110 | [R2 * $\sqrt{\epsilon_x}$ * cos(11.0 * π/12.0), R2 * $\sqrt{\epsilon_x}$ * sin(11 * π/12.0)] |
| 0111 | [R2 * $\sqrt{\epsilon_x}$ * cos(13.0 * π/12.0), R2 * $\sqrt{\epsilon_x}$ * sin(13 * π/12.0)] |
| 1000 | [R2 * $\sqrt{\epsilon_x}$ * cos(5.0 * π/12.0), R2 * $\sqrt{\epsilon_x}$ * sin(5 * π/12.0)] |
| 1001 | [R2 * $\sqrt{\epsilon_x}$ * cos(19.0 * π/12.0), R2 * $\sqrt{\epsilon_x}$ * sin(19 * π/12.0)] |
| 1010 | [R2 * $\sqrt{\epsilon_x}$ * cos(7.0 * π/12.0), R2 * $\sqrt{\epsilon_x}$ * sin(7 * π/12.0)] |
| 1011 | [R2 * $\sqrt{\epsilon_x}$ * cos(17.0 * π/12.0), R2 * $\sqrt{\epsilon_x}$ * sin(17 * π/12.0)] |
| 1100 | [R1 * $\sqrt{\epsilon_x}$ * cos(π/4.0), R1 * $\sqrt{\epsilon_x}$ * sin(π/4.0)] |
| 1101 | [R1 * $\sqrt{\epsilon_x}$ * cos(7.0 * π/4.0), R1 * $\sqrt{\epsilon_x}$ * sin(7.0 * π/4.0)] |
| 1110 | [R1 * $\sqrt{\epsilon_x}$ * cos(3.0 * π/4.0), R1 * $\sqrt{\epsilon_x}$ * sin(3.0 * π/4.0)] |
| 1111 | [R1 * $\sqrt{\epsilon_x}$ * cos(5.0 * π/4.0), R1 * $\sqrt{\epsilon_x}$ * sin(5.0 * π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and 4*R1²+12*R2²+16*R3²=32):

| Bit Label | [x, y] Coordinates |
|---|---|
| 00000 | [R2 * $\sqrt{\epsilon_x}$ * sin(π/4.0), R2 * $\sqrt{\epsilon_x}$ * sin(π/4.0)] |
| 00001 | [R2 * $\sqrt{\epsilon_x}$ * sin(π/12.0), R2 * $\sqrt{\epsilon_x}$ * sin(5.0 * π/12.0)] |
| 00010 | [R2 * $\sqrt{\epsilon_x}$ * sin(π/4.0), -R2 * $\sqrt{\epsilon_x}$ * sin(π/4.0)] |
| 00011 | [R2 * $\sqrt{\epsilon_x}$ * sin(π/12.0), -R2 * $\sqrt{\epsilon_x}$ * sin(5.0 * π/12.0)] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [-R2 * $\sqrt{\epsilon_x}$ * sin(π/4.0), -R2 * $\sqrt{\epsilon_x}$ * sin(π/4.0)] |
| 00111 | [-R2 * $\sqrt{\epsilon_x}$ * sin(π/12.0), -R2 * $\sqrt{\epsilon_x}$ * sin(5.0 * π/12.0)] |
| 01000 | [R3 * $\sqrt{\epsilon_x}$ * cos(π/8.0), R3 * $\sqrt{\epsilon_x}$ * sin(π/8.0)] |
| 01001 | [R3 * $\sqrt{\epsilon_x}$ * sin(π/8.0), R3 * $\sqrt{\epsilon_x}$ * cos(π/8.0)] |
| 01010 | [R3 * $\sqrt{\epsilon_x}$ * sin(π/4.0), -R3 * $\sqrt{\epsilon_x}$ * sin(π/4.0)] |
| 01011 | [0, -R3 * $\sqrt{\epsilon_x}$] |
| 01100 | [-R3 * $\sqrt{\epsilon_x}$ * sin(π/4.0), R3 * $\sqrt{\epsilon_x}$ * sin(π/4.0)] |
| 01101 | [0, R3 * $\sqrt{\epsilon_x}$] |
| 01110 | [-R3 * $\sqrt{\epsilon_x}$ * cos(π/8.0), -R3 * $\sqrt{\epsilon_x}$ * sin(π/8.0)] |
| 01111 | [-R3 * $\sqrt{\epsilon_x}$ * sin(π/8.0), -R3 * $\sqrt{\epsilon_x}$ * cos(π/8.0)] |
| 10000 | [R2 * $\sqrt{\epsilon_x}$ * sin(5.0 * π/12.0), R2 * $\sqrt{\epsilon_x}$ * sin(π/12.0)] |
| 10001 | [R1 * $\sqrt{\epsilon_x}$ * sin(π/4.0), R1 * $\sqrt{\epsilon_x}$ * sin(π/4.0)] |
| 10010 | [R2 * $\sqrt{\epsilon_x}$ * sin(5.0 * π/12.0), -R2 * $\sqrt{\epsilon_x}$ * sin(π/12.0)] |
| 10011 | [R1 * $\sqrt{\epsilon_x}$ * sin(π/4.0), -R1 * $\sqrt{\epsilon_x}$ * sin(π/4.0)] |
| 10100 | [-R2 * $\sqrt{\epsilon_x}$ * sin(5.0 * π/12.0), R2 * $\sqrt{\epsilon_x}$ * sin(π/12.0)] |
| 10101 | [-R1 * $\sqrt{\epsilon_x}$ * sin(π/4.0), R1 * $\sqrt{\epsilon_x}$ * sin(π/4.0)] |
| 10110 | [-R2 * $\sqrt{\epsilon_x}$ * sin(5.0 * π/12.0), -R2 * $\sqrt{\epsilon_x}$ * sin(π/12.0)] |
| 10111 | [-R1 * $\sqrt{\epsilon_x}$ * sin(π/4.0), -R1 * $\sqrt{\epsilon_x}$ * sin(π/4.0)] |
| 11000 | [R3 * $\sqrt{\epsilon_x}$, 0] |
| 11001 | [R3 * $\sqrt{\epsilon_x}$ * sin(π/4.0), R3 * $\sqrt{\epsilon_x}$ * sin(π/4.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$ * sin(π/8.0), -R3 * $\sqrt{\epsilon_x}$ * cos(π/8.0)] |
| 11100 | [-R3 * $\sqrt{\epsilon_x}$ * cos(π/8.0), R3 * $\sqrt{\epsilon_x}$ * sin(π/8.0)] |
| 11101 | [-R3 * $\sqrt{\epsilon_x}$ * sin(π/8.0), R3 * $\sqrt{\epsilon_x}$ * cos(π/8.0)] |
| 11110 | [-R3 * $\sqrt{\epsilon_x}$, 0] |
| 11111 | [-R3 * $\sqrt{\epsilon_x}$ * sin(π/4.0), -R3 * $\sqrt{\epsilon_x}$ * sin(π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and 4*R1²+12*R2²+16*R3²=32):

| Bit Label | [x, y] Coordinates |
|---|---|
| 00000 | [-R3 * $\sqrt{\epsilon_x}$ * sin(π/4.0), R3 * $\sqrt{\epsilon_x}$ * sin(π/4.0)] |
| 00001 | [-R3 * $\sqrt{\epsilon_x}$ * sin(π/8.0), R3 * $\sqrt{\epsilon_x}$ * cos(π/8.0)] |
| 00010 | [R3 * $\sqrt{\epsilon_x}$ * sin(π/8.0), R3 * $\sqrt{\epsilon_x}$ * cos(π/8.0)] |
| 00011 | [0, R3 * $\sqrt{\epsilon_x}$] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [R2 * $\sqrt{\epsilon_x}$ * sin(π/4.0), R2 * $\sqrt{\epsilon_x}$ * sin(π/4.0)] |
| 00111 | [R2 * $\sqrt{\epsilon_x}$ * sin(π/12.0), R2 * $\sqrt{\epsilon_x}$ * sin(5.0 * π/12.0)] |
| 01000 | [-R3 * $\sqrt{\epsilon_x}$ * cos(π/8.0), R3 * $\sqrt{\epsilon_x}$ * sin(π/8.0)] |
| 01001 | [-R3 * $\sqrt{\epsilon_x}$, 0] |
| 01010 | [R3 * $\sqrt{\epsilon_x}$ * sin(π/4.0), R3 * $\sqrt{\epsilon_x}$ * sin(π/4.0)] |
| 01011 | [R3 * $\sqrt{\epsilon_x}$ * cos(π/8.0), R3 * $\sqrt{\epsilon_x}$ * sin(π/8.0)] |
| 01100 | [-R2 * $\sqrt{\epsilon_x}$ * sin(5.0 * π/12.0), R2 * $\sqrt{\epsilon_x}$ * sin(π/12.0)] |
| 01101 | [-R1 * $\sqrt{\epsilon_x}$ * sin(π/4.0), R1 * $\sqrt{\epsilon_x}$ * sin(π/4.0)] |
| 01110 | [R2 * $\sqrt{\epsilon_x}$ * sin(5.0 * π/12.0), R2 * $\sqrt{\epsilon_x}$ * sin(π/12.0)] |
| 01111 | [R1 * $\sqrt{\epsilon_x}$ * sin(π/4.0), R1 * $\sqrt{\epsilon_x}$ * sin(π/4.0)] |
| 10000 | [-R3 * $\sqrt{\epsilon_x}$ * sin(π/8.0), -R3 * $\sqrt{\epsilon_x}$ * cos(π/8.0)] |
| 10001 | [0, -R3 * $\sqrt{\epsilon_x}$] |
| 10010 | [R3 * $\sqrt{\epsilon_x}$ * sin(π/4.0), -R3 * $\sqrt{\epsilon_x}$ * sin(π/4.0)] |
| 10011 | [R3 * $\sqrt{\epsilon_x}$ * sin(π/8.0), -R3 * $\sqrt{\epsilon_x}$ * cos(π/8.0)] |
| 10100 | [-R2 * $\sqrt{\epsilon_x}$ * sin(π/4.0), -R2 * $\sqrt{\epsilon_x}$ * sin(π/4.0)] |
| 10101 | [-R2 * $\sqrt{\epsilon_x}$ * sin(π/12.0), -R2 * $\sqrt{\epsilon_x}$ * sin(5.0 * π/12.0)] |
| 10110 | [R2 * $\sqrt{\epsilon_x}$ * sin(π/4.0), -R2 * $\sqrt{\epsilon_x}$ * sin(π/4.0)] |
| 10111 | [R2 * $\sqrt{\epsilon_x}$ * sin(π/12.0), -R2 * $\sqrt{\epsilon_x}$ * sin(5.0 * π/12.0)] |
| 11000 | [-R3 * $\sqrt{\epsilon_x}$ * sin(π/4.0), -R3 * $\sqrt{\epsilon_x}$ * sin(π/4.0)] |
| 11001 | [-R3 * $\sqrt{\epsilon_x}$ * cos(π/8.0), -R3 * $\sqrt{\epsilon_x}$ * sin(π/8.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$, 0] |
| 11100 | [-R2 * $\sqrt{\epsilon_x}$ * sin(5.0 * π/12.0), -R2 * $\sqrt{\epsilon_x}$ * sin(π/12.0)] |
| 11101 | [-R1 * $\sqrt{\epsilon_x}$ * sin(π/4.0), -R1 * $\sqrt{\epsilon_x}$ * sin(π/4.0)] |
| 11110 | [R2 * $\sqrt{\epsilon_x}$ * sin(5.0 * π/12.0), -R2 * $\sqrt{\epsilon_x}$ * sin(π/12.0)] |
| 11111 | [R1 * $\sqrt{\epsilon_x}$ * sin(π/4.0), -R1 * $\sqrt{\epsilon_x}$ * sin(π/4.0)]. |

25. An apparatus comprising:
accessing, by a processor of a device, stored information representing a predetermined structured parity check matrix of a Low Density Parity Check (LDPC) code, wherein the stored information reflects a tabular format of rows and columns, wherein each row represents occurrences of one values within a respective column of the parity check matrix, and wherein the columns of the parity check matrix are derived according to a predetermined operation based on the respective rows of the stored tabular information; and encoding one or more blocks of information bits of a source signal based on the LDPC code to generate an LDPC encoded signal;

wherein the LDPC encoding of the blocks of information bits (each block being of a size of $k_{ldpc}$ information bits, and each resulting encoded block being of a size of $n_{ldpc}$ code bits including parity bits $p_i$, i=0, 1, 2, ..., $n_{ldpc}-k_{ldpc}-1$), comprises:

initializing parity bit accumulators $a_0=a_1= \ldots =a_{n_{ldpc}-k_{ldpc}-1}=0$;

for a one of the blocks of information bits, divided into j sequential groups (each of a size of M information bits), and for j=1, 2, 3, ... $k_{ldpc}/M$: (1) accumulating a first information bit of a $j^{th}$ group in certain of the parity bit accumulators reflected by accumulator addresses based on a $j^{th}$ row of the stored tabular information; and (2) accumulating the remaining (M−1) information bits of the $j^{th}$ group in certain of the parity bit accumulators reflected by accumulator addresses according to $$\{x + m \bmod M\} - \left\{\frac{x+m \bmod M}{M} - \frac{x}{M}\right\} * M,$$

wherein the division within the second bracketed term reflects integer division, and x denotes an address of the parity bit accumulator corresponding to the first bit of the group; and after all of the information bits are accumulated, starting with M=1, sequentially performing operations (with respect to the parity bit accumulators) according to the following (where the additions are in Galois Field (GF) 2), $$a_M = a_M \oplus p_0$$
$$a_{2M} = a_{2M} \oplus a_M$$
$$a_{3M} = a_{3M} \oplus a_{2M}$$
$$\vdots \quad \vdots \quad \vdots$$
$$a_{n_{ldpc}-k_{ldpc}-M} = a_{n_{ldpc}-k_{ldpc}-M} \oplus a_{n_{ldpc}-k_{ldpc}-2M}$$
$$\vdots \quad \vdots \quad \vdots$$
$$a_1 = a_1 \oplus a_{n_{ldpc}-k_{ldpc}-M}$$
$$a_{M+1} = a_{M+1} \oplus a_1$$
$$a_{2M+1} = a_{2M+1} \oplus a_{M+1}$$
$$\vdots \quad \vdots \quad \vdots$$
$$a_{n_{ldpc}-k_{ldpc}-M+1} = a_{n_{ldpc}-k_{ldpc}-M+1} \oplus a_{n_{ldpc}-k_{ldpc}-2M+1}$$
$$\vdots \quad \vdots \quad \vdots$$
$$a_2 = a_2 \oplus a_{n_{ldpc}-k_{ldpc}-M+1}$$
$$a_{M+2} = a_{M+2} \oplus a_2$$
$$a_{2M+2} = a_{2M+2} \oplus a_{M+2}$$
$$\vdots \quad \vdots \quad \vdots$$
$$a_{n_{ldpc}-k_{ldpc}-M+2} = a_{n_{ldpc}-k_{ldpc}-M+2} \oplus a_{n_{ldpc}-k_{ldpc}-2M+2}$$
$$\vdots \quad \vdots \quad \vdots$$
$$a_3 = a_3 \oplus a_{n_{ldpc}-k_{ldpc}-M+2}$$
$$a_{M+3} = a_{M+3} \oplus a_3$$
$$a_{2M+3} = a_{2M+3} \oplus a_{M+3}$$
$$\vdots \quad \vdots \quad \vdots$$
$$a_{n_{ldpc}-k_{ldpc}-M+3} = a_{n_{ldpc}-k_{ldpc}-M+3} \oplus a_{n_{ldpc}-k_{ldpc}-2M+3}$$
$$\vdots \quad \vdots \quad \vdots$$
$$a_{M-1} = a_{M-1} \oplus a_{n_{ldpc}-k_{ldpc}-2}$$
$$a_{2M-1} = a_{2M-2} \oplus a_{M-1}$$
$$a_{3M-1} = a_{3M-1} \oplus a_{2M-1}$$
$$\vdots \quad \vdots \quad \vdots$$
$$a_{n_{ldpc}-k_{ldpc}-1} = a_{n_{ldpc}-k_{ldpc}-1} \oplus a_{n_{ldpc}-k_{ldpc}-M-1}$$

wherein the parity bits $p_i$, i=0, 1, ... ($n_{ldpc}-k_{ldpc}-1$) are respectively reflected by the resulting parity bit accumulators $a_i$, i=0, 1, ... ($n_{ldpc}-k_{ldpc}-1$); and wherein the stored information representing the structured parity check matrix comprises a one of the following Tables 25a through 25k, TABLE 25a

| Address of Parity Bit Accumulators (Rate 9/10) |
| --- |
| 405 3342 3664 6278 |
| 121 538 4579 4801 |
| 776 3102 3279 5298 |
| 135 1119 4225 6307 |
| 440 902 3893 5464 |
| 139 3289 5101 5543 |
| 1016 1893 3076 5942 |
| 2253 2759 5611 6055 |
| 335 1122 3260 5610 |
| 436 2337 2781 4648 |
| 2027 2451 5009 5137 |
| 1165 2440 4331 6125 |
| 1704 1858 3986 5327 |
| 938 2077 3080 5007 |
| 1239 1668 4309 4524 |
| 1464 2825 3640 4979 |
| 1682 3716 4081 5851 |
| 2709 2976 5931 6213 |
| 3811 5917 6342 |
| 1558 3818 4076 |
| 2290 5606 5807 |
| 2080 2467 4655 |
| 465 2866 4971 |
| 873 1881 4624 |
| 1301 2270 5161 |
| 1637 2567 4787 |
| 1380 4475 5563 |
| 258 2769 3845 |
| 240 1228 3387 |
| 46 5258 6393 |
| 583 1652 4139 |
| 2983 4137 5095 |
| 601 3064 3299 |
| 1821 6025 6123 |
| 775 3243 5674 |
| 822 3142 4768 |
| 3068 3255 6474 |

TABLE 25a-continued

Address of Parity Bit Accumulators (Rate 9/10)

1006 2795 4896
2791 2997 5909
2583 3167 6427
1395 4398 5579
608 2248 3277
2491 5104 5580
2437 4228 4444
246 568 3849
253 3723 4093
242 3968 6360
700 964 4904
1470 4714 5146
866 1382 3801
1107 3368 4559
1679 1981 6041
1868 5706 6063
1602 1894 5142
289 2726 4941
1943 3179 6347
2186 4446 5537
1055 3361 5448
531 2627 4448
1467 3414 5117
1738 4095 4628
1254 4214 5078
2218 5681 5936
272 5085 6284
139 1218 6269
576 3127 4258
1122 3584 3844
1795 4712 6092
1071 3754 4913
728 1868 3004
586 2425 2573
1986 3826 5894
217 1148 4123
1136 3201 3286
1138 4906 5344
548 3705 6148
2510 3974 4654
1846 2949 5959
2374 4890 6009
1495 2556 4359
582 4226 4406
233 3425 3922
1017 3734 5431
2358 5105 6251
260 418 2567
1627 2737 5360
788 3492 5646
1561 2057 4812
2147 5844 6217
952 2938 5458
1468 1837 4577
234 5186 6359
372 2505 2680
112 461 3311
1294 3488 6350
1377 2441 6280
841 2776 5751
295 2591 5086
1628 4822 5080
3920 5608 5788
641 3885 4916
1482 3689 5845
2930 3257 5936
750 4659 4733
1864 2899 4301
1068 1963 5753
2214 4295 4650
1367 3170 4306
1519 4107 5104
289 4410 4959
1252 5166 6162
389 1624 4422
1420 1543 4360
669 3321 3631
125 1396 3536

TABLE 25a-continued

Address of Parity Bit Accumulators (Rate 9/10)

2955 5317 6367
561 2194 4127
2206 4179 6352
794 3549 5771
2570 3692 4924
2001 3095 4990
2380 5638 6039
733 2805 3687
2704 3062 6013
187 2154 5745
861 1833 5750
1197 2312 4677
941 2008 4171
994 4565 5542
2058 3148 5976
789 1130 5079
448 4531 4763
1082 3375 5742
3455 5065 5744
621 1691 4313
90 4103 5953
1592 3266 3800
3144 5789 6418
270 2561 3650
668 2477 6348
2011 3060 4880
1490 3886 4777
122 2583 6348
2484 2643 5308
714 3867 4171
192 2798 3938
2420 4733 6067
647 1656 3776
85 6080 6232
1058 3109 4875
3035 3305 5118
1711 4216 6044
918 2044 4085
458 2522 4675
1113 2240 6268
1686 2087 5113
2385 2773 6280
1405 3216 5737
2016 4555 4733
853 3414 4395
3344 5214 5751
306 1153 5579

TABLE 25b

Address of Parity Bit Accumulators (Rate 8/9)

185 1982 5090 6885
2051 2208 6645 7139
463 930 3108 5287
267 4014 6164 6820
1118 1629 3252 5478
1939 2411 4705 6527
3131 3252 5283 6315
1376 4003 5928 6875
1744 2522 4828 5888
775 1312 4686 6012
1147 2917 5313 5516
1657 2852 3653 6751
2580 3234 5634 5767
2344 2721 4417 6418
179 3305 3726 7140
265 3322 4581 6309
443 2495 4394 4866
437 1796 3762 4139
768 1957 3793 3966
647 892 4421 5589
990 2583 2887 4756
1066 1924 3116 6195
1993 3020 5375 5699

TABLE 25b-continued

Address of Parity Bit Accumulators (Rate 8/9)

2781 4456 6173 6700
1280 1782 3254 5823
1102 1476 3325 5079
717 1636 5021 5053
718 1445 2691 5432
1965 3073 5711 6010
1941 2496 4802 6018
2517 3299 5556 6486
825 3944 5793 6425
666 2499 2522 4531
287 619 3347 3816
964 1328 4743 5169
1157 2369 4523 7043
127 4266 4568 6180
307 3640 4260 6893
292 4052 6794 7117
3713 4114 6485 7015
916 1840 4808 5220
139 438 3527 4645
654 1723 3612 4033
47 4410 4716 7198
1432 3782 4126 6347
41 1835 4267 5105
228 4313 5213 6963
894 3161 4884 5093
1561 2814 3746 6634
1393 1792 5407 5863
685 1078 2679 3088
1529 1937 5427 5781
1056 3146 4779 6602
649 2204 2568 6951
2768 3151 5521 6676
2074 2484 5833 6967
2398 3331 4515 5561
1280 3728 5934 6182
2485 3373 6190 6815
1141 3276 4393 6389
104 3339 7107
656 3450 5083
1912 3649 7037
273 2119 6733
916 4161 4570
2206 4605 6266
2610 3601 5771
723 1363 3961
2300 2790 6200
4199 4441 6771
1495 2820 5471
936 1329 5098
1475 5488 6486
1185 3676 4992
2330 5321 6307
2004 2901 5853
3133 3465 5656
120 4787 5879
384 1757 4790
701 2989 6954
193 3359 3727
1352 3685 4958
1982 2227 5529
1841 3055 6728
225 498 6919
2731 4716 6809
1503 2052 5524
1234 3886 5007
1341 4384 7124
434 868 6365
2928 5292 5711
2569 4525 7013
2659 3072 6131
541 995 5083
202 4311 5089
2258 6221 6630
1715 4295 6096
2435 4296 4435
900 3540 5913
1671 3425 5981
1627 2049 5389

TABLE 25b-continued

Address of Parity Bit Accumulators (Rate 8/9)

1946 3883 4259
1194 3432 6018
1903 6028 7168
67 3683 6193
2604 3891 5706
216 4278 4516
908 2717 5497
2309 4658 6455
1338 4593 6133
2279 5039 6588
334 4056 5129
3244 5460 6040
685 5104 6933
1369 2978 5006
2318 4819 7028
639 809 3032
585 1547 2797
966 3231 6705
1573 3363 6546
2085 6713 7136
1171 3970 5141
249 2769 4607
1519 4336 4827
377 1688 5622
3204 4717 6716
576 1078 3713
4697 5765 7128
1933 5226 6382
708 1625 2782
3166 5564 6505
808 2529 5679
64 1107 3749
1971 3071 4053
2298 4369 6479
1255 3962 5119
2359 5902 6978
169 3333 3750
739 3475 6479
2380 3302 6020
1153 2982 6933
108 3675 4989
1684 3397 4607
2468 3309 5749
1567 3494 5287
2695 5500 6779
1650 3987 5381
952 3655 5634
931 4061 5859
1862 3208 5942
114 1175 4355
59 3906 6452
1337 4180 7050
1052 2851 5200
2014 3149 6787
662 2573 4810
2249 6025 6192
1868 2250 6544
702 5004 6942
488 4582 6161

TABLE 25c

Address of Parity Bit Accumulators (Rate 5/6)

798 1195 3207 3556 5147 5412 7636 8021
181 3530 5203 5661 7617 8048 10135 10609
1462 1898 3635 3961 6209 6648 8552 9391
761 2127 2918 5450 7539 7636 9676 9809
1878 2332 5152 5494 7238 7765 9607 9727
181 3351 5105 5496 7409 7702 9598 10763
433 2788 3838 5588 5828 7800 8720 9731
488 2907 3472 6327 6569 8352 8930 10689
89 2842 5508 6026 7669 8121 10349 10699
1925 2231 4325 5010 6583 7643 8721 9846
1073 1231 3228 4187 5319 6420 7491 8521

TABLE 25c-continued

Address of Parity Bit Accumulators (Rate 5/6)

154 2531 4592 5601 7458 7695 10201 10581
479 881 2553 5231 5431 7847 8862 9787
391 818 3787 4243 5817 7830 8104 10055
97 588 2769 3729 5973 6278 8902 9993
2045 2185 4299 6169 6816 8287 8827 10767
507 1663 2729 3810 4901 5789 7930 9212
2496 2802 4651 5027 6717 7163 9596 10444
159 2056 4328 4854 6630 8590 9452 10469
105 1425 3252 3895 5416 6726 9204 9691
518 2749 3784 4758 5853 6843 8190 10706
331 2785 4978 5396 7162 8264 9814 10120
418 2240 2800 4818 6481 7079 8751 10595
1066 2927 4130 5387 6921 8198 9866 10247
25 3567 3892 5833 6308 7967 8287 10482
54 679 2617 4622 4734 6949 8644 9208
214 525 4266 4365 6258 6756 8899 9914
2030 2273 4200 4413 6808 6929 9081 10322
810 1196 3735 4282 6022 6390 8811 9881
869 3411 3871 5997 7129 8067 9328 10212
833 7114 8123
432 2458 4108
1764 7069 9592
4174 5900 7187
2292 5716 8280
2941 4153 5310
3285 3918 6052
794 3044 8493
1528 2043 4966
2117 9315 10277
1191 2175 6178
1469 5270 7449
1107 1504 6235
2293 4650 6746
839 4508 9493
1715 5088 8931
3454 4487 9120
2059 7336 9626
3162 4847 8433
3098 9173 9491
3195 6317 10336
1402 2396 7200
1190 4378 7312
3132 3499 10186
1505 1947 10088
1356 3312 9270
4853 7227 8577
1760 7218 9050
1124 1500 9030
1133 1501 8484
1277 2932 10769
369 6143 7263
2624 4740 8068
2270 5183 10587
1490 5278 5741
2996 5955 10051
2646 5143 7804
3515 5866 9203
2007 4063 7813
2784 6381 6663
1535 4845 8402
2345 6141 9480
7229 9659 10068
5821 8323 8658
388 5608 7239
4440 5599 8039
3254 3863 10116
145 4960 9463
4161 6533 6951
854 7196 8816
4022 7710 10676
1111 2194 8266
627 3218 3319
1884 4623 8735
1904 6509 9830
898 1433 3632
788 3712 8292
1668 7197 9130
330 4454 10156

TABLE 25c-continued

Address of Parity Bit Accumulators (Rate 5/6)

244 9082 10160
2683 3844 4759
1266 1752 5956
781 5063 10334
1256 1626 4876
1758 7765 8001
980 3659 7851
4149 8190 10202
92 3468 5352
825 5942 7041
3015 7100 10738
3478 5859 8168
3629 9571 9750
5503 6818 8354
3328 7496 10540
169 4810 9788
4408 5712 6625
1988 5507 9347
461 5210 8677
263 4203 8549
4588 7551 9631
2122 2239 8785
6645 9519 10624
2312 4343 8735
2199 4041 7078
1817 7474 8339
2908 6305 9881
3070 9077 10184
1137 6336 9262
437 2562 7750
671 2647 6444
3094 5542 5834
2498 4042 7138
3933 8184 8378
769 2671 9268
425 3579 5432
4120 4369 8476
546 3291 5723
2273 2530 7559
425 1494 5071
275 1890 9065
4492 5010 10023
147 1404 5990
4047 9339 10134
5177 7388 9568
2151 7534 10210
191 2601 6367
1124 3094 9452
1405 7140 9375
3908 9782 10082
1902 4924 8442
1706 4323 6831
1786 3732 6867
7563 8939 10016
5784 8885 10703
6173 8155 10542
3011 4950 7607
3283 8830 10655
895 5348 8081
2444 6732 7821
750 6367 6530

TABLE 25d

Address of Parity Bit Accumulators (Rate 4/5)

498 2356 3399 4631 5536 7415 9550 9825 11986
499 722 3381 4400 7825 8864 9980 10902 12000
923 1278 3976 5353 6383 7233 9807 11841 12067
1027 1141 3080 3450 6270 6615 8936 10053 12197
241 641 2589 3938 5948 7939 8405 10918 12913
1140 1748 3891 3977 5929 6450 8852 11141 11465
389 720 2956 3508 5292 6390 7424 9013 11890
913 2029 3157 6116 6139 8615 9640 10504 12410
1169 2356 3348 5141 5417 8732 9775 10888 11893

TABLE 25d-continued

Address of Parity Bit Accumulators (Rate 4/5)

2068 2926 4223 6046 7006 9224 9651 12316 12691
1872 2497 4581 6490 8352 8820 10713 10983 12827
883 1338 2907 3415 6435 7383 9426 9937 11822
2638 2906 5312 5413 8136 9226 10117 12244 12602
223 2800 4527 5538 6773 9346 9604 11204 12275
277 2712 3892 5465 5996 7851 10705 11551 12726
2053 2383 4042 4524 6654 7155 9091 9381 11287
1645 2733 3773 4901 5829 8913 9297 11284 12363
596 1703 2826 4657 4790 7024 7407 10286 10768
1260 7640 10440
413 1758 7516
6709 6900 11071
1638 11242 12568
247 4966 8252
2125 3685 7002
252 10234 11279
17 1921 5116
2515 4974 7892
2470 8033 12635
8169 10285 10536
7131 7997 11731
1646 4100 6581
5489 8335 10367
4315 5206 7834
3661 8534 10114
4825 8537 11665
4735 7855 11729
3636 7050 12359
5855 11577 12216
3709 4041 11974
1302 4819 9598
3726 5951 12780
439 6839 12862
6107 6862 10014
329 3400 9601
4365 4963 6828
2659 10871 12147
2956 5165 12608
1292 3562 8246
1694 9213 10369
558 1639 7845
5331 8084 10216
4385 4729 6706
5253 5424 11744
718 1662 8953
8672 9013 10984
3992 4522 9006
1971 3055 6477
6282 7542 9563
3542 10674 12227
2869 8558 8790
2382 7955 11422
2227 5687 10917
7260 10148 11466
866 2025 6459
807 8584 11291
3185 5589 8581
724 4213 10711
6951 7549 12599
2034 2386 10704
306 2866 11776
1115 7630 9974
226 7681 10061
1262 8047 11342
2579 11466 11672
5616 5900 9675
214 525 10189
2502 4013 9398
4192 8827 11901
749 8020 11632
2689 10394 12856
45 3331 12206
1852 3988 10681
1080 8893 11333
2708 11688 12168
144 4672 10289
6772 7703 8784
562 733 7714

TABLE 25d-continued

Address of Parity Bit Accumulators (Rate 4/5)

768 5510 9791
519 9482 10071
1462 5139 9118
1443 2000 4859
1636 3443 6279
2989 3370 5667
5155 6176 7256
2052 5261 7773
2950 8290 11050
5767 6931 7984
4358 6356 10596
2486 10860 12919
1421 3168 9846
5989 8551 10654
4504 4762 12565
4925 6522 10829
7308 8503 12839
2383 7034 7547
3957 9245 12567
3857 9346 12337
3692 6689 6950
3084 4828 7816
977 3692 6597
1538 7007 9577
623 8432 10784
6408 7355 10231
946 9879 12496
7515 8521 10900
4040 8421 10792
3361 5178 6908
2236 8735 10552
3647 6779 9745
5516 6702 12914
272 11360 11827
1847 4653 12103
25 7344 9583
2454 11437 12443
2047 4203 6137
6285 10091 11506
3281 4656 9090
4289 8798 12488
1220 9341 10946
73 3759 7981
6859 8176 10167
1755 4703 5322
1434 10905 12144
2380 3454 8174
1259 11673 12041
408 4852 12932
3116 5666 7879
2986 8641 10037
1022 6055 11595
1604 5858 7579
1860 5406 12830
2547 5839 9415
454 2602 4342
2697 5238 9006

TABLE 25e

Address of Parity Bit Accumulators (Rate 3/4)

755 3136 3253 5541 8180 13010 14277 15226
464 989 2773 3063 5246 5711 7829 10703
687 2174 5068 6955 8933 9180 12238 12247
620 868 3613 7063 7491 9977 11659 12231
1121 3221 3985 7303 8598 9677 11994 15459
239 3514 3734 5618 7483 9443 13290 14309
624 1641 4395 4791 8232 8520 11653 13714
1764 3468 3630 6883 8179 10354 10666 12589
5441 6021 9211 10116 11365 12476 15587 16031
1191 3709 4945 5821 9932 13549 13712 15675
4312 4559 6892 9729 11121 12847 14493 15725
2522 4963 7683 8080 10332 10545 13579 15279
2324 2660 4650 10336 12099 12402 14149 14535

TABLE 25e-continued

Address of Parity Bit Accumulators (Rate ¾)

6217 6529 9102 11077 11401 13051 14247 16145
1900 4014 6973 9765 10139 13297 15029 15931
356 3856 4735 8197 10020 13408 13819 16041
589 3148 4079 5870 6141 9278 11221 11732
3162 5352 6442 7233 8287 11507 13756 15666
1600 8280 14758
8404 8921 13248
1796 8643 13329
3470 5959 10511
1771 2651 10918
5690 14326 14698
4969 7444 13930
3426 9264 13439
6079 7897 12750
731 5131 12199
4567 9453 15026
804 12393 12657
1363 2349 15827
2393 5056 11552
183 11487 15154
33 1989 15052
352 2157 14479
2459 2678 11725
7572 8993 11156
4590 10501 10934
3970 6836 16007
6430 6525 9597
2015 12757 14985
1842 6677 7692
12934 14875 15425
1165 6320 9437
1205 6831 8927
3986 8773 15795
7310 8501 14143
5813 10378 10472
3293 12137 15600
750 6051 8898
7955 13595 16006
947 6895 16179
1474 5536 11069
214 1979 5872
1373 1461 13091
8116 12210 15540
188 2677 6413
2785 6824 14251
2798 8431 12629
470 1655 3872
4471 6408 8522
8263 11449 16194
9329 9687 11535
21 6478 13326
2904 7141 11399
701 7076 11584
3166 5197 15397
5328 5731 7774
875 12344 15421
9177 13008 14984
3884 7246 14544
3334 6747 10089
4492 10028 13128
2463 12431 14331
2429 11404 14714
4661 11689 15261
6515 12787 14813
3354 9539 9857
9146 12412 12863
585 4001 7578
2300 7776 13341
3839 4001 14733
7541 9827 15058
5177 10853 12062
4861 10697 11004
1976 4984 9453
1118 10773 13950
1800 2888 4942
5525 10278 13858
1141 8799 14032
5552 8722 11930

TABLE 25e-continued

Address of Parity Bit Accumulators (Rate ¾)

3755 10366 15563
3879 6873 9914
1236 10327 13474
10007 12774 15695
2178 9047 16151
6256 7420 11075
7780 12124 14020
5611 7207 15439
2529 4322 15087
2714 5217 9884
81 10799 11594
1845 7854 12328
2480 4360 8883
1107 6991 10377
3479 5761 14289
5639 8855 9053
1460 3703 11295
7710 12577 14375
4720 12673 14956
1176 12155 13882
2187 6857 12985
1622 5874 9437
942 2765 14378
3492 5768 12701
6432 14722 14794
11046 13036 15948
2904 4211 7521
229 592 4897
1616 8035 11683
10569 13395 14431
4474 6712 15158
13340 13920 15592
5030 13245 15131
1061 6169 6794
328 6771 12242
8398 10475 10827
535 5368 9184
1903 5121 11454
745 2003 14697
503 3281 11435
3200 8219 8491
8299 9504 11601
4128 8160 16124
2994 4032 9680

TABLE 25f

Address of Parity Bit Accumulators (Rate ⅔)

1615 2039 8200 11116 12879 13266 14888
1056 2837 5958 7722 10531 13028 16131
321 4196 6772 8327 18370 21171 21440
2720 4996 7486 11437 15927 16234 21032
250 4778 5126 9839 16614 18590 21299
36 10862 13201 15758 17702 20512 21310
4548 8263 11202 12249 14424 17146 20605
521 2272 5846 7080 11967 15642 17973
1858 5497 5858 7892 13057 15657 19262
65 1964 3694 6305 7236 12924 14509
648 3736 6461 10779 13755 17583 19163
4991 6081 9123 11807 12144 18877 20967
667 1787 6412 8270 13080 15684 19871
7185 7366 14404 17011 17561 19430 21050
2701 4406 9153 9479 15365 19423 21462
3942 7315 10933 14239 17054 17558 19977
1427 5839 8022 10208 16873 16924 21529
60 6459 7405 9609 11824 16053 19264
1956 4737 6790 9007 12579 16313 19839
6949 8003 10138 12354 14675 17960 20107
3267 6813 10410 12761 14996 15151 17838
975 1375 3246 6456 9683 9895 14572
496 4250 9354 10365 14249 16724 19585
4187 5342 7802 10016 10840 13690 14811
954 9023 12299 15481 17308 19923 20256
1554 2755 4407 4842 10638 16587 17877

TABLE 25f-continued

Address of Parity Bit Accumulators (Rate ⅔)

1953 3616 8712 12206 14211 16877 21233
1295 4174 4522 9604 12613 14892 17298
500 3106 5334 12580 12669 15443 18409
2283 8824 9896 13581 13889 20424 20765
13321 16111 18888
6938 17206 19746
1784 4153 15066
9407 14334 18336
5350 6942 10093
3170 8370 11789
905 1308 8307
3052 5479 14093
1269 16063 19442
2686 4519 8777
1756 3659 11721
3002 11645 18023
8978 10622 20164
8846 11139 13721
3066 10762 13957
3464 11167 13550
16215 18615 18961
7676 15415 18065
5396 10017 18358
7850 16492 18269
3531 16286 18989
5739 11192 13524
1009 18408 18920
6625 13662 15264
3505 12215 20200
8426 12029 20522
8496 19529 20705
2218 6541 11495
2253 5667 20631
2320 5739 19782
2335 8137 9814
1688 9285 15288
1393 8162 12727
3355 11661 14163
142 10231 20568
9158 12878 13257
14324 17954 19658
2483 4417 18250
661 10219 14001
6896 10200 14537
8802 17982 20021
2787 9042 14255
3101 13180 18975
1164 8420 16306
6500 9735 12804
11842 14862 19904
7598 8199 17910
4273 17028 20983
544 9997 17358
3136 19586 20591
1785 5171 9714
8388 14782 18328
32 6240 10995
865 5080 8797
624 11476 14648
2163 7348 13686
101 3574 18935
7330 13508 14000
5743 7379 9514
1592 11437 17432
4893 6775 20933
762 2691 7070
3030 19170 20360
4299 7845 19138
1978 6589 12314
2757 11178 14780
4956 5881 21471
3392 7590 19773
15990 19435 20227
1888 5932 16298
4085 5882 12449
4813 16665 20934
5522 9375 18435
10466 12470 16771

TABLE 25f-continued

Address of Parity Bit Accumulators (Rate ⅔)

11805 16606 21277
856 5550 18431
1094 12130 15534
14549 17123 19074
5076 13100 17343
10615 16455 20767
13544 15381 16991
3829 18367 21333
15456 15532 19920
6866 15766 18286
6461 8677 12234
2026 12038 20327
3839 8318 10649
4613 11022 15972
3757 13434 15910
4519 6461 11133

TABLE 25g

Address of Parity Bit Accumulators (Rate ⅗)

487 2424 5103 6294 14728 16989 22394 22707
1634 5235 7897 8219 10473 10926 15226 17159
7836 8222 10026 12421 17812 20194 21551 25762
178 4183 5238 8916 11565 13513 17234 23622
2619 3761 6539 10279 11943 16294 19745 22819
1097 3310 5297 10950 12939 13749 18284 19985
5062 8675 11402 13351 14655 16741 20553 22461
5862 7897 12406 13503 16929 17631 20389 22142
1160 8004 9813 13540 14666 18003 22246 24879
157 6179 13015 16673 17089 19482 23223 24324
1568 3396 5983 13072 13336 18349 18521 21010
3632 5935 7011 12522 15857 17935 18950 23596
7555 8375 10646 12391 15071 20478 22501 23402
2000 2378 7387 11854 13513 21598 24971 25503
476 2578 7339 8402 13753 16147 19513 22512
1646 7593 8714 9846 12535 14403 21897 22723
913 3205 5384 6134 13821 16335 23236 24236
502 1494 5665 8092 9094 13273 18152 23856
3571 5849 7970 10318 16538 19009 19186 24775
1768 5020 10749 15104 18446 21191 21392 25505
279 7272 9982 10336 13151 15451 18316 22103
2005 4026 4677 7991 9235 13384 14754 23731
1319 3499 6567 7679 11063 15094 15267 17449
6162 6797 10759 11683 12866 13911 17226 22718
2382 9187 11808 16423 18162 19122 21873 22911
216 1114 7075 14485 16966 19607 22914 24691
721 2693 6387 8821 17550 19330 22719 24673
972 2842 8828 9933 12899 15009 15268 23746
1947 4539 10078 12725 13876 18387 20589 24783
1755 4300 6903 8799 14179 14485 20595 24429
3854 4896 7018 10751 14016 14346 16861 19163
3859 4085 5919 7733 15182 16468 19409 21431
1371 6763 10705 10999 14233 17684 21160 22018
2356 5185 5651 12200 12308 16384 18868 21030
6600 8655 9801 11712 13854 16725 20795 25380
1692 3627 6962 7462 10218 21056 21314 24003
16314 19603 22678
1179 19957 21941
14163 19047 24512
10474 20933 24258
461 8308 11535
7361 11441 12375
40 6417 10855
6001 22526 23757
1071 3964 9467
2756 6525 23536
449 3246 11782
12053 19545 21812
2670 3701 10363
7809 17817 20062
2900 6138 24663
7042 9061 22324
7149 12133 15790
7464 15848 22261

TABLE 25g-continued

Address of Parity Bit Accumulators (Rate 3/5)

4406 15275 21965
2305 8240 15658
844 3405 18366
1893 2451 17338
5810 17934 20992
2244 4845 24158
17878 18964 23878
5429 22314 24712
303 14398 24478
15836 18743 21826
4587 17442 23891
9067 19984 25568
12659 20803 25727
5409 6673 23824
9692 15061 18694
861 1169 16870
12226 14993 20284
13054 14784 20185
160 15501 23163
614 18992 23847
4719 15363 20481
19129 23171 24212
5465 21650 25118
3669 15823 17361
12767 13112 21339
4658 14270 17975
503 11296 14239
16728 20243 25123
1952 12991 19964
11201 17284 18410
2840 12877 24940
4989 21344 23127
3268 15681 23795
2050 16692 25423
4144 9210 10293
896 8604 15852
9235 23106 25062
4425 5548 25280
4343 10845 11308
3224 9603 25270
1859 10301 21895
4944 11025 23373
5530 9419 25244
8525 15896 18435
8591 19838 24964
18261 19436 25885
4301 15776 15875
9532 16158 20694
9674 11995 20018
8382 9360 12086
2974 19579 25776
2968 4956 20785
3009 11349 25614
2975 11230 25789

TABLE 25h

Address of Parity Bit Accumulators (Rate 1/2)

1690 4392 7243 10123 12751 19068 23261 25882 25950
4295 8310 13735 14903 18216 18521 20457 22873 26999
2900 6292 14253 16327 19561 21463 23348 26738 31108
1201 2187 4037 6084 7112 17403 20499 23973 29486
1913 5146 8684 10762 11063 15735 19611 22881 27218
1569 1918 5946 8361 9717 12102 16573 19187 28309
925 7530 10304 16459 18002 20820 22693 24097 30913
4336 14315 16734 16940 19494 19977 21895 25121 31768
3367 3872 10516 11797 16080 18647 21646 24129 31143
1557 4179 6997 9985 19179 23292 24350 26834 28821
2605 4611 6484 13227 16750 22762 26200 28877 31731
3139 6378 7943 9983 10171 14917 17887 19560 25630
5706 5916 8409 10080 13664 13753 20142 22989 29228
4479 7229 10272 12943 17716 21870 24521 29638 32330
818 2084 5177 9571 10713 14061 17997 28946 31914
4223 8466 15465 16241 18591 20686 25672 28312 31533

TABLE 25h-continued

Address of Parity Bit Accumulators (Rate 1/2)

3049 3335 8311 11572 17578 22419 23724 27334 27454
607 4010 11542 13746 16393 19392 21126 28048 28409
1687 2090 4816 6641 7824 8909 10871 25465 30399
1282 3011 6333 8010 10952 16958 24124 26242 32302
2156 4900 6829 9255 15769 16823 25927 30541 30839
3133 5074 7609 10078 13090 15951 22294 27409 28021
588 1624 7313 9206 12908 15670 21180 22034 30955
3342 7385 7790 11060 13010 17437 21755 28052 28308
3431 5338 15158 18950 23091 24334 26495 28510 30791
515 3366 11860 15866 18097 19816 20516 23868 32139
219 6739 12840 20551 23331 23530 25670 28997 32168
152 1161 11055 18106 18657 20617 25241 26437 30692
4846 9453 14029 14862 20321 22192 26263 26518 29656
3613 6463 12229 15428 17644 19554 20150 27965 31614
110 6876 9265
14936 18681 31853
3661 16313 30499
271 6718 20110
21531 29984 30553
1164 17609 23628
8154 13382 24492
3653 10000 31610
2337 21448 28080
11999 15213 25875
12821 31286 31518
6097 17194 24909
9702 24304 28525
5883 18252 26861
16032 17834 20825
8986 16741 21021
568 27281 27400
13853 15558 19265
1005 5259 12243
10050 23589 27597
758 7779 12074
2783 12248 14536
810 1354 27229
6362 20993 27191
10553 18772 30110
2402 2835 21129
12261 15601 22445
11442 15365 22496
9669 16977 21706
5711 13362 23591
17344 21970 29298
240 13300 29750
12151 27394 32351
2346 25180 25427
2473 16162 20178
3772 7888 29067
4813 22325 26724
5566 11255 14096
11274 26442 28451
5733 14961 21477
9204 11769 32017
4994 8043 9090
5419 10606 24702
7182 11243 14543
13457 24507 29332
7082 21960 26549
13422 17659 31308
4351 30026 30998
11180 13085 17157
18933 21543 23781
14066 18961 22375
8255 12388 19309
2529 12598 29636
8811 28673 31573
8938 24504 30413
14629 24906 30234
14478 24007 30182
2559 14678 29540
25088 25451 28782
553 25507 29461

TABLE 25i

Address of Parity Bit Accumulators (Rate 2/5)

4173 6386 6813 15139 16380 22095 22454
24964 26820 27326 30289 32188
826 1264 3864 7778 9667 17876 20474
21361 24378 24599 28142 33137
229 1256 4395 6290 6664 15376 17436
19340 19463 28818 33008 36039
3801 8483 10585 12292 13418 14753
17085 18901 21746 22945 35570 37330
1056 7871 8934 9916 12131 17573 20277
23395 30197 33313 35985 37827
367 6393 7261 12313 16956 18789 19865
22650 23639 24535 31056 36744
4276 10788 13433 16512 17384 20031
26177 27799 29564 30931 33354 37567
1446 3707 5576 7649 9769 11723 15461
19981 23591 30056 34358 36599
4336 4879 6768 8836 11153 16163 18737
26233 28194 29209 32440 36228
4993 6006 9212 11740 14173 16526 24459
25254 29745 33408 36055 36434
664 2361 9581 15385 18970 20683 22481
25313 25573 28771 29109 38646
60 4096 7203 9634 13663 17240 22069
22446 25032 35038 36150 37117
531 2834 6551 13051 17419 18553 21464
23928 26936 29707 32040 37070
1518 2753 6081 6875 9167 10435 12956
20117 23116 24850 32134 38490
3408 7120 7440 10653 12980 16264 21753
28010 29934 31090 32798 37138
1625 2003 12165 12307 18588 19634
22220 24047 24332 32481 32815 36389
43 5869 9888 13215 14897 16193 17231
19751 28403 34240 37503 37977
995 8360 11257 11794 14564 20565 24887
27011 29372 31511 36783 37169
1807 2320 5317 5423 14505 18577 20893
27636 30865 33909 37026 38577
2917 3575 8016 11563 15569 17766 20889
24069 24341 35063 38343 38694
127 2839 6382 9940 11027 12217 14285
27540 27894 31199 31358 34474
1933 4300 6891 13497 16865 20989 22027
28776 29073 32248 33905 38280
1378 3266 8115 10258 14509 21738 25522
25610 28824 29362 31876 33896
849 7607 10285 10474 12436 16182 19495
21673 29264 32706 35784 38261
18317 32445 34841
3016 3492 27531
11220 27356 31589
14213 19144 37905
17819 20378 21592
25822 27680 28748
11051 18497 31183
8759 22683 30156
8604 15941 32844
19298 23156 30575
21482 28103 37945
2142 5436 35950
2977 10390 20959
1436 7104 12063
14316 22841 36453
4795 15107 25769
4674 5422 31791
3026 11082 34646
13803 18011 35474
22733 33617 34598
2430 11376 17648
19089 27031 33569
3748 31787 38672
1716 28541 30394
18278 33786 34836
8313 26157 32033
2619 34491 37580
31387 33834 35739
5034 11365 26172
24580 30460 33982

TABLE 25i-continued

Address of Parity Bit Accumulators (Rate 2/5)

4375 14974 34935
6085 8159 25482
12728 23556 35511
2361 35221 35496
7948 15663 37449
12946 13026 23162
9367 13954 16799
15553 18209 29641
9304 24815 26869
5095 26639 30677
14012 20605 23633
12915 13984 30821
9349 16778 23849
16874 26541 26754
15642 20257 28066
7505 14992 20745
547 5328 26296
5178 8851 26552

TABLE 25j

Address of Parity Bit Accumulators (Rate 1/3)

7127 12217 14903 17792 19690 23709 26904
31847 32174 37971 39934 43192
631 3892 3961 7110 9168 14664 20881 33763
34077 38290 38589 40587
1561 4952 12735 17050 17363 23114 23432
26431 30725 34201 38679 41775
3120 6362 9346 10202 19293 21581 26158
28110 28791 30854 37723 39609
937 3213 3271 8272 9035 15349 18735 23617
27626 33046 35819 42715
42 5281 15192 15731 20687 23236 29529
31564 32442 35605 36703 42323
3415 5078 7595 8830 16298 16735 18395
18860 20659 21190 24411 39339
1247 3506 4592 7574 11799 14188 22214
27862 31190 33446 39010 39447
659 6732 8711 10845 14967 20932 21392
24561 27950 30282 34491 39662
1574 6084 6401 10616 15496 21480 22587
24801 28997 34755 40468 40765
1816 5243 8287 9380 12795 13208 22838
23280 31453 35837 36957 38620
2526 5720 11010 12022 15200 19448 27202
27673 29334 32919 36071 42350
542 3767 8589 14736 17599 18679 20408
29296 37332 38338 40657 42203
1274 6050 11401 13088 14271 17551 31621
32620 36895 37191 39291 43194
312 4625 6259 6839 10672 16695 21781
27493 27928 31056 33505 41398
167 1811 6813 10155 10651 15544 16043
23824 28470 32607 35112 37845
2477 2675 8067 19670 22707 27069 29018
30917 33456 37625 40865 42750
2232 8590 13476 14000 16942 23026 23964
26975 29689 33460 36770 41758
2199 4775 7747 8795 17270 18866 21982
24102 29704 34123 34954 41148
2130 4709 11954 12300 19938 25299 25579
28797 30414 36228 36617 42694
1336 22318 25169
18630 24904 26071
19828 24680 29215
33916 41065 41539
14761 30074 40827
10013 20112 25932
14530 21735 41427
12985 26680 37635
7003 9909 14113
16556 18312 20606
18051 19132 21794
4506 10959 16641

TABLE 25j-continued

Address of Parity Bit Accumulators (Rate ⅓)

13543 16372 29889
9717 22665 37324
30086 36117 40152
19395 33829 38170
3120 17782 40104
1599 30981 35293
5514 10349 25365
5646 10000 25213
5839 12560 41786
20495 31791 34710
4251 31730 33042
1029 12241 28921
4009 32368 35306
7216 13773 36495
12623 22397 34316
20441 24199 41893
15962 17883 25624
13355 13717 35667
24883 27266 28103
24291 28357 34576
964 35256 39973
11315 18036 39120
2832 16014 25615
3789 7400 11418
9383 32137 37908
11721 30386 39012
7963 26523 43088
7442 11584 26585

TABLE 25k

Address of Parity Bit Accumulators (Rate ¼)

4154 7271 18608 26981 29145 30753 34895
36931 37422 42768 47366 47722
3011 5069 6156 9587 12589 20148 33306
36809 37089 44032 45205 48468
39 1332 8129 19650 21273 25443 26292
28737 31676 33999 34500 38260
2180 2761 8052 10750 16919 18907 23210
24269 26621 34815 39889 43751
1473 1960 13924 21410 23195 27618 32955
36079 38702 41888 44387 44654
4943 6550 9829 14893 15444 19815 24320
29734 33955 36141 42602 45015
1132 3914 6903 12154 12305 16298 20487
25855 29304 32150 39228 47188
880 8771 13199 15965 21881 22783 25410
28163 31814 34217 38887 40142
2890 7245 11208 18761 21093 26680 31955
38349 40180 43274 43710 46286
296 571 2760 9305 13529 14589 17815
28360 30693 33015 35716 39781
3678 9475 12627 13894 16267 19135 22641
24756 28788 33357 35290 46414
2066 9907 11657 15142 15516 21000 22945
27012 29663 40795 44925 47884
713 4869 6526 10360 14920 21797 31226
35575 41795 42905 45382 45984
1015 4061 6411 8415 11494 13574 23760
24879 27137 37539 42259 45488
8455 11853 14155 16832 19318 19778 27886
28893 36425 41079 43947 48266
5393 17152 43557
17300 25044 48036
25767 28037 31468
4322 42152 44324
27676 46770 47870
23456 24791 30363
7899 10123 45744
7716 12923 33714
18718 30285 40475
1794 18035 32276
26277 33598 38109
8757 21965 40705

TABLE 25k-continued

Address of Parity Bit Accumulators (Rate ¼)

7007 12090 17815
17010 22010 37440
3493 13085 32557
10988 18098 20180
2166 11137 23546
15518 20550 35071
26272 41471 46610
4430 14274 35788
23839 29219 43155
17336 20770 32566
10570 16186 35139
5836 22534 38783
5863 36391 41378
5580 30971 41722
5558 30075 39521
14465 39539 40407
3369 30151 46801
9211 37880 46862.

26. An apparatus according to claim 25, wherein row indices of 1's in a column index j*M (j=0, 1, 2, 3, . . . , $k_{ldpc}$/M−1) of the parity check matrix are given at the $j^{th}$ row according to the one Table.

27. An apparatus according to claim 25, wherein the LDPC code is of a structure that facilitates use of a plurality of parallel engines for decoding the encoded signal.

28. An apparatus according to claim 25, wherein the apparatus is further caused to perform the following:
    modulating the LDPC coded signal according to a signal constellation reflecting one of QPSK (Quadrature Phase Shift Keying), OQPSK (Offset QPSK), PSK (Phase Shift Keying), 8-PSK, 16-APSK (Amplitude PSK), and 32-APSK.

29. An apparatus according to claim 25, wherein the apparatus is further caused to perform the following:
    modulating the encoded signal according to a signal constellation that comprises a one of the following formats (where $\epsilon_x$ represents average energy per symbol),
    a QPSK (Quadrature Phase Shift Keying) constellation having bit labeling and x-y bit positioning according to the following table:

| Bit Label | [x, y] Coordinates |
|---|---|
| 00 | [$\sqrt{\epsilon_x}$ * cos(π/4.0), $\sqrt{\epsilon_x}$ * sin(π/4.0)] |
| 01 | [$\sqrt{\epsilon_x}$ * cos(7.0 * π/4.0), $\sqrt{\epsilon_x}$ * sin(7.0 * π/4.0)] |
| 10 | [$\sqrt{\epsilon_x}$ * cos(3.0 * π/4.0), $\sqrt{\epsilon_x}$ * sin(3.0 * π/4.0)] |
| 11 | [$\sqrt{\epsilon_x}$ * cos(5.0 * π/4.0), $\sqrt{\epsilon_x}$ * sin(5.0 * π/4.0)] | an 8-PSK (Phase Shift Keying) constellation having bit labeling and x-y bit positioning according to the following table:

| Bit Label | [x, y] Coordinates |
|---|---|
| 000 | [$\sqrt{\epsilon_x}$ * cos(π/8.0), $\sqrt{\epsilon_x}$ * sin(π/8.0)] |
| 001 | [$\sqrt{\epsilon_x}$ * cos(15.0 * π/8.0), $\sqrt{\epsilon_x}$ * sin(15.0 * π/8.0)] |
| 010 | [$\sqrt{\epsilon_x}$ * cos(7.0 * π/8.0), $\sqrt{\epsilon_x}$ * sin(7.0 * π/8.0)] |
| 011 | [$\sqrt{\epsilon_x}$ * cos(9.0 * π/8.0), $\sqrt{\epsilon_x}$ * sin(9.0 * π/8.0)] |
| 100 | [$\sqrt{\epsilon_x}$ * cos(3.0 * π/8.0), $\sqrt{\epsilon_x}$ * sin(3.0 * π/8.0)] |
| 101 | [$\sqrt{\epsilon_x}$ * cos(13.0 * π/8.0), $\sqrt{\epsilon_x}$ * sin(13.0 * π/8.0)] |
| 110 | [$\sqrt{\epsilon_x}$ * cos(5.0 * π/8.0), $\sqrt{\epsilon_x}$ * sin(5.0 * π/8.0)] |
| 111 | [$\sqrt{\epsilon_x}$ * cos(11.0 * π/8.0), $\sqrt{\epsilon_x}$ * sin(11.0 * π/8.0)] | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and 4*R1²+12*R2²=16):

| Bit Label | [x, y] Coordinates |
|---|---|
| 0000 | [R2 * $\sqrt{\epsilon_x}$ * cos(3.0 * π/12.0), R2 * $\sqrt{\epsilon_x}$ * sin(3.0 * π/12.0)] |
| 0001 | [R2 * $\sqrt{\epsilon_x}$ * cos(21.0 * π/12.0), R2 * $\sqrt{\epsilon_x}$ * sin(21 * π/12.0)] |
| 0010 | [R2 * $\sqrt{\epsilon_x}$ * cos(9.0 * π/12.0), R2 * $\sqrt{\epsilon_x}$ * sin(9 * π/12.0)] |
| 0011 | [R2 * $\sqrt{\epsilon_x}$ * cos(15.0 * π/12.0), R2 * $\sqrt{\epsilon_x}$ * sin(15 * π/12.0)] |
| 0100 | [R2 * $\sqrt{\epsilon_x}$ * cos(π/12.0), R2 * $\sqrt{\epsilon_x}$ * sin(π/12.0)] |
| 0101 | [R2 * $\sqrt{\epsilon_x}$ * cos(23.0 * π/12.0), R2 * $\sqrt{\epsilon_x}$ * sin(23 * π/12.0)] |
| 0110 | [R2 * $\sqrt{\epsilon_x}$ * cos(11.0 * π/12.0), R2 * $\sqrt{\epsilon_x}$ * sin(11 * π/12.0)] |
| 0111 | [R2 * $\sqrt{\epsilon_x}$ * cos(13.0 * π/12.0), R2 * $\sqrt{\epsilon_x}$ * sin(13 * π/12.0)] |
| 1000 | [R2 * $\sqrt{\epsilon_x}$ * cos(5.0 * π/12.0), R2 * $\sqrt{\epsilon_x}$ * sin(5 * π/12.0)] |
| 1001 | [R2 * $\sqrt{\epsilon_x}$ * cos(19.0 * π/12.0), R2 * $\sqrt{\epsilon_x}$ * sin(19 * π/12.0)] |
| 1010 | [R2 * $\sqrt{\epsilon_x}$ * cos(7.0 * π/12.0), R2 * $\sqrt{\epsilon_x}$ * sin(7 * π/12.0)] |
| 1011 | [R2 * $\sqrt{\epsilon_x}$ * cos(17.0 * π/12.0), R2 * $\sqrt{\epsilon_x}$ * sin(17 * π/12.0)] |
| 1100 | [R1 * $\sqrt{\epsilon_x}$ * cos(π/4.0), R1 * $\sqrt{\epsilon_x}$ * sin(π/4.0)] |
| 1101 | [R1 * $\sqrt{\epsilon_x}$ * cos(7.0 * π/4.0), R1 * $\sqrt{\epsilon_x}$ * sin(7.0 * π/4.0)] |
| 1110 | [R1 * $\sqrt{\epsilon_x}$ * cos(3.0 * π/4.0), R1 * $\sqrt{\epsilon_x}$ * sin(3.0 * π/4.0)] |
| 1111 | [R1 * $\sqrt{\epsilon_x}$ * cos(5.0 * π/4.0), R1 * $\sqrt{\epsilon_x}$ * sin(5.0 * π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and 4*R1²+12*R2²+16*R3²=32):

| Bit Label | [x, y] Coordinates |
|---|---|
| 00000 | [R2 * $\sqrt{\epsilon_x}$ * sin(π/4.0), R2 * $\sqrt{\epsilon_x}$ * sin(π/4.0)] |
| 00001 | [R2 * $\sqrt{\epsilon_x}$ * sin(π/12.0), R2 * $\sqrt{\epsilon_x}$ * sin(5.0 * π/12.0)] |
| 00010 | [R2 * $\sqrt{\epsilon_x}$ * sin(π/4.0), -R2 * $\sqrt{\epsilon_x}$ * sin(π/4.0)] |
| 00011 | [R2 * $\sqrt{\epsilon_x}$ * sin(π/12.0), -R2 * $\sqrt{\epsilon_x}$ * sin(5.0 * π/12.0)] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [-R2 * $\sqrt{\epsilon_x}$ * sin(π/4.0), -R2 * $\sqrt{\epsilon_x}$ * sin(π/4.0)] |
| 00111 | [-R2 * $\sqrt{\epsilon_x}$ * sin(π/12.0), -R2 * $\sqrt{\epsilon_x}$ * sin(5.0 * π/12.0)] |
| 01000 | [R3 * $\sqrt{\epsilon_x}$ * cos(π/8.0), R3 * $\sqrt{\epsilon_x}$ * sin(π/8.0)] |
| 01001 | [R3 * $\sqrt{\epsilon_x}$ * sin(π/8.0), R3 * $\sqrt{\epsilon_x}$ * cos(π/8.0)] |
| 01010 | [R3 * $\sqrt{\epsilon_x}$ * sin(π/4.0), -R3 * $\sqrt{\epsilon_x}$ * sin(π/4.0)] |
| 01011 | [0, -R3 * $\sqrt{\epsilon_x}$] |
| 01100 | [-R3 * $\sqrt{\epsilon_x}$ * sin(π/4.0), R3 * $\sqrt{\epsilon_x}$ * sin(π/4.0)] |
| 01101 | [0, R3 * $\sqrt{\epsilon_x}$] |
| 01110 | [-R3 * $\sqrt{\epsilon_x}$ * cos(π/8.0), -R3 * $\sqrt{\epsilon_x}$ * sin(π/8.0)] |
| 01111 | [-R3 * $\sqrt{\epsilon_x}$ * sin(π/8.0), -R3 * $\sqrt{\epsilon_x}$ * cos(π/8.0)] |
| 10000 | [R2 * $\sqrt{\epsilon_x}$ * sin(5.0 * π/12.0), R2 * $\sqrt{\epsilon_x}$ * sin(π/12.0)] |
| 10001 | [R1 * $\sqrt{\epsilon_x}$ * sin(π/4.0), R1 * $\sqrt{\epsilon_x}$ * sin(π/4.0)] |
| 10010 | [R2 * $\sqrt{\epsilon_x}$ * sin(5.0 * π/12.0), -R2 * $\sqrt{\epsilon_x}$ * sin(π/12.0)] |
| 10011 | [R1 * $\sqrt{\epsilon_x}$ * sin(π/4.0), -R1 * $\sqrt{\epsilon_x}$ * sin(π/4.0)] |
| 10100 | [-R2 * $\sqrt{\epsilon_x}$ * sin(5.0 * π/12.0), R2 * $\sqrt{\epsilon_x}$ * sin(π/12.0)] |
| 10101 | [-R1 * $\sqrt{\epsilon_x}$ * sin(π/4.0), R1 * $\sqrt{\epsilon_x}$ * sin(π/4.0)] |
| 10110 | [-R2 * $\sqrt{\epsilon_x}$ * sin(5.0 * π/12.0), -R2 * $\sqrt{\epsilon_x}$ * sin(π/12.0)] |
| 10111 | [-R1 * $\sqrt{\epsilon_x}$ * sin(π/4.0), -R1 * $\sqrt{\epsilon_x}$ * sin(π/4.0)] |
| 11000 | [R3 * $\sqrt{\epsilon_x}$, 0] |
| 11001 | [R3 * $\sqrt{\epsilon_x}$ * sin(π/4.0), R3 * $\sqrt{\epsilon_x}$ * sin(π/4.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$ * sin(π/8.0), -R3 * $\sqrt{\epsilon_x}$ * cos(π/8.0)] |
| 11100 | [-R3 * $\sqrt{\epsilon_x}$ * cos(π/8.0), R3 * $\sqrt{\epsilon_x}$ * sin(π/8.0)] |
| 11101 | [-R3 * $\sqrt{\epsilon_x}$ * sin(π/8.0), R3 * $\sqrt{\epsilon_x}$ * cos(π/8.0)] |
| 11110 | [-R3 * $\sqrt{\epsilon_x}$, 0] |
| 11111 | [-R3 * $\sqrt{\epsilon_x}$ * sin(π/4.0), -R3 * $\sqrt{\epsilon_x}$ * sin(π/4.0)] | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and 4*R1²+12*R2²+16*R3²=32):

| Bit Label | [x, y] Coordinates |
|---|---|
| 00000 | [-R3 * $\sqrt{\epsilon_x}$ * sin(π/4.0), R3 * $\sqrt{\epsilon_x}$ * sin(π/4.0)] |
| 00001 | [-R3 * $\sqrt{\epsilon_x}$ * sin(π/8.0), R3 * $\sqrt{\epsilon_x}$ * cos(π/8.0)] |
| 00010 | [R3 * $\sqrt{\epsilon_x}$ * sin(π/8.0), R3 * $\sqrt{\epsilon_x}$ * cos(π/8.0)] |
| 00011 | [0, R3 * $\sqrt{\epsilon_x}$] |
| 00100 | [-R2 * $\sqrt{\epsilon_x}$ * sin(π/4.0), R2 * $\sqrt{\epsilon_x}$ * sin(π/4.0)] |
| 00101 | [-R2 * $\sqrt{\epsilon_x}$ * sin(π/12.0), R2 * $\sqrt{\epsilon_x}$ * sin(5.0 * π/12.0)] |
| 00110 | [R2 * $\sqrt{\epsilon_x}$ * sin(π/4.0), R2 * $\sqrt{\epsilon_x}$ * sin(π/4.0)] |
| 00111 | [R2 * $\sqrt{\epsilon_x}$ * sin(π/12.0), R2 * $\sqrt{\epsilon_x}$ * sin(5.0 * π/12.0)] |
| 01000 | [-R3 * $\sqrt{\epsilon_x}$ * cos(π/8.0), R3 * $\sqrt{\epsilon_x}$ * sin(π/8.0)] |
| 01001 | [-R3 * $\sqrt{\epsilon_x}$, 0] |
| 01010 | [R3 * $\sqrt{\epsilon_x}$ * sin(π/4.0), R3 * $\sqrt{\epsilon_x}$ * sin(π/4.0)] |
| 01011 | [R3 * $\sqrt{\epsilon_x}$ * cos(π/8.0), R3 * $\sqrt{\epsilon_x}$ * sin(π/8.0)] |
| 01100 | [-R2 * $\sqrt{\epsilon_x}$ * sin(5.0 * π/12.0), R2 * $\sqrt{\epsilon_x}$ * sin(π/12.0)] |
| 01101 | [-R1 * $\sqrt{\epsilon_x}$ * sin(π/4.0), R1 * $\sqrt{\epsilon_x}$ * sin(π/4.0)] |
| 01110 | [R2 * $\sqrt{\epsilon_x}$ * sin(5.0 * π/12.0), R2 * $\sqrt{\epsilon_x}$ * sin(π/12.0)] |
| 01111 | [R1 * $\sqrt{\epsilon_x}$ * sin(π/4.0), R1 * $\sqrt{\epsilon_x}$ * sin(π/4.0)] |
| 10000 | [-R3 * $\sqrt{\epsilon_x}$ * sin(π/8.0), -R3 * $\sqrt{\epsilon_x}$ * cos(π/8.0)] |
| 10001 | [0, -R3 * $\sqrt{\epsilon_x}$] |
| 10010 | [R3 * $\sqrt{\epsilon_x}$ * sin(π/4.0), -R3 * $\sqrt{\epsilon_x}$ * sin(π/4.0)] |
| 10011 | [R3 * $\sqrt{\epsilon_x}$ * sin(π/8.0), -R3 * $\sqrt{\epsilon_x}$ * cos(π/8.0)] |
| 10100 | [-R2 * $\sqrt{\epsilon_x}$ * sin(π/4.0), -R2 * $\sqrt{\epsilon_x}$ * sin(π/4.0)] |
| 10101 | [-R2 * $\sqrt{\epsilon_x}$ * sin(π/12.0), -R2 * $\sqrt{\epsilon_x}$ * sin(5.0 * π/12.0)] |
| 10110 | [R2 * $\sqrt{\epsilon_x}$ * sin(π/4.0), -R2 * $\sqrt{\epsilon_x}$ * sin(π/4.0)] |
| 10111 | [R2 * $\sqrt{\epsilon_x}$ * sin(π/12.0), -R2 * $\sqrt{\epsilon_x}$ * sin(5.0 * π/12.0)] |
| 11000 | [-R3 * $\sqrt{\epsilon_x}$ * sin(π/4.0), -R3 * $\sqrt{\epsilon_x}$ * sin(π/4.0)] |
| 11001 | [-R3 * $\sqrt{\epsilon_x}$ * cos(π/8.0), -R3 * $\sqrt{\epsilon_x}$ * sin(π/8.0)] |
| 11010 | [R3 * $\sqrt{\epsilon_x}$ * cos(π/8.0), -R3 * $\sqrt{\epsilon_x}$ * sin(π/8.0)] |
| 11011 | [R3 * $\sqrt{\epsilon_x}$, 0] |
| 11100 | [-R2 * $\sqrt{\epsilon_x}$ * sin(5.0 * π/12.0), -R2 * $\sqrt{\epsilon_x}$ * sin(π/12.0)] |
| 11101 | [-R1 * $\sqrt{\epsilon_x}$ * sin(π/4.0), -R1 * $\sqrt{\epsilon_x}$ * sin(π/4.0)] |
| 11110 | [R2 * $\sqrt{\epsilon_x}$ * sin(5.0 * π/12.0), -R2 * $\sqrt{\epsilon_x}$ * sin(π/12.0)] |
| 11111 | [R1 * $\sqrt{\epsilon_x}$ * sin(π/4.0), -R1 * $\sqrt{\epsilon_x}$ * sin(π/4.0)]. |

30. An apparatus according to claim 25, wherein the apparatus is further caused to perform the following:
    encoding, prior to the LDPC encoding, the one or more blocks of information bits of the source signal based on a t-error Bose Chaudhuri Hocquenghem (BCH) code.

31. An apparatus according to claim 30, wherein the apparatus is further caused to perform the following:
    interleaving the LDPC encoded signal.

32. An apparatus according to claim 31, wherein the apparatus is further caused to perform the following:
    modulating the interleaved signal according to a signal constellation that comprises a one of the following formats (where $\epsilon_x$ represents average energy per symbol),
    a QPSK (Quadrature Phase Shift Keying) constellation having bit labeling and x-y bit positioning according to the following table:

| Bit Label | [x, y] Coordinates |
|---|---|
| 00 | [$\sqrt{\epsilon_x}$ * cos(π/4.0), $\sqrt{\epsilon_x}$ * sin(π/4.0)] |
| 01 | [$\sqrt{\epsilon_x}$ * cos(7.0 * π/4.0), $\sqrt{\epsilon_x}$ * sin(7.0 * π/4.0)] |
| 10 | [$\sqrt{\epsilon_x}$ * cos(3.0 * π/4.0), $\sqrt{\epsilon_x}$ * sin(3.0 * π/4.0)] |
| 11 | [$\sqrt{\epsilon_x}$ * cos(5.0 * π/4.0), $\sqrt{\epsilon_x}$ * sin(5.0 * π/4.0)] | an 8-PSK (Phase Shift Keying) constellation having bit labeling and x-y bit positioning according to the following table:

| Bit Label | [x, y] Coordinates |
|---|---|
| 000 | [$\sqrt{\epsilon_x}$ * cos(π/8.0), $\sqrt{\epsilon_x}$ * sin(π/8.0)] |
| 001 | [$\sqrt{\epsilon_x}$ * cos(15.0 * π/8.0), $\sqrt{\epsilon_x}$ * sin(15.0 * π/8.0)] |
| 010 | [$\sqrt{\epsilon_x}$ * cos(7.0 * π/8.0), $\sqrt{\epsilon_x}$ * sin(7.0 * π/8.0)] |
| 011 | [$\sqrt{\epsilon_x}$ * cos(9.0 * π/8.0), $\sqrt{\epsilon_x}$ * sin(9.0 * π/8.0)] |
| 100 | [$\sqrt{\epsilon_x}$ * cos(3.0 * π/8.0), $\sqrt{\epsilon_x}$ * sin(3.0 * π/8.0)] |
| 101 | [$\sqrt{\epsilon_x}$ * cos(13.0 * π/8.0), $\sqrt{\epsilon_x}$ * sin(13.0 * π/8.0)] |

-continued

| Bit Label | [x, y] Coordinates |
|---|---|
| 110 | $[\sqrt{\epsilon_x} * \cos(5.0 * \pi/8.0), \sqrt{\epsilon_x} * \sin(5.0 * \pi/8.0)]$ |
| 111 | $[\sqrt{\epsilon_x} * \cos(11.0 * \pi/8.0), \sqrt{\epsilon_x} * \sin(11.0 * \pi/8.0)]$ | a 16-APSK (Amplitude Phase Shift Keying) constellation, of a 4+12 bit/ring format, having bit labeling and x-y bit positioning according to the following table (where R1 represents the radius of an inner ring and R2 represents the radius of an outer ring, and $4*R1^2+12*R2^2=16$):

| Bit Label | [x, y] Coordinates |
|---|---|
| 0000 | $[R2 * \sqrt{\epsilon_x} * \cos(3.0 * \pi/12.0), R2 * \sqrt{\epsilon_x} * \sin(3.0 * \pi/12.0)]$ |
| 0001 | $[R2 * \sqrt{\epsilon_x} * \cos(21.0 * \pi/12.0), R2 * \sqrt{\epsilon_x} * \sin(21 * \pi/12.0)]$ |
| 0010 | $[R2 * \sqrt{\epsilon_x} * \cos(9.0 * \pi/12.0), R2 * \sqrt{\epsilon_x} * \sin(9 * \pi/12.0)]$ |
| 0011 | $[R2 * \sqrt{\epsilon_x} * \cos(15.0 * \pi/12.0), R2 * \sqrt{\epsilon_x} * \sin(15 * \pi/12.0)]$ |
| 0100 | $[R2 * \sqrt{\epsilon_x} * \cos(\pi/12.0), R2 * \sqrt{\epsilon_x} * \sin(\pi/12.0)]$ |
| 0101 | $[R2 * \sqrt{\epsilon_x} * \cos(23.0 * \pi/12.0), R2 * \sqrt{\epsilon_x} * \sin(23 * \pi/12.0)]$ |
| 0110 | $[R2 * \sqrt{\epsilon_x} * \cos(11.0 * \pi/12.0), R2 * \sqrt{\epsilon_x} * \sin(11 * \pi/12.0)]$ |
| 0111 | $[R2 * \sqrt{\epsilon_x} * \cos(13.0 * \pi/12.0), R2 * \sqrt{\epsilon_x} * \sin(13 * \pi/12.0)]$ |
| 1000 | $[R2 * \sqrt{\epsilon_x} * \cos(5.0 * \pi/12.0), R2 * \sqrt{\epsilon_x} * \sin(5 * \pi/12.0)]$ |
| 1001 | $[R2 * \sqrt{\epsilon_x} * \cos(19.0 * \pi/12.0), R2 * \sqrt{\epsilon_x} * \sin(19 * \pi/12.0)]$ |
| 1010 | $[R2 * \sqrt{\epsilon_x} * \cos(7.0 * \pi/12.0), R2 * \sqrt{\epsilon_x} * \sin(7 * \pi/12.0)]$ |
| 1011 | $[R2 * \sqrt{\epsilon_x} * \cos(17.0 * \pi/12.0), R2 * \sqrt{\epsilon_x} * \sin(17 * \pi/12.0)]$ |
| 1100 | $[R1 * \sqrt{\epsilon_x} * \cos(\pi/4.0), R1 * \sqrt{\epsilon_x} * \sin(\pi/4.0)]$ |
| 1101 | $[R1 * \sqrt{\epsilon_x} * \cos(7.0 * \pi/4.0), R1 * \sqrt{\epsilon_x} * \sin(7.0 * \pi/4.0)]$ |
| 1110 | $[R1 * \sqrt{\epsilon_x} * \cos(3.0 * \pi/4.0), R1 * \sqrt{\epsilon_x} * \sin(3.0 * \pi/4.0)]$ |
| 1111 | $[R1 * \sqrt{\epsilon_x} * \cos(5.0 * \pi/4.0), R1 * \sqrt{\epsilon_x} * \sin(5.0 * \pi/4.0)]$ | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | $[R2 * \sqrt{\epsilon_x} * \sin(\pi/4.0), R2 * \sqrt{\epsilon_x} * \sin(\pi/4.0)]$ |
| 00001 | $[R2 * \sqrt{\epsilon_x} * \sin(\pi/12.0), R2 * \sqrt{\epsilon_x} * \sin(5.0 * \pi/12.0)]$ |
| 00010 | $[R2 * \sqrt{\epsilon_x} * \sin(\pi/4.0), -R2 * \sqrt{\epsilon_x} * \sin(\pi/4.0)]$ |
| 00011 | $[R2 * \sqrt{\epsilon_x} * \sin(\pi/12.0), -R2 * \sqrt{\epsilon_x} * \sin(5.0 * \pi/12.0)]$ |
| 00100 | $[-R2 * \sqrt{\epsilon_x} * \sin(\pi/4.0), R2 * \sqrt{\epsilon_x} * \sin(\pi/4.0)]$ |
| 00101 | $[-R2 * \sqrt{\epsilon_x} * \sin(\pi/12.0), R2 * \sqrt{\epsilon_x} * \sin(5.0 * \pi/12.0)]$ |
| 00110 | $[-R2 * \sqrt{\epsilon_x} * \sin(\pi/4.0), -R2 * \sqrt{\epsilon_x} * \sin(\pi/4.0)]$ |
| 00111 | $[-R2 * \sqrt{\epsilon_x} * \sin(\pi/12.0), -R2 * \sqrt{\epsilon_x} * \sin(5.0 * \pi/12.0)]$ |
| 01000 | $[R3 * \sqrt{\epsilon_x} * \cos(\pi/8.0), R3 * \sqrt{\epsilon_x} * \sin(\pi/8.0)]$ |
| 01001 | $[R3 * \sqrt{\epsilon_x} * \sin(\pi/8.0), R3 * \sqrt{\epsilon_x} * \cos(\pi/8.0)]$ |
| 01010 | $[R3 * \sqrt{\epsilon_x} * \sin(\pi/4.0), -R3 * \sqrt{\epsilon_x} * \sin(\pi/4.0)]$ |
| 01011 | $[0, -R3 * \sqrt{\epsilon_x}]$ |
| 01100 | $[-R3 * \sqrt{\epsilon_x} * \sin(\pi/4.0), R3 * \sqrt{\epsilon_x} * \sin(\pi/4.0)]$ |
| 01101 | $[0, R3 * \sqrt{\epsilon_x}]$ |
| 01110 | $[-R3 * \sqrt{\epsilon_x} * \cos(\pi/8.0), -R3 * \sqrt{\epsilon_x} * \sin(\pi/8.0)]$ |
| 01111 | $[-R3 * \sqrt{\epsilon_x} * \sin(\pi/8.0), -R3 * \sqrt{\epsilon_x} * \cos(\pi/8.0)]$ |
| 10000 | $[R2 * \sqrt{\epsilon_x} * \sin(5.0 * \pi/12.0), R2 * \sqrt{\epsilon_x} * \sin(\pi/12.0)]$ |
| 10001 | $[R1 * \sqrt{\epsilon_x} * \sin(\pi/4.0), R1 * \sqrt{\epsilon_x} * \sin(\pi/4.0)]$ |
| 10010 | $[R2 * \sqrt{\epsilon_x} * \sin(5.0 * \pi/12.0), -R2 * \sqrt{\epsilon_x} * \sin(\pi/12.0)]$ |
| 10011 | $[R1 * \sqrt{\epsilon_x} * \sin(\pi/4.0), -R1 * \sqrt{\epsilon_x} * \sin(\pi/4.0)]$ |
| 10100 | $[-R2 * \sqrt{\epsilon_x} * \sin(5.0 * \pi/12.0), R2 * \sqrt{\epsilon_x} * \sin(\pi/12.0)]$ |
| 10101 | $[-R1 * \sqrt{\epsilon_x} * \sin(\pi/4.0), R1 * \sqrt{\epsilon_x} * \sin(\pi/4.0)]$ |
| 10110 | $[-R2 * \sqrt{\epsilon_x} * \sin(5.0 * \pi/12.0), -R2 * \sqrt{\epsilon_x} * \sin(\pi/12.0)]$ |
| 10111 | $[-R1 * \sqrt{\epsilon_x} * \sin(\pi/4.0), -R1 * \sqrt{\epsilon_x} * \sin(\pi/4.0)]$ |
| 11000 | $[R3 * \sqrt{\epsilon_x}, 0]$ |
| 11001 | $[R3 * \sqrt{\epsilon_x} * \sin(\pi/4.0), R3 * \sqrt{\epsilon_x} * \sin(\pi/4.0)]$ |
| 11010 | $[R3 * \sqrt{\epsilon_x} * \cos(\pi/8.0), -R3 * \sqrt{\epsilon_x} * \sin(\pi/8.0)]$ |
| 11011 | $[R3 * \sqrt{\epsilon_x} * \sin(\pi/8.0), -R3 * \sqrt{\epsilon_x} * \cos(\pi/8.0)]$ |
| 11100 | $[-R3 * \sqrt{\epsilon_x} * \cos(\pi/8.0), R3 * \sqrt{\epsilon_x} * \sin(\pi/8.0)]$ |
| 11101 | $[-R3 * \sqrt{\epsilon_x} * \sin(\pi/8.0), R3 * \sqrt{\epsilon_x} * \cos(\pi/8.0)]$ |
| 11110 | $[-R3 * \sqrt{\epsilon_x}, 0]$ |
| 11111 | $[-R3 * \sqrt{\epsilon_x} * \sin(\pi/4.0), -R3 * \sqrt{\epsilon_x} * \sin(\pi/4.0)]$ | a 32-APSK constellation, of a 4+12+16 bit/ring format, having bit labeling and x-y bit positioning according to the following table (where R1 represents the radius of an inner ring, R2 represents the radius of a middle ring and R3 represents the radius of an outer ring, and $4*R1^2+12*R2^2+16*R3^2=32$):

| Bit Label | [x, y] Coordinates |
|---|---|
| 00000 | $[-R3 * \sqrt{\epsilon_x} * \sin(\pi/4.0), R3 * \sqrt{\epsilon_x} * \sin(\pi/4.0)]$ |
| 00001 | $[-R3 * \sqrt{\epsilon_x} * \sin(\pi/8.0), R3 * \sqrt{\epsilon_x} * \cos(\pi/8.0)]$ |
| 00010 | $[R3 * \sqrt{\epsilon_x} * \sin(\pi/8.0), R3 * \sqrt{\epsilon_x} * \cos(\pi/8.0)]$ |
| 00011 | $[0, R3 * \sqrt{\epsilon_x}]$ |
| 00100 | $[-R2 * \sqrt{\epsilon_x} * \sin(\pi/4.0), R2 * \sqrt{\epsilon_x} * \sin(\pi/4.0)]$ |
| 00101 | $[-R2 * \sqrt{\epsilon_x} * \sin(\pi/12.0), R2 * \sqrt{\epsilon_x} * \sin(5.0 * \pi/12.0)]$ |
| 00110 | $[R2 * \sqrt{\epsilon_x} * \sin(\pi/4.0), R2 * \sqrt{\epsilon_x} * \sin(\pi/4.0)]$ |
| 00111 | $[R2 * \sqrt{\epsilon_x} * \sin(\pi/12.0), R2 * \sqrt{\epsilon_x} * \sin(5.0 * \pi/12.0)]$ |
| 01000 | $[-R3 * \sqrt{\epsilon_x} * \cos(\pi/8.0), R3 * \sqrt{\epsilon_x} * \sin(\pi/8.0)]$ |
| 01001 | $[-R3 * \sqrt{\epsilon_x}, 0]$ |
| 01010 | $[R3 * \sqrt{\epsilon_x} * \sin(\pi/4.0), R3 * \sqrt{\epsilon_x} * \sin(\pi/4.0)]$ |
| 01011 | $[R3 * \sqrt{\epsilon_x} * \cos(\pi/8.0), R3 * \sqrt{\epsilon_x} * \sin(\pi/8.0)]$ |
| 01100 | $[-R2 * \sqrt{\epsilon_x} * \sin(5.0 * \pi/12.0), R2 * \sqrt{\epsilon_x} * \sin(\pi/12.0)]$ |
| 01101 | $[-R1 * \sqrt{\epsilon_x} * \sin(\pi/4.0), R1 * \sqrt{\epsilon_x} * \sin(\pi/4.0)]$ |
| 01110 | $[R2 * \sqrt{\epsilon_x} * \sin(5.0 * \pi/12.0), R2 * \sqrt{\epsilon_x} * \sin(\pi/12.0)]$ |
| 01111 | $[R1 * \sqrt{\epsilon_x} * \sin(\pi/4.0), R1 * \sqrt{\epsilon_x} * \sin(\pi/4.0)]$ |
| 10000 | $[-R3 * \sqrt{\epsilon_x} * \sin(\pi/8.0), -R3 * \sqrt{\epsilon_x} * \cos(\pi/8.0)]$ |
| 10001 | $[0, -R3 * \sqrt{\epsilon_x}]$ |
| 10010 | $[R3 * \sqrt{\epsilon_x} * \sin(\pi/4.0), -R3 * \sqrt{\epsilon_x} * \sin(\pi/4.0)]$ |
| 10011 | $[R3 * \sqrt{\epsilon_x} * \sin(\pi/8.0), -R3 * \sqrt{\epsilon_x} * \cos(\pi/8.0)]$ |
| 10100 | $[-R2 * \sqrt{\epsilon_x} * \sin(\pi/4.0), -R2 * \sqrt{\epsilon_x} * \sin(\pi/4.0)]$ |
| 10101 | $[-R2 * \sqrt{\epsilon_x} * \sin(\pi/12.0), -R2 * \sqrt{\epsilon_x} * \sin(5.0 * \pi/12.0)]$ |
| 10110 | $[R2 * \sqrt{\epsilon_x} * \sin(\pi/4.0), -R2 * \sqrt{\epsilon_x} * \sin(\pi/4.0)]$ |
| 10111 | $[R2 * \sqrt{\epsilon_x} * \sin(\pi/12.0), -R2 * \sqrt{\epsilon_x} * \sin(5.0 * \pi/12.0)]$ |
| 11000 | $[-R3 * \sqrt{\epsilon_x} * \sin(\pi/4.0), -R3 * \sqrt{\epsilon_x} * \sin(\pi/4.0)]$ |
| 11001 | $[-R3 * \sqrt{\epsilon_x} * \cos(\pi/8.0), -R3 * \sqrt{\epsilon_x} * \sin(\pi/8.0)]$ |
| 11010 | $[R3 * \sqrt{\epsilon_x} * \cos(\pi/8.0), -R3 * \sqrt{\epsilon_x} * \sin(\pi/8.0)]$ |
| 11011 | $[R3 * \sqrt{\epsilon_x}, 0]$ |
| 11100 | $[-R2 * \sqrt{\epsilon_x} * \sin(5.0 * \pi/12.0), -R2 * \sqrt{\epsilon_x} * \sin(\pi/12.0)]$ |
| 11101 | $[-R1 * \sqrt{\epsilon_x} * \sin(\pi/4.0), -R1 * \sqrt{\epsilon_x} * \sin(\pi/4.0)]$ |
| 11110 | $[R2 * \sqrt{\epsilon_x} * \sin(5.0 * \pi/12.0), -R2 * \sqrt{\epsilon_x} * \sin(\pi/12.0)]$ |
| 11111 | $[R1 * \sqrt{\epsilon_x} * \sin(\pi/4.0), -R1 * \sqrt{\epsilon_x} * \sin(\pi/4.0)]$. |

\* \* \* \* \*